US009190511B2

(12) United States Patent
Pfirsch et al.

(10) Patent No.: US 9,190,511 B2
(45) Date of Patent: Nov. 17, 2015

(54) SEMICONDUCTOR COMPONENT WITH A DRIFT REGION AND A DRIFT CONTROL REGION

(71) Applicant: Infineon Technologies Austria AG, Villach (AT)

(72) Inventors: Frank Pfirsch, Munich (DE); Anton Mauder, Kolbermoor (DE); Armin Willmeroth, Augsburg (DE); Hans-Joachim Schulze, Taufkirchen (DE); Stefan Sedlmaier, Munich (DE); Markus Zundel, Egmating (DE); Franz Hirler, Isen (DE); Arunjai Mittal, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/915,277

(22) Filed: Jun. 11, 2013

(65) Prior Publication Data

US 2014/0001528 A1 Jan. 2, 2014

Related U.S. Application Data

(63) Continuation of application No. 11/996,906, filed as application No. PCT/EP2006/007450 on Jul. 27, 2006, now Pat. No. 8,461,648, which is a continuation-in-part of application No. 11/435,979, filed on May 17, 2006, now Pat. No. 8,110,868.

(30) Foreign Application Priority Data

| | | |
|---|---|---|
| Jul. 27, 2005 | (DE) | 10 2005 035 153 |
| Aug. 19, 2005 | (DE) | 10 2005 039 331 |
| Mar. 3, 2006 | (DE) | 10 2006 009 942 |

(51) Int. Cl.

| | |
|---|---|
| ***H01L 29/732*** | (2006.01) |
| ***H01L 29/78*** | (2006.01) |

(Continued)

(52) U.S. Cl.
CPC ........ *H01L 29/7803* (2013.01); *H01L 29/0634* (2013.01); *H01L 29/0653* (2013.01);
(Continued)

(58) Field of Classification Search
CPC ............ H01L 29/7802; H01L 29/7803; H01L 29/7804; H01L 29/7813
USPC .......... 257/300, 328, 341, E29.012, E29.257, 257/E21.418
See application file for complete search history.

(56) References Cited

U.S. PATENT DOCUMENTS

| | | |
|---|---|---|
| 568,928 A | 10/1896 | Stratton et al. |
| 3,763,406 A | 10/1973 | Bosselaar |

(Continued)

FOREIGN PATENT DOCUMENTS

| | | |
|---|---|---|
| DE | 4309764 | 9/1994 |
| DE | 19604043 | 8/1997 |

(Continued)

OTHER PUBLICATIONS

Fujihira, et al., “Simulated Superior Performances of Semiconductor Superjunction Devices”, ISPSD, 12.4, pp. 423-426 (1998).

(Continued)

*Primary Examiner* — Eduardo A Rodela
*Assistant Examiner* — Christopher M Roland
(74) *Attorney, Agent, or Firm* — Dicke, Billig & Czaja, PLLC

(57) ABSTRACT

A semiconductor component with a drift region and a drift control region. One embodiment includes a semiconductor body having a drift region of a first conduction type in the semiconductor body. A drift control region composed of a semiconductor material, which is arranged, at least in sections, is adjacent to the drift region in the semiconductor body. An accumulation dielectric is arranged between the drift region and the drift control region.

34 Claims, 114 Drawing Sheets

(51) Int. Cl.

| | |
|---|---|
| ***H01L 29/06*** | (2006.01) |
| ***H01L 29/08*** | (2006.01) |
| ***H01L 29/40*** | (2006.01) |
| ***H01L 29/66*** | (2006.01) |
| ***H01L 29/872*** | (2006.01) |
| *H01L 29/10* | (2006.01) |
| *H01L 29/417* | (2006.01) |
| *H01L 29/49* | (2006.01) |

(52) U.S. Cl.

CPC .......... *H01L29/0878* (2013.01); *H01L 29/407* (2013.01); *H01L 29/66734* (2013.01); *H01L 29/7802* (2013.01); *H01L 29/7804* (2013.01); *H01L 29/7813* (2013.01); *H01L 29/872* (2013.01); *H01L 29/0696* (2013.01); *H01L 29/1095* (2013.01); *H01L 29/41766* (2013.01); *H01L 29/4916* (2013.01)

(56) References Cited

U.S. PATENT DOCUMENTS

| | | | |
|---|---|---|---|
| 4,754,310 | A | 6/1988 | Coe |
| 4,774,560 | A | 9/1988 | Coe |
| 4,903,189 | A | 2/1990 | Ngo et al. |
| 4,907,056 | A | 3/1990 | Goesele et al. |
| 4,941,026 | A | 7/1990 | Temple |
| 5,032,878 | A | 7/1991 | Davies et al. |
| 5,075,739 | A | 12/1991 | Davies |
| 5,216,275 | A | 6/1993 | Chen |
| 5,237,193 | A | 8/1993 | Williams et al. |
| 5,386,136 | A | 1/1995 | Williams et al. |
| 5,430,324 | A | 7/1995 | Bencuya |
| 5,438,215 | A | 8/1995 | Tihanyi |
| 5,689,128 | A | 11/1997 | Hshieh et al. |
| 5,844,272 | A | 12/1998 | Soderbarg et al. |
| 5,889,314 | A | 3/1999 | Hirabayashi |
| 5,973,359 | A | 10/1999 | Kobayashi et al. |
| 5,981,996 | A | 11/1999 | Fujishima |
| 6,064,103 | A | 5/2000 | Pfirsch |
| 6,184,555 | B1 | 2/2001 | Tihanyi et al. |
| 6,201,279 | B1 | 3/2001 | Pfirsch |
| 6,259,134 | B1 | 7/2001 | Amaratunga et al. |
| 6,362,505 | B1 | 3/2002 | Tihanyi |
| 6,373,098 | B1 | 4/2002 | Brush et al. |
| 6,504,697 | B1 | 1/2003 | Hille |
| 6,555,872 | B1 | 4/2003 | Dennen |
| 6,605,862 | B2 | 8/2003 | Van Dalen et al. |
| 6,635,944 | B2 | 10/2003 | Stoisiek |
| 6,717,230 | B2 | 4/2004 | Kocon |
| 6,774,434 | B2 | 8/2004 | Hueting et al. |
| 6,853,033 | B2 | 2/2005 | Liang et al. |
| 6,872,611 | B2 | 3/2005 | Takemori et al. |
| 6,914,297 | B2 | 7/2005 | Deboy et al. |
| 6,921,941 | B2 | 7/2005 | Nishiwaki et al. |
| 6,953,968 | B2 | 10/2005 | Nakamura et al. |
| 7,064,384 | B2 | 6/2006 | Hara et al. |
| 7,238,576 | B2 | 7/2007 | Yamaguchi et al. |
| 7,250,639 | B1 | 7/2007 | Suckawa |
| 7,304,354 | B2 | 12/2007 | Morris |
| 7,821,033 | B2 | 10/2010 | Sedlmaier |
| 2003/0073287 | A1 | 4/2003 | Kocon |
| 2003/0094649 | A1 | 5/2003 | Hueting et al. |
| 2004/0043565 | A1 | 3/2004 | Yamaguchi et al. |
| 2004/0084721 | A1 | 5/2004 | Kocon et al. |
| 2004/0094799 | A1 | 5/2004 | Nakamura |
| 2004/0129973 | A1 | 7/2004 | Saito et al. |
| 2005/0045960 | A1 | 3/2005 | Takahashi |
| 2005/0082591 | A1 | 4/2005 | Hirler et al. |
| 2005/0253170 | A1 | 11/2005 | Akiyama |
| 2006/0097313 | A1 | 5/2006 | Yanagisawa et al. |
| 2007/0023830 | A1 | 2/2007 | Pfirsch |
| 2007/0108513 | A1 | 5/2007 | Rub et al. |
| 2008/0197441 | A1 | 8/2008 | Mauder et al. |
| 2008/0265320 | A1 | 10/2008 | Mauder et al. |
| 2009/0189216 | A1 | 7/2009 | Werner et al. |
| 2009/0321804 | A1 | 12/2009 | Mauder et al. |
| 2009/0322417 | A1 | 12/2009 | Hirler et al. |
| 2010/0078694 | A1 | 4/2010 | Willmeroth et al. |
| 2012/0132956 | A1 | 5/2012 | Pfirsch et al. |

FOREIGN PATENT DOCUMENTS

| | | | | |
|---|---|---|---|---|
| DE | 19606983 | | | 8/1997 |
| DE | 19704861 | | | 8/1998 |
| DE | 19854915 | | | 6/2000 |
| DE | 10301939 | | | 9/2004 |
| DE | 10301939 | A1 | * | 9/2004 |
| DE | 102004041198 | | | 3/2006 |
| DE | 102004041198 | A1 | * | 3/2006 |
| DE | 102005035153 | | | 2/2007 |
| DE | 102005039331 | | | 2/2007 |
| DE | 102005044165 | | | 3/2007 |
| DE | 102006009942 | | | 9/2007 |
| EP | 1056134 | | | 11/2000 |
| EP | 1056134 | A2 | * | 11/2000 |
| EP | 1073123 | | | 1/2001 |
| EP | 1107123 | | | 6/2001 |
| EP | 1170803 | | | 1/2002 |
| EP | 1300886 | | | 4/2003 |
| EP | 1 453 105 | | | 9/2004 |
| GB | 2089118 | | | 6/1982 |
| JP | 09-092826 | A2 | | 4/1997 |
| JP | 09092826 | A | * | 4/1997 |
| JP | 2000-208757 | | | 7/2000 |
| JP | 2001-085685 | | | 3/2001 |
| JP | 2001230412 | A | * | 8/2001 |
| JP | 2003-031809 | | | 1/2003 |
| JP | 2003031809 | A | * | 1/2003 |
| JP | 2003-298053 | | | 10/2003 |
| JP | 2004-095954 | | | 3/2004 |
| JP | 2004-193212 | | | 7/2004 |
| JP | 2004193212 | A | * | 7/2004 |
| JP | 2005/510059 | | | 4/2005 |
| WO | 0038242 | | | 6/2000 |
| WO | 02/058160 | | | 7/2002 |
| WO | 02067332 | | | 8/2002 |
| WO | 03043089 | | | 5/2003 |
| WO | 2004090973 | | | 10/2004 |
| WO | 2004/107449 | | | 12/2004 |
| WO | 2005/065385 | | | 7/2005 |
| WO | 2007012490 | | | 2/2007 |

OTHER PUBLICATIONS

Contiero et al., "Progress in Power ICs and MEMS, 'Analog' Technologies to Interface the Real World", ISPSC, 1 pp. 2-12, 2004.

Presentation of Symmorphix: "Symmorphix=Amorphous Oxide Films' A 'Moore's Law' Platform for Passive Integration, Flexible Electronics, & Energy Storage", Dr. Ernest Demaray, (Mar. 2005).

Final Office Action mailed Jun. 10, 2009 in U.S. Appl. No. 11/435,979.

Notice of Allowance mailed Aug. 18, 2011 in U.S. Appl. No. 11/435,979.

PCT International Search Report of PCT Application No. PCT/EP2006/007450 mailed Jul. 4, 2007 (23 pgs.).

Notice of Allowance mailed Nov. 23, 2012 in U.S. Appl. No. 11/996,906.

* cited by examiner

FIG 23A
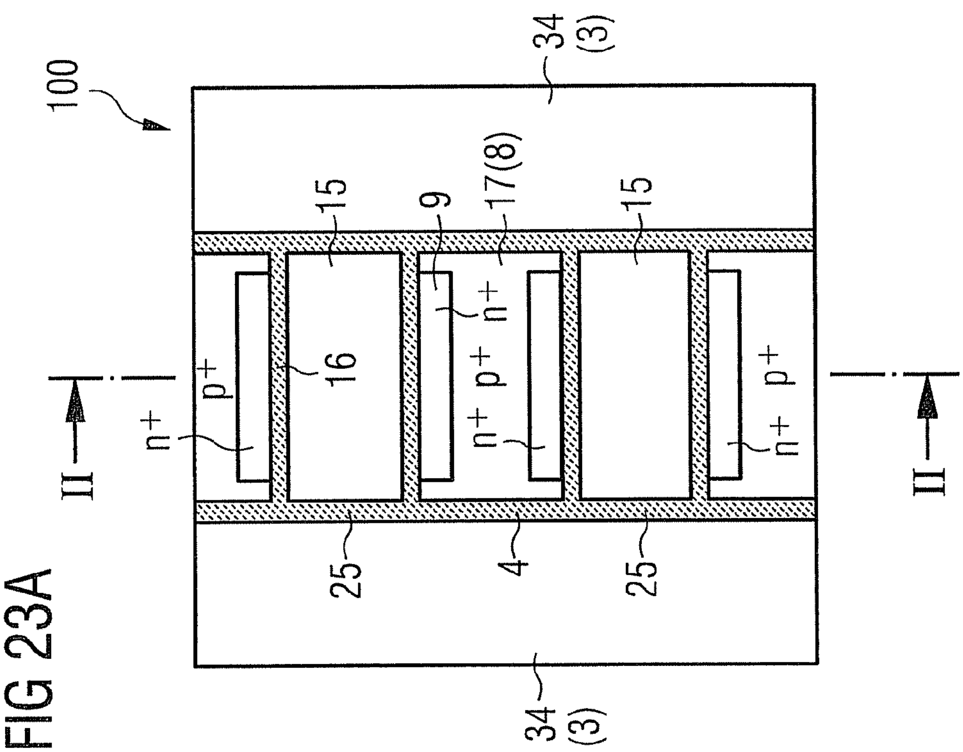
FIG 22 I-I
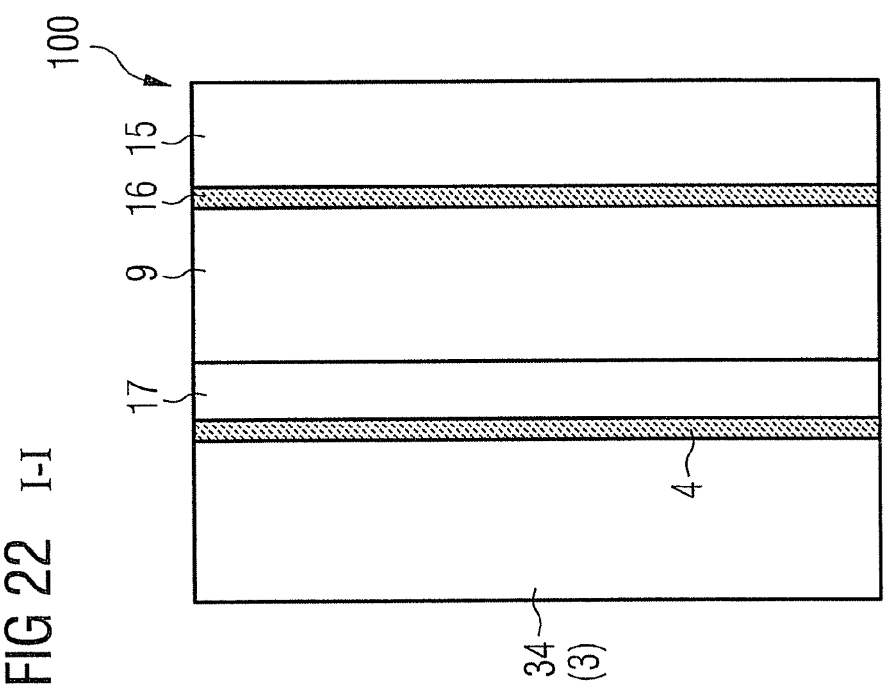

V-V

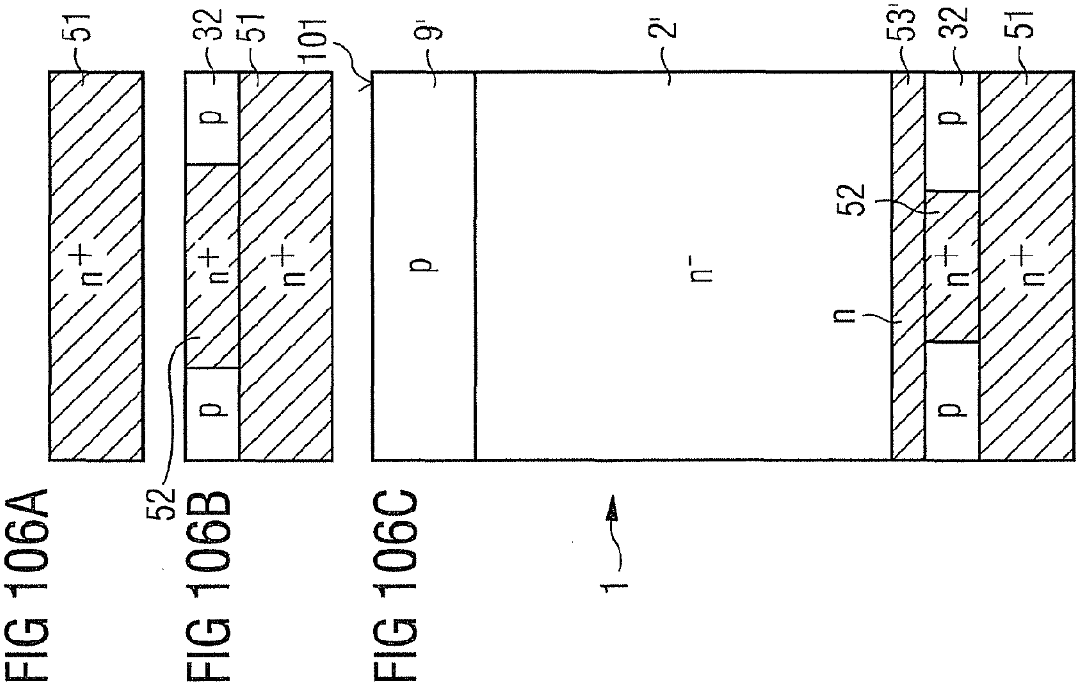
FIG 106A
FIG 106B
FIG 106C
FIG 105
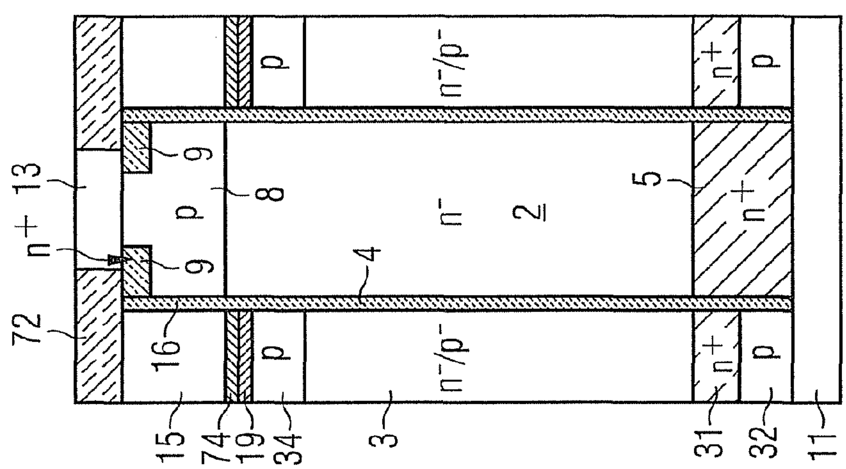

Z-Z

C-C

D-D

E-E

F-F

E-E

F-F

G-G

H-H

J-J

K-K

M-M

N-N

Q-Q

SEMICONDUCTOR COMPONENT WITH A DRIFT REGION AND A DRIFT CONTROL REGION

CROSS REFERENCE TO RELATED APPLICATION

This Utility patent application is a continuation of U.S. Ser. No. 11/996,906, filed Jan. 25, 2008, and claims the benefit of the filing date of International Application No. PCT/EP2006/007450, filed Jul. 27, 2006, which claims priority to German Application No. 10 2005 035 153.0, filed Jul. 27, 2005; German Application No. 10 2005 039 331.4, filed Aug. 19, 2005; German Application No. 10 2006 009 942.7, filed Mar. 3, 2006; and U.S. Ser. No. 11/435,979, filed May 17, 2006, now U.S. Pat. No. 8,110,868, issued Feb. 7, 2012; all of which are herein incorporated by reference.

BACKGROUND

The invention relates to a power semiconductor component, having a low on resistance.

One important aim in the development of power semiconductor components is to produce components which have the highest possible blocking capability and which nevertheless have a low on resistance and which simultaneously have the lowest possible switching losses.

One possibility for reducing the on resistance of a power semiconductor component for a given blocking capability is to use the compensation principle, described for example in U.S. Pat. No. 4,754,310 (Coe), U.S. Pat. No. 5,216,275 A1 (Chen), U.S. Pat. No. 5,438,215 or DE 43 09 764 C2 (Tihanyi).

A further possibility for reducing the on resistance of a semiconductor component is to provide a field electrode insulated dielectrically from the drift region. Components of this type are described in U.S. Pat. No. 4,903,189 (Ngo), U.S. Pat. No. 4,941,026 (Temple), U.S. Pat. No. 6,555,873 B2 (Disney), U.S. Pat. No. 6,717,230 B2 (Kocon) or U.S. Pat. No. 6,853,033 B2 (Liang).

EP 1 073 123 A2 (Yasuhara) describes a lateral power MOSFET having a plurality of auxiliary electrodes which are arranged in a drift region of the component and which are insulated from the drift region by a dielectric. The auxiliary electrodes are composed of a semi-insulating polysilicon (SIPOS) or a resistive material and are connected between a source connection and a drain connection of the component. The auxiliary electrodes bring about the formation of a depletion zone (depletion layer) in the drift region when the component is driven in the off state.

GB 2 089 118 A describes a power MOSFET having a resistive layer which extends along the drift region between a gate electrode and a drain electrode and which “spreads” an electric field in the drift region with the aim of increasing the dielectric strength.

U.S. Pat. No. 5,844,272 (Söderbärg) describes a lateral high-frequency transistor with a drift region running in the lateral direction of a semiconductor body.

US 2003/0073287 A1 (Kocon) proposes providing a plurality of field electrodes along the drift path of a semiconductor component, the field electrodes being at different potentials.

SUMMARY

One or more embodiments provide a semiconductor device including a semiconductor component in one embodiment, a power semiconductor component, with a drift path/drift region having a low on resistance.

One embodiment provides a semiconductor device including a semiconductor component having in a semiconductor body a drift region and a drift control region composed of a semiconductor material, the drift control region being arranged, at least in sections, adjacent to the drift region, and an accumulation dielectric being arranged between the drift region and the drift control region. In this component, the drift control region serves for controlling a conducting channel in the drift region along the accumulation dielectric.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 22 illustrates a cross section through the components illustrated in FIGS. 20 and 21, in a sectional plane I-I.

FIG. 105 illustrates a component which is modified relative to the component in FIG. 104 and in which the gate electrode and the drift control region are insulated from one another and in which the drift control region can be connected to a control potential.

FIGS. 106A-106E illustrate a method for producing a semiconductor component embodied as a MOSFET, in which the drift control region is directly adjacent to the gate electrode, during individual method steps.

DETAILED DESCRIPTION

Figure 1:
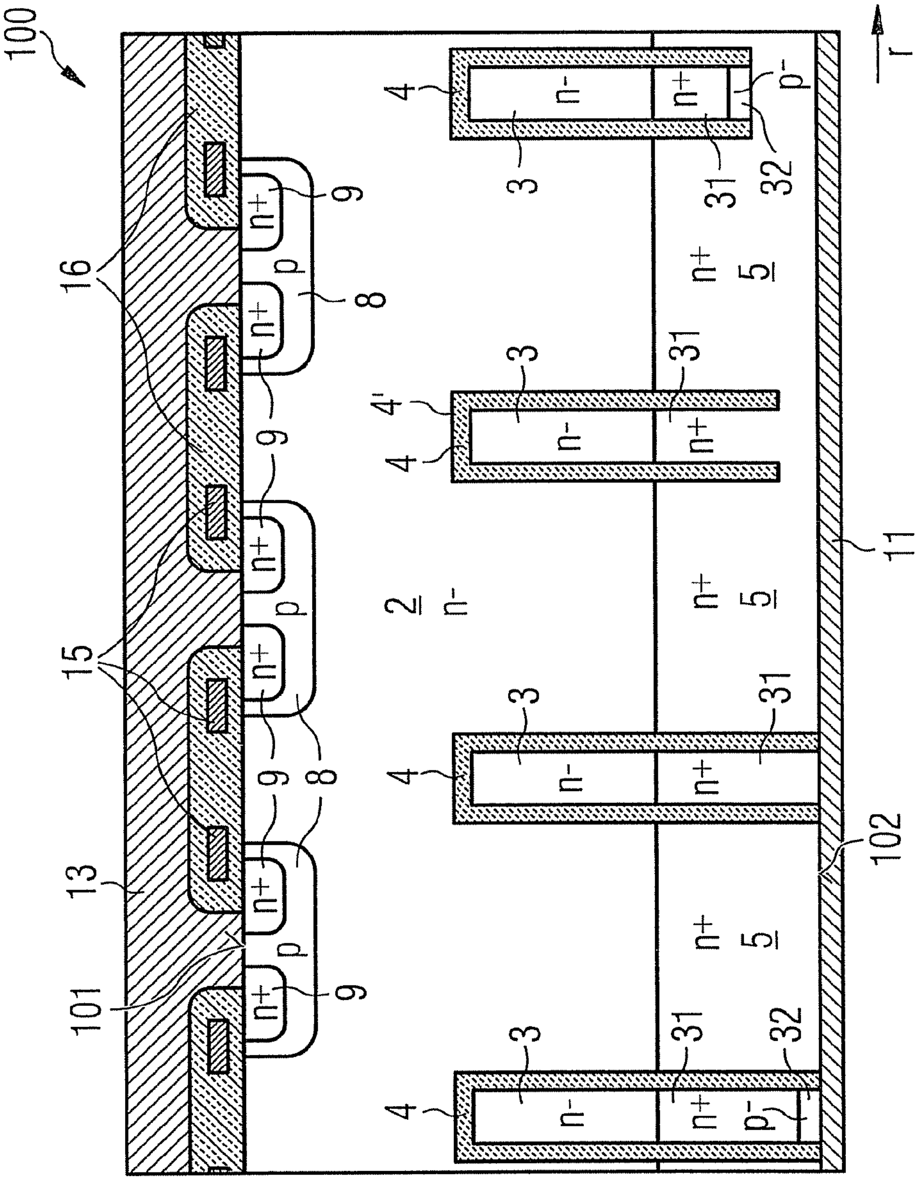
FIG. 1 illustrates a section of a semiconductor component which is embodied as a planar MOSFET and which has a semiconductor body with a plurality of MOSFET cells and a plurality of drift control regions arranged in the drift region, a dielectric being arranged between the drift region and the drift control regions.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In one embodiment of a semiconductor device, a drift region and a drift control region are arranged, at least in sections, adjacent to one another in a semiconductor body and are separated from one another by a dielectric layer. That region of the dielectric layer which separates the drift region and the drift control region is referred to hereinafter as "accumulation dielectric".

The terms "drift region" or "drift path" in the case of a power semiconductor component denote a semiconductor region in which, when a reverse voltage is applied to the component, the reverse voltage is reduced, that is to say in which a space charge region propagates as the reverse voltage increases. The terms "drift region" and "drift path" are used particularly in the case of unipolar power semiconductor components, such as, for example, in the case of power MOSFETs or power Schottky diodes, while the terms "n-type base" or "p-type base" are customary in the case of bipolar components depending on the type of doping of the semiconductor region that takes up the reverse voltage. For the explanation below, without restricting the invention to unipolar components, the terms "drift region" or "drift path" are used throughout for the region that takes up the reverse voltage of a power semiconductor component.

The doping of the drift control region is chosen for example in such a way that the latter has at least one semiconductor section which can be fully depleted in a direction perpendicular to the accumulation dielectric. This is tantamount to the fact that the dopant atoms present in the semiconductor section can be completely ionized when an electric field is present in a direction perpendicular to the accumulation dielectric, without an avalanche breakdown occurring. When the component is driven in the on state, the drift control region serves for controlling an accumulation channel, that is to say a region having a locally greatly increased charge carrier density, in the drift region along the accumulation dielectric. A potential difference between the drift control region and the drift region is required for forming the channel. In this case, the type of charge carriers, that is to say electrons or holes, which accumulate along the accumulation dielectric is dependent on the polarity of the potential difference, but not on the basic doping of the drift region, which can also be realized as an undoped or intrinsic region.

The presence of such an accumulation channel leads to a considerable reduction of the on resistance of the power semiconductor component in comparison with components which do not have such a drift control region. For the same on resistance, the basic doping of the drift region of the component can be reduced in comparison with the basic doping of the drift region of conventional components, which results in a higher dielectric strength of the component in comparison with conventional components.

The drift region is capacitively coupled to the drift control region via the accumulation dielectric, whereby the accumulation channel can be formed when the component is driven in the on state. This capacitive coupling and complying with the doping condition specified above for the drift control region have the effect that when the component is in the off state, that is to say when a space charge region propagates in the drift region, a space charge region likewise propagates in the drift control region. This space charge region propagating in the drift control region has the effect that the potential profile in the drift control region follows the potential profile in the drift region. A potential difference or an electrical voltage between the drift region and the drift control region is thereby limited. This voltage limiting makes it possible to use a thin accumulation dielectric, which entails the advantage of an improved capacitive coupling between the drift control region and the drift region.

A component junction, e.g., a pn junction or a Schottky junction, can be provided adjacent to the drift region, proceeding from which junction a space charge region propagates in the drift region when a reverse voltage is applied between the drift region and a first component region.

The semiconductor component is a unipolar power semiconductor component, such as, for example, a power MOSFET or a power Schottky diode. However, a drift control region which is composed of a doped or undoped semiconductor material, is insulated from a drift region by an accumulation dielectric and meets the doping condition specified above can also be provided in the case of bipolar components, such as diodes or IGBTs.

In the case of a MOSFET, an IGBT or a diode, the component junction between the first and second component regions is a pn junction. The first component region forms the body region in the case of a MOSFET or IGBT, and one of the p-type or n-type emitter regions in the case of a diode. The second component region forms the drain region in the case of a MOSFET, and the emitter region in the case of an IGBT or in the case of a diode.

In the case of a Schottky diode, the component junction between the first component region and the drift region is a Schottky contact, and the first component region is composed of a Schottky metal. In the case of a Schottky diode, the first component region is its anode region composed of a Schottky metal.

FIG. 1 illustrates a cross section through a section of one exemplary embodiment of a power semiconductor component. The component illustrated is embodied as a planar MOSFET and has a drift region 2, a source region 9, and also a body region 8, which is arranged between the source region 9 and the drift region 2 and is doped complementarily to the source region 9. A gate electrode 15 is present for controlling an inversion channel in the body region 8 between the source region 9 and the drift region 2, the gate electrode being dielectrically insulated from the semiconductor body by a gate dielectric 16. In the example illustrated, the gate electrode is arranged above a front side 101 of the semiconductor body 100 and extends in a lateral direction r of the semiconductor body 100 from the source region 9 as far as the drift region 2, which extends in sections as far as the front side 101. The component additionally includes a drain region 5, which is adjacent to the drift region 2 and which is doped more highly than the drift region and with which contact is made by a drain electrode 11.

The drain region 5 of the component illustrated can be realized by a semiconductor substrate, for example, to which is applied an epitaxial layer with a basic doping. Sections of the epitaxial layer which have the basic doping form the drift region 2 in this case. It should be pointed out that the dimensions of the semiconductor substrate and of the epitaxial layer are not reproduced to scale in FIG. 1.

The MOSFET illustrated is n-conducting, the source region 9, the drift region 2 and the drain region 5 are n-doped in this case, while the body region is p-doped. It goes without saying that the invention can also be applied to a p-conducting MOSFET, the component regions of which are doped complementarily to those of an n-conducting MOSFET.

The MOSFET illustrated in FIG. 1 is realized as a vertical MOSFET. The source region 9, the body region 8, the drift region 2 and the drain region 5 of this component are arranged successively in a vertical direction v of the semiconductor body 100. When the component is driven in the on state, that is to say when a positive voltage is applied between drain and source and a suitable driving potential is applied to the gate electrode 15, a current flows in a vertical direction through the drift region between source and drain. In the case of this component, the body region 8 and the drain region 5 form first and second component regions, between which the drift region 2 is arranged, in which case a space charge region propagates in the drift region 2 proceeding from the semiconductor junction between the body region 8 and the drift region 2 when a reverse voltage is applied between the body region 8 and the drain region 5.

In the component, at least one drift control region 3 is formed, at least in sections, adjacent to the drift region 2. In the component illustrated in FIG. 1, a plurality of such drift control regions 3 are provided, which are arranged at a distance from one another in a lateral direction r of the semiconductor body 1. A dielectric layer 4 is arranged between each of the drift control regions 3 and the drift region 2, the dielectric layer being referred to as "accumulation dielectric". For the purposes of the explanation below, the accumulation dielectric should in this case be understood to mean only that section of the dielectric layer 4 which is arranged directly between the drift region 2 and the drift control region 3, that is to say to which the drift region 2 is directly adjacent on one side and the drift control region 3 is directly adjacent on the other side.

The drift control regions 3 are coupled to one of the load connection potentials of the MOSFET, which are present at drain 5 and/or source 9 during operation. In the example, the drift control regions 3 are connected to the drain region 5 for this purpose. The drift control regions 3 can be connected to the drain region 5 in various ways. Four different possibilities are illustrated in this respect in FIG. 1. Firstly, the drift control region 3 can be connected to the drain electrode 11 via a highly doped first connection region 31 of the same conduction type as the drift control region. In this case, the dielectric layer 4 extends as far as the drain electrode 11 and thereby dielectrically insulates the first connection region 31 and the drain region 5 from one another.

Optionally, a second connection region 32 doped complementarily to the first connection region can be arranged between the highly doped first connection region 31 and the drain electrode 11, the second connection region being doped more weakly than the first connection region 31.

Furthermore, there is the possibility of the drain region 5 extending as far as below the drift control region 3 or the first connection region 31 adjacent to the drift control region 3. In this case, too, a complementarily doped second connection region 32 may optionally be present, which is then arranged between the first connection region 31 and that section of the drain region 5 which extends as far as below the drift control region 3.

The component in accordance with FIG. 1 is constructed cellularly and has a number of transistor cells of identical type, each having a source and a body region 9, 8. The individual transistor cells are connected in parallel by virtue of their source regions 9 being connected to a common source electrode 13 and by virtue of their gate electrodes 15 being connected to a common gate connection (not illustrated). In the component illustrated, the drift region 2 is common to all of the transistor cells. Depending on the realization of the drift control regions 3, the drain region 5 can be realized as a continuous semiconductor region common to all of the transistor cells, or have a plurality of separate semiconductor sections connected to one another by the drain electrode 11.

Each individual one of the drift control regions 3 is composed of a semiconductor material, which may be monocrystalline. Each of the drift control regions 3 is doped in such a way that it has at least one semiconductor section which can be fully depleted in a direction perpendicular to the accumulation dielectric 4. Consideration is given here to those sections of the accumulation dielectric 4 which extend along the current flow direction, that is to say in a vertical direction v of the semiconductor body in the present case. The drift control regions then have at least one section which extends in a direction perpendicular to the current flow direction over the entire dimension of the drift control region and which can be fully depleted by an electric field in the direction. This is tantamount to the fact that the dopants of the at least one section of the drift control region can be completely ionized when an electric field is present transversely with respect to the current flow direction—that is to say in a lateral direction r of the semiconductor body 100 in the example illustrated—without an avalanche breakdown occurring. This condition is met when the net dopant charge present in the semiconductor section relative to the area of the section of the accumulation dielectric 4 which dielectrically insulates the semiconductor section from the drift region 2 is lower than the breakdown charge of the semiconductor material used for the drift control region.

The drift control region 3 can be doped in such a way that it can be depleted not only in sections but fully in a direction perpendicular or transversely with respect to the current flow direction. The quotient of the net dopant charge present in the drift control region and the area of the accumulation dielectric 4 extending in the current flow direction between the drift region 2 and the drift control region 3 is then lower than the breakdown charge of the semiconductor material used for the drift control region 3.

One of the drift control regions which are illustrated in FIG. 1 and which are bounded by the dielectric layer 4 toward two sides and toward the top shall be considered below for explanation purposes. Moreover, the special case where the drift control regions 3 are in each case doped homogeneously shall be assumed below for the purposes of the explanation. For this special case, the doping stipulation specified above is tantamount to the fact that the integral of the ionized dopant concentration of the drift control region 3 in a direction r perpendicular to the accumulation dielectric 4 and considered over the entire "width" of the drift control region 3 is less than twice the value of the breakdown charge of the semiconductor material of the drift control region 3. For silicon as semiconductor material, the breakdown charge is approximately $1.2\times10^{12}$ e/cm$^2$, where e denotes the elementary charge.

If consideration is given to a homogeneously doped drift control region (not illustrated in greater detail) to which there is adjacent only on one side a drift region separated from the drift control region by a dielectric layer, then it holds true for the drift control region that the integral of the dopant concentration in a direction perpendicular to the dielectric layer is less than the breakdown charge. Such a drift control region can then be fully depleted by an electric field present via the accumulation dielectric 4.

The doping stipulation explained above for the drift control region 3 is based on the consideration of doping the drift control region so lightly that an electric field which reaches the breakdown field strength of the semiconductor material of the drift control region 3 cannot build up in the drift control region 3 in the direction of the dielectric layer 4 independently of an electrical potential present in the drift region 2.

The drift control regions 3 can be composed of the same semiconductor material as the drift region 2 and have the same doping concentration as the drift region. In the direction transversely with respect to the current flow direction, that is to say in the lateral direction r in the example, the dimensions of the drift control regions are chosen in such a way that the condition specified above with regard to the net dopant charge relative to the area of the dielectric 4 is met.

In order to achieve a good accumulation effect of charge carriers in the drift region 2 along the accumulation dielectric, it is advantageous to make the dielectric 4 very thin, such that the electric field in the drift control region 3 can punch through to the drift region 2 as well as possible. In this case, the minimum thickness of the dielectric 4 is given by the potential difference present between the drift control region 3 and drift region 2 and the maximum permissible permanent field strength loading of the accumulation dielectric. Given typical permanent potential differences of significantly less than approximately 100 V, preferably of 5 V to 20 V, between drift control region 3 and drift region 2, and the use of thermal silicon dioxide as dielectric, this results in typical thicknesses of less than approximately 500 nm, preferably of approximately 25 nm to approximately 150 nm.

The accumulation dielectric 4 can completely separate the drift control region 3 from the drift region 2 and thus form a completely closed area between the drift control region 3 and the drift region 2. In this case, there is the possibility, in one embodiment, of forming the dielectric layer that forms the accumulation dielectric 4 as a tunnel dielectric, in one embodiment as a tunnel oxide, in sections. This is illustrated for one of the drift control regions 3 in FIG. 1, in which the dielectric above the drift control region 3 is formed as a tunnel dielectric 4'. The function of the tunnel dielectric will be explained further below.

In the current flow direction, that is to say in the vertical direction v in the example, the drift control region 3 preferably has the same doping profile as that section of the drift region 2 which is arranged adjacent to the drift control region 3 transversely with respect to the current flow direction and which extends over the same region as the drift control region 3 in the current flow direction (vertical direction v).

In the example in accordance with FIG. 1, the drift control regions 3 are adapted to the grid of the cell array arranged in the region of the front side 101, the drift control regions 3 being arranged in each case between two adjacent body regions 8 in a lateral direction of the semiconductor body 1. Such adaptation to the grid of the cell array is not necessary, however. Thus, it is possible, in one embodiment, to choose a different grid for the drift control regions 3 than for the cell array; in one embodiment, the drift control regions 3 can also be arranged below the body regions 8 (not illustrated).

Figure 2:
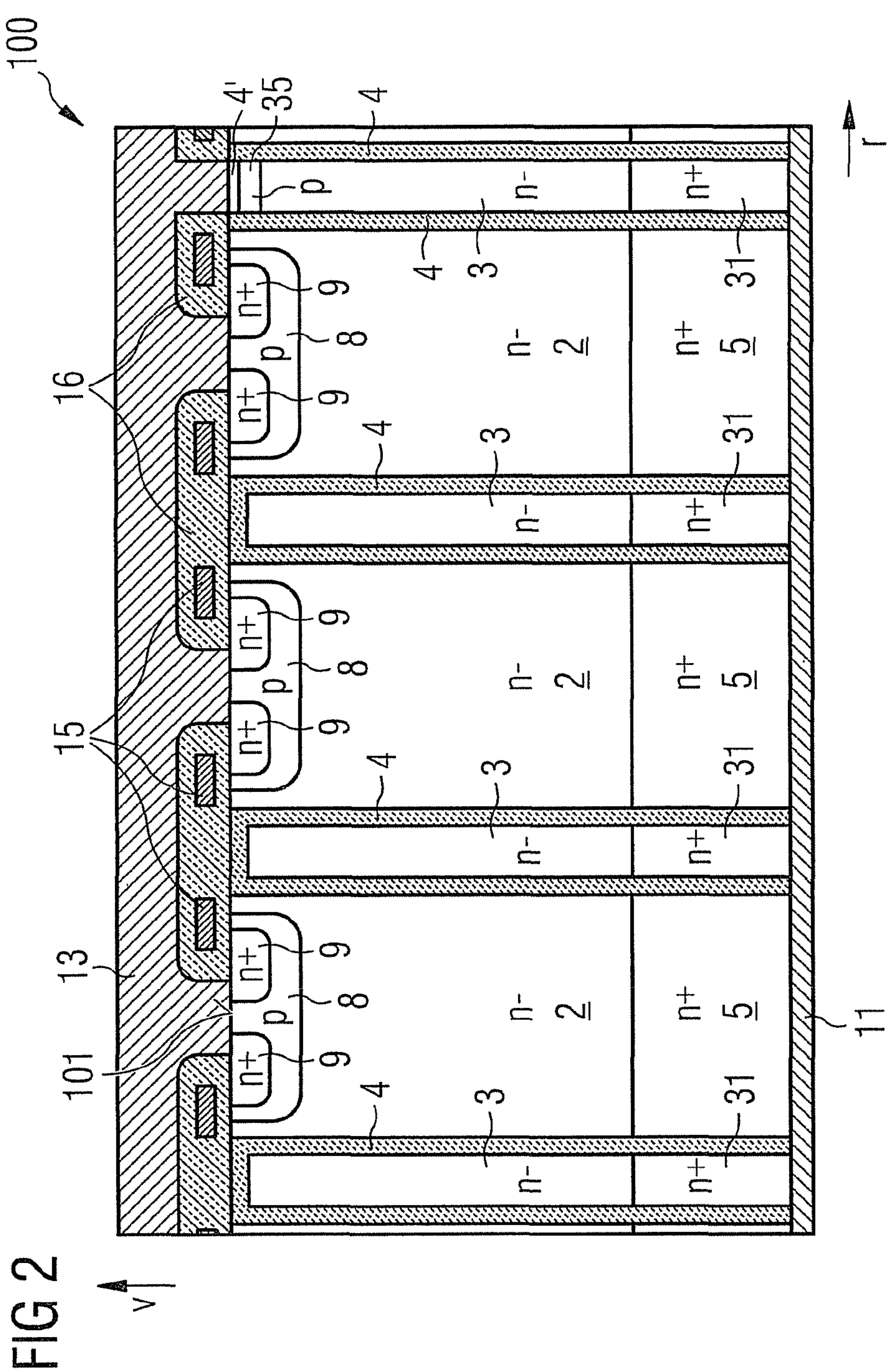
FIG. 2 illustrates a cross section through a section of a planar MOSFET with a plurality of drift control regions, in which the dielectric extends in a vertical direction between two mutually opposite sides of the semiconductor body.

One exemplary embodiment of a component that is embodied as a MOSFET is illustrated in FIG. 2. This component differs from the component in accordance with FIG. 1 by virtue of the fact that the drift control regions 3 extend as far as the front side 101 of the semiconductor body 1. In the example, the drift control regions 3 are likewise covered in the region of the front side by the dielectric layer 4, or the tunnel dielectric 4', forming the accumulation dielectric 4.

Figure 3:
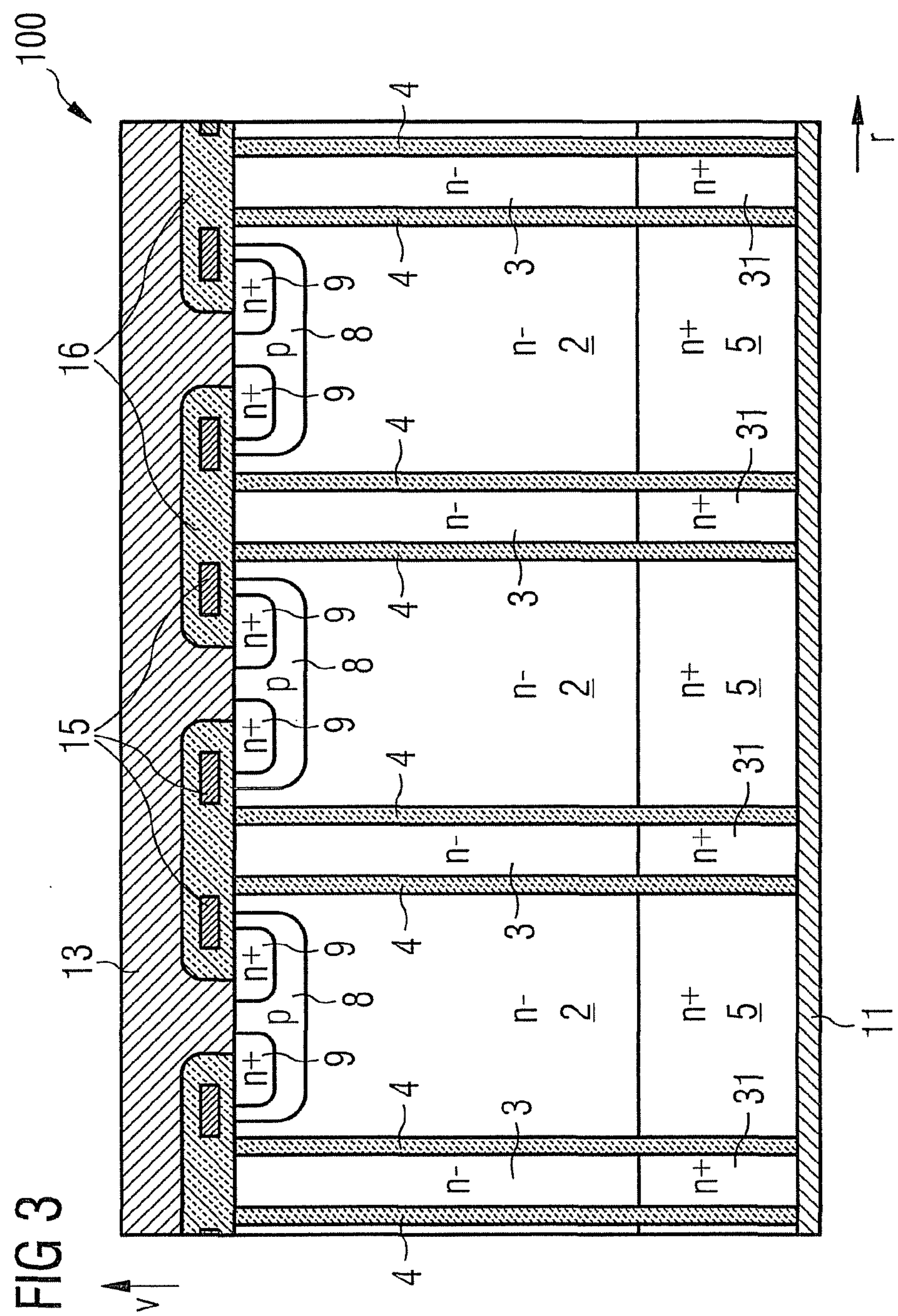
FIG. 3 illustrates a cross section through a section of a planar MOSFET, the drift control regions of which extend as far as the source-side surface of the semiconductor body.

FIG. 3 illustrates one exemplary embodiment, in which the dielectric layer forming the accumulation dielectric 4 adjoins the drift control region 3 only in a lateral direction. This is possible when a dielectric or an insulator that covers the drift control region is applied to the front side of the semiconductor body 1 in the region of the drift control region 3. In the example, the drift control region 3 is covered by the gate dielectric 16. The drift control region 3 of each cell is thereby electrically insulated from the gate electrodes 15 and the source electrode 13 in the region of the front side of the semiconductor body 1 (on the source side).

In one embodiment, in the case of the components in FIGS. 2 and 3, in which the drift control regions 3 extend as far as the front side of the semiconductor body, there is also the possibility of connecting the drift control region 3 to the source electrode 13 via a connection region 35 doped complementarily to the drift control region 3 and via a tunnel dielectric 4', as is illustrated for the drift control region 3 which is illustrated on the far right in FIG. 2.

Figure 4:
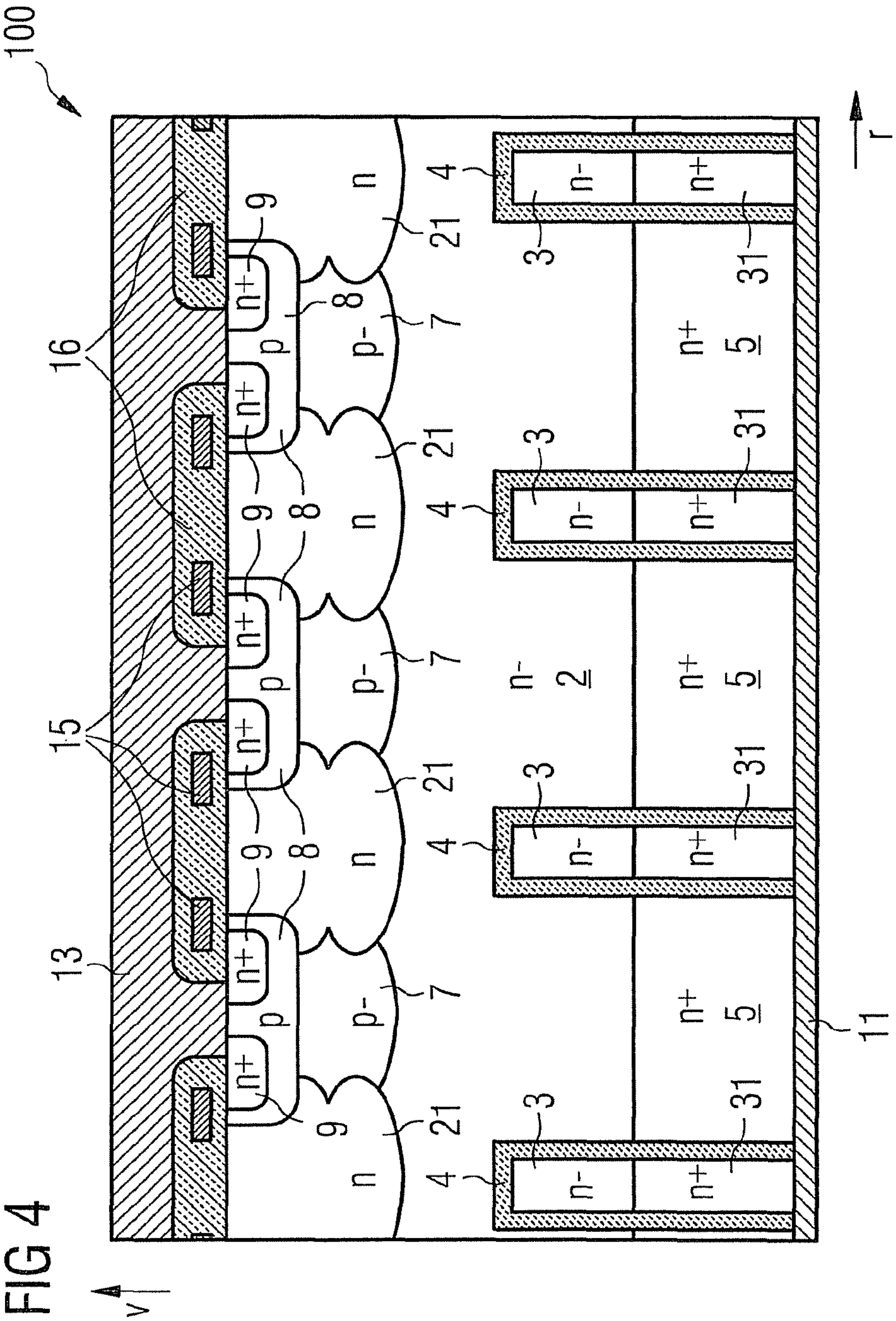
FIG. 4 illustrates a cross section through a section of a MOSFET with compensation regions which adjoin the body regions and between which are arranged intermediate regions doped complementarily to the body regions, the drift control regions being arranged on the drain side of the intermediate regions.

Referring to FIG. 4, compensation regions 7 can be provided in the drift region 2 of the MOSFET, which compensation regions have the same conduction type as the body regions 8 of the individual cells but are doped more weakly than these. The compensation regions 7 preferably make contact with a respective one of the body regions 8. In the example illustrated, intermediate regions 21 doped more highly than other regions of the drift region 2 are additionally arranged in the drift region 2 between adjacent body and compensation regions 8, 7, the doping of the intermediate regions being complementary to the compensation regions 7.

In one exemplary embodiment in accordance with FIG. 4, the drift control regions 3 are arranged in each case between the intermediate regions 21 and the drain electrode 11. In this exemplary embodiment, the drift control regions 3 surrounded by the dielectric 4 in the semiconductor body end at a distance from the intermediate regions 21 in the vertical direction.

Figure 5:
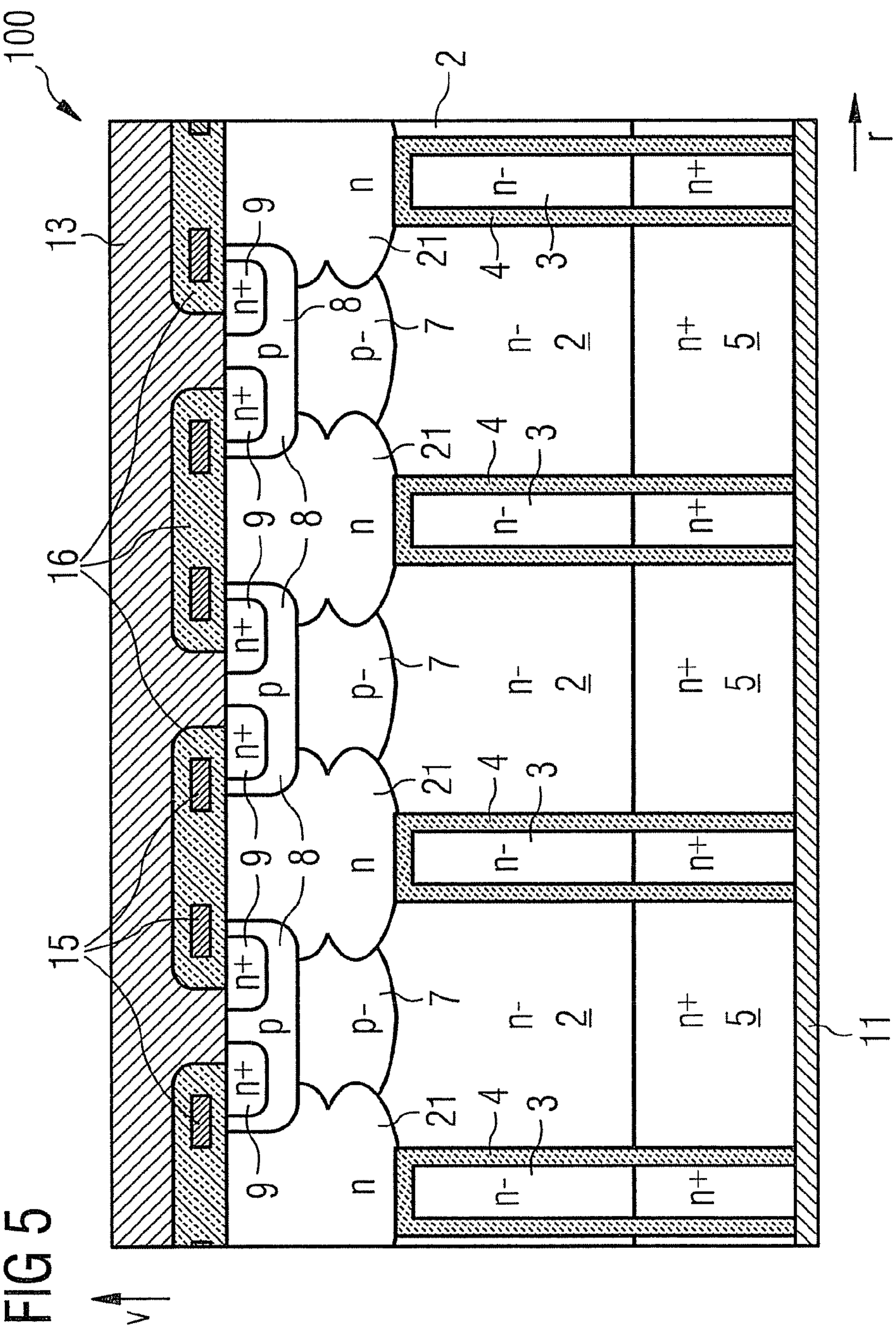
FIG. 5 illustrates a MOSFET in accordance with FIG. 4, in which the dielectric surrounding the drift control regions extends as far as the intermediate regions.

Referring to FIG. 5, the drift control regions 3 with the dielectric 4 surrounding them can also extend as far as the intermediate regions 21 or extend right into the intermediate regions 21. In this case, the drift control regions 3 can also extend as far as the front side of the semiconductor body (not illustrated).

Figure 6:
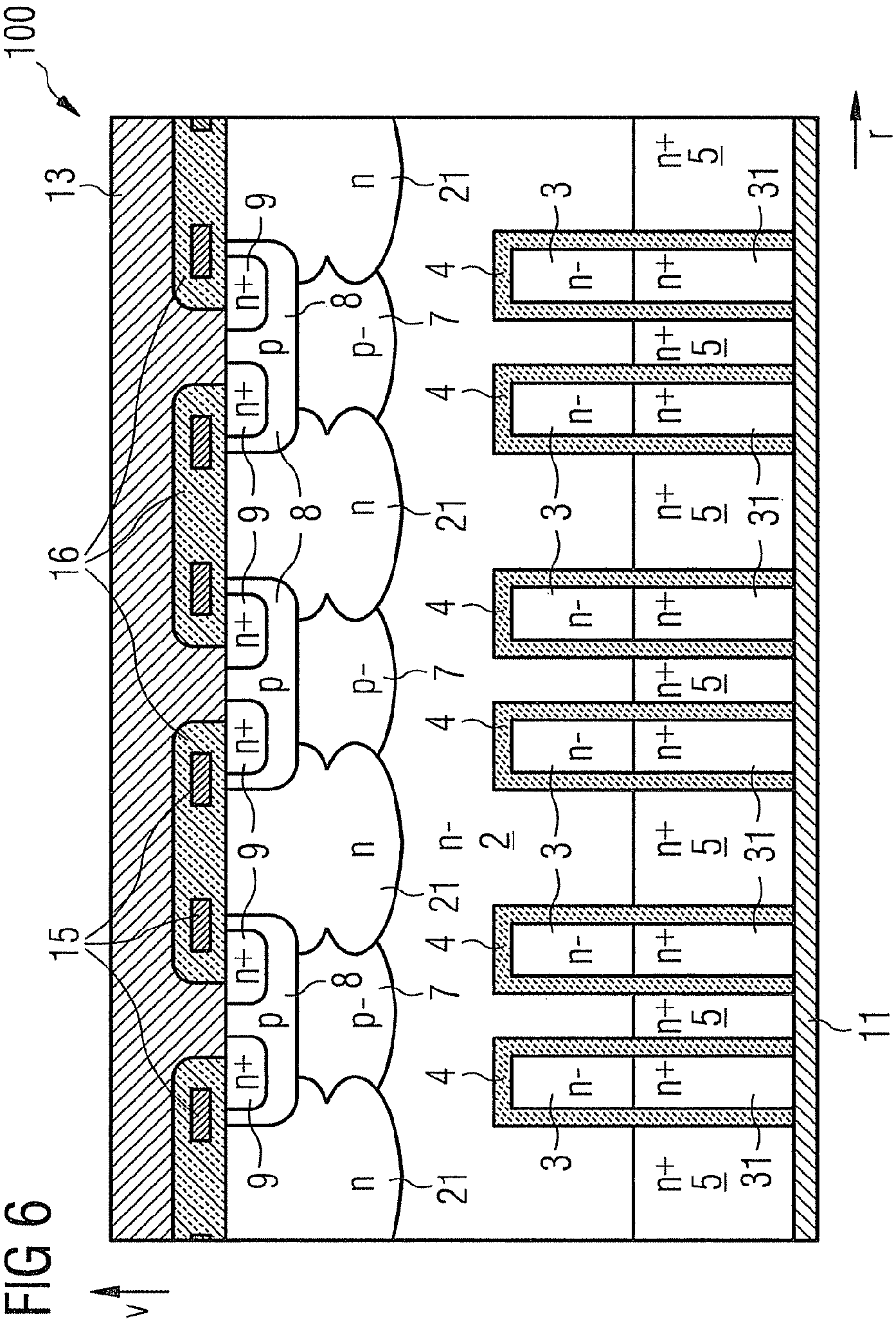
FIG. 6 illustrates a cross section through a section of a MOSFET having a plurality of compensation regions with a plurality of drift control regions which are at a distance from one another in a lateral direction and which have a smaller spacing in the region below the compensation regions than in the other regions of the semiconductor body.

One exemplary embodiment of a MOSFET with drift control regions 3 is illustrated in FIG. 6. In this case, a plurality of drift control regions 3 coupled to the drain region are arranged nonuniformly in the semiconductor body 100 in the lateral direction. In this case, the distance between adjacent drift control regions 3 is chosen to be smaller in the region of the compensation regions 7 than in other regions.

Figure 7:
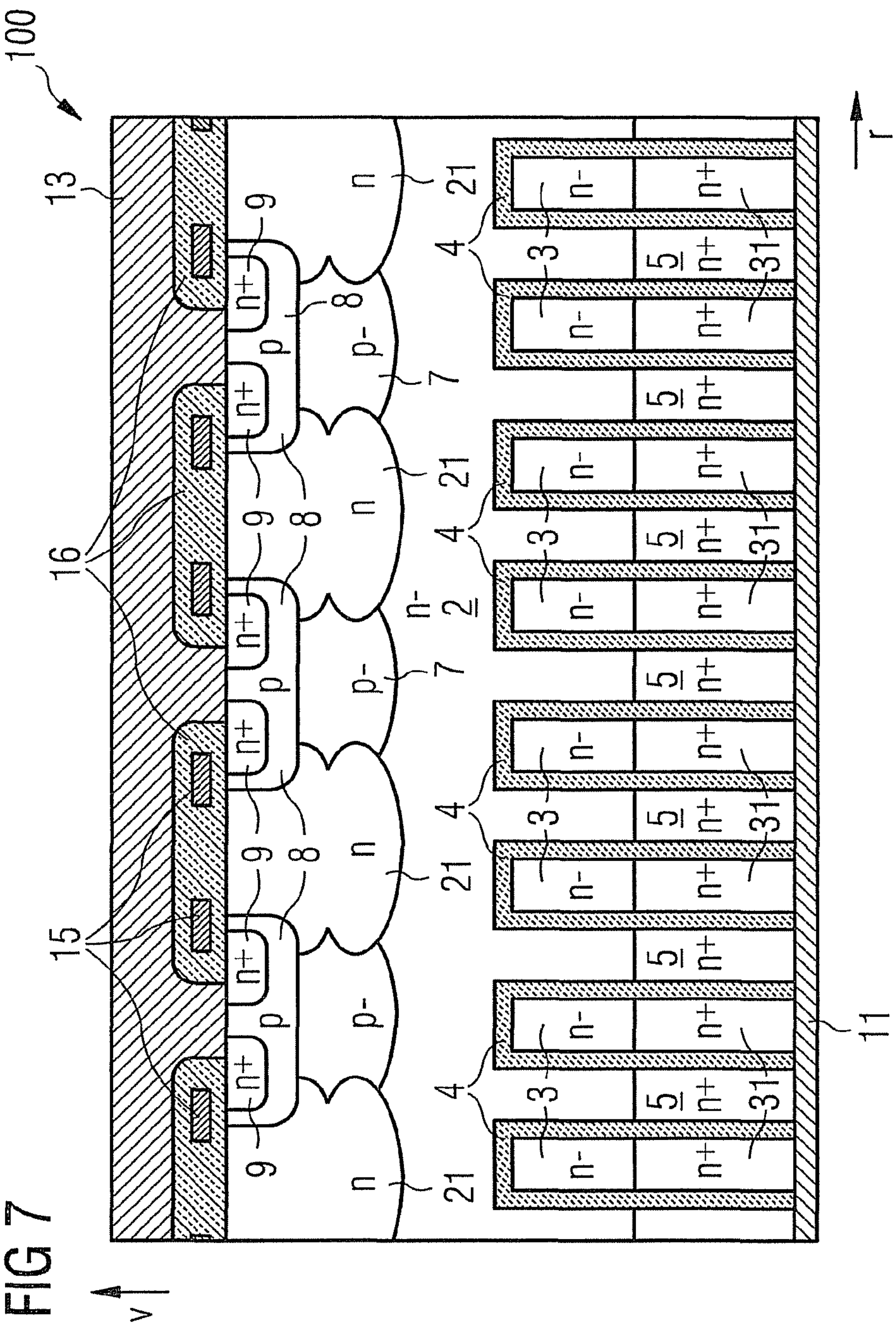
FIG. 7 illustrates a cross section through a section of a MOSFET with a number of drift control regions spaced apart equidistantly from one another in a lateral direction.

Referring to FIG. 7, the drift control regions 3 can be spaced apart equidistantly from one another in the lateral direction of the semiconductor body 1.

The exemplary embodiments in accordance with FIGS. 1 to 7 illustrate MOSFETs with planar gate electrodes. The concept of the present invention of providing a drift control region 3 which is composed of a semiconductor material and which is insulated from a drift region 2 by an accumulation dielectric 4 and whose net dopant charge relative to the area of the dielectric 4 is less than the breakdown charge can also be applied, of course, to trench MOSFETs with a vertical gate electrode 15 arranged in a trench.

Figure 8:
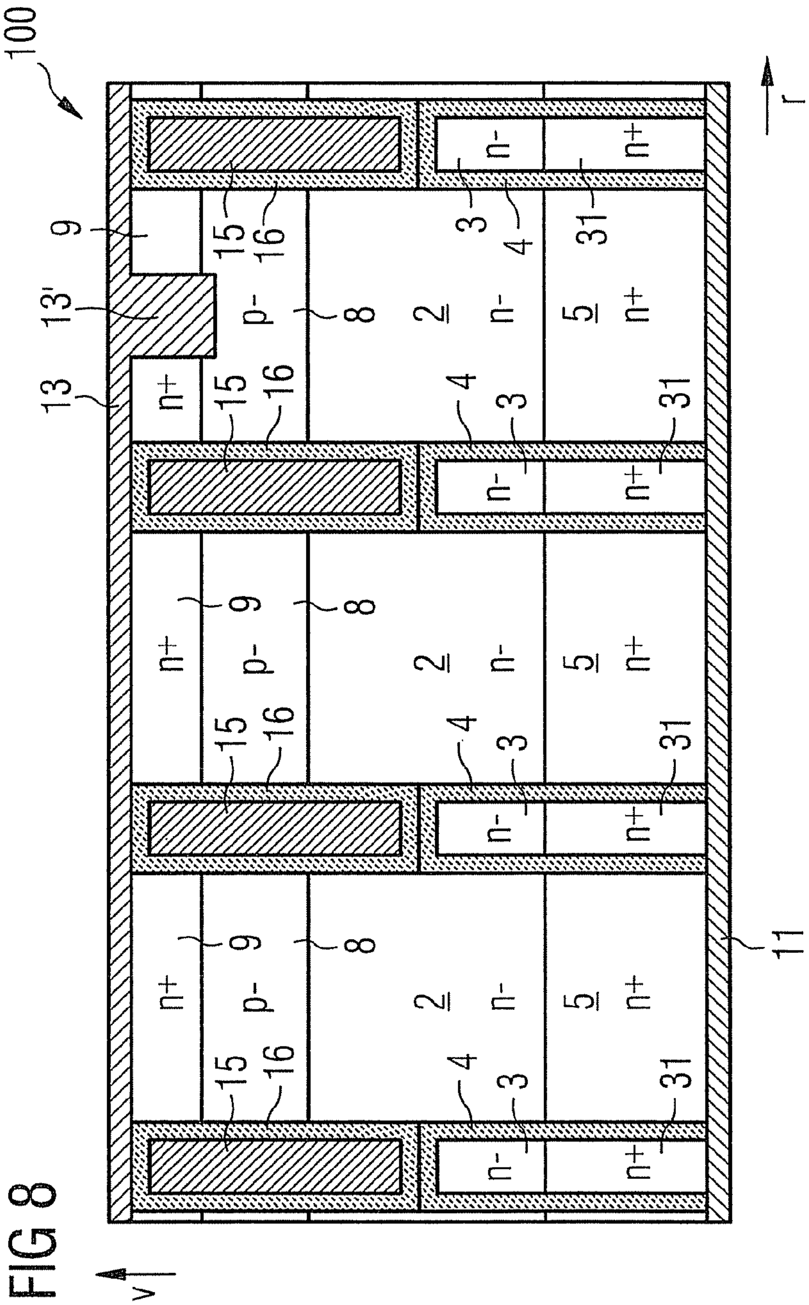
FIG. 8 illustrates a cross section through a section of a semiconductor component which is embodied as a trench MOSFET with a plurality of gate electrodes arranged in trenches of the semiconductor body, and with drift control regions arranged below the gate electrodes.

FIG. 8 illustrates such a trench MOSFET with a plurality of drift control regions 3. In the case of this component, the source region 9, the body region 8 doped complementarily to the source region, the drift region 2 and the heavily n-doped connection region or drain region 5 are arranged in directly successive fashion proceeding from the source electrode 13 toward the drain electrode 11.

The trench MOSFET has electrically conductive gate electrodes 15 which are composed for example of a metal or a highly doped polycrystalline semiconductor material, e.g., polysilicon, which are electrically insulated from the other regions of the semiconductor body 100 and also from the source electrode 13 by using a gate dielectric 16, for example a semiconductor oxide.

The gate electrode 15 is arranged in trenches which extend through the source regions 9 and body regions 8 right into the drift region.

The source electrode 13 is preferably configured in such a way that it short-circuits the source region 9 and the body region 8 in order thereby to eliminate, in a known manner, a parasitic bipolar transistor formed by the source region 8, the body region 9 and the drift region 2. In the example, the source electrode 13 has an electrode section 13' for this purpose, the electrode section extending in a vertical direction through the source region 9 right into the body region 8, as is illustrated for the transistor cells in the right-hand part of FIG. 8.

As in the previous exemplary embodiments, the drift control region 3 is connected, by a heavily n-doped first connecting region 31, to the drain electrode 11 and thus to the drain region 5.

Figure 9:
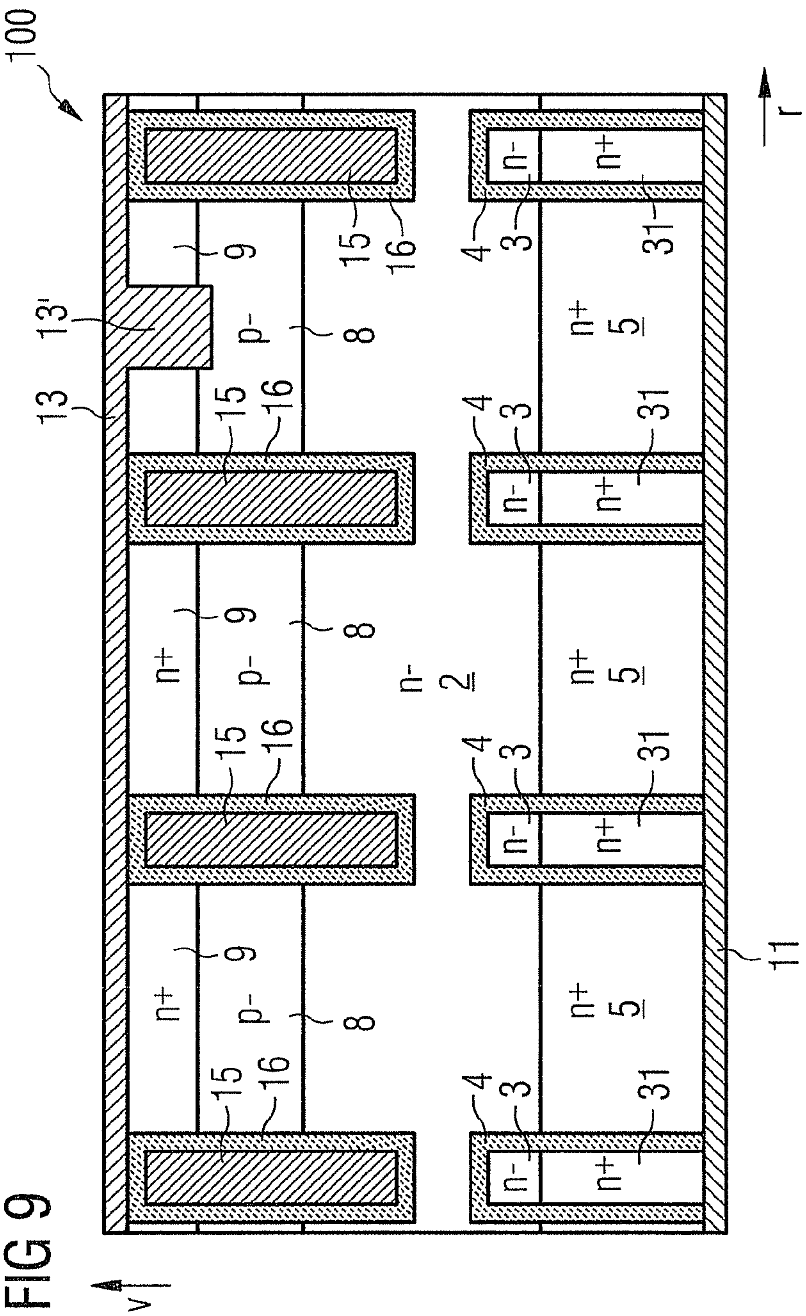
FIG. 9 illustrates a cross section through a section of a trench MOSFET in accordance with FIG. 8, in which the drift control regions and the dielectric arranged between the drift control regions and the drift regions are at a distance from a gate insulation arranged between the gate electrodes and the drift region.

In this case, the drift control regions 3 are each arranged directly below the trenches with the gate electrodes 15 and are insulated from the drift region 2 by the dielectric 4. In this case, the drift control regions 3 with the dielectric 4 extend as far as the trenches with the gate electrodes 15. Referring to FIG. 9, however, the drift control regions 3 with the accumulation dielectric 4 can also end at a distance from the trenches with the gate electrodes 15.

While the drift control regions 3 are arranged in each case between a gate electrode 15 and the drain electrode 11 in the exemplary embodiments in accordance with FIGS. 8 and 9, it is possible to provide further drift control regions which are arranged between adjacent gate electrodes 15 in a lateral direction.

Figure 10:
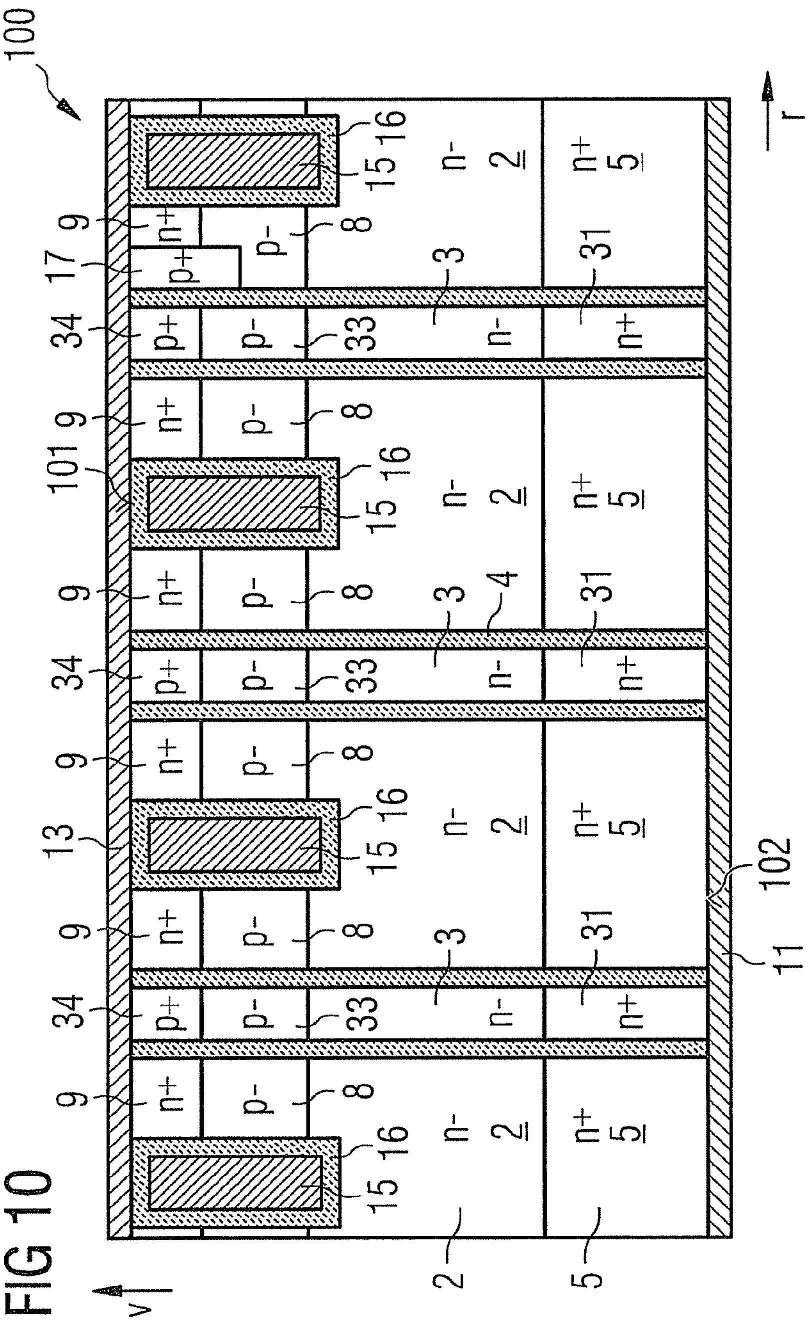
FIG. 10 illustrates a cross section through a section of a trench MOSFET with a plurality of drift control regions which are arranged in each case between the gate electrodes in a lateral direction, and wherein the drift control regions and a dielectric arranged between the drift control regions and the drift region extend in a vertical direction between mutually opposite sides of the semiconductor body.

In the latter case, which is illustrated in FIG. 10, the accumulation dielectric 4 can extend from the drain-side surface 102 of the semiconductor body 100 as far as the source-side surface 101 thereof.

In the exemplary embodiment illustrated, the drift control region 3 is connected both to the drain region 5, to be precise via the drain electrode 11, and to the source region 9, to be precise via the source electrode 13. In this case, the connection to the drain electrode 11 is effected via the first connection region 31, while the connection to the source electrode 13 is effected via a weakly p-doped third connecting region 33 and a heavily p-doped fourth connecting region 34. In this case, the fourth connecting region 34 makes contact with the source electrode 13 or is at least electrically conductively connected to the latter.

Referring to FIG. 10, the drift control regions 3 can extend over the same region as the drift region 2 in the vertical direction v. In this case, the third connecting region 33 extends over the same region as the body region 8 in the vertical direction v, the fourth connecting region 34 extends over the same vertical region as the source region, and the first connection region 31 extends over the same vertical region as the drain region 5.

In the example in accordance with FIG. 10, the drift control region 3 is connected, by the heavily n-doped first connecting region 31, to the drain electrode 11 and thus to the drain region 5. It should be pointed out in this context that the various possibilities—explained with reference to FIG. 1—of electrically connecting the drift control region 3 to the drain region 5 can also be applied to the component in accordance with FIG. 10, to the components of FIGS. 2 to 9 explained above, and to the component in accordance with FIG. 11 that will be explained below.

Adjacent to the dielectric layer forming the accumulation dielectric 4, a heavily p-doped semiconductor region 17 may be arranged in the body region 9 and in sections in the source region 8, as is illustrated for one of the transistor cells in the right-hand part of FIG. 10. The region 17, which is referred to below as bypass region, forms a very low-resistance bypass for holes to the source electrode 13 and thus prevents an early latching of the cell particularly in the operating cases "avalanche" and "commutation" of the power semiconductor component. The region 17 additionally prevents a channel controllable by the drift control region 3 from being present between the source region 9 and the drift region 2. Moreover, the semiconductor region 17 brings about a low-resistance connection of the source electrode 13 to the body region 8. In addition, the region 17 brings about a low-resistance connection of the source electrode 13 to the body region 8.

Figure 11:
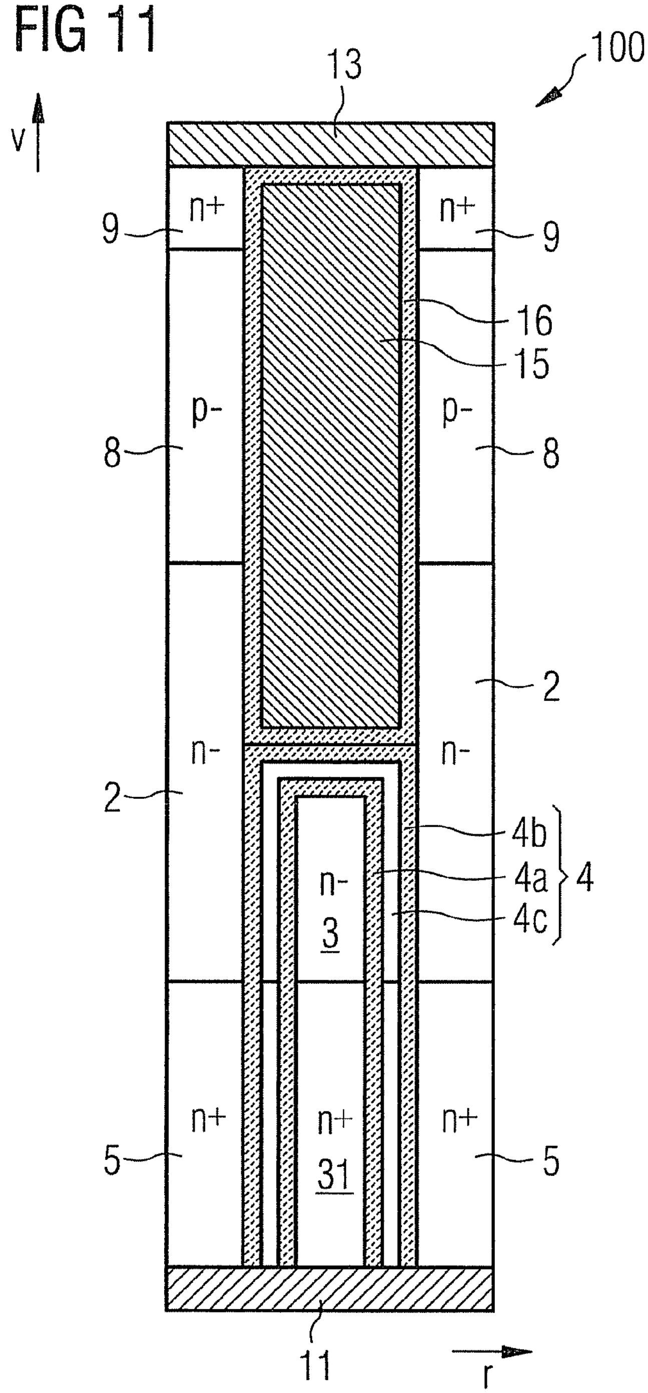
FIG. 11 illustrates a section of a vertical MOSFET in accordance with FIG. 8, in which the dielectric arranged between the drift region and the drift control region has two partial layers between which air or a material having a low dielectric constant is arranged.

FIG. 11 illustrates a possibility for reducing the sensitivity of the semiconductor body 1 to mechanical stresses that can arise as a result of the production of the drift control regions 3 with the accumulation dielectric 4 surrounding them. For this purpose, the dielectric 4 is formed from dielectric partial layers 4*a*, 4*b*, between which is situated an interspace 4*c* filled with a compressible medium such as a gas, for example air.

In this case, the partial layers 4*a*, 4*b* of the dielectric 4 can bear against one another on the source side or be formed in one piece there. Furthermore, webs which can be composed of the same material as the partial layers 4*a*, 4*b* can be provided for stabilization between the partial layers 4*a*, 4*b*.

The MOSFET explained above on the basis of various examples is driven in the on state by applying a suitable driving potential to the gate electrode 15 and by applying a positive voltage between drain region 5 and source region 9 or between drain electrode 11 and source electrode 13. In this case, the electrical potential of the drift control regions 3 follows the electrical potential of the drain region 5, wherein the potential of the drift control region 3 can be lower than the potential of the drain region 5 by the value of the forward voltage of a pn junction if the drift control region 3 is connected to the drain region 5 via a pn junction (32, 31 in FIG. 1). Due to an unavoidable electrical resistance of the drift region 2, the electrical potential in the drift region 2 decreases in the direction of the body region 8. As a result, the drift control region 3 is at a higher potential than the drift region 2, this potential difference increasing with increasing distance from the drain region 5 in the direction of the body region 8. This potential difference has the effect that an accumulation region arises in the drift region 2 adjacent to the accumulation dielectric 4, charge carriers, electrons in the present case, being accumulated in the accumulation region. The accumulation region brings about a reduction of the on resistance of the component in comparison with conventional components.

The MOSFET is in the off state if no suitable driving potential is present at the gate electrode 15 and if a positive drain-source voltage is present. The pn junction between the drift region 2 and the body region 8 is thereby reverse-biased, such that a space charge region forms in the drift region 2 proceeding from the pn junction in the direction of the drain region. In this case, the reverse voltage present is reduced in the drift region 2, that is to say that the voltage present across the drift region 2 corresponds to the reverse voltage present.

In the off-state case, a space charge region likewise forms in the vertical direction in the drift control region 3, the space charge region resulting from the fact that the voltage drop at the accumulation dielectric 4 is limited to an upper maximum value due to the low doping of the drift control region 3. The accumulation dielectric 4 together with the drift control region 3 and drift region 2 forms a capacitance, for whose capacitance per unit length C' the following holds true:

$$C'=\epsilon_0\epsilon_r/d_{accu} \quad (1)$$

in this case, $\epsilon_0$ denotes the permittivity of free space and $\epsilon_r$ denotes the relative permittivity of the dielectric used, which is approximately 4 for silicon dioxide ($SiO_2$).

The voltage across the dielectric is dependent on the stored charge in a known manner in accordance with $$U=Q'/C' \quad (2)$$

where Q' denotes the stored charge relative to the area of the dielectric.

In the off-state case, the voltage U present across the accumulation dielectric 4 is limited by the net dopant charge of the drift control region 3. Assuming that the net dopant charge of the drift control region 3 relative to the area of the dielectric is less than the breakdown charge $Q_{Br}$, the following holds true for the voltage U present across the dielectric 4:

$$U=\frac{Q'}{C'}\leq\frac{Q_{Br}}{\varepsilon_0\varepsilon_r}\cdot d_{accu} \quad (3)$$

The maximum voltage present across the accumulation dielectric 4 therefore rises linearly with the thickness $d_{accu}$ thereof, and thus to a first approximation to about just the same extent as its dielectric strength. For $SiO_2$ having an $\epsilon_r$ of approximately 4 and a thickness of 100 nm, this results in a maximum voltage loading U of 6.8 V, which is significantly less than the permissible continuous loading of such an oxide of approximately 20 V. In this case, the breakdown charge is approximately $1.2\cdot10^{12}/cm^2$.

In the off-state case, in the drift control region 3 a space charge region thus builds up whose potential profile can differ from the potential profile of the drift region 2 maximally by the value of the voltage which is present across the dielectric 4 and which is limited by the low doping of the drift control region 3. In this case, the voltage across the accumulation dielectric 4 is always lower than the breakdown voltage thereof.

For the purposes of the explanation, the drift control region 3 in the components explained above is represented as a region of the same conduction type as the drift region 2. In a departure from this above representation, however, the drift control region 3 can also be doped as a semiconductor region doped complementarily to the drift region 2, or as an intrinsic semiconductor region.

The semiconductor components explained above and those which will be explained below are n-conducting components and the majority charge carriers flowing in the drift region 2 when the component is driven in the on state are electrons in this case. However, the concept of the invention is not restricted to n-conducting components, but rather can also be applied to p-conducting components, in which case the semiconductor regions of a p-conducting component are to be doped complementarily to the semiconductor regions of the n-conducting components explained above.

In the case of the components explained above with reference to FIGS. 1 to 9 and 11, the drift control regions 3 are exclusively connected to the drain region 5. When the component is in the off state, holes can be accumulated in this case in the drift control regions 3, which holes arise as a result of a thermal generation of electron-hole pairs and cannot flow away. Over time this quantity of charge can rise to an extent such that the maximum permissible field strength of the accumulation dielectric 4 is reached and the dielectric 4 breaks down. Referring to FIG. 1, such a breakdown can be avoided by virtue of the dielectric layer 4 which forms the accumulation dielectric being embodied as tunnel dielectric 4' in sections. The tunnel dielectric enables the accumulated charge carriers to flow away into the drift region 2 as soon as the breakdown field strength of the tunnel dielectric 4' is reached and even before the breakdown field strength of the accumulation dielectric 4 is reached.

Examples of suitable tunnel dielectrics include layers composed of silicon oxide ($SiO_2$) or silicon nitride ($Si_3N_4$) or else multilayer layers composed of silicon oxide and silicon nitride. Mixed dielectrics composed of silicon, oxygen and nitrogen are likewise possible. Typical tunnel field strengths lie within the range of 1 . . . 2 V/nm. For a tunnel oxide 4' having a thickness of 13 nm, this results in maximum voltages of 13 . . . 26 V, which lie above the voltage present at the dielectric 4 during normal off-state operation and are withstood without any problems by a dielectric 4 composed of silicon oxide having a thickness of 100 nm, for example.

In the case of the exemplary embodiment illustrated in FIG. 1, the tunnel dielectric is arranged at the upper end of the drift control region 3. It is particularly advantageous that the accumulated holes support the switching on of the component because they support the generation of an accumulation region in the drift region 2 until the difference between the potential of the drift region 2 and the drain region 5 has fallen below the value of the tunnel voltage. Excess holes then flow away from the drift control region 3 in the direction of the drain region 5 or drain electrode 11.

The tunnel dielectric 4' in FIG. 2, which is arranged between the drift control region 3 and the source electrode 13, likewise serves for dissipating a leakage current generated by thermal charge carrier generation. The pn junction between the drift control region 3 and the complementarily doped intermediate region 35 takes up a reverse voltage present between the drift control region 3 and the source electrode. The tunnel dielectric can also be adjacent to the source region 9 (not illustrated).

Figure 12:
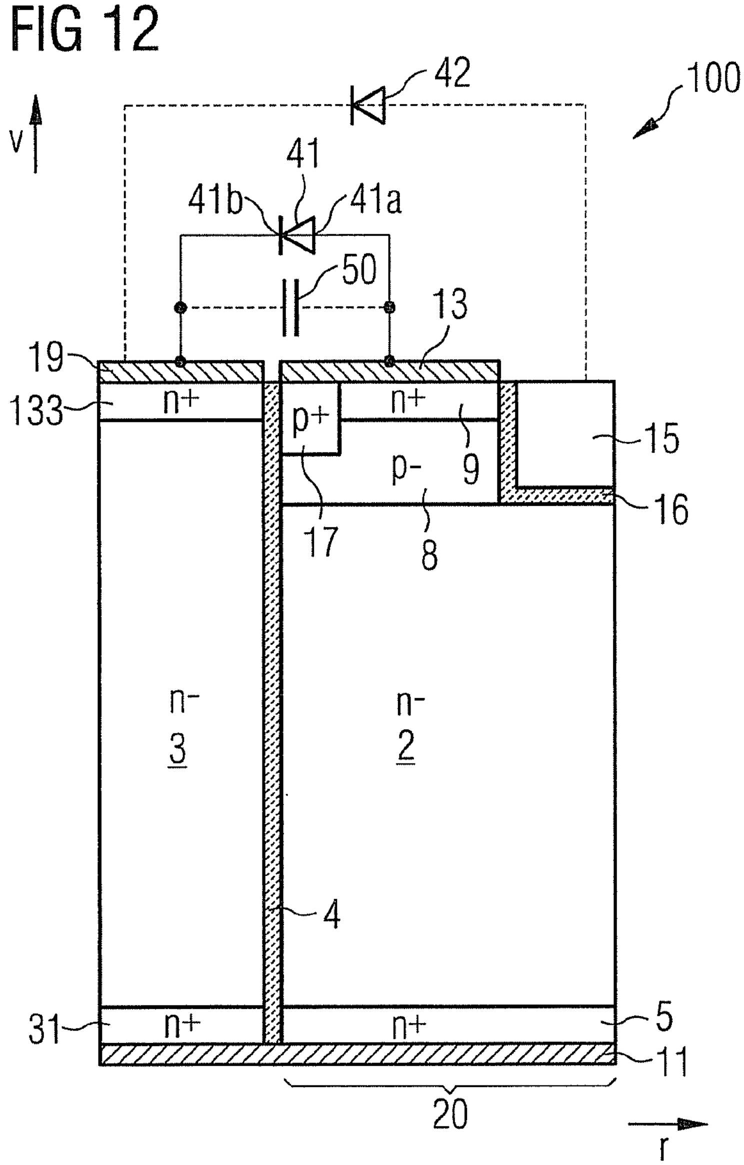
FIG. 12 illustrates a cross section through a section of a MOSFET with a drift control region which, together with heavily n-doped connecting regions adjoining the drift control region on the source side and on the drain side, forms a junction field effect transistor, the drift control region being connected to the source region via a first diode.

FIG. 12 illustrates an excerpt from a further exemplary embodiment of a component, which is embodied as an n-conducting trench MOSFET. One of a multiplicity of identical transistor cells of the component is illustrated in side view in cross section. The component has a component structure of a conventional vertical trench MOSFET 20 with a source region 9, a body region 8, a drift region 2 and a drain region 5 and also a gate electrode 15 arranged in a trench. In this case, a source electrode 13 makes contact with the source region 9 and a drain electrode 11 makes contact with the drain region 5.

In this case, the p-doped body region 8 is connected to the source electrode 13 via the heavily p-doped bypass region 17, which forms a very low-resistance bypass for holes to the source region 9 and thus prevents early latching of the cell particularly in the operating cases “avalanche” and “commutation” of the power semiconductor component. The region 17 additionally prevents a channel controllable by the drift control region 3 from being present between the source region 9 and the drift region 2.

A drift control region 3 is arranged adjacent to the drift region 2, and is connected to the rear-side drain electrode 11 by using a heavily n-doped first connecting region 31. In this component, the drift control region 3 extends in the vertical direction approximately as far as the front side of the semiconductor body 1 and is thus also arranged, in sections, adjacent to the body region 8. In the direction of the front side, a heavily n-doped further connecting region 133 is adjacent to the drift control region 3, a fourth electrode 19 arranged on the semiconductor body 1 making contact with the connecting region. In the example, the fourth electrode 19 is separated from the source electrode 13.

The drift control region 3 together with the first connecting region 31 and the further connecting region 133 forms a junction field effect transistor (JFET), the gate of which represents the body region 8 or bypass region 17. This junction field effect transistor 31, 3, 33 can be switched off by a sufficiently high negative potential of the body region 8. In conventional n-channel JFETs, no dielectric is situated between the p-doped gate and the n-doped channel region. The dielectric 4 present here does not impede the pinch-off effect, however.

The dopant concentration in the drift control region 3 can be very low and amount for example to approximately $10^{14}$ $cm^{-3}$. A pinch-off of the junction field effect transistor 31, 3, 133 is thereby already effected at a voltage difference of a few volts between the body region 8 and the drift control region 3.

In the component illustrated, the drift control region 3 is connected to the source region 9 or source electrode 13 via a first diode 41. In this case, an anode 41*a* of the diode 41 is electrically conductively connected to the source region 9 via the source electrode 13 and a cathode 41*b* is electrically conductively connected to the drift control region 3 or the junction field effect transistor, 31, 3, 133 via the fourth electrode 19. It is not necessary to impose stringent requirements on the diode 41 with regard to the leakage current. Since the junction field effect transistor 31, 3, 133 is switched off in the off state of the MOSFET and no current can flow from it, it is unimportant if the first diode 41 has a high leakage current.

The first diode 41 can be realized as an external component or can be integrated in the semiconductor body, for example monolithically or as a polysilicon diode. Furthermore, instead of the first diode 41, it is also possible to use a high-resistance resistor or a transistor connected up as a diode.

It should be pointed out that FIG. 12 only illustrates one section or one cell of the entire component. On the left-hand side, there is adjacent to the section firstly a further section of the dielectric 4 followed by a further trench MOSFET structure (not illustrated). The MOSFET structure illustrated and the further MOSFET structure are formed mirror-symmetrically with respect to one another with respect to a plane of symmetry running in the vertical direction v and perpendicular through the plane of the illustration.

The functioning of the component illustrated is explained below:

the component is in the on state if a positive operating voltage is present between drain electrode 11 and source electrode 13 and if a suitable driving potential is present at the gate electrode 15. When the component is driven in the on state, the voltage drop between drain and source is lower than the reverse voltage of the diode 41, whereby the diode 41 is in the off state and the potential of the drift control region 3 approximately corresponds to the drain potential. In the region of the MOSFET structure, the operating voltage is dropped across the drift path 2, whereby the potential in the drift path decreases as the distance from the drain region 5 increases, and whereby the voltage between the drift control region 3 and the drift region 2 equally increases as the distance from the drain region 5 increases. The positive potential of the drift control region 3 relative to the potential of the drift region 2 provides for an accumulation of charge carriers, electrons in the example, in the drift region 2 along the dielectric 4, which leads to a reduction of the on resistance of the component.

If the component is in the off state by virtue of the gate electrode 15 being driven in a suitable manner, then a space charge region propagates in the drift region 2 proceeding from the pn junction, and the voltage across the drift path 2 rises. In this case, due to the blocking diode 41, the potential of the drift control region 3 initially follows the potential of the drain region 5 or drain electrode 11. As the potential of the drift control region 3 rises, the junction FET formed by the drift control region 3, the dielectric 4 and the body region 4 is increasingly pinched off until it turns off completely and holds the potential in this region adjacent to the body region at a value which differs from the potential of the body region 8 by the value of the reverse voltage of the junction FET. In this case, the junction FET formed in the upper region of the drift control region protects the diode 41 against excessively high voltages as the drain potential rises further. In this case, the voltage for completely pinching off the junction FET is set in such a way that it is lower than the breakdown voltage of the diode 41.

As the drain potential rises further, the voltage drop across the drift control region 3 increases in the lower region, that is to say in the region between the highly doped connection region 31 and the body region 8, in accordance with the voltage drop across the drift region 2, whereby a space charge region propagates further in the direction of the highly doped connection region 31 in the drift control region 3 as the voltage increases. In this case, this space charge region propagating in the drift control region 3 and the space charge region propagating in the drift region 2 limit a maximum voltage present across the accumulation dielectric 4 between the drift control region 3 and the drift region 2. Given identical dopings of the drift region 2 and of the drift control region 3 or given identical doping profiles in the current flow direction, the voltage lies approximately within the range of the turn-off voltage of the junction FET and usually amounts to a few volts, such that the accumulation dielectric 4 is not subjected to high voltage loading and can be dimensioned in a correspondingly thin fashion. A thin dielectric 4 is in turn advantageous with regard to the accumulation of charge carriers in the drift region 2 when the component is driven in the on state, the accumulation behavior being all the better, the thinner the dielectric 4 for a given potential difference between drift control region 3 and the drift region 2.

One advantage of the arrangement in accordance with FIG. 12 is that a current path between the connection electrodes or drain and source electrodes 11, 13 of the component is present via the diode 41, via which current path charge carriers generated thermally in the drift control region 3 can flow away, such that in the off-state case, the above-explained undesirable accumulation of charge carriers in the drift control region 3 or at the dielectric 4 does not occur.

Figure 14:
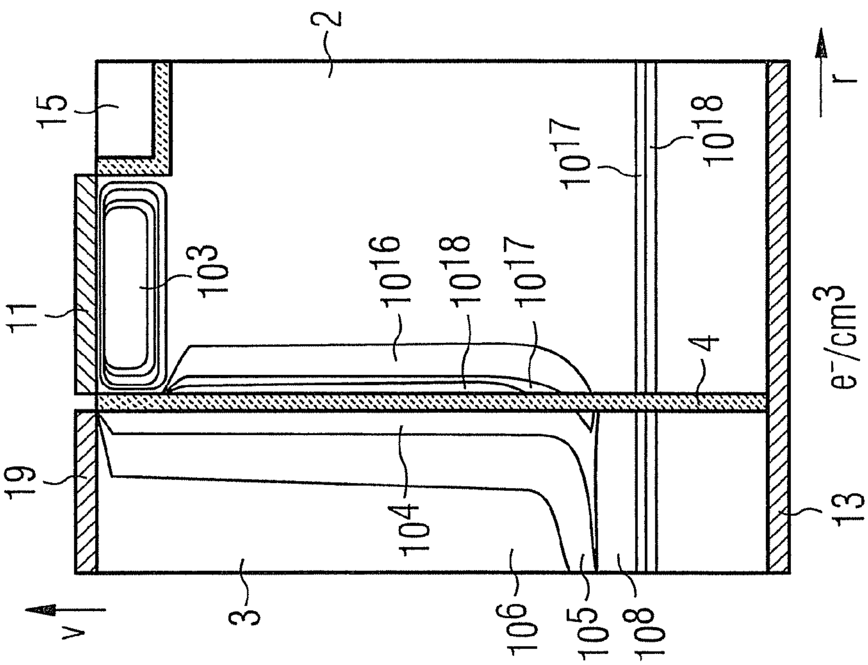
FIG. 14 illustrates an example of the profile of the electron distribution of a conducting MOSFET in accordance with FIG. 12.
Figure 13:
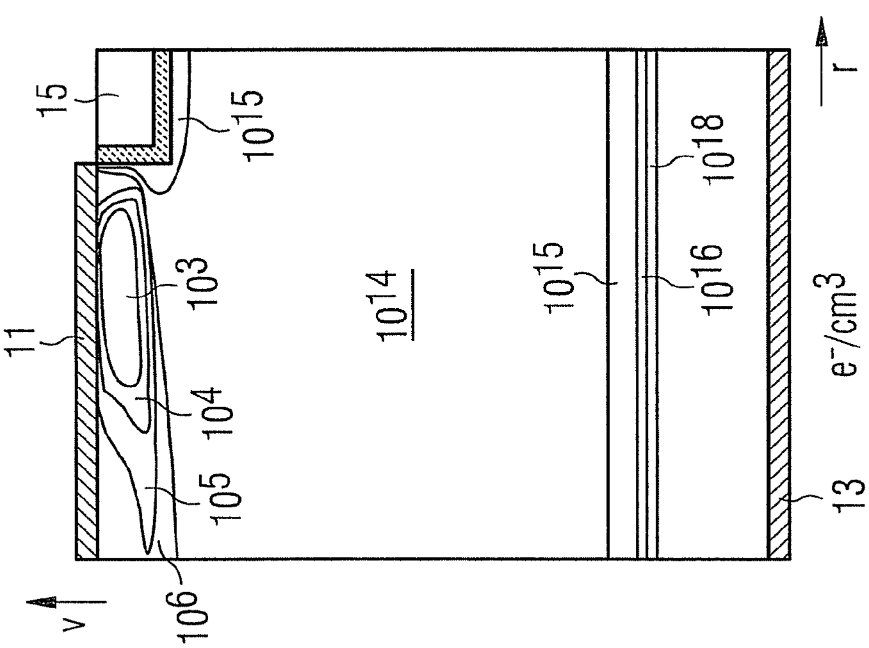
FIG. 13 illustrates an example of the profile of the electron distribution of a conducting MOSFET according to the prior art.

FIGS. 13 and 14 compare the electron distribution of a conventional MOSFET and of the MOSFET in accordance with FIG. 12 in the turned-on state given in each case a gate voltage of 10 V and in each case a drain-source voltage of likewise 10 V. FIG. 13 illustrates the electron distribution of the conventional MOSFET, and FIG. 14 illustrates the electron distribution of the MOSFET from FIG. 12.

The values plotted in the diagrams specify the electron concentration in electrons per $cm^3$ for the respective regions.

In this case, it can be discerned for the component in accordance with FIG. 14 that a region having increased electron concentration at least two orders of magnitude greater than the electron concentration of the drift region of a corresponding conventional component in accordance with FIG. 13 is formed in that region of the drift region 2 which adjoins the accumulation dielectric 4, virtually over the entire length of the drift region. This increased electron concentration is due to the potential of the drift control region adjacent to the regions of the drift regions 2 in which the electron concentration is increased, and which is higher than the potential in the drift region.

Figure 15:
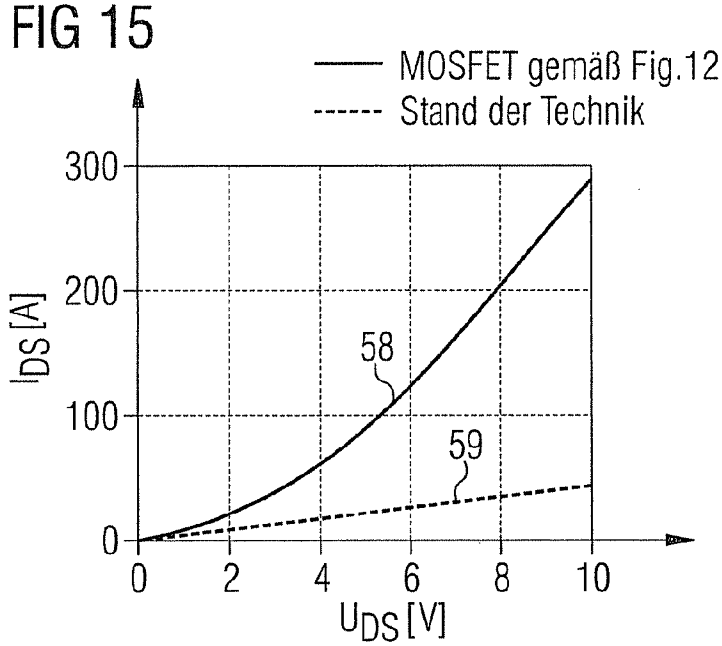
FIG. 15 illustrates a diagram comparing the profile of the drain-source current of a MOSFET in accordance with the prior art and the profile of the drain-source current of a MOSFET in accordance with FIG. 12 as a function of the drain-source voltage $U_{DS}$.

FIG. 15 illustrates a characteristic curve 59, which indicates the profile of the drain-source current $I_{DS}$ of a MOSFET in accordance with the prior art in comparison with the corresponding characteristic curve 58 of a MOSFET in accordance with FIG. 12, as a function of the drain-source voltage $U_{DS}$.

It can be discerned here that the load current $I_{DS}$ of the MOSFET lies above the drain-source current $I_{DS}$ of a MOSFET in accordance with the prior art by a factor of 4 in the case of a drain-source voltage of 4 V and by a factor of 7 in the case of a drain-source voltage of 10 V, even though the cross section available for the current flow is significantly reduced in the case of the MOSFET, on account of the space requirement needed for the drift control region, by comparison with the cross-sectional area of a MOSFET in accordance with the prior art.

Figure 16:
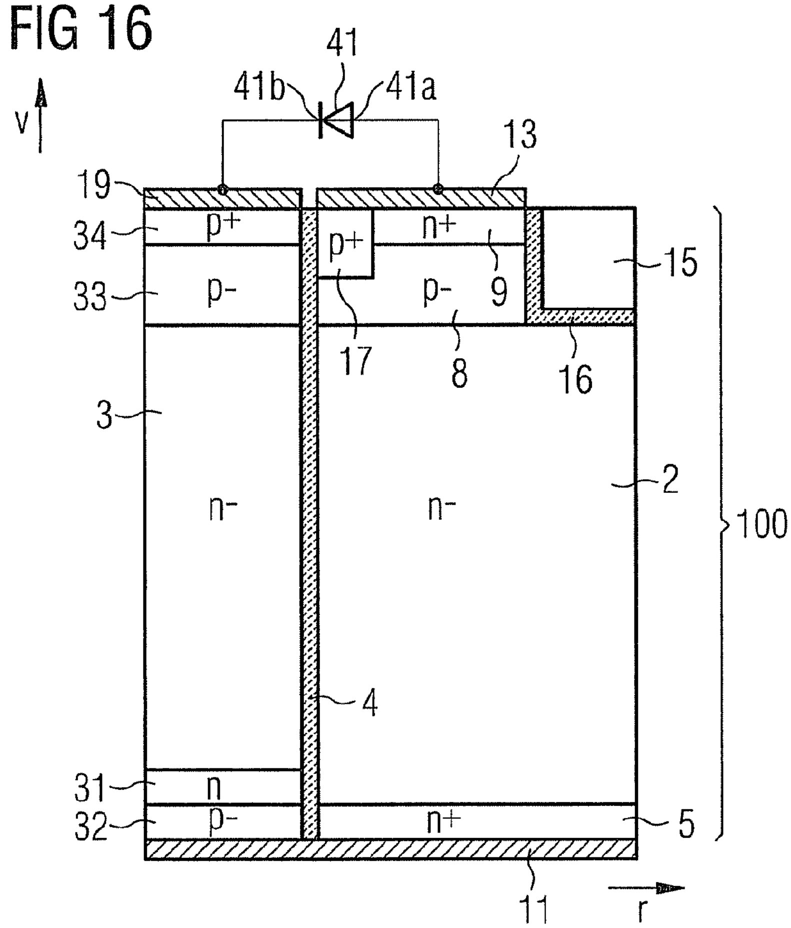
FIG. 16 illustrates a cross section through a section of a MOSFET in accordance with FIG. 12, in which the drift control regions are connected to the source regions via a first diode on the source side by using a weakly p-doped connecting region followed by a heavily p-doped connecting region and are connected to the drain regions by using a p-doped connecting region.

FIG. 16 illustrates a trench MOSFET that differs from the MOSFET in accordance with FIG. 12 by virtue of the fact that the drift control region 3 is electrically connected to the fourth electrode 19 via a weakly p-doped third connecting region 33 and a heavily p-doped fourth connecting region 34. The two-stage configuration of the p-doped connecting region with a more heavily doped region 34 and a more weakly doped region 33 is optional in this case. The task of the more highly doped region 34 here is essentially to achieve a low-resistance connection of the connection electrode 19 to the more weakly p-doped region 33, which forms a pn junction with the drift control region 3.

In the on state, this component functions in accordance with the component explained above with reference to FIG. 12, in which case, in the case of the component in accordance with FIG. 16, the pn junction formed between the drift control region 3 and the p-doped regions 33, 34 already ensures that the potential of the drift control region can rise above the source potential, that is to say the potential of the source electrode 13.

It shall be assumed subsequently that the MOSFET is in the off state, wherein a voltage of a few 10 V or even a few 100 V is present between the drain electrode and the source electrode 11, 13 or across the drift path 2 of the MOSFET structure, and that the source electrode 13 is at a reference potential, e.g., 0 V. The potential at the fourth electrode 19 then lies above the reference potential at most approximately by the value of the breakdown voltage of the first diode 41, for example +15 V. The remainder of the reverse voltage, that is to say the difference between the drain potential and the potential at the fourth electrode 19, is essentially taken up by the lightly doped drift control region 3, in which a space charge region propagates proceeding from the pn junction between the drift control region and the p-doped regions 33, 34. In this case, the space charge regions propagating in the drift region 2 and in the drift control region 3 limit the voltage present across the accumulation dielectric 4 in the off-state case, since no accumulation or inversion layers can form at the accumulation dielectric 4 in the region of the space charge regions. Given identical doping of the drift region 2 and of the drift control region 3 and assuming that the pn junctions between the body region 8 and the drift region 2 and between the p-type region 33 and the drift control region 3 in the current flow direction are at the same level, this voltage corresponds at most to the reverse voltage of the diode 41. The diode 41 ensures that the p-type region 33 is at a higher potential compared with the body region in the off-state case.

The dopings of the drift region 2 and of the drift control region 3 can be different, in which case the voltage loading of the accumulation dielectric can be greater compared with an identical doping of the two regions. In this case, the doping of the drift control region 3 should be coordinated with the doping conditions in the drift region 2, the dielectric strength of the accumulation dielectric 4 and the desired dielectric strength of the component in such a way that, at a maximum permissible reverse voltage, no avalanche breakdown occurs in the drift control region 3 and a space charge region propagates in the drift control region 3 in the current flow direction to such an extent that the electric field formed from the field strength components in the current flow direction and perpendicular to the current flow direction does not exceed the breakdown field strength of the semiconductor material. In the p-doped semiconductor regions 33, 34 arranged adjacent to the body region 8 and the highly doped short-circuit region 17 above the drift control region 3, with the component in the off state, if the potential of the regions 33, 34 lies above the potential of the body region 8 by the value of the breakdown voltage of the diode 41, holes are accumulated in the p-doped regions in the region of the dielectric 4. With the component in the off state, this part of the structure corresponds to a capacitance charged to the breakdown voltage of the diode, the capacitance being referred to hereinafter as storage capacitance. It should be pointed out that the diode 41 is optionally present in the case of this component. The diode 41 supports charge storage in the drift control region 3 when the component is in the off state, such that less charge has to be subsequently supplied in the event of driving in the on state.

When the MOSFET is switched on, that region of the drift region 2 which is arranged near the body region 8 falls rapidly to potentials below the breakdown voltage of the first diode 41. As a result, holes are extracted from the upper region, that is to say region located near the fourth electrode 19, of the drift control region 3 and are shifted into regions located further below, that is to say in the direction of the drain electrode 11. The holes bring about an accumulation of electrons there on the opposite side of the dielectric 4, that is to say on that side of the drift region 2 which faces the drift control region 3. Therefore, the charge shifts from the storage capacitance into a more deeply situated "accumulation capacitance".

The first n-doped connecting region 31, in conjunction with the second p-doped connecting region 32, prevents the holes from being able to flow away from the drift control region 3 to the drain region 5 or to the drain connection 11 during the on state. The drift region 2 can be regarded as a control electrode for a hole channel on that side of the highly n-doped connecting region 31 which faces the drift region 2. The hole channel must necessarily be prevented in order to maintain the required accumulation of holes in the drift control region 3. In order to increase the magnitude of the threshold voltage of the channel, provision should preferably be made of a correspondingly high donor concentration in the highly n-doped connecting region 31 or a local increase in the thickness of the dielectric 2 at the level of the connecting region 31 (not illustrated). It suffices here to choose a particularly high donor concentration in the first connecting region 31 in a lateral direction in the region which is directly adjacent to the dielectric 4, in order to avoid the formation of a hole channel; a lower doping can be chosen in the remaining regions of the connecting region 31. In this case, it may suffice to increase the doping of the connecting region 31 in the region adjacent to the dielectric 4 in a vertical direction only in sections rather than over the entire width of the connecting region 31.

The hole charge responsible for the formation of an electron accumulation channel on that side of the drift region 2 which faces the drift control region 3, and thus for the low on-state losses, is largely maintained by the correspondingly dimensioned connecting regions 31, 32. Only a relatively small portion is lost due to the leakage current of the first diode 41 and due to the subthreshold current through the layer 31 along the dielectric 4.

During the off-state case, thermally generated electrons can flow away from the drift control region 3 via the arrangement with the first and second connecting regions 31, 32.

In the case of the component in accordance with FIG. 16, the holes required in the drift control region 3 with the component in the on state are therefore shifted only between the lower n-doped "accumulation region" (opposite the drift region 2) and the upper p-doped "storage region" 33, 34, such that only a charge shift takes place here and the holes do not have to be fed from the drain-source current of the component upon each switch-on operation. The switching losses of the component are thereby minimized.

The storage capacitance illustrated in FIG. 16 need not necessarily be completely part of the semiconductor body 1. Thus, in addition to the storage capacitance formed by the body region 8, the p-doped regions 33, 34 and the dielectric, a further capacitance may also be present, which may also be arranged outside the semiconductor body.

Figure 17B:
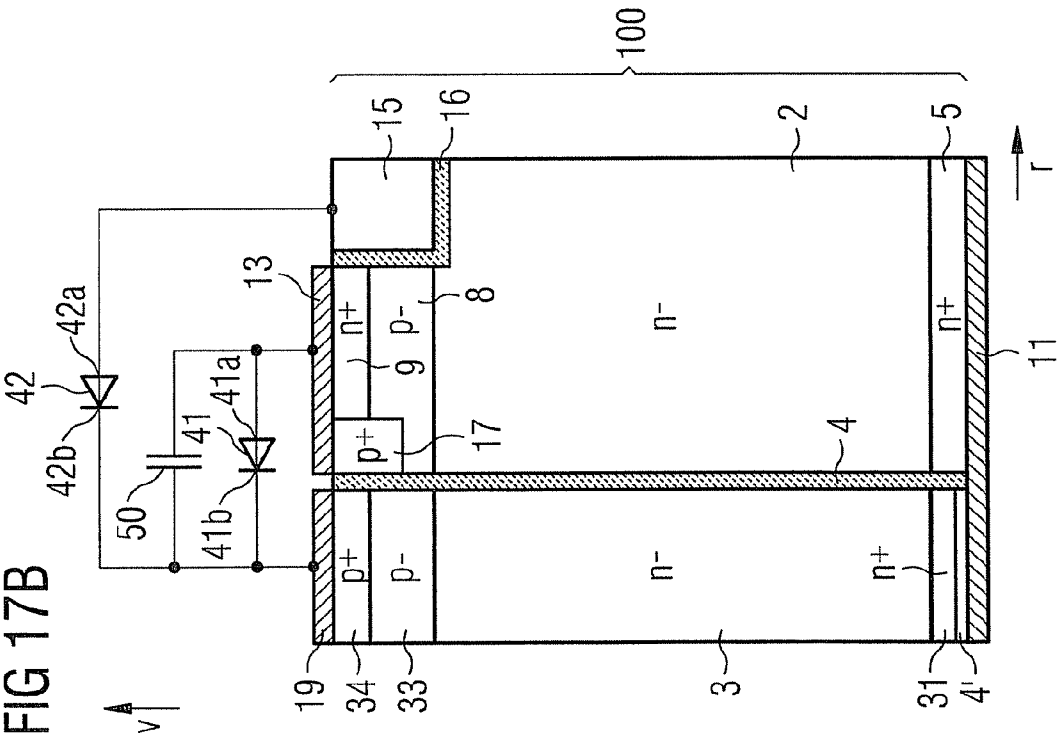
FIG. 17B illustrates a MOSFET which is modified relative to the MOSFET in FIG. 17A in which the drift control region is coupled to a drain electrode at least in sections via a tunnel dielectric.
Figure 17A:
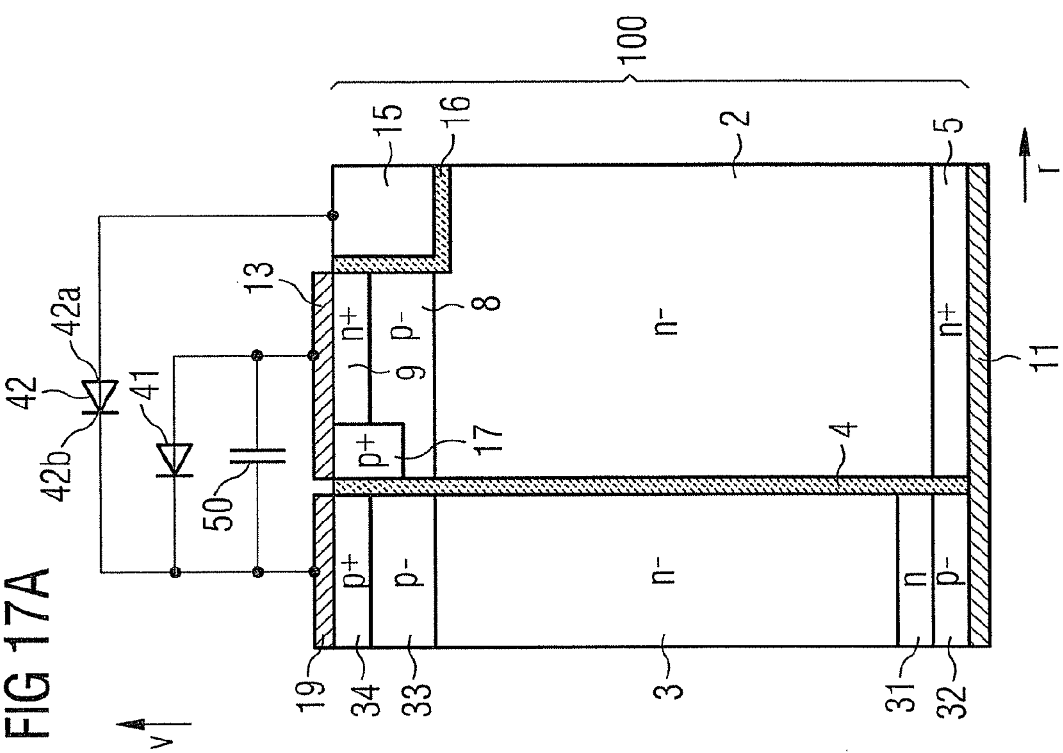
FIG. 17A illustrates the MOSFET in accordance with FIG. 16, in which the source regions and the drift control regions are connected via a capacitor, and in which the drift control regions and the gate electrodes are connected to one another via a second diode.

An arrangement with such an additional capacitance 50 is illustrated in FIG. 17A. The capacitance is illustrated schematically here as a capacitor and is referred to hereinafter as external capacitance, which can be realized in any desired manner within or outside the semiconductor body. The further capacitance 50 is connected between the source electrode 13 and the fourth electrode 34, and thus between the drift control region 3 and the source region 9.

In the example, the connection regions 33, 34 doped complementarily to the drift control region 3 are arranged between the drift control region 3 and the fourth connection electrode 19, the connection regions forming an internal storage capacitance. This p-doped storage region 33, 34 can be replaced by a heavily n-doped connecting region 33 (not illustrated) given the presence of the external capacitance 50 in accordance with the component in accordance with FIG. 12. What is advantageous about the p-doped connecting regions 33, 34, is their more favorable leakage current behavior.

In order to be able to utilize the full degree of the improved on-state losses of the component in comparison with conventional components, it should be ensured that the storage capacitance, whether it is an internal capacitance as in FIG. 16 or an internal and external capacitance as in FIG. 17A, is charged when the component is switched on, and that the charges lost through leakage currents are subsequently supplied again.

This can be achieved, referring to FIG. 17A, by providing a second diode 42 connected between the gate electrode 15 and the drift control region 3. In this case, an anode 42*a* of the diode 42 is connected to the gate electrode 15 and a cathode 42*b* is connected to the fourth electrode 19 and that connection of the external capacitance which is remote from the source electrode 13. In order that the charge shifted during switch-on in the drift control region 3 in the form of holes is maintained in a sufficient quantity, the p-doped region 34 above the drift control region should have a sufficiently high doping.

An external capacitance 50 and a second diode 42 can also be provided in a corresponding manner in the case of the component in accordance with FIG. 12, as is illustrated by dashed lines there.

When the MOSFET is first switched on, the storage capacitance formed by an internal and/or external capacitance in the case of the components of FIGS. 12 and 17A, 17B is charged from the gate circuit via the second diode 42 unless it has already been charged by the thermal reverse current from the drift control region 3. In the switched-on state of the MOSFET, lost holes are immediately supplied subsequently from the gate circuit. During the dynamic charge reversal of storage and accumulation capacitance, no or only very little current is drawn in this case from the external control connections, that is to say the gate electrode 15, in the settled state.

In order to prevent a discharge of the storage capacitance toward the drain region 5 if the drain potential falls below the potential of the drift control region 3, a pn junction can be provided between the drift control region 3 and the drain electrode 11, the pn junction being formed, in the case of the component in accordance with FIG. 17A, by the n-doped first connecting region 31 adjacent to the drift control region 3 and a more weakly p-doped second connecting region 32 adjacent to the drain electrode 11.

For the proper function of the component explained above, the diode formed by the first and second connecting regions 31, 32 should have a reverse voltage that is higher than a maximum permissible gate voltage applied between gate and source for driving the component in the on state.

FIG. 17B illustrates a component which is modified relative to FIG. 17A and in which the drift control region 3 is connected to the drain electrode 11 via an optional highly doped first connection region 31, the doping of which may correspond to the doping of the drain region 5, and a tunnel dielectric 4'. In the on-state case, the tunnel dielectric 4' prevents holes that have accumulated in the drift control region 3 from being able to flow away to the drain electrode 11, and, in the off-state case, the tunnel dielectric enables a thermally generated leakage current to flow away to the drain electrode 11. In this case, the dielectric strength of the tunnel dielectric 4' merely has to be high enough that the tunnel dielectric can block the gate voltage.

In the case of the component in accordance with FIG. 17B, monocrystalline semiconductor material is situated above the tunnel dielectric 4'. Such a component can be produced by growing the semiconductor material epitaxially onto the tunnel dielectric. In this case, the drain region 5 represents the substrate to which the tunnel oxide is applied, onto which the epitaxial layer is subsequently grown. In this case—unlike in the case of the component of FIG. 17B—the tunnel dielectric 4' is situated between the drift control region 3 and the highly n-doped drain region 5 (not illustrated).

Figure 18:
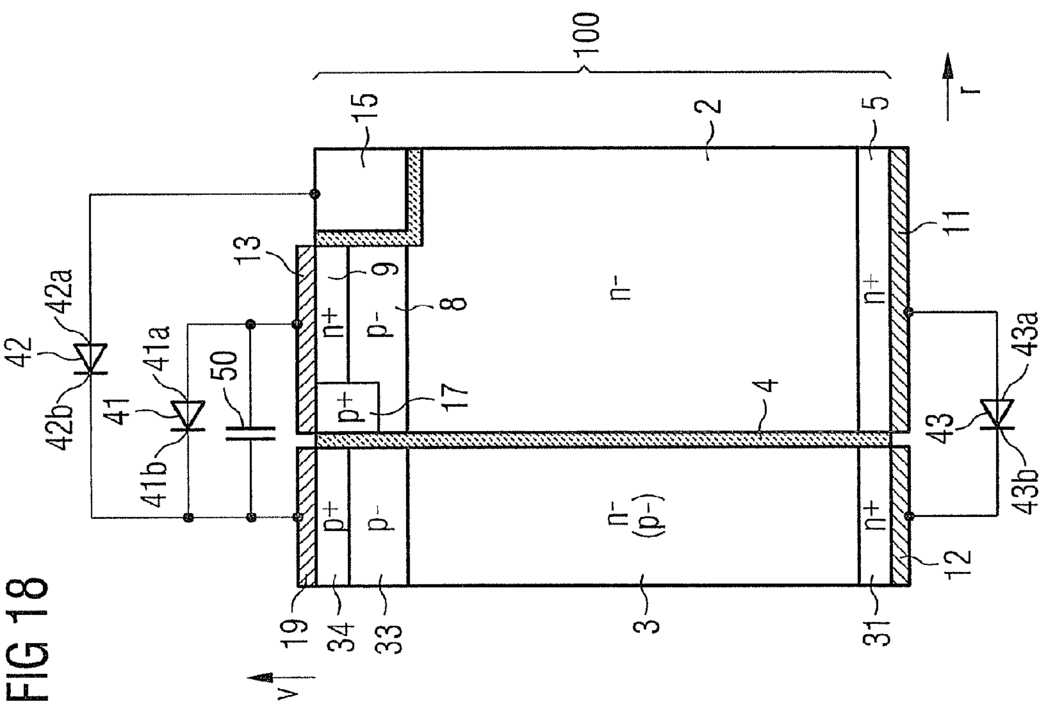
FIG. 18 illustrates the MOSFET in accordance with FIGS. 16 and 17, which is connected up with a first diode in accordance with FIG. 16 and also with a second diode and a capacitor in accordance with FIG. 17A and in which the drift control regions are connected to the drain regions on the drain side by using a third diode.

FIG. 18 illustrates a further possibility of how a discharge of the (hole) storage capacitance in the direction of the drain region 5 can be prevented. In this case, the drift control region 3 is connected via a highly doped connection region to a second electrode 12, which is separated from the drain electrode 11. Connected between these two electrodes 11, 12 is a third diode 43, which can also be realized as an external component and the anode 43*a* of which is connected to the drain electrode 11 and the cathode 43*b* of which is connected to the second electrode 12. The third diode 43 prevents the discharge of the accumulation capacitance toward the drain region 5. In this case, the blocking ability of the third diode 43 should be higher than the maximum gate voltage for switching on the MOSFET and can be lower than the permissible potential difference across the accumulation dielectric 4.

When the MOSFET is first switched on, the drift control region 3 is charged from the gate circuit to a maximum gate voltage, for example to 10 V. When the MOSFET is switched off, the charge is shifted from the accumulation capacitance into the storage capacitance. In this case, the storage capacitance should be chosen with a magnitude such that the reverse voltage of the second diode 42, for example 15V, is not exceeded. The storage capacitance is preferably 2 to 3 times the accumulation capacitance between the drift control region 3 and the drift region 2 and consists of the sum of the internal capacitance formed by the connecting regions 33, 34 and the bypass region 17 and also the optional external accumulation capacitance 50.

Instead of providing an external storage capacitance 50 outside the component, such a capacitance can also be integrated into the component, for example into the semiconductor body 1. In one embodiment, it is possible to increase the storage capacitance toward the bypass region 17 by using a dielectric 4 having a higher dielectric constant and/or by enlarging the interface between the hole bypass 17 and the dielectric 4 (not illustrated).

In the case of the arrangement in accordance with FIG. 18, the first diode 41 can also be dispensed with, in principle. However, it can then happen that possible excess charges flow away from the storage capacitance into the gate circuit. Such excess charges may arise in one embodiment when the storage capacitance is charged up to the reverse voltage of the second diode 42 by the leakage current from the drift control region 3 during a relatively lengthy blocking phase.

In a departure from the representation above, there is also the possibility of doping the drift control region 3 complementarily to the drift region 2, that is to say of providing a p-doped drift control region 3 in the example in accordance with FIG. 18. When the component is driven in the off state, a space charge region then propagates in the drift control region 3 proceeding from the pn junction between the drift control region 3 and the connection region 31 in the direction of the front side of the semiconductor body 100, while a space charge region propagates in the drift region 2 proceeding from the pn junction between the body region 8 and the drift region 2 in the direction of the rear side. These space charge regions propagating from different directions bring about a voltage drop across the accumulation dielectric which has the effect that space charge regions also propagate in the lateral direction in the drift region 2 and the drift control region 3 in the case of this component. To summarize, this results in a compensation effect that enables the drift region 2 to have a higher basic doping for the same dielectric strength.

The doping of the drift region 2 and of the drift control region 3 given an identical type of doping is in the region of $10^{14}$ $cm^{-3}$, for example, while dopings within the range of $10^{15}$ $cm^{-3}$ to $10^{16}$ $cm^{-3}$ are possible in the case of a complementary doping of drift region 2 and drift control region 3.

Figure 19:
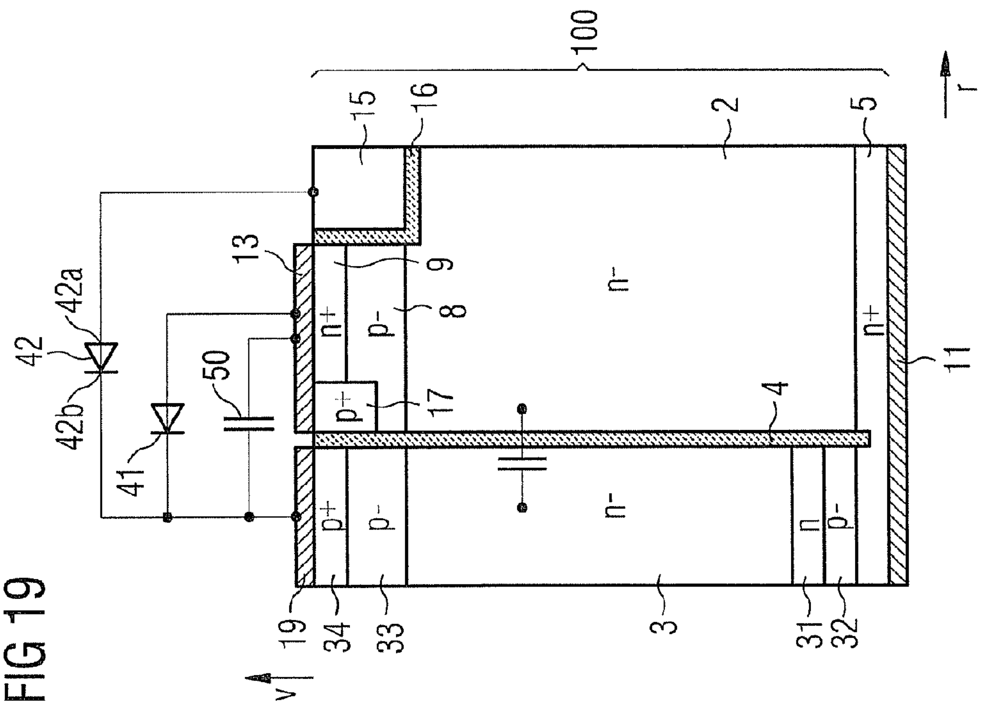
FIG. 19 illustrates the MOSFET with the circuit arrangement in accordance with FIGS. 16 to 18, in which a drain-side diode in accordance with FIG. 15 is integrated into the semiconductor body and in which the drain region extends as far as below the drift control region.

FIG. 19 illustrates a further possibility for linking the drift control region 3 to the drain region 5. In this case, the drift control region 3 is connected to the drain region 5 directly via the connecting regions 31, 32 doped complementarily to one another, and without interposition of the drain electrode 11. This is achieved by virtue of the fact that the dielectric layer forming the accumulation dielectric 4 begins at a distance from the drain electrode 5 and that the drain region 5 extends as far as below the drift control region 3 in a lateral direction.

As is usual in the case of semiconductor components, in one embodiment in the case of power semiconductor components, a plurality of individual cells, in the present case a plurality of MOSFET cells, can be arranged in the same semiconductor body and connected up in parallel with one another. In the case of the component, here two adjacent cells of the component can utilize an intervening common drift control region 3.

In order to detect a voltage present between load connections of a power semiconductor component, it is known to connect a capacitive voltage divider between the load connections of the power component and to tap off a voltage signal at the capacitive voltage divider. In this case, the value of the voltage signal is dependent on the load path voltage present. In the case of the power semiconductor component explained above on the basis of examples, such a capacitive voltage divider connected in parallel with the load path, in the present case in parallel with the drain-source path, is already present. In the case of this component, a first capacitance is formed by the drift region 2 and the drift control region 3, which are separated from one another by the accumulation dielectric 4. The capacitance is depicted schematically in FIG. 19. In this case, one connection of the capacitance is connected to the drain region 5. A capacitance connected to the source region 9 is either the capacitance 50 depicted as external component in FIG. 19 or an internal capacitance formed by the highly doped connection region 34, the highly doped connection region 17 of the body region 8 and the intervening dielectric. A center tap of the capacitive voltage divider formed by these two capacitances forms the connection electrode 19 of the drift control region 3. Consequently, a signal related to the load path voltage of the power semiconductor component can be tapped off directly at this connection 19 of the drift control region 3.

In order to evaluate the load path voltage, it is either possible to evaluate the absolute value of an electrical potential at the connection 19. However, it is also possible to evaluate the dynamic behavior of the potential at the connection 19, a rise in the potential corresponding to a rise in the load path voltage, and a fall in the potential corresponding to a fall in the load path voltage.

Figure 20:
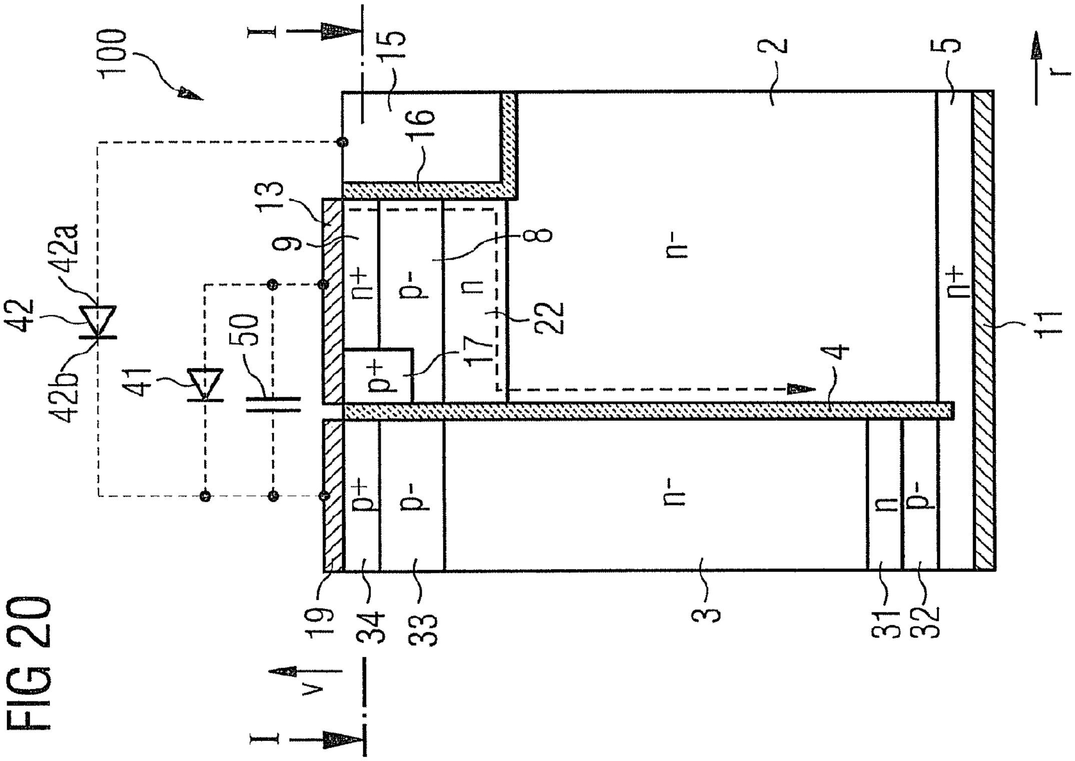
FIG. 20 illustrates a semiconductor component embodied as a MOS transistor, in which, in order to reduce the on resistance, an intermediate region that is doped more highly than the drift region is arranged between the drift region and the body region.

FIG. 20 illustrates a modification of the vertical power component illustrated in FIG. 19. In the case of this component, an intermediate region 22 that is of the same conduction type as the drift region 2 and is doped more highly than the drift region 2 is present between the body region 8 and the drift region 2. The intermediate region 22 extends in a lateral direction r of the semiconductor body 100 from the gate dielectric 16 as far as the accumulation dielectric 4. The task of the intermediate region 22, when the component is driven in the on state, is to increase the transverse conductivity between the inversion channel, which forms in the body region 8 along the gate dielectric 16, and the accumulation channel, which forms along the accumulation dielectric 4 in the drift region 2, or to reduce the electrical resistance between the inversion channel arranged at a distance from the accumulation channel in a lateral direction r of the semiconductor body. The path of the charge carriers through the component between the source region 9 and the drain region 5 is illustrated by dashed lines in FIG. 20. The doping concentration of the intermediate region 22 lies for example within the range of between $10^{15}$ $cm^{-3}$ and $10^{17}$ $cm^{-3}$ and thus one to two orders of magnitude above the doping concentration of the drift region 2.

As a result of the provision of the more highly doped intermediate region 22, with the doping concentration of the drift region 2 remaining the same, the number of dopant atoms between the body region 8 and the drain region 5 increases, which in principle leads to a reduction of the dielectric strength of the component. In order to avoid such a reduction of the dielectric strength, the doping concentration of the drift region 2 can be reduced when a more highly doped intermediate region 22 is provided.

Figure 21:
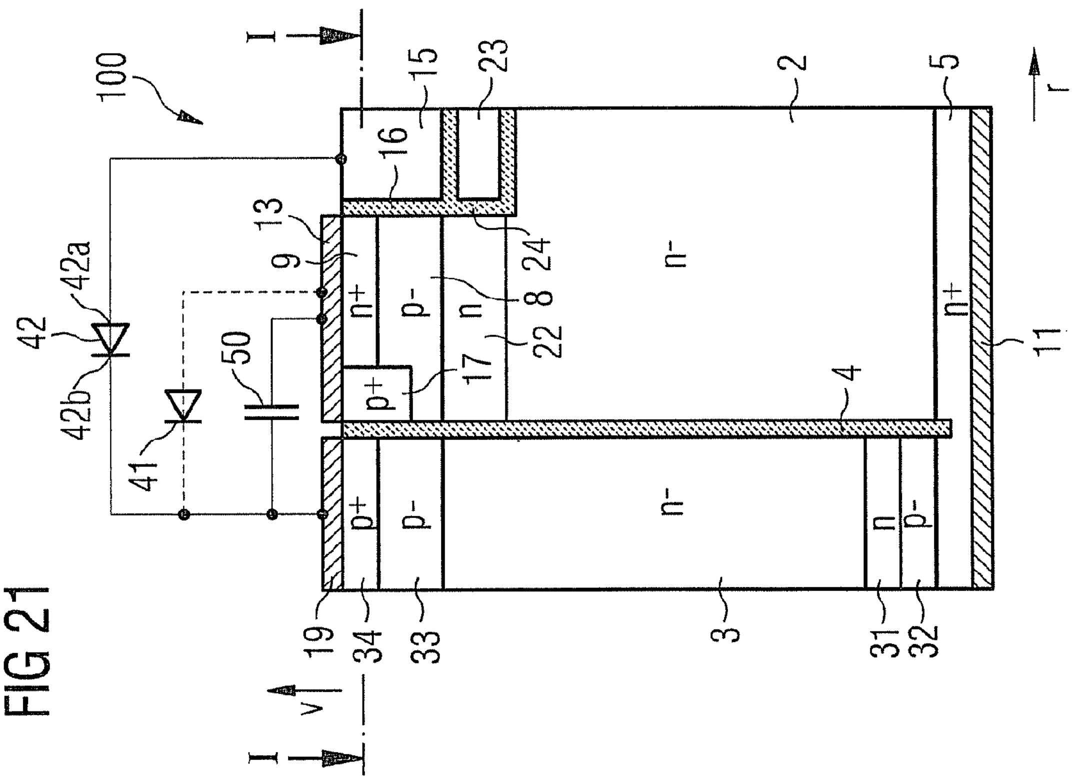
FIG. 21 illustrates a component which is modified relative to FIG. 20 and in which a field electrode is arranged adjacent to the more highly doped intermediate region.

In order to prevent a reduction of the dielectric strength when the more highly doped intermediate region 22 is provided, it is possible as an alternative or in addition to lowering the doping concentration of the drift region 2, referring to FIG. 21, to provide a field electrode 23 which is arranged adjacent to the more highly doped intermediate layer 22 and which is dielectrically insulated from the intermediate region 22 and the drift region 2 by a dielectric layer 24. In one exemplary embodiment illustrated, the field electrode 23 is arranged directly adjacent to the gate electrode 15 in the vertical direction v of the semiconductor body 100. The field electrode 23 is for example electrically connected to the source electrode 13 and is thus at the source potential of the semiconductor component. The task of the field electrode 23, when the semiconductor component is driven in the off state, that is to say when a space charge region forms proceeding from the pn junction between the body region 8 and the more highly doped intermediate region 22, is to compensate for at least part of the dopant charge present in the intermediate region 22. The intermediate region 22 can thereby be doped more highly in comparison with a component without a field electrode 23 for the same dielectric strength of the component.

In the case of the components in accordance with FIGS. 20 and 21, the drift control region 3 is connected to the drain region 5 via the connection regions 31, 32 already explained and to the connection electrode 19 via the connection regions 33, 34 likewise already explained. It should be pointed out that the drift control region can, of course, also be connected to the drain region 5 and the connection electrode 19 in accordance with the explanations concerning FIGS. 12, 17 and 18.

FIG. 22 illustrates a cross section through the components illustrated in FIGS. 20 and 21 in the sectional plane I-I. In the case of these components, the gate electrode 15 runs essentially parallel to the drift control region 3 in a lateral direction of the semiconductor body 100. In the case of these components, the more highly doped intermediate regions 22 illustrated in FIGS. 20 and 21 increase the transverse conductivity between the inversion channel along the gate electrode 15 and the accumulation channel along the accumulation dielectric 4.

Figure 23B:
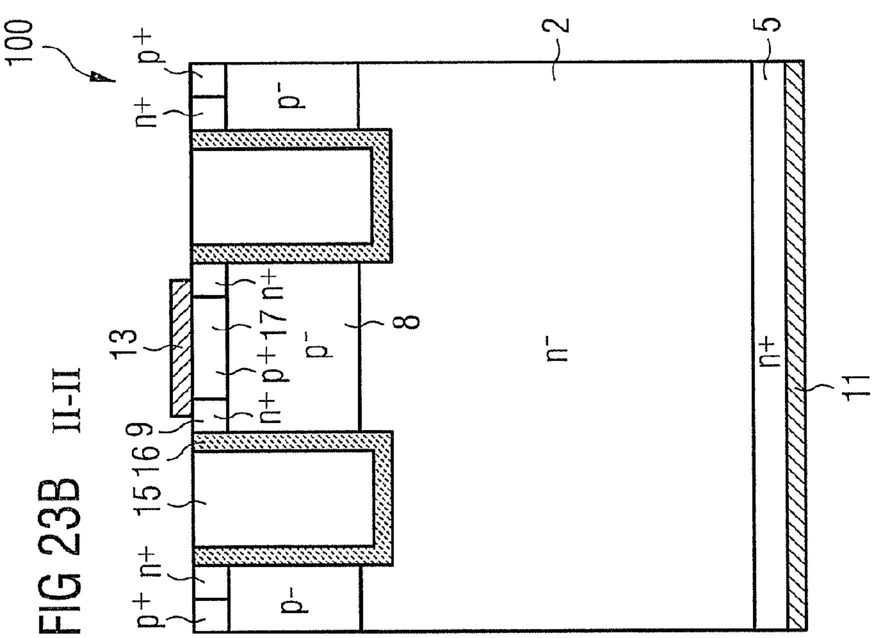
FIG. 23 illustrates a modification of the components illustrated in FIGS. 20 and 21, in a first sectional plane (FIG. 23A) and a second sectional plane (FIG. 23B).

FIG. 23A illustrates, in a sectional plane corresponding to the sectional plane I-I, a component modified relative to the components of FIGS. 20 and 21. A cross section through this component in a sectional plane II-II illustrated in FIG. 23A is illustrated in FIG. 23B. In the case of this component, gate electrodes or sections of the gate electrode 15 and body regions or sections of the body region 8 are arranged alternately between two drift control regions 3. The sectional illustration in FIG. 23A illustrates the highly doped connection regions 17 and the source regions 9; the body regions 8 are in this case arranged below the connection regions 17 and the source regions 9. The gate electrodes 15 are insulated from the body regions by the gate dielectric 16 and are additionally insulated from the drift control region 3 by using a dielectric layer. The gate dielectric 16, the accumulation dielectric 4 and the dielectric 25 that insulates the gate electrode 15 from the drift control region 3 may in this case be composed of the same material or a material having identical dielectric properties.

In the case of the component illustrated with reference to FIGS. 23A and 23B, an area of the gate dielectric 16 along which the inversion channel forms in the body region 8 when the component is driven in the on state, and an area of the accumulation dielectric 4 along which the accumulation channel forms in the drift region 2 run perpendicular to one another. In the case of this component, the inversion channel that forms along the gate dielectric 16 in the upper region of the semiconductor body extends in a lateral direction as far as the accumulation channel that forms along the accumulation dielectric 4 in the lower region of the semiconductor body 100.

Figure 24:
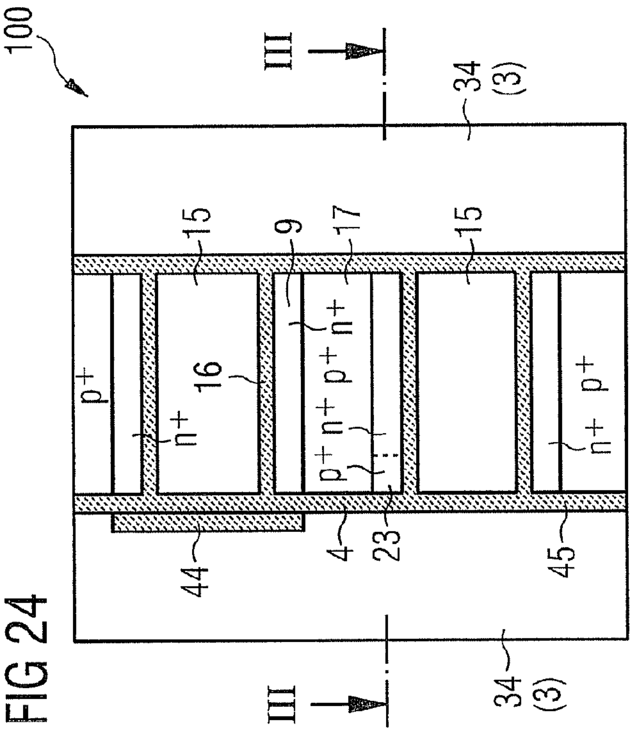
FIG. 24 illustrates a modification of the component illustrated in FIG. 23.
Figure 25:
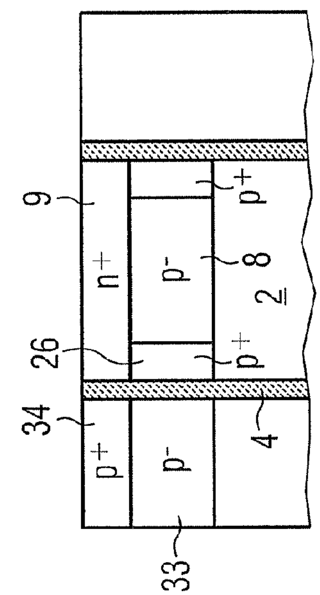
FIG. 25 illustrates a cross section through the component in accordance with FIG. 24 in a sectional plane III-III.

In order to prevent a channel that can no longer be turned off from forming in that part of the body region 8 which adjoins the accumulation dielectric 4, the source regions 9 are arranged in such a way that they do not extend as far as the accumulation dielectric 4 in a lateral direction of the semiconductor body 100, which is illustrated in FIG. 23A. If the source regions 9 are intended to extend as far as the accumulation dielectric 4 in a lateral direction of the semiconductor body for process-technological reasons, there are various possibilities—illustrated in FIG. 24—for preventing the formation of a channel that can no longer be turned off. One possibility is for the accumulation dielectric 4 to be made thicker in the regions in which the source region 9 extends as far as the accumulation dielectric 4 than in the remaining regions. This is illustrated in FIG. 24 by the provision of an additional dielectric layer 44 directly adjacent to the accumulation dielectric 4. As an alternative, there is the possibility of realizing the accumulation dielectric 4 in such a way that its dielectric constant is lower in the regions in which the source region 9 extends as far as the accumulation dielectric 4 than in remaining regions, in one embodiment than in those regions in which an accumulation channel is intended to form along the accumulation dielectric 4 in the drift region 2 when the component is driven in the on state. As an alternative, there is the possibility of providing a channel stop region 26 along the accumulation dielectric 4 adjacent to the body region 8 in the vertical direction of the semiconductor body 100 between the source region 9 and the drift region 2. The channel stop region 26 is doped complementarily to the source region 9 and more highly than the body region 8 and serves to prevent a channel controlled by the drift control region along the accumulation dielectric 4 between the source region 9 and the drift region 2. A cross section in a sectional plane III-III in the region of the channel stop region 26 is illustrated in FIG. 25.

Figure 27:
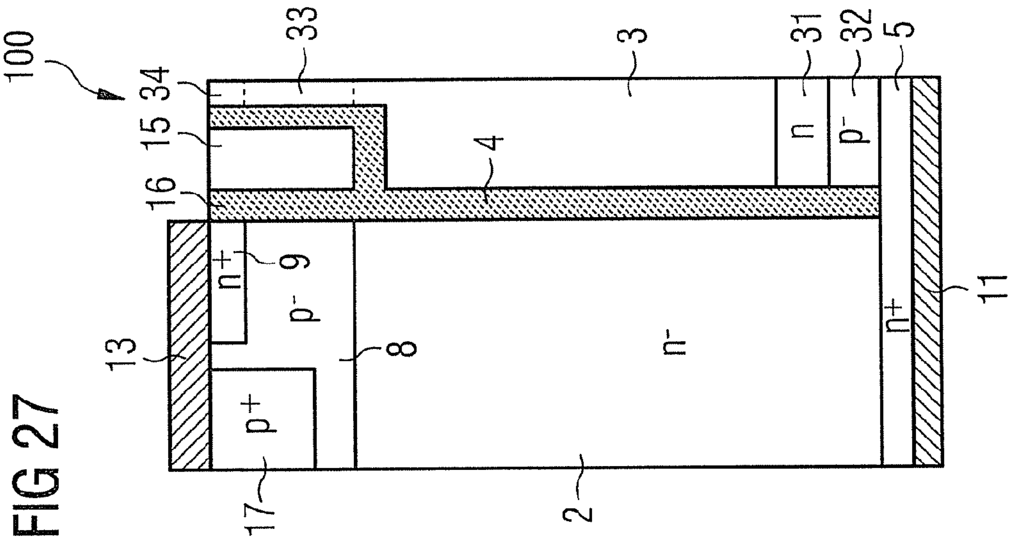
FIG. 27 illustrates a modification of the component illustrated in FIG. 26, in which the drift control region extends in sections as far as a front side of a semiconductor body.
Figure 26:
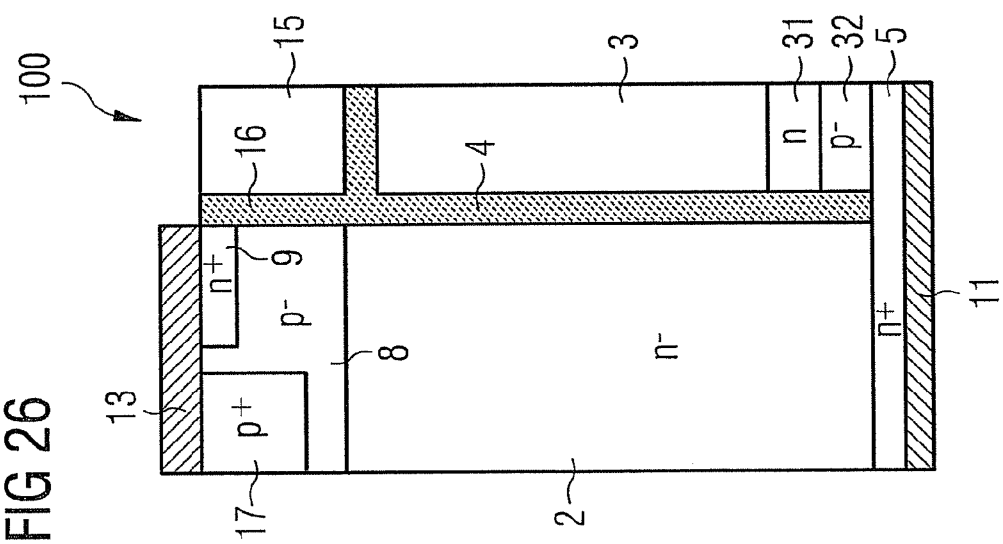
FIG. 26 illustrates a semiconductor component which is realized as a MOS transistor and in which a gate electrode is arranged above a drift control region in a vertical direction.

Special measures for increasing the transverse conductivity as explained above with reference to FIGS. 21 to 25 can be dispensed with, referring to FIGS. 26 and 27, if the gate electrode 15 is arranged in extension of the drift control region 3 in such a way that, when the component is driven in the on state, an inversion channel that forms along the gate dielectric 16 undergoes transition directly into an accumulation channel that forms along the accumulation dielectric 4. In the case of the components illustrated in FIGS. 26 and 27, the gate electrode 15 is arranged above the drift control region 3 in the vertical direction of the semiconductor body 100. In order to realize the gate dielectric 16 and the accumulation dielectric 4, it is possible to provide a common dielectric layer which forms the gate dielectric 16 in the region between the gate electrode 15 and the body region 8 and the accumulation dielectric 4 in the region between the drift control region 3 and the drift region. In this case, the gate electrode 15 and the drift control region 3 are dielectrically insulated from one another by a dielectric which may correspond, with regard to its dielectric properties, to the gate dielectric 16 and/or to the accumulation dielectric 4. The drift control region 3 can be coupled to the source electrode 13 or the gate electrode 15 in accordance with one of the possibilities explained above with reference to FIGS. 12 and 17 to 19. The illustration of such electrical connections and components, such as diodes or capacitances, that are additionally required, if appropriate, has been dispensed with in FIGS. 26 and 27 for reasons of clarity.

In the case of the component in accordance with FIG. 26, the gate electrode 15 completely covers the region above the drift control region 3 in sections, that is to say that the drift control region 3 does not reach as far as the front side of the semiconductor body 100 in sections. In a manner not illustrated in greater detail, this component contains sections in which the drift control region 3 extends as far as the front side of the semiconductor body 100 in order that contact is made with it there. In a direction perpendicular to the plane of the drawing illustrated, the sections lie offset with respect to the section of the drift control region 3 that is illustrated in FIG. 26.

In the case of the component illustrated in FIG. 27, the gate electrode 15 is made narrower in a direction perpendicular to the gate dielectric 16 than in the case of the semiconductor component in accordance with FIG. 26, such that the drift control region 3 in the case of this component extends past the gate electrode 15, and in a manner insulated from the gate electrode 15 by a dielectric layer, as far as the front side 100 of the semiconductor body. In this region it is possible to provide the intermediate layers or contact layers 33, 34 already explained above, which are illustrated by dashed lines in FIG. 27.

In the case of the component explained with reference to FIGS. 26 and 27, in which the gate electrode 15 is provided in direct extension of the drift control region 3, when the component is driven in the off state, spikes in the electric field propagating in the drift region 2 can occur at the transition region between the gate electrode 15 and the drift control region 3 or between the regions in which the inversion channel and the accumulation channel form when the component is driven in the on state. Such voltage spikes can lead to a premature voltage breakdown in this region of the component. In order to prevent such a premature voltage breakdown, referring to FIG. 28, a semiconductor region 81 of the same conduction type as the body region 8 can be provided adjacent to the body region 8. The semiconductor region 81 is referred to hereinafter as body extension region or body extension.

This body extension region 81 extends to the level of the drift control region 3 in a vertical direction of the semiconductor body 100, but does not extend as far as the accumulation dielectric 4 in a lateral direction of the semiconductor body 100. As a result, the body extension region does not influence the formation of the accumulation channel along the accumulation dielectric 4 when the semiconductor component is driven in the on state, but in the off-state case the body extension region shields that region of the drift region 2 which lies between the body extension region 81 and the accumulation dielectric 4 from the electric field. This prevents the occurrence of field spikes in this region of the drift region 2 near the accumulation dielectric 4.

Figure 28:
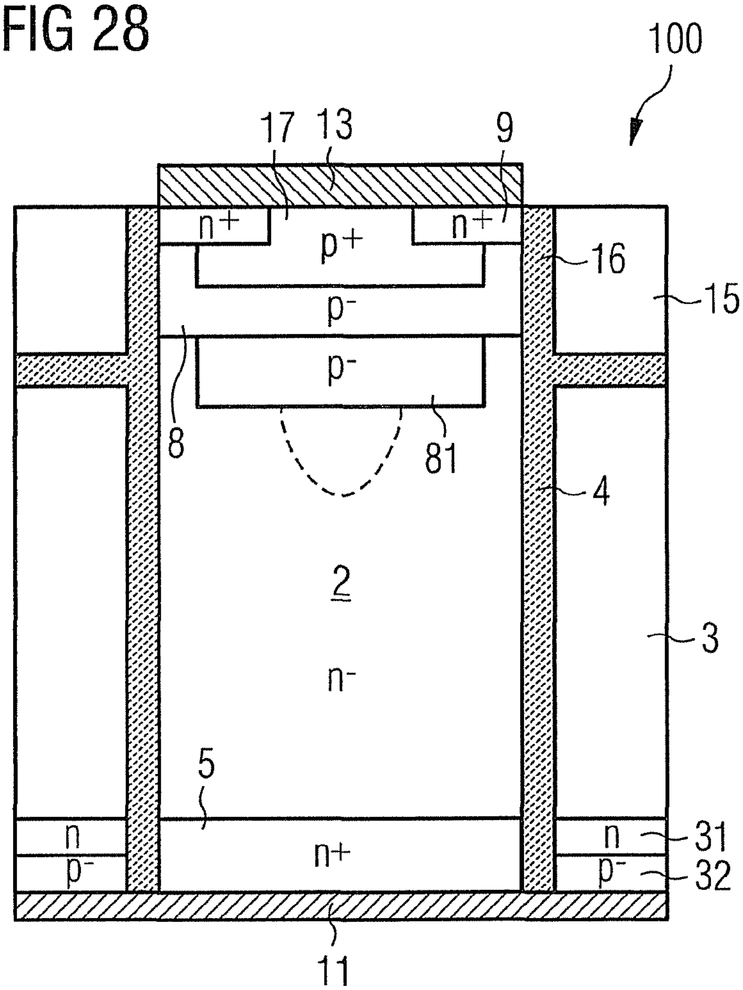
FIG. 28 illustrates a semiconductor component which is realized as a MOS transistor and which has a more deeply situated body region adjacent to the body region.

In a first configuration of the component illustrated in FIG. 28, the body extension region is comparatively lightly doped, that is to say is doped for example in accordance with the body region 8 or more lightly. In this case, the body extension region supplies a compensation charge with respect to the complementary dopant charge at the upper end of the drift region 2, that is to say in that region of the drift region 2 which lies directly adjacent to the body extension region 81. When the component is driven in the off state, this increases the voltage taken up in the transition region between the body extension region 81 and the drift region 2 on account of a smaller gradient of the electric field, such that field spikes are avoided.

A further configuration provides for realizing the body extension region 81 in such a way that with the component in the off state, field strength spikes are generated in a targeted manner in the region of the body extension region 81 in order to concentrate a voltage breakdown on the body extension region. This can be achieved by a pn junction between the body extension region 81 and the drift region 2 having comparatively strong edges, as is illustrated for example for the body extension region 81 in accordance with FIG. 28. Furthermore, there is the possibility of realizing the body extension region 81 in such a way that the latter extends locally particularly deeply into the drift region 2, a voltage breakdown then occurring in those regions of the semiconductor body 100 which extend deeply into the drift region 2. Such a locally particularly deep course of the body extension region 81 is illustrated by dashed lines in FIG. 28. In these cases, the body extension region 81 is comparatively highly doped, that is to say for example more highly than the body region 8.

A body extension region 81 explained with reference to FIG. 28 can be used both in the case of n-conducting components with an n-doped drift region 2 (as illustrated in FIG. 28) and in the case of an n-conducting component with a p-doped drift region, which will be explained further below with reference to FIGS. 41 to 43.

In the case of the power components explained above with reference to FIGS. 16, 17 and 19, the drain region 5 of the component is connected to the drift control region 3 via a rectifier element, in the present case a diode, or a tunnel dielectric. Referring to FIGS. 16, 17A and 19, the diode may be formed by a pn junction between two connection regions 31, 32 which are doped complementarily to one another and which are arranged adjacent to the drift control region 3 successively in the direction of the rear side of the semiconductor body 100.

Figure 29:
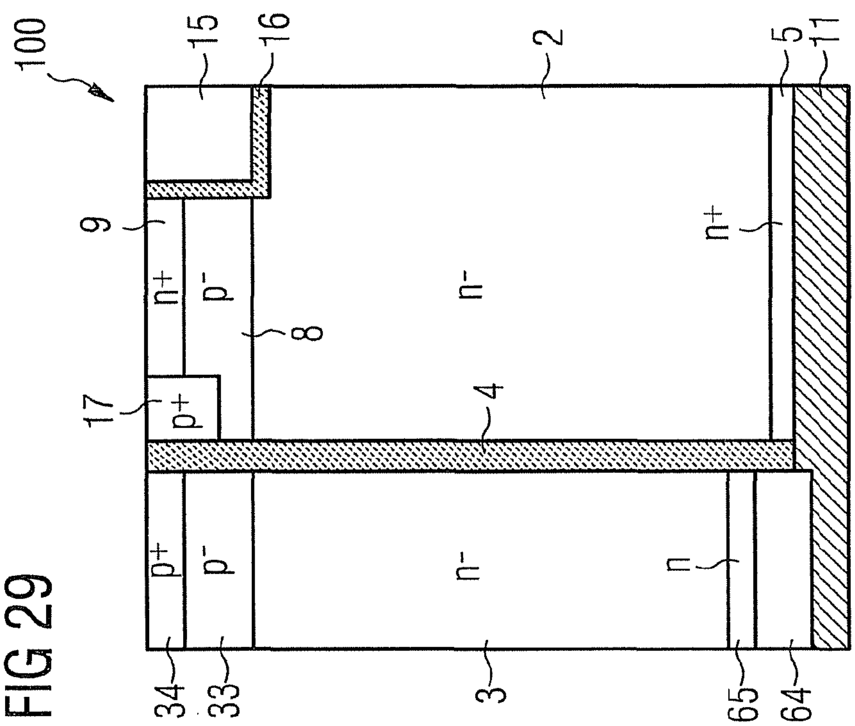
FIG. 29 illustrates a MOS transistor with a Schottky diode between a drain electrode and a drift control region.

Referring to FIG. 29, such a pn junction between the drain region 5 or the drain electrode 11 and the drift control region 3 can be replaced by a Schottky junction. In the component illustrated, a Schottky contact is present between a Schottky metal 64, for example platinum, and an intermediate region 65 doped more highly than the drift control region 3. The intermediate region 65 is not required for forming a Schottky contact, but rather serves as a stop region that prevents holes from flowing away from the drift control region 3 to the drain electrode 11.

Figure 30:
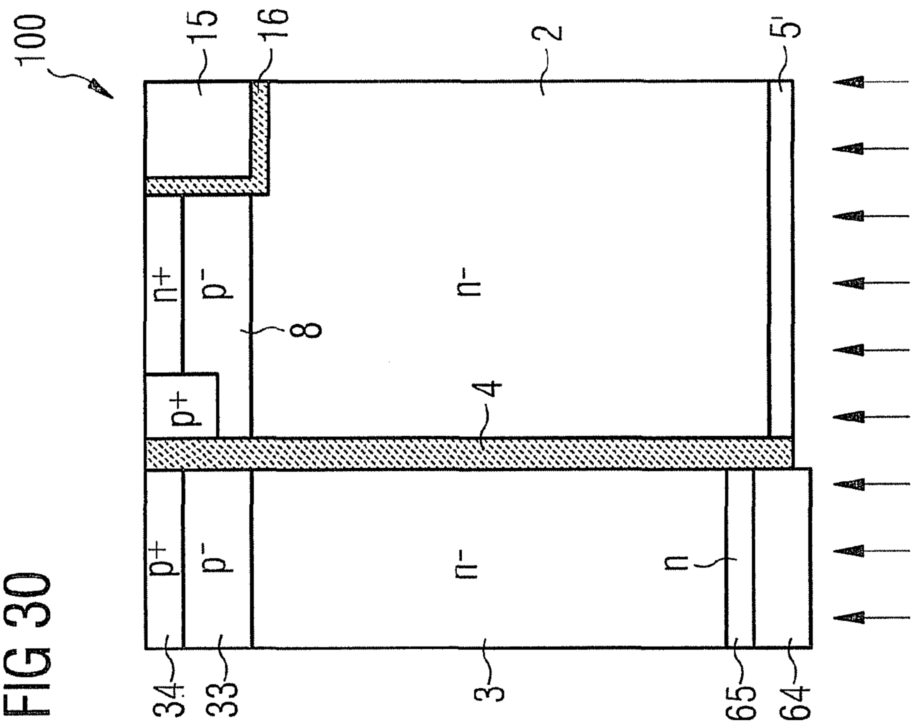
FIG. 30 illustrates a possible method for realizing the Schottky diode of the component in accordance with FIG. 29.

FIG. 30 illustrates the component in accordance with FIG. 29 during a possible production method. In this method, after producing the hole stop region 65 and applying the Schottky metal 64 to the hole stop region 65, an ion implantation is carried out via the uncovered rear side of the semiconductor body 100. During the ion implantation, n-type dopant atoms are implanted into the drift region 2 via the rear side of the semiconductor body 100. In this case, the Schottky metal 64 acts as a mask that prevents dopant atoms from being implanted into the drift control region 3. A semiconductor region of the drift region 2 into which the n-type dopant atoms are implanted is designated by the reference symbol 5' in FIG. 30. The semiconductor component is completed by applying a rear-side metallization, which forms the drain electrode 11, and also an annealing step, by using which the semiconductor body 100 is heated in the rear-side region in order to electrically activate the dopant atoms implanted into the semiconductor region 5' and thereby to form the highly doped drain region 5, which simultaneously produces a low-resistance electrical contact between the drain electrode 11 and the drift region 2.

The hole stop region 65 of this component can be produced in various ways:

firstly, there is the possibility of producing the hole stop region 65 as early as during the production of the drift control region 3. The drift control region 3 is produced by epitaxially depositing a semiconductor material onto a semiconductor substrate (not illustrated) that is initially still present. The arrangement with the hole stop region 65 and the drift control region 3 can be produced by a procedure in which firstly a more highly doped layer is produced at the beginning of the epitaxy method, the layer forming the later hole stop region 65, and then a more weakly doped semiconductor material, which forms the later drift control region 3, is deposited epitaxially. In this case, the epitaxial deposition takes place in a trench that is bounded toward the sides by the accumulation dielectric. After etching back, that is to say removal of the substrate, the Schottky metal is produced by the deposition of a Schottky metal and suitable patterning.

As an alternative, there is the possibility of producing the hole stop region 65 in accordance with the drain region 5 by using a masked ion implantation via the rear side of the semiconductor body 100.

The dopant atoms implanted for producing the hole stop region 65 and/or for producing the drain region 5 can be activated by heating the rear side of the semiconductor body 100 by using a laser beam (laser annealing).

Figure 31:
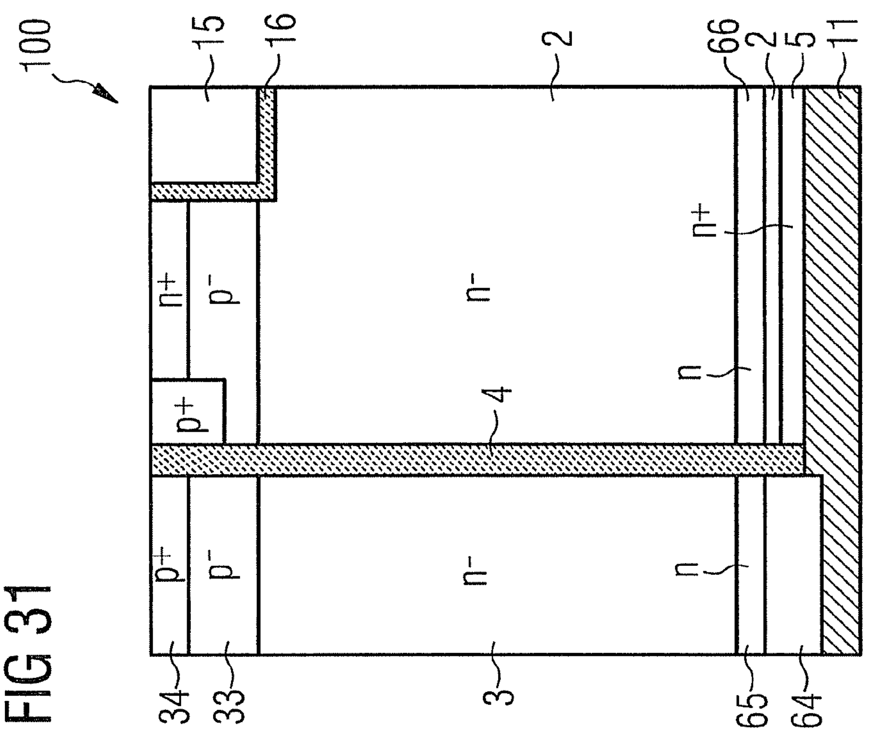
FIG. 31 illustrates a first modification of the component in accordance with FIG. 29.

FIG. 31 illustrates a variant of the semiconductor component illustrated in FIG. 29. This component contains a field stop region 66 in the drift region 2, for example at the same level as the hole stop region 65, the field stop region being doped more highly than the drift region 2. The field stop region 66 can be produced for example before the application of the rear-side metallization forming the drain electrode 11, by using an ion implantation and a subsequent annealing process.

Figure 32:
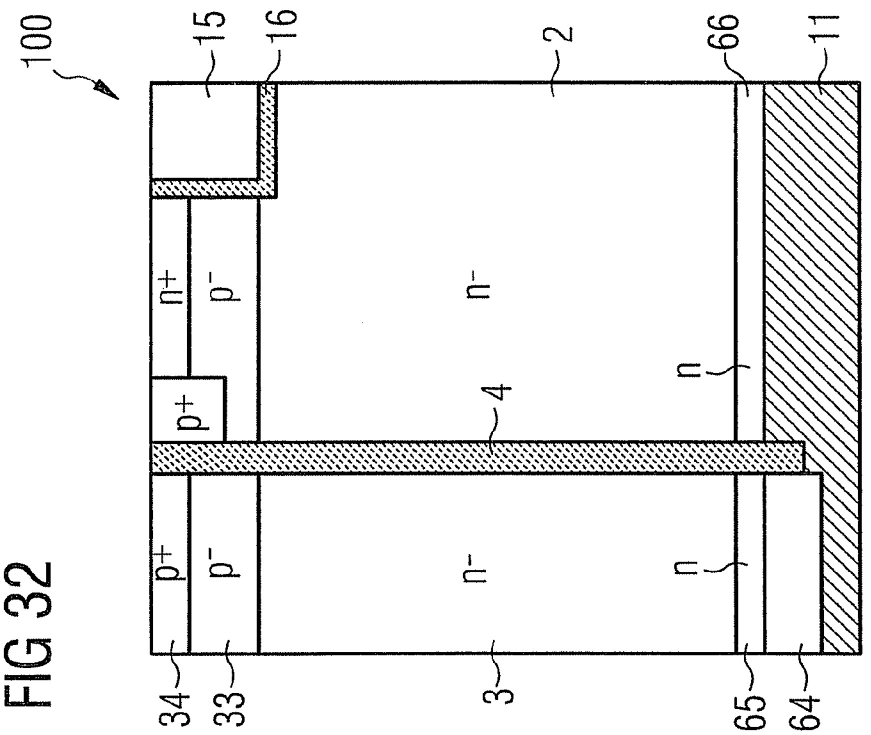
FIG. 32 illustrates a second modification of the component in accordance with FIG. 29.

In the case of a variant of a semiconductor component as illustrated in FIG. 32, the semiconductor body 100 in the region of the drift region 2, before the production of the rear-side metallization forming the drain electrode 11, is etched back to the level of the more highly doped semiconductor region 66, which forms the field stop region in the component in accordance with FIG. 31. In this component, the rear side metallization 11 makes contact directly with the more highly doped semiconductor region 66, which in this case provides for a low-resistance contact between the rear side metallization 11 and the drift region 2.

Figure 33:
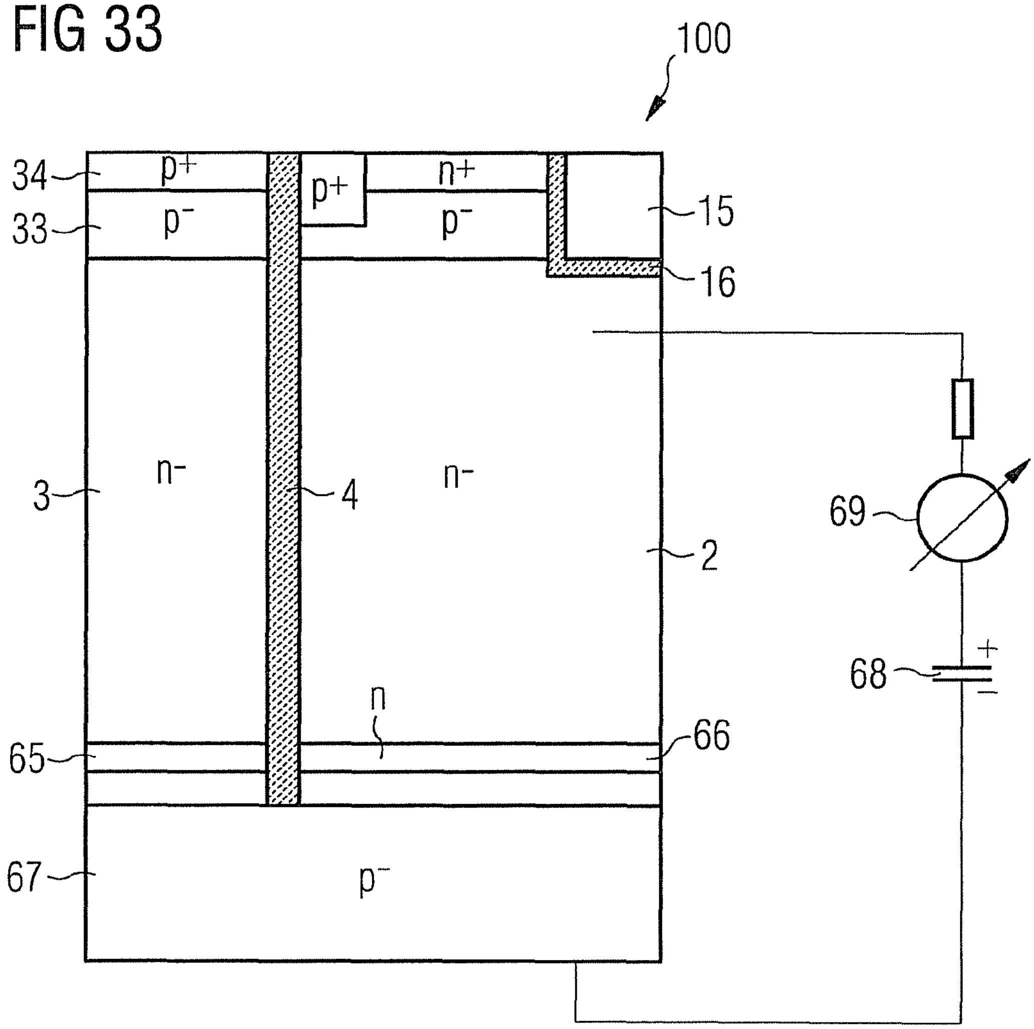
FIG. 33 illustrates one method for producing the semiconductor components illustrated in FIGS. 29 to 32.

Referring to FIG. 33, the semiconductor structure explained with reference to FIGS. 29 to 32 with the drift control region 3, the accumulation dielectric 4 and the drift region 2 and also with the further component structures arranged in the region of the front side of the semiconductor body can firstly be produced on a p-doped semiconductor substrate, which is to be removed before producing the Schottky metal (64 in FIGS. 29 to 32), and the rear side metallization (11 in FIGS. 29 to 32). The p-type substrate is removed for example by using an electrochemical etching method in a basic etching medium, such as, for example, $NH_4OH$, NaOH, KOH in aqueous solution. In this case, an electrical voltage is applied, by using a voltage source 68, between the semiconductor substrate 67 and the epitaxial layer applied thereto, whereby the p-type substrate is etched back electrochemically. During this etching process, the current supplied by the voltage source 68 is measured by a current measuring arrangement 69. In this case, use is made of the fact that the flowing current rises abruptly when the substrate 67 is completely etched back and the etching medium then attacks the n-doped epitaxial layer. The flowing current serves as etching control in this method, the etching method being ended when the current rises abruptly upon reaching the n-doped epitaxial layer.

The method explained, involving the removal of the p-substrate 67 by an electrochemical etching method, can be controlled better than a chemical or mechanical removal process, in which case the method explained can be combined with such a process by virtue of the semiconductor substrate 67 firstly being chemically or mechanically thinned and by virtue of the electrochemical method, which permits exact end point control, only being carried out afterward.

Figure 34:
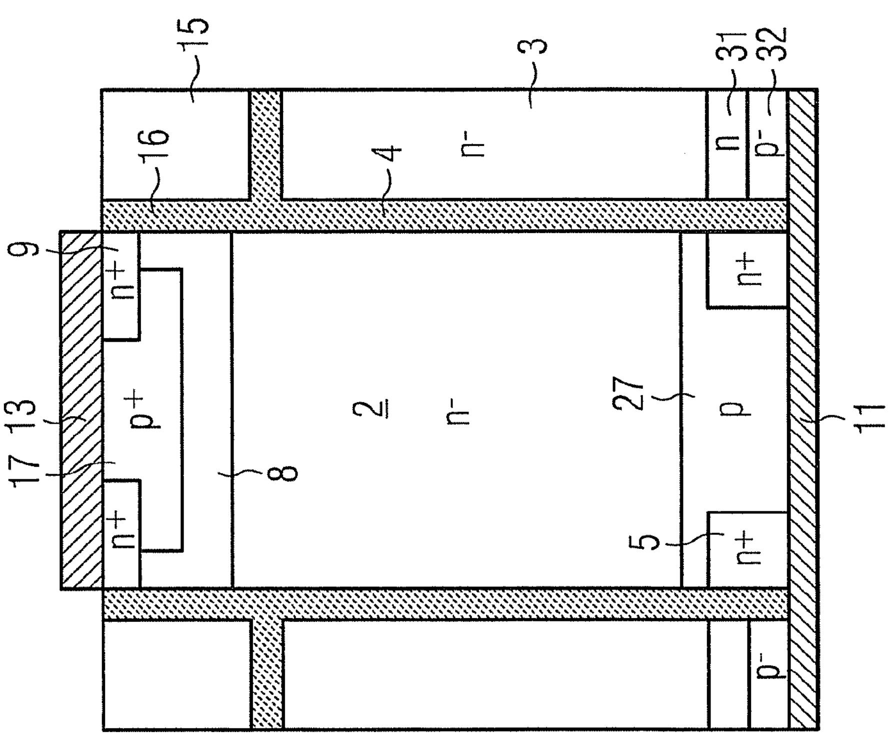
FIG. 34 illustrates a semiconductor component which is realized as a MOS transistor and in which a semiconductor region doped complementarily to the drain region is present, a drain electrode of the component making contact with the semiconductor region.

FIG. 34 illustrates one exemplary embodiment of a power component which, with regard to its switch-on, switch-off and overcurrent behavior, is improved by comparison with the semiconductor components explained above. In the case of this component, a semiconductor region 27 doped complementarily to the drift region is present adjacent to the drift region 2, and is connected to the drain electrode 11 together with the drain region 5. In a lateral direction the p-type region 27 extends between the drain regions 5 over the entire width of the drift region 2 between the accumulation dielectrics 4 of two drift control regions 3 that are adjacent to the drift region 2 on both sides. In this component, the drift control region 3 is connected to the drain electrode 11 via a diode formed by the connection regions 31, 32. For connecting the drift control region 3 to the drain electrode 11 it is also possible, however, to apply one of the other possibilities explained above, in one embodiment providing a Schottky diode.

The functioning or the effects of the p-type region 27 on the function of the semiconductor component are explained below:

for explanation purposes, a semiconductor component in the off state is initially assumed. As explained, with the component in the off state, a space charge region propagates in the drift region 2 and in the drift control region 3 under the control of the drift region 2. If the component is subsequently driven in the on state, then firstly an inversion channel forms along the gate dielectric 16 in the body region 8, such that charge carriers flow from the source region 9 via the inversion channel into the drift region 2. At the beginning of the driving operation, the accumulation channel has not yet formed in the drift region 2, such that the charge carriers flow in a manner distributed approximately homogeneously via the drift region in the direction of the drain region 5. In this case, an accumulation channel in the drift region 2 forms only when the voltage drop across the drift region 2 has fallen to such an extent that the potential difference between the drift control region 3 and the drift region 2 suffices for forming such an accumulation channel along the accumulation dielectric 4. In this component, at the beginning of the switch-on operation, the p-type region 27 adjacent to the drift region 2 supports a decrease in the voltage present across the drift region 2 and thus brings about an acceleration of the operation leading to the formation of the accumulation channel. This effect can be attributed to the fact that the p-type region 27 brings about a flooding of the drift region 2 with charge carriers. In the component in accordance with FIG. 34, the accumulation channel along the accumulation dielectric 4 also extends through the sections of the p-type region 27 that extends as far as the accumulation dielectric 4, as far as the drain region 5. In the switched-on state, that is to say after the formation of the accumulation channel, therefore, there is a shunt with respect to the p-doped region 27. In this component, the substantial portion of the charge carriers then flows via the inversion channel along the gate dielectric 16 and the accumulation channel along the accumulation dielectric 4 into the drain region 5. The rear-side emitter formed by the p-type region 27 is no longer effective, therefore, when the component is switched on. The magnitude of the p-type doping of the p-type region 27 can vary over a wide range. It should amount to at least one or more $10^{17}$ $cm^{-3}$, but can also be doped more highly. The lateral extent of the p-type region 27 should be designed in such a way that the vertical conductivity in the drain region 5 remains so high that at the nominal current of the component, the voltage drop in the drain region 5 is smaller than the diode threshold of the pn junction formed by the p-type region 27 and the drift region 2. The vertical extent of 27 is relatively insignificant; it should only be at least large enough that the p-type dose in the vertical direction suffices for good emitter properties, for example approximately $10^{13}$ $cm^{-2}$, which corresponds to a vertical dimension of 1 μm given a p-type doping of $10^{17}$ $cm^{-3}$.

Figure 35:
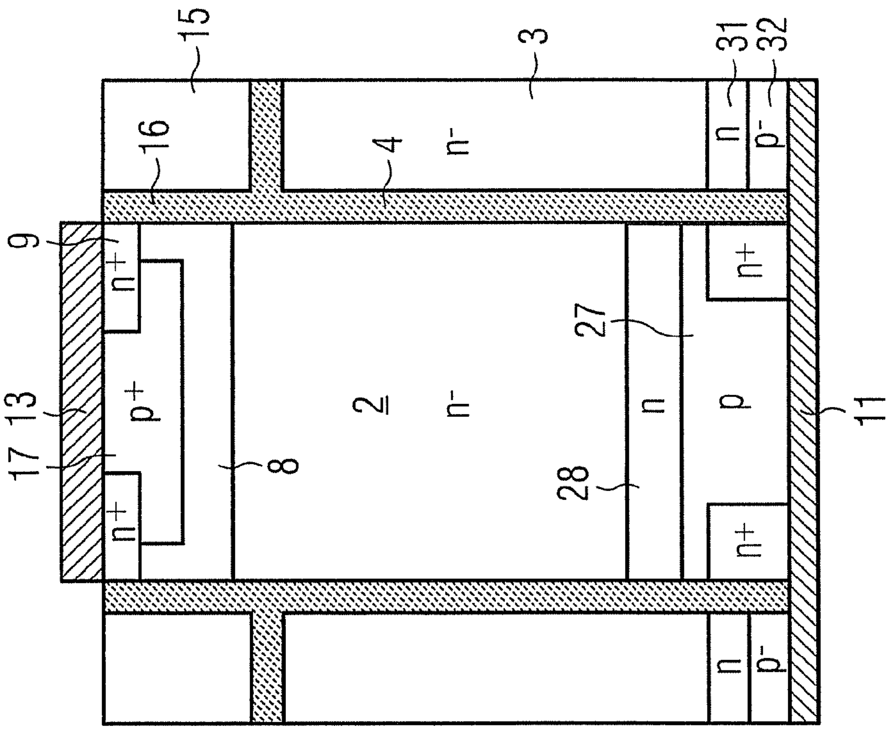
FIG. 35 illustrates a modification of the component illustrated in FIG. 34, in which a field stop region is arranged between a drift region and the component region doped complementarily to the drain region.

FIG. 35 illustrates a modification of the semiconductor component illustrated in FIG. 34. In the case of this component, a field stop region 28 of the same conduction type as the drift region 2 is disposed upstream of the p-type region 27. The field stop region 28, which is doped more highly than the drift region 2, extends in a lateral direction between the two accumulation dielectrics 4 bounding the drift region 2 illustrated in a lateral direction.

Figure 36:
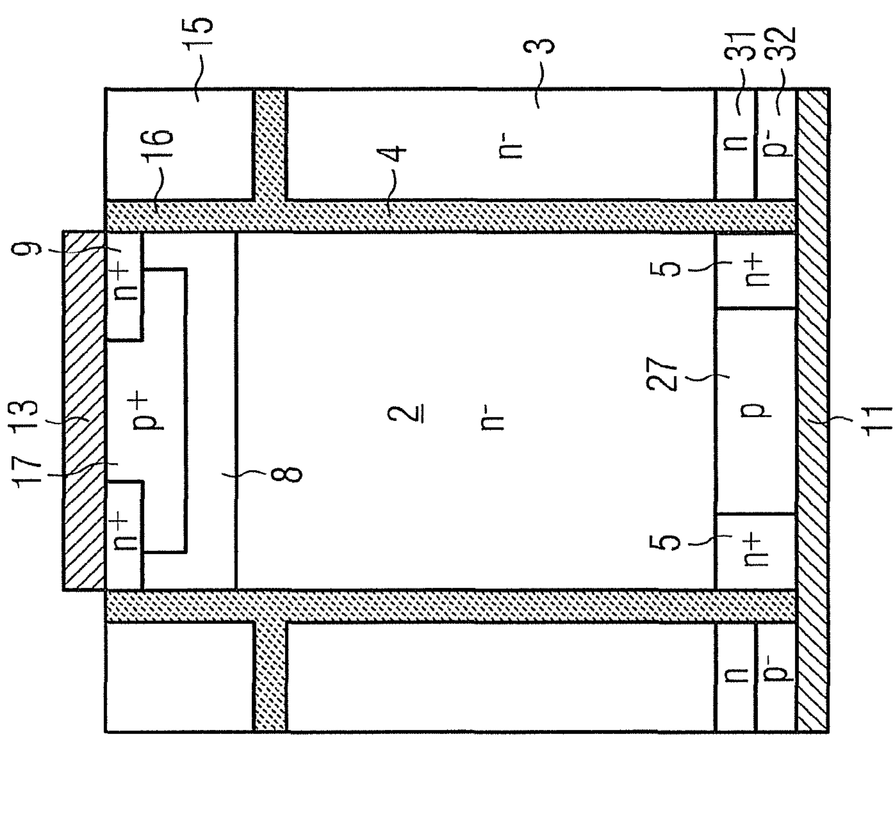

A further variant of the semiconductor component illustrated in FIG. 34 is illustrated in FIG. 36. In the case of this component, the dimensions of the p-type region 27 in the vertical direction of the semiconductor body 100 correspond to the dimensions of the drain region 5. Consequently, the p-type region 27 does not extend as far as the accumulation dielectric 4 in a lateral direction of the semiconductor body, such that, in the region of the accumulation dielectric 4, the drift region 2 is directly adjacent to the drain region 5.

Figure 37:
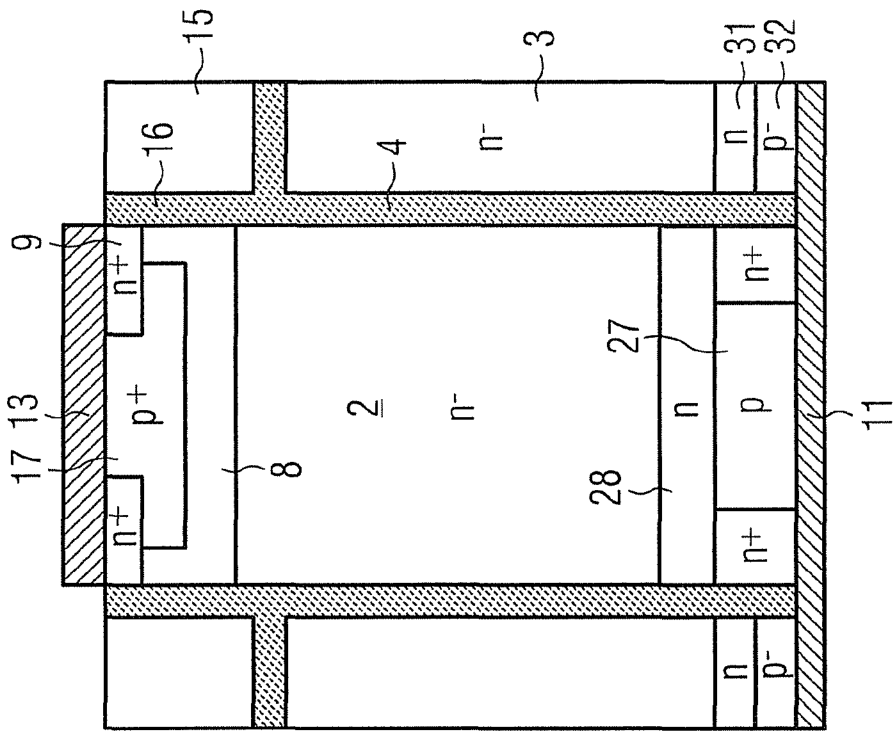
FIGS. 36 to 40 illustrate various modifications of the components illustrated in FIGS. 34 and 35.
Figure 38:
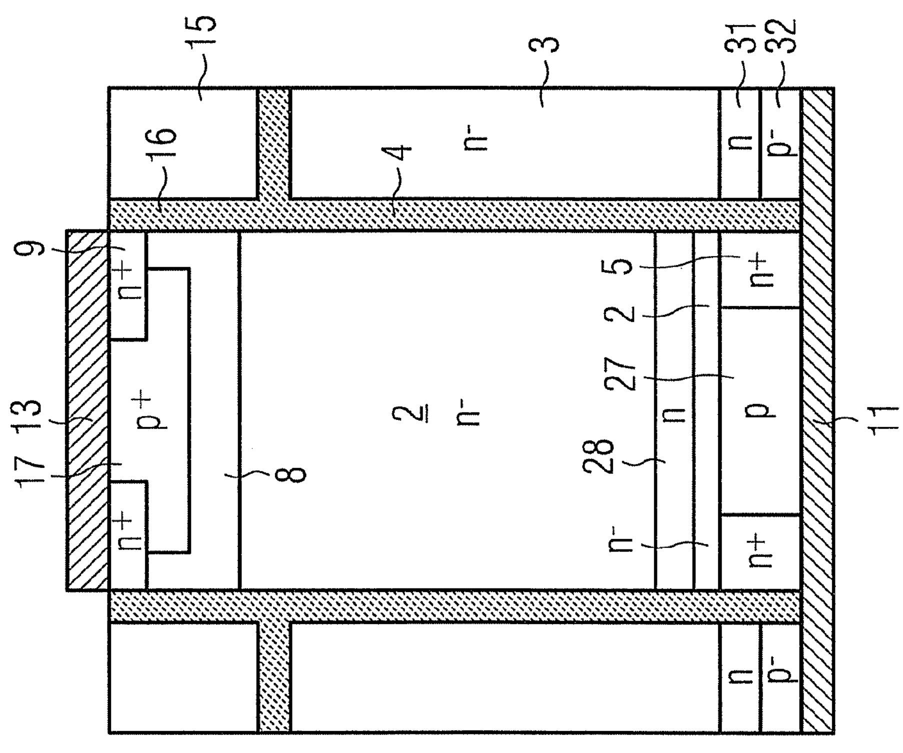

In a modification of the component illustrated in FIG. 36 which is illustrated in FIG. 37, the field stop region 28 is directly adjacent to the drain region 5 and the p-type region 27. As an alternative, the field stop region 28 can also be arranged at a distance from the drain region 5 and the p-type region 27, as is illustrated in FIG. 38. In the case of this component, a section of the drift region 2 is present between the field stop region 28 and the drain region 5 and respectively the p-type region 27.

Figure 39:
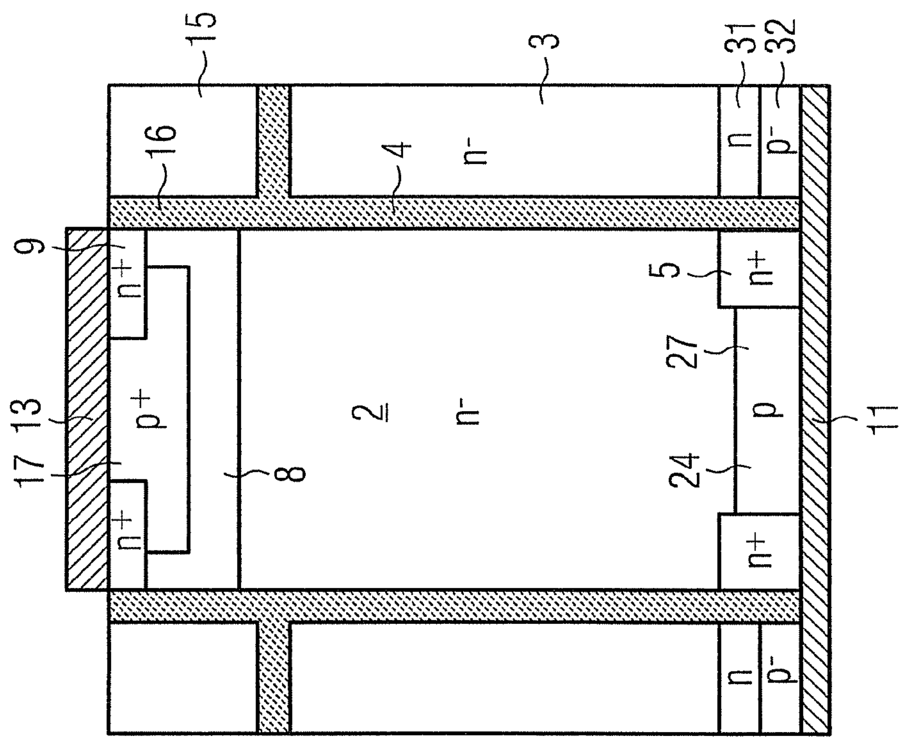

A further variant of the semiconductor component illustrated in FIG. 36 is illustrated in FIG. 39. In the case of this component, the dimensions of the p-type region 27 in the vertical direction are smaller compared with the dimensions of the drain region 5, such that the p-type region 27 is recessed relative to the drain region 5 in the direction of the drain electrode.

Figure 40:
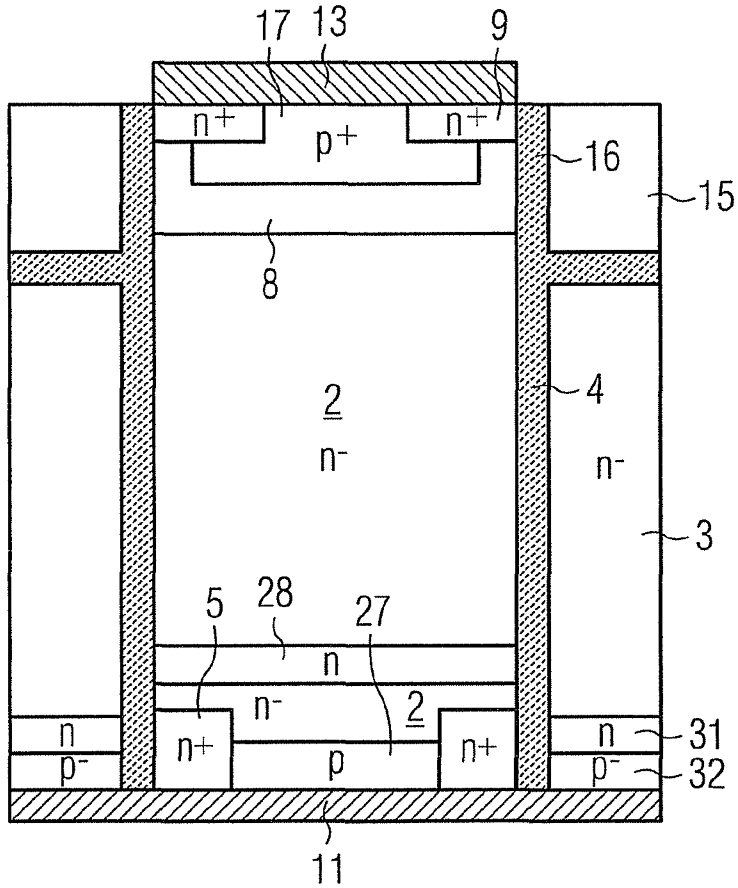

FIG. 40 illustrates the component in accordance with FIG. 39 with an additional field stop region 28 disposed upstream of the drain region and the p-type region 27.

Figure 41:
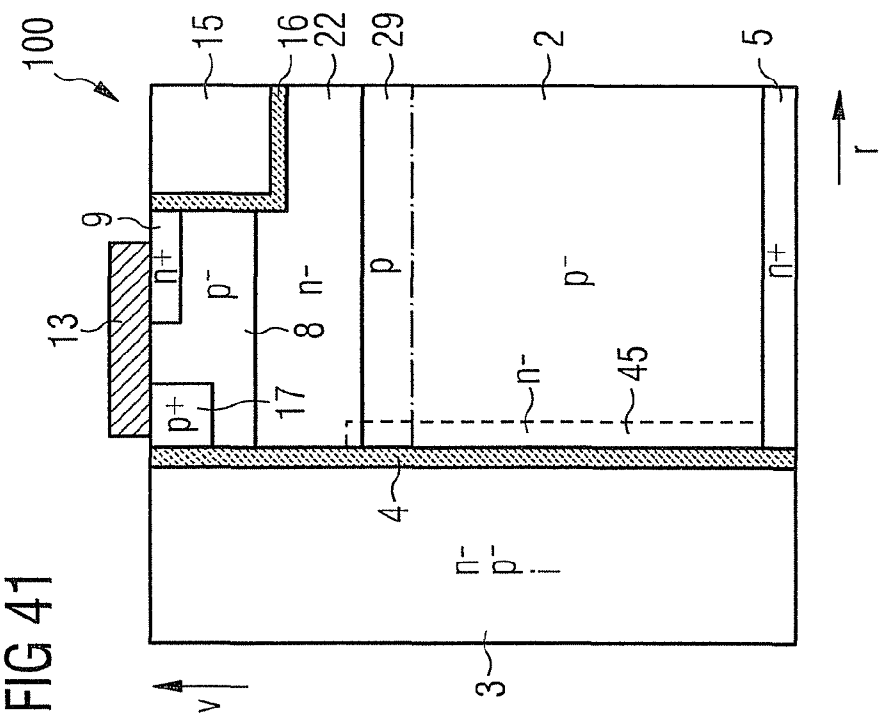
FIG. 41 illustrates a semiconductor component realized as a MOS transistor with a drift region doped complementarily to the drain region.

One exemplary embodiment of a power semiconductor component with a drift region 2, a drift control region 3 and an accumulation dielectric 4 arranged between the drift region 2 and the drift control region 3 is illustrated in FIG. 41. The component illustrated is realized as an n-conducting MOSFET with an n-doped source region 9 and an n-doped drain region 5, but a drift region 2 that is p-doped at least in sections. For reasons of clarity, the connection of the drift control region 3 to the drain region 5, the source region 9 and, if appropriate, the gate electrode 15 is not explained in greater detail in FIG. 41. This connection of the drift control region 3 to the semiconductor regions can be effected using any one of the possibilities explained above.

When the component is driven in the on state, that is to say when a positive voltage is applied between drain region 5 and source region 9, and a suitable driving potential is applied to the gate electrode 15, an inversion channel forms along the accumulation dielectric 4 in the p-doped drift region 2 in the component illustrated. In this component, therefore, the accumulation dielectric 4 has the function of an "inversion dielectric". For the sake of simplicity, however, in the present case the term "accumulation dielectric" is also used for a dielectric along which an inversion channel forms in a p-doped drift region 2.

In the component illustrated, the gate electrode 15 is arranged at a distance from the drift control region 3 in the lateral direction r of the semiconductor body 100. An inversion channel that forms along the gate dielectric 16 in the body region 8 when the component is driven in the on state and the inversion channel that forms along the accumulation dielectric 4 in the p-type drift region 2 are therefore arranged at a distance from one another in a lateral direction. In order to bridge this distance, an n-doped intermediate region 22 is arranged between the body region 8 and the p-type drift region 2, which intermediate region increases the transverse conductivity between these two channels, or in the present case actually first enables an electron flow between these two channels.

Figure 42:
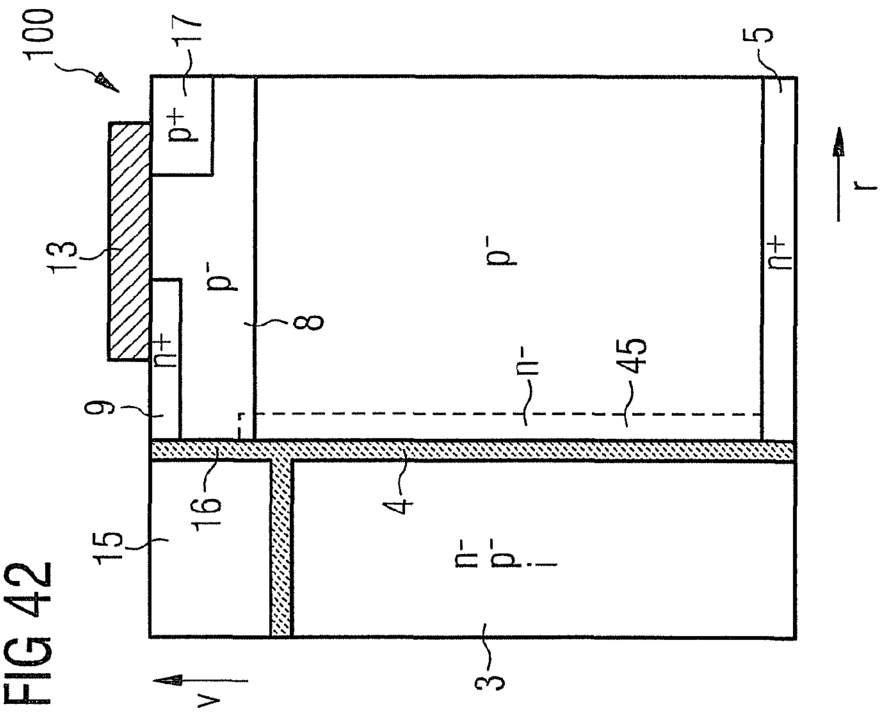
FIG. 42 illustrates a modification of the component illustrated in FIG. 41, a gate electrode being arranged above a drift control region in a vertical direction.

FIG. 42 illustrates a modification of the component illustrated in FIG. 41. In the case of this component, the gate electrode 15 is arranged above the drift control region 3 in the vertical direction v of the semiconductor body. In the case of this component, the p-type drift region 2 is directly adjacent to the p-doped body region 8. The interconnection of the drift control region 3 with the drain region 5 and the source region 9 and respectively the gate electrode 15 is not illustrated in detail in the component illustrated in FIG. 42 either. This interconnection can be effected in any manner explained above. The doping concentration of the p-type drift region 2 lies within the range of $10^{14}$ $cm^{-3}$ to $5 \cdot 10^{15}/cm^{-3}$, for example, and is thus significantly lower than that of the body region 8.

In the case of the component illustrated in FIG. 41, a more highly p-doped region 29 can optionally be provided between the drift region 2 and the intermediate region 22 running transversely. The task of this p-type region 29 is to reduce the electric field strength below the body region 8 and the gate electrode 15 when the component is driven in the off state. Moreover, a weakly n-doped semiconductor region 45 can optionally be provided in the p-type drift region 2 along the accumulation dielectric 4, an accumulation channel forming in the semiconductor region when the component is driven in the on state. The doping concentration of the region 45 lies for example within the range of $10^{15}$ $cm^{-3}$ to $5 \cdot 10^{16}$ $cm^{3}$, and the width/dimension of the region in a lateral direction lies for example within the range of between 0.2 μm-2 μm.

This very thin n-doped semiconductor region 45 has only little influence on the off-state behavior of the component, but provides for an improved switch-on behavior since a conducting channel for majority charge carriers is always present along the accumulation dielectric 4. This n-type region 45 extends in the vertical direction from the n-conducting intermediate region 22 as far as the drain region 5. Such an n-type region can also be provided in the case of the component in accordance with FIG. 42. In the case of this component, the n-type region extends from the body region 8 as far as the drain region 5. In the case of the component in accordance with FIG. 42, in which the gate electrode 15 and the drift control region 3 lie one above another in the vertical direction, such a thin and weakly n-doped region 45 can also be dimensioned in such a way that it extends in the vertical direction only from the gate electrode 15 via the dielectric separating the gate electrode 15 and the drift control region 3 to the level of the drift control region 3 in order thereby to bridge, in the p-type drift region 2, the section between the inversion channel that forms with the component in the on state along the gate dielectric 16 and the accumulation channel propagating along the accumulation dielectric 4.

Figure 43:
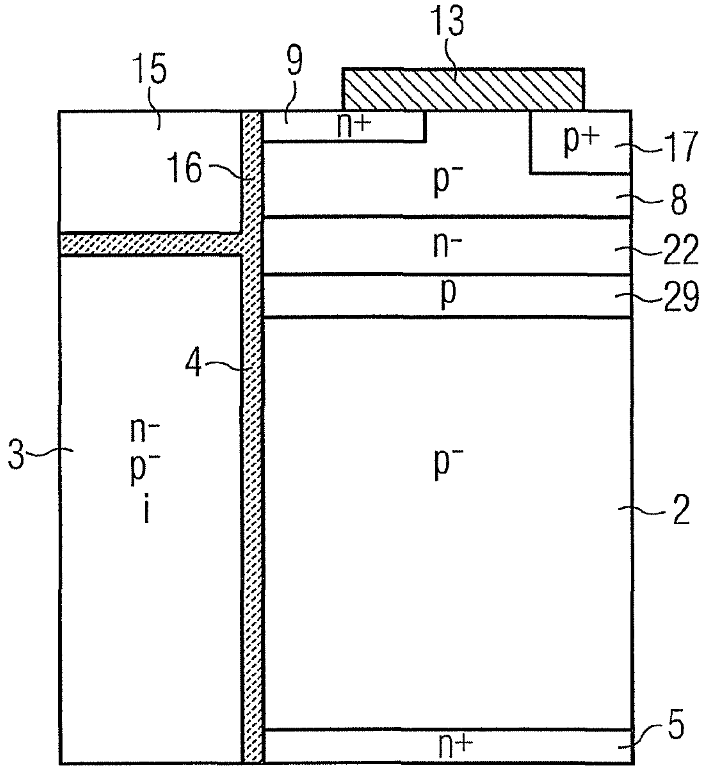
FIG. 43 illustrates a modification of the component illustrated in FIG. 42.

FIG. 43 illustrates a modification of the component illustrated in FIG. 42. In the case of this component, a more highly p-doped region 29 is adjacent to the p-type drift region 2 and has the function of reducing the field strength loading in the upper region of the drift region 2. A weakly n-doped region 22 is provided between the more highly p-doped region 29 and the drift region 8, and serves to “bridge” the semiconductor region between the gate dielectric 16, along which an inversion channel forms in the body region 8 when the component is driven in the on state, and along the accumulation dielectric 4, along which an accumulation channel forms when the component is driven in the on state. It should be pointed out that the doping of the p-type region 29 must not, of course, be so high that the channel is pinched off along the accumulation dielectric 4.

It should be pointed out that the drift control region 3, for realizing an n-conducting semiconductor component, need not necessarily be n-doped. As is explicitly illustrated in FIGS. 41 to 43, the drift control region 3 can alternatively also be weakly p-doped or intrinsic. This applies to all of the power semiconductor components which have been explained above and those which will be explained below.

Figure 44:
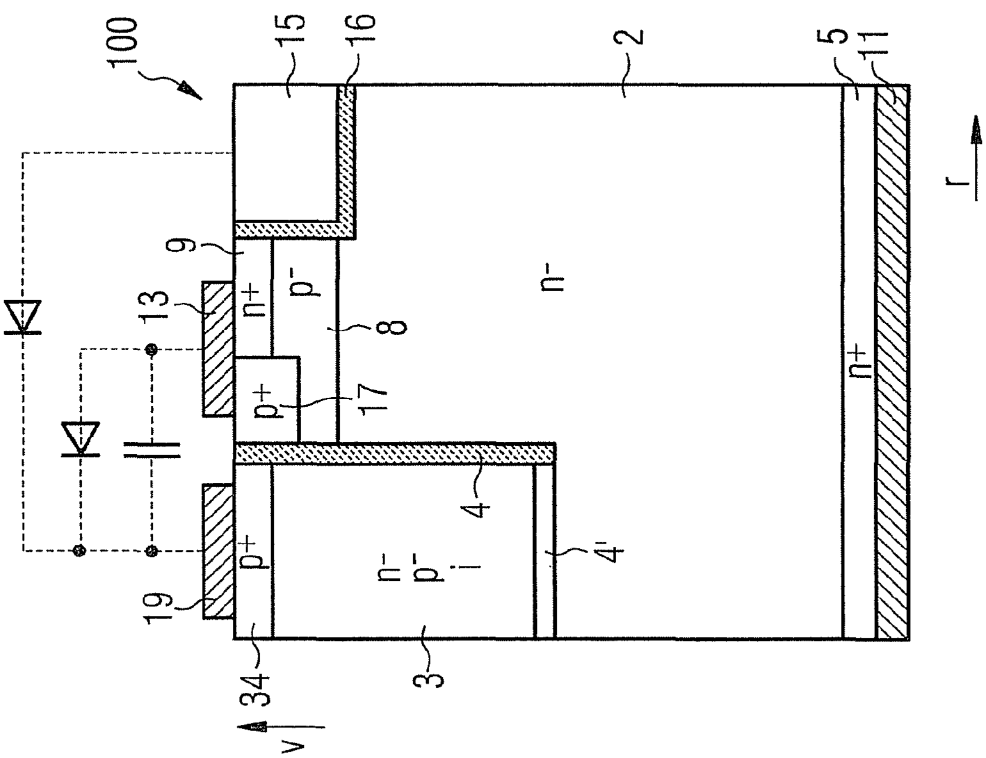
FIG. 44 illustrates a semiconductor component which is realized as a MOS transistor and in which a tunnel dielectric and a section of a drift region are arranged between a drift control region and a drain region of the component.

FIG. 44 illustrates one exemplary embodiment of a power semiconductor component. The component illustrated is realized as a vertical n-conducting MOSFET. In the case of this component, the drift control region 3 is arranged adjacent to the drift region 2 only in sections, that is to say does not extend completely along the drift region 2 in the vertical direction v of the semiconductor body 100. In the case of the component illustrated, the drift control region 3 is arranged at a distance from the drain region 5 in the upper region of the semiconductor body 100, a section of the drift region 2 being arranged between the drift control region 3 and the drain region 5. In the case of the component illustrated, the drift control region 3 is dielectrically insulated from the drift region 2 by the accumulation dielectric 4 in a lateral direction r of the semiconductor body. A tunnel dielectric 4' is present between the drift control region 3 and the drift region 2 in the vertical direction of the semiconductor body, the tunnel dielectric serving to be able to dissipate “hot reverse currents” and “displacement currents” from the drift control region 3.

The drift control region 3 can be connected to the source region 9 and, if appropriate, the gate electrode 15 by using a highly doped connection region 34 and also diodes and a capacitance (illustrated by dashed lines) in the manner already explained.

The component in accordance with FIG. 44 is based on the basic structure of a trench MOSFET wherein the drift control region 3 is additionally present along the drift region 2. In the case of this trench MOSFET, the gate electrode 15 is arranged in a trench extending into the semiconductor body proceeding from the front side 101. In the case of this component, an inversion channel in the body region 8 forms in the vertical direction between the source region 9 arranged in the region of the front side 101 and the drift region 2 adjacent to the body region 8 in the vertical direction.

Figure 45:
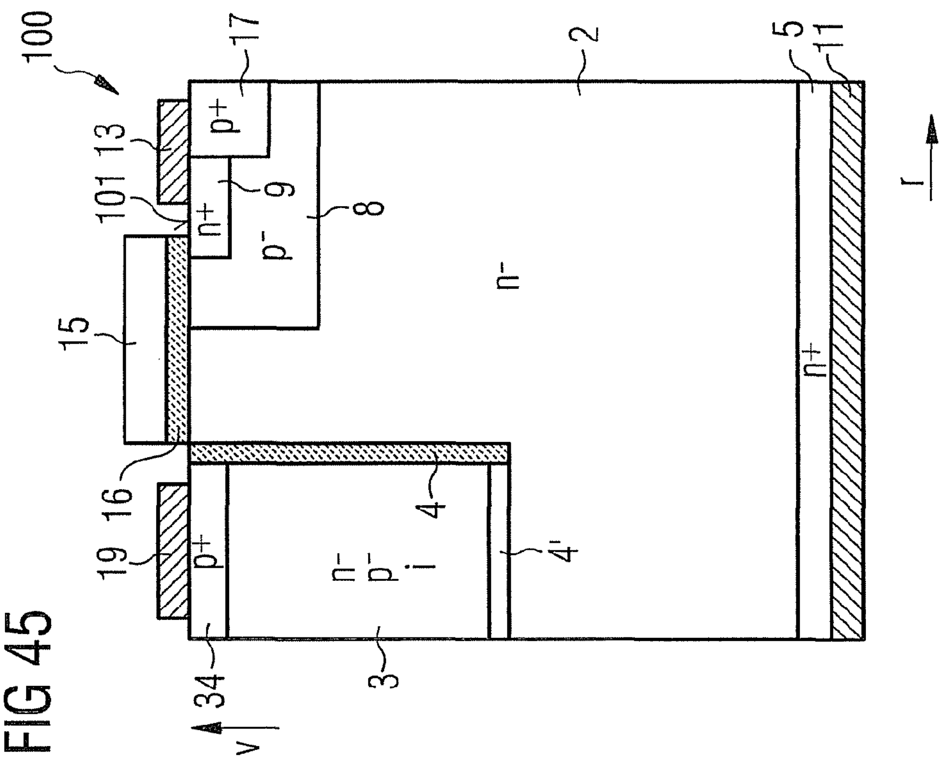
FIG. 45 illustrates a component which is modified relative to the component in FIG. 44 and which is realized as a planar MOS transistor.

FIG. 45 illustrates a modification of the component illustrated in FIG. 44. The component illustrated in FIG. 45 is based on the basic structure of a planar MOSFET. In the case of the component illustrated, the gate electrode 15 is arranged above the front side 101 of the semiconductor body 100 and is insulated from the semiconductor body 100 by the gate dielectric 16. In a lateral direction r of the semiconductor body 100, the gate electrode 15 extends as far as the accumulation dielectric 4 extending into the semiconductor body 100 in the vertical direction v. However, the gate electrode 15 can also already end before the accumulation dielectric 4 in a lateral direction (not illustrated), but should extend in a lateral direction from the source region 9 as far as a section of the drift region 2 which extends as far as the front side 101. In the case of the component illustrated, in the on state, an inversion channel forms in a lateral direction in the body region 8 between the source region 9 and that section of the drift region 2 which extends as far as the front side 101. The body region 8 is furthermore formed in such a way that it encloses the source region 9 in a lateral and vertical direction of the semiconductor body 100.

Figure 46:
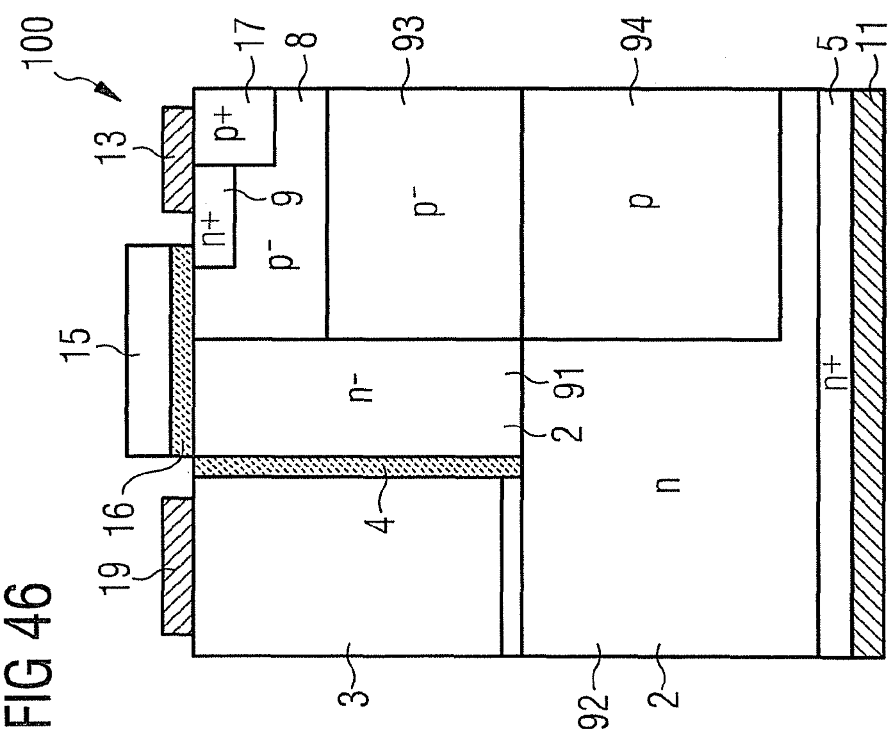
FIG. 46 illustrates a component which is modified relative to FIG. 45 and in which semiconductor regions doped complementarily to one another are present in the drift region.

FIG. 46 illustrates a component modified relative to the component in FIG. 45. In the case of this component, the drift region 2 includes two differently doped semiconductor sections, namely a first, more weakly doped semiconductor section 91 adjacent to the accumulation dielectric 4 and a second, more highly doped semiconductor section 92 in the region between the drift control region 3 and the drain region 5. Compensation regions 93, 94 doped complementarily to the drift region 2 are additionally present in the case of this component. A first one 93 of the compensation regions is arranged adjacent to the more weakly doped drift region section 91 in a lateral direction r of the semiconductor body, and a second one 94 of the compensation regions is arranged adjacent to the more highly doped drift region section 92 in a lateral direction r. In this case, the doping concentration of the first compensation region section 93 is lower than that of the second compensation region section 94.

Referring to FIG. 46, the drift region 2 can be realized in such a way that a section of the more highly doped drift region section 92 is arranged between the compensation region section 94 and the drain region 5. The compensation region sections 93, 94 are arranged directly adjacent to one another in the vertical direction v of the semiconductor body. The first compensation region section 93 is furthermore directly adjacent to the body region 8 in the vertical direction v.

The task of the compensation region sections 93, 94, when the component is driven in the off state, is to compensate for n-type dopant atoms of the drift region 2 by p-type dopant atoms in the compensation regions 93, 94. This compensation effect occurs in one embodiment in the lower region of the semiconductor body, in which the more highly doped drift region section 92 and the more highly doped compensation region section 94 adjoin one another. The compensation effect explained makes it possible, given the same dielectric strength as a corresponding component without compensation regions, to dope the drift region more highly, which results in a reduction of the on resistance.

Figure 47:
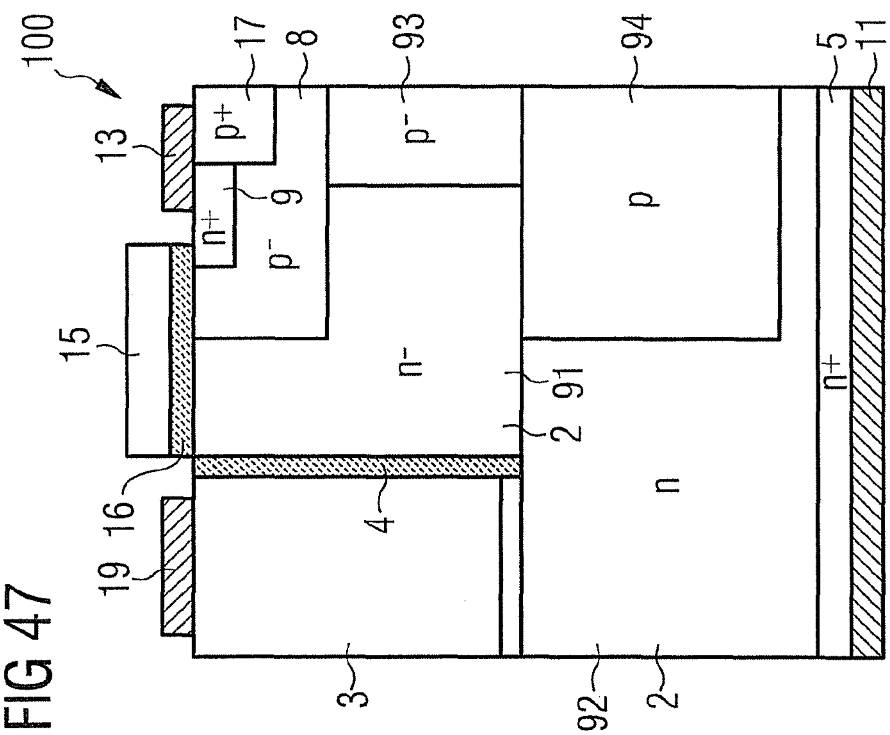
FIG. 47 illustrates a semiconductor component which is modified relative to the component in FIG. 46.

FIG. 47 illustrates a variant of the component illustrated in FIG. 46 in which the more weakly doped compensation region section 93 has smaller dimensions than the more highly doped compensation region section 94 in a lateral direction of the semiconductor body. In the case of this component, the more lightly doped compensation region section 93 serves to a lesser extent for the compensation of the dopant atoms in the more weakly doped drift region section 91, but rather serves essentially for connecting the more highly doped compensation region section 94 to the body region 8.

Method steps for producing a semiconductor structure which is used for the components in accordance with FIGS. 44 to 47 and in which a drift control region 3 is arranged adjacent to the drift region 2 only in sections are explained below with reference to FIGS. 48A to 48D.

In this method, firstly a semiconductor substrate is made available, which forms the later drain region 5 of the semiconductor component and to which a semiconductor layer 2' is subsequently applied by using an epitaxy method, the semiconductor layer forming a part of the later drift region 2 of the semiconductor component. In order to realize an n-conducting power component, the semiconductor substrate 5 is n-doped, and the epitaxial layer 2' can be n-doped or p-doped. A tunnel dielectric 4' is subsequently applied in sections on the epitaxial layer 2', the tunnel dielectric serving for the later separation of the drift control region 3 and the drift region 2. The production of the tunnel dielectric 4' can be effected for example by whole-area deposition of a suitable dielectric layer and subsequent selective removal of the dielectric layer by using an etching method. The result of these method steps explained above is illustrated in FIG. 48A.

Figure 48B:
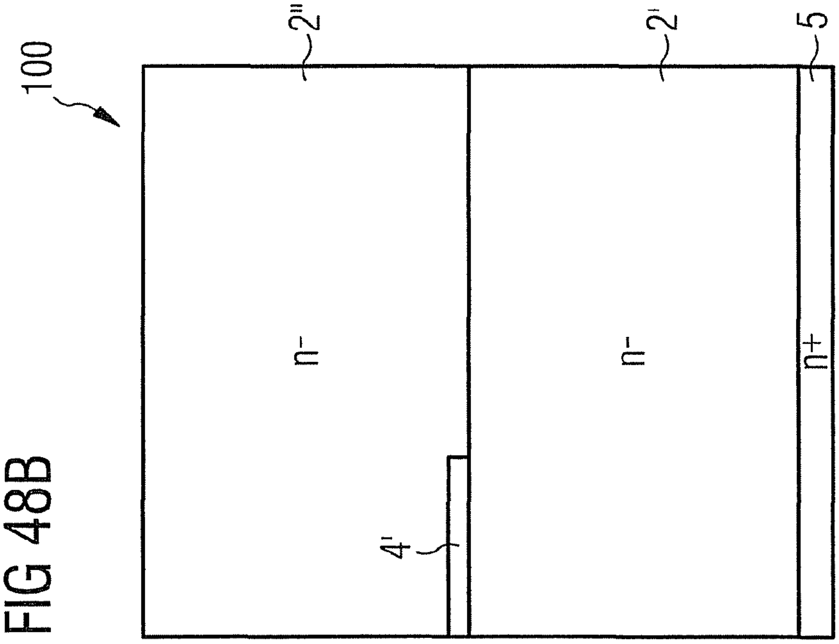
FIGS. 48A-48D illustrate individual method steps for producing the semiconductor components illustrated in FIGS. 44 to 47.
Figure 48A:
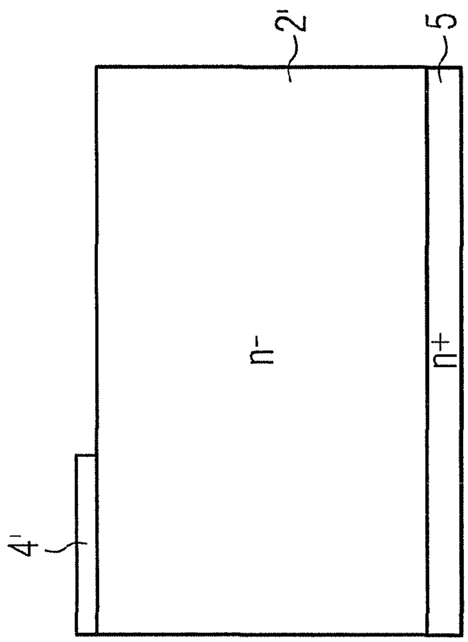
Figure 48D:
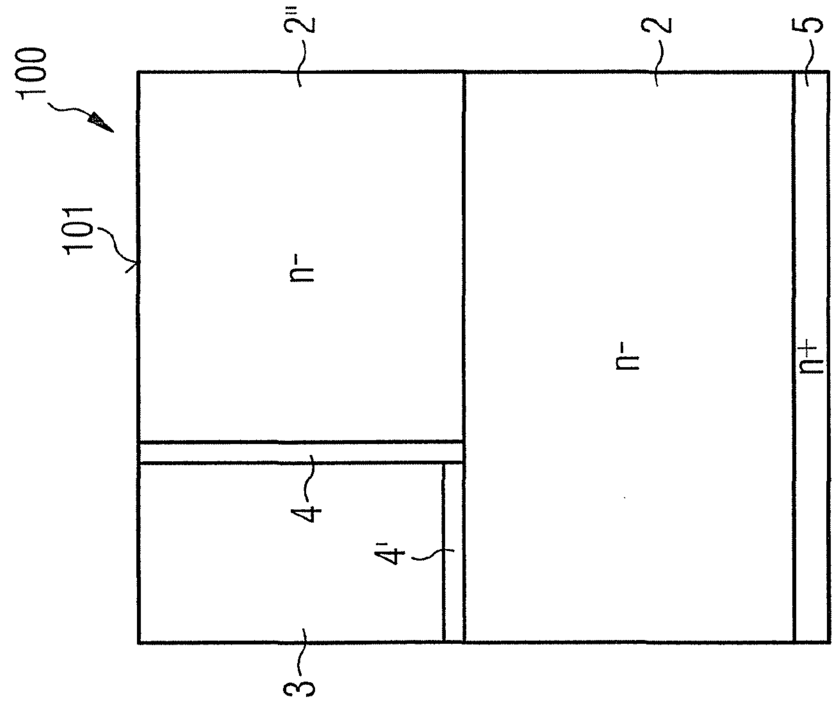

Referring to FIG. 48B, a further epitaxial layer 2" is subsequently applied to the first epitaxial layer 2' and the tunnel dielectric 4'. The tunnel dielectric 4' is therefore overgrown epitaxially by the further epitaxial layer 2".

Figure 48C:
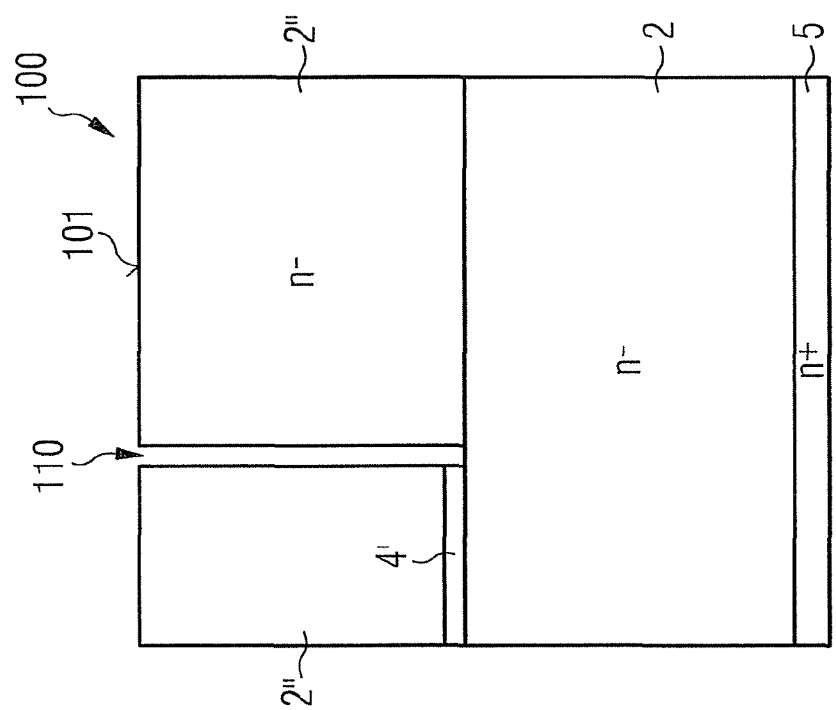

Referring to FIG. 48C, a trench 110 is etched proceeding from a front side 101 of the semiconductor body 100 present after the deposition of the second epitaxial layer 2", which trench extends to the level of the tunnel dielectric 4' in the vertical direction and extends as far as the tunnel dielectric 4' in a lateral direction. This trench is subsequently filled with a material suitable for realizing the accumulation dielectric 4, which is illustrated as the result in FIG. 48D. The accumulation dielectric can be for example a thermal semiconductor oxide—e.g., silicon oxide in the case of a semiconductor body 100 composed of silicon—which can be produced by heating the semiconductor body 100.

In the case of this semiconductor structure, a section of the second epitaxial layer 2" which is bounded by two trenches 110, only one of which is illustrated in FIG. 48C, in a lateral direction and by the tunnel dielectric 4' in a vertical direction forms the later drift control region 3, while remaining regions of the second epitaxial layer 2" form a part of the later drift region 2. The method steps for producing the semiconductor structure with the drift region 2, the drift control region 3 and the accumulation dielectric 4 as explained with reference to FIGS. 48A to 48D can be followed by fundamentally known further method steps for realizing the transistor structure in the region of the front side 101 of the semiconductor body, that is to say method steps for producing the source region 9, the body region 8, the gate electrode 15 and the gate dielectric 16.

The epitaxial layers 2', 2" explained above can be doped to different degrees in order in this way to produce the drift region sections 91, 92 which are doped to different degrees. The compensation region sections 93, 94 can be produced as early as during the epitaxy method by a procedure in which, in each case after the epitaxial deposition of a layer having a specific thickness, p-type dopant atoms are locally introduced into the epitaxially deposited layer. These introduced dopant atoms are finally indiffused into the semiconductor body by using a diffusion method and then form the continuous compensation regions 93, 94.

As was explained with reference to FIGS. 17 to 20, a capacitor 50 can be provided between the drift control region 3 and the source region 9, which capacitor, when the component is driven in the off state, serves for buffer-storing the charge carriers required, when the component is driven in the on state, in the drift control region 3 for forming an accumulation channel along the accumulation dielectric 4. One possibility for realizing the capacitor 50 is explained below with reference to FIGS. 49A and 49B.

Figure 49A:
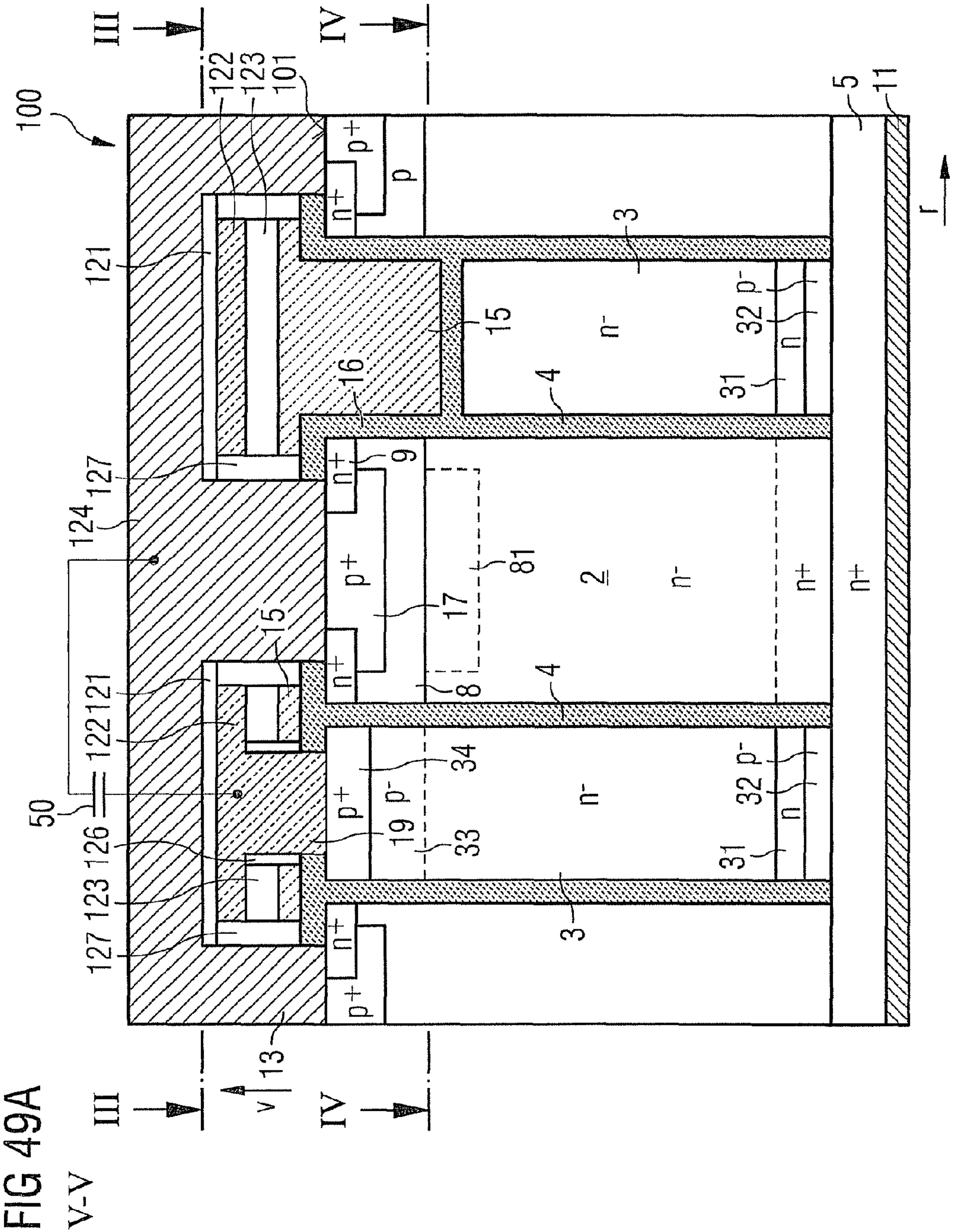
FIGS. 49A-49B illustrate a semiconductor component which is realized as a MOS transistor and which has a capacitance between a source electrode and a drift control region, the capacitance being integrated between two conducting layers above a semiconductor body.
Figure 49B:
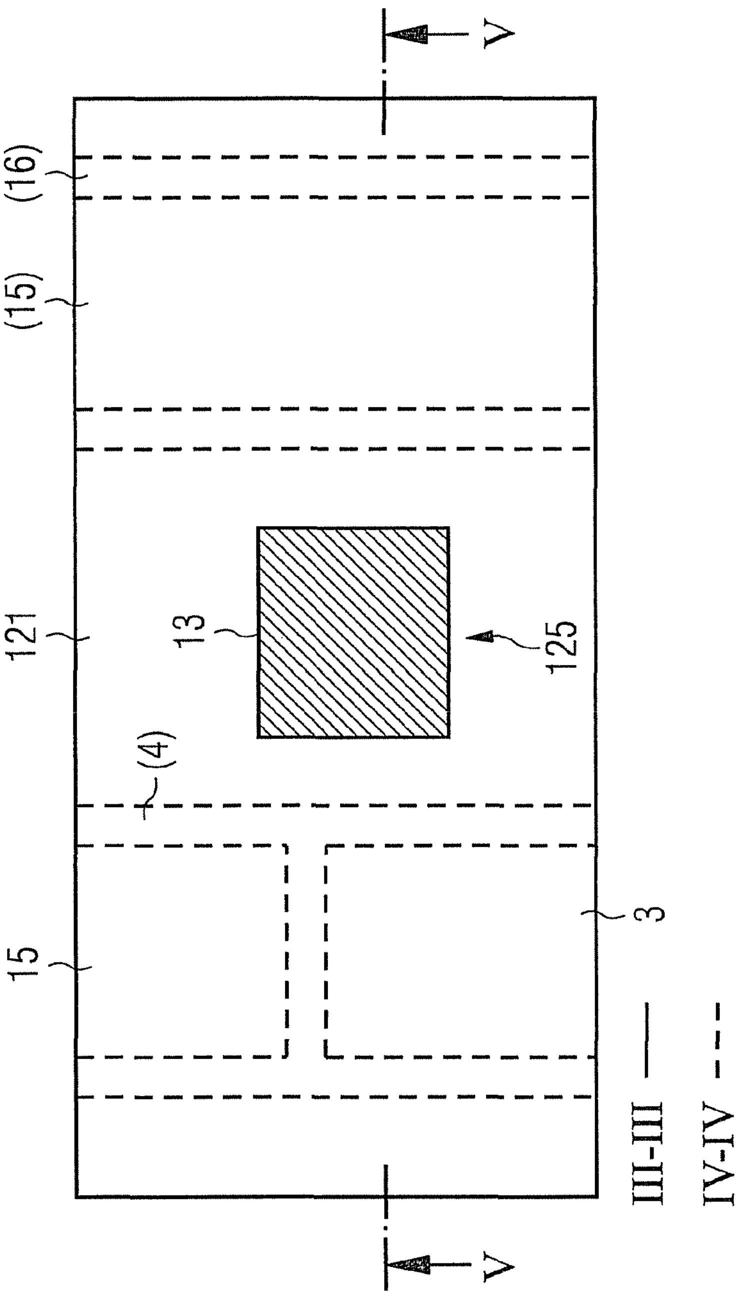

In this case, FIG. 49A illustrates an excerpt from the semiconductor component in side view in cross section. FIG. 49B illustrates a cross section through the component in two sectional planes III-III and IV-IV illustrated in FIG. 49A. The component structures of the sectional plane III-III are illustrated by solid lines in FIG. 49B, and the component structures of the sectional plane IV-IV are illustrated by dashed lines. In this case, the numerals between parentheses denote the reference symbols of the component structures of the sectional plane IV-IV.

In the case of the component illustrated, the capacitor 50 includes a dielectric layer 121 arranged between two metallization layers 122, 124. A first one 122 of the metallization layers is arranged below the capacitor dielectric layer 121 with respect to the semiconductor body 100, that is to say between the capacitor dielectric layer 121 and the semiconductor body 100. In this case, this first metallization layer 122 is connected to the drift control region 3 either directly or, as illustrated in FIG. 49A, via at least one of the connection regions 33, 34 explained above. In this case, the first metallization layer 122 has metallization sections which extend in sections as far as the front side 101 of the semiconductor body in order to make contact with the drift control region 3 directly or indirectly there. In this case, that section of the first metallization layer 122 which extends in the direction of the front side 101 forms the connection contact 19 of the drift control region 3 explained with reference to FIGS. 17 to 19. The second one 124 of the metallization layers is arranged above the capacitor dielectric 121 and is therefore dielectrically insulated from the first metallization layer 121 by the capacitor dielectric 121.

The capacitor dielectric 121 and the first metallization layer 122 have cutouts 125 through which the metallization layer 124 extends as far as the front side 101 of the semiconductor body, where it makes contact with the source region 9 and, via a highly doped connection region 17, the body region 8. Within the cutout 125, the second metallization layer 124 is insulated from the first metallization layer 122 by using an insulation layer 127, for example an oxide. In the case of this component, the second metallization layer 124 simultaneously forms the source electrode 13 of the component.

The transistor illustrated in FIGS. 49A and 49B is realized as a trench transistor, the gate electrode 15 of which is arranged in a trench extending into the semiconductor body proceeding from the front side 101. In the case of this component, the gate electrode 15 is arranged above the drift control region 3 in a vertical direction v, the drift control region 3, as is illustrated in the left-hand part of FIGS. 49A and 49B, extending in sections as far as the front side 101 and being connected to the connection electrode 19 there. A further insulation layer 123, for example an oxide layer, is arranged between the gate electrode 15, which extends beyond the front side 101 of the semiconductor body in the example illustrated, and the first metallization layer 122.

In a manner not illustrated in greater detail, the gate electrode 15 can, of course, also be arranged at a distance from the drift control region 3 in a lateral direction. In this case, the drift control region 3 can adjoin the front side 101 of the semiconductor body over its entire length directly or indirectly via connection regions 33, 34.

Individual method steps for producing the component illustrated in FIGS. 49A and 49B are briefly explained below:

after producing the transistor structures in the semiconductor body 100, that is to say after producing the source region 9, the body region 8 and the highly doped connection region 17, and also after producing the drift control region 3 and the trench structure for realizing the gate electrode 15, a conductive layer (e.g., doped polysilicon) is applied to an insulation layer above the front side 101 of the semiconductor body. In this case, the insulation layer can be formed by the same insulation layer that forms the gate dielectric 16 and the accumulation dielectric 4 within the semiconductor body. The conductive layer, which fills a trench provided for the gate electrode 15, forms the gate electrode 15 of the component. The insulation layer 123 is subsequently applied to the conductive layer. In the insulation layer 123 and the conductive layer forming the gate electrode 15, a contact hole is subsequently produced above the drift control region 3, the insulation layers 126 being produced on the sidewalls of the contact hole. The first metallization layer 122 of the capacitor is subsequently deposited onto the insulation layer 123 and into the contact hole. Afterward, the capacitor dielectric 121 is applied to the first metallization layer 122 and contact holes are produced above the source regions 9, the contact holes extending through the capacitor dielectric 121, the insulation layer 123, the conductive layer forming the gate electrode 15, and the insulation layer applied directly to the front side 101. On the sidewalls of the contact holes, the insulation layers 127 are then produced at least on uncovered regions of the first metallization layer 122. The second metallization layer 124 is subsequently deposited above the capacitor dielectric 121 and in the contact hole produced previously. In this case, the production of the capacitor dielectric 121 can be effected either before or after the production of the contact hole above the source region 9. When depositing the capacitor dielectric 121 after the production of the contact hole, however, the capacitor dielectric should be removed again at least at the bottom of the contact hole before the production of the second metallization layer 124.

Further possibilities of realizing the capacitor 50 between the source region 9 and the drift control region 3 are explained below with reference to FIGS. 50 to 56.

Figure 50B:
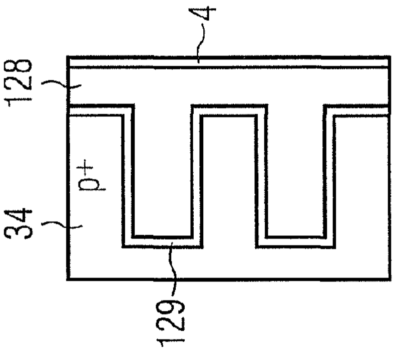
FIGS. 50A-50B to 56 illustrate further possibilities for realizing a capacitance in a semiconductor body.
Figure 50A:
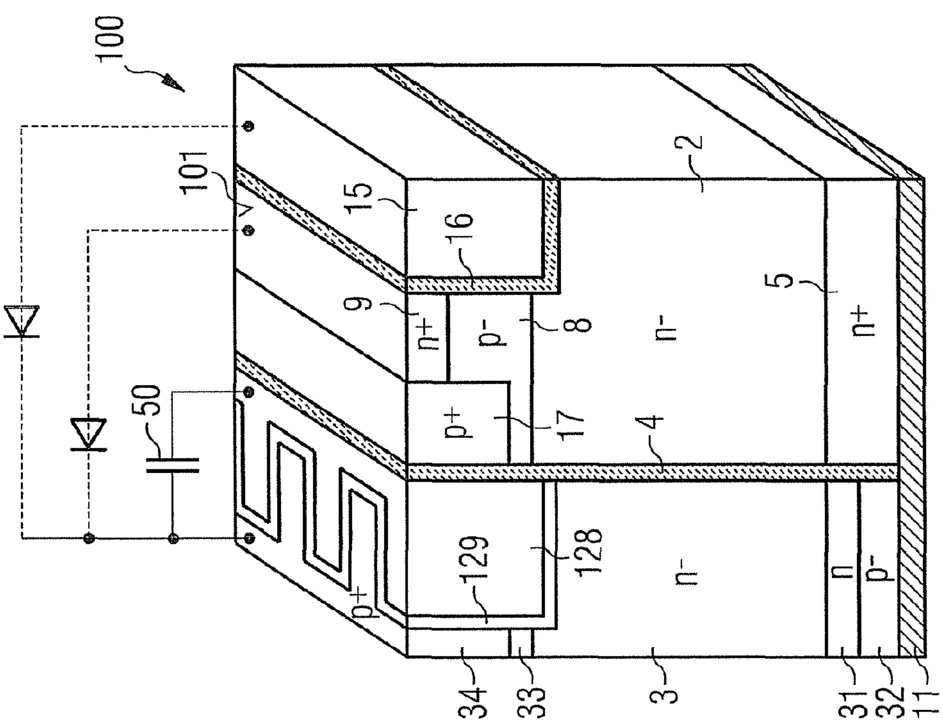

FIG. 50A illustrates an excerpt from one exemplary embodiment of the semiconductor component in a perspective illustration. FIG. 50B illustrates a capacitor structure of the component in a plan view of the front side 101 of the semiconductor body 100.

This component is realized as a trench MOSFET in accordance with the component in FIG. 17A and differs from the component illustrated in FIG. 17A by virtue of the fact that the storage capacitor 50 between the source region 9 and the drift control region 3 is integrated in the semiconductor body above the drift control region 3. In the case of this component, the capacitor 50 has a first capacitor electrode 128, which is arranged in a trench above the drift control region 3 in the semiconductor body 100. In the exemplary embodiment illustrated, the trench is delimited in a lateral direction by the dielectric layer 4 forming the accumulation dielectric 4. The first capacitor electrode 128 is dielectrically insulated from the drift control region 3 and also the connection regions 33, 34 adjacent to the drift control region 3, if appropriate, by using a capacitor dielectric 129. In one embodiment the highly doped connection region 34 in the region of the front side 101 of the semiconductor body forms the second capacitor electrode in the case of this component. In order to achieve a highest possible storage capacitance of the storage capacitor 50, the capacitor electrode 128 is embodied in finger-shaped fashion on the side remote from the accumulation dielectric layer 4.

In the case of this component, the source electrode can be connected directly to the first capacitor electrode 128. Moreover, the source electrode and the gate electrode 15 can be connected via diodes to the drift control region 3, or the connection region 34 thereof, in the manner already explained with reference to FIG. 17A.

Figure 51:
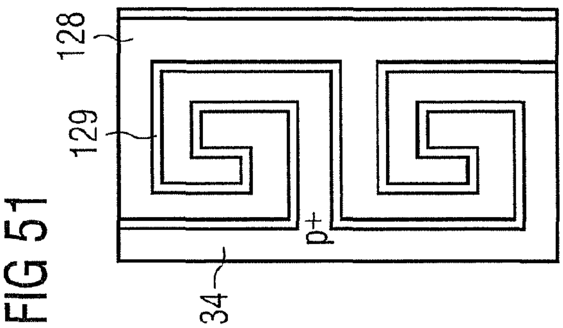

FIG. 51 illustrates a plan view of a variant of the capacitor structure integrated in the semiconductor body 100 that has already been explained. In the case of this capacitor structure, the first capacitor electrode 128 has a meandering structure in sections, whereby the interface and hence the area of the capacitor dielectric 129 between the first capacitor electrode 128 and the second capacitor electrode 34 is increased further by comparison with the finger-shaped structure in accordance with FIG. 50. The first capacitor electrode 128 can include a highly doped polysilicon, for example.

Figure 52:
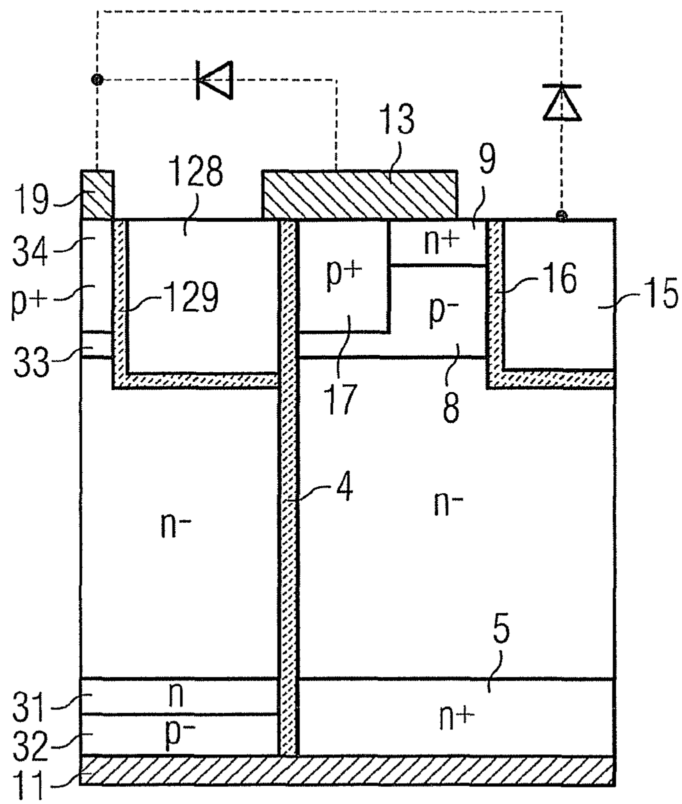

Referring to FIG. 52, the source region 9 can be directly connected to the first capacitor electrode 128 by using the source electrode 13. In this case, the source electrode 13 extends in a lateral direction r of the semiconductor body 100 from the source region 9 via the highly doped body connection region 17 as far as the first capacitor electrode 128.

Figure 53B:
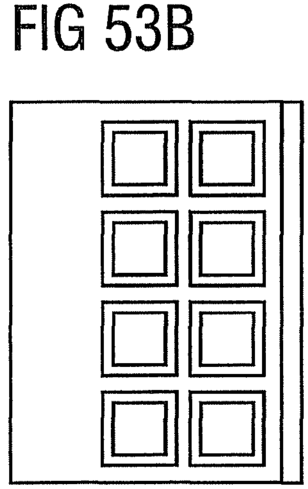
Figure 53A:
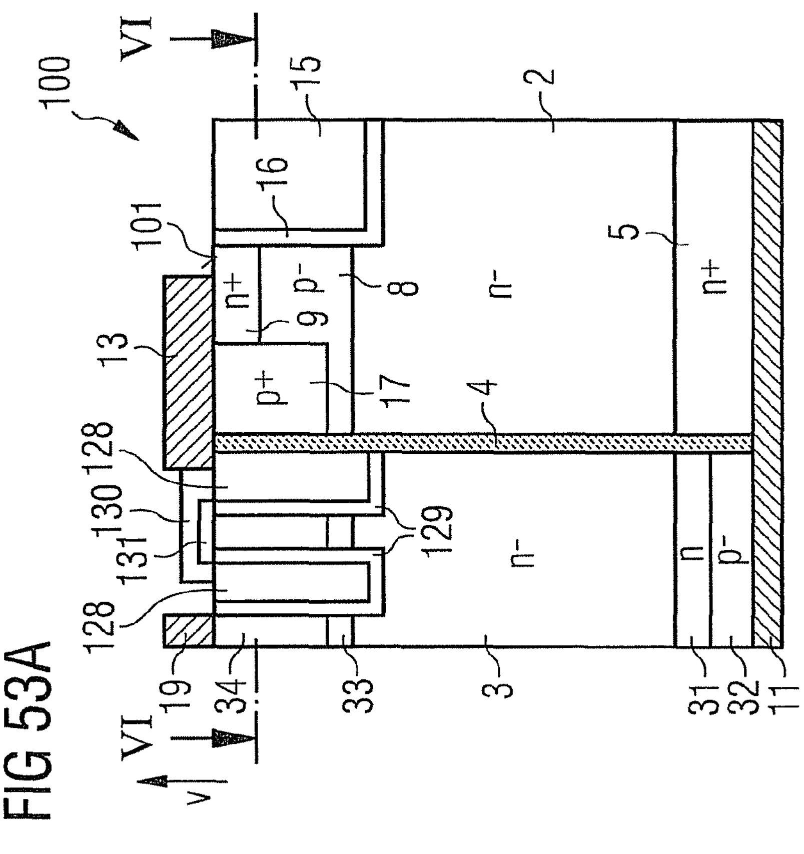

A further variant for the realization of the storage capacitor 50 is illustrated in FIGS. 53A and 53B. In this case, FIG. 53A illustrates an excerpt from an exemplary embodiment of the semiconductor component in side view in cross section. FIG. 53B illustrates a cross section through the semiconductor component in the region of the capacitor structure in a sectional plane VI-VI illustrated in FIG. 53A. In the case of this component, the capacitor structure includes a number of pillar-shaped electrode sections which extend into the semiconductor body in a vertical direction v proceeding from the front side 101 and which are in each case insulated from surrounding regions by the capacitor dielectric. In the example, a portion of the pillar-shaped electrode sections, which jointly form the first capacitor electrode 128, is adjacent to the accumulation dielectric layer 4 and is insulated from the semiconductor body 100 in sections by the accumulation dielectric layer 4. The individual electrode sections are electrically conductively connected to one another by a connecting electrode 130, which is arranged above the semiconductor body 100 and is insulated from semiconductor regions of the semiconductor body 100 by an insulation layer 131. The source region 9 is electrically linked to this capacitor structure by the source electrode 13, which extends in a lateral direction as far as above the capacitor structure, in accordance with the exemplary embodiment explained with reference to FIG. 52.

Figure 54:
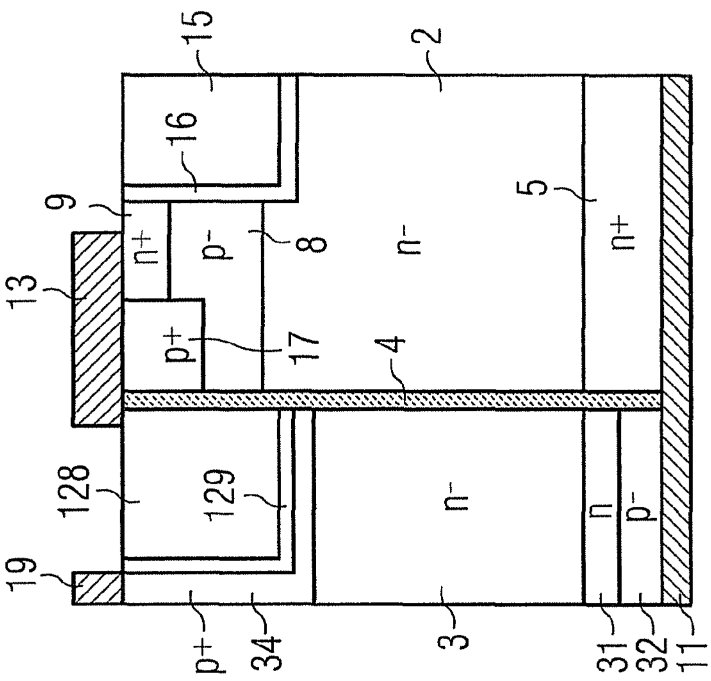
Figure 55:
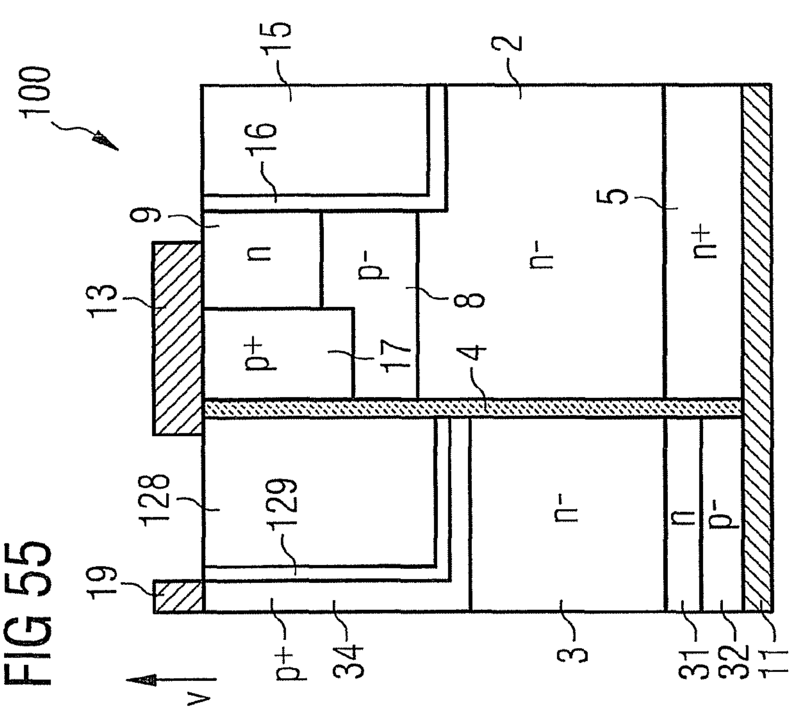

FIG. 54 illustrates in side view in cross section an exemplary embodiment of a semiconductor component in which, in order to increase the capacitance of the capacitor structure, the doped semiconductor region 34 forming the second capacitor electrode extends into the semiconductor body more deeply than in the case of the exemplary embodiments in accordance with FIGS. 50 to 53. In one exemplary embodiment illustrated, the highly doped region 34 extends in a vertical direction of the semiconductor body as far as below the body region 8. In the case of this component, the first capacitor electrode 128 also extends in a vertical direction v of the semiconductor body as far as below the body region 8. In order not to jeopardize the dielectric strength of the component, the more highly doped connection region 34 which is adjacent to the drift control region 3 and which forms the second capacitor electrode should not overlap too far the drift region 2 lying on the other side of the accumulation dielectric 4, however. In order to further increase the capacitance of the capacitor structure, therefore, the exemplary embodiment in accordance with FIG. 55 provides for realizing the connection region 34, the body region 8 and correspondingly the gate electrode 15 in such a way that these extend into the semiconductor body more deeply proceeding from the front side 101. The geometries of the capacitor structures illustrated in FIGS. 54 and 55 can correspond to those of the capacitor structures explained with reference to FIGS. 50B and 51. A capacitor structure explained with reference to FIG. 53B can also be realized as an alternative.

Figure 56:
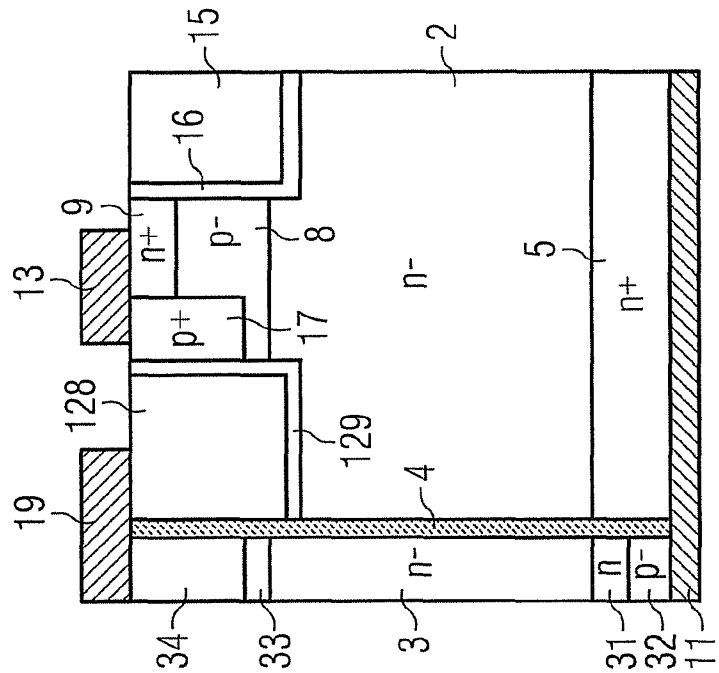

FIG. 56 illustrates one exemplary embodiment of the power semiconductor component which includes an integrated capacitor structure which, unlike in the exemplary embodiments explained with reference to FIGS. 50 to 55, is realized above the drift region 2 in the semiconductor body. This capacitor structure illustrated in FIG. 56 emerges geometrically from the capacitor structures explained with reference to FIGS. 50 to 55 by mirroring at the accumulation dielectric layer 4. The first capacitor electrode 128 can correspondingly be realized in finger-shaped fashion, in meandering fashion or in pillar-shaped fashion with a plurality of pillars.

In the case of this exemplary embodiment, the second capacitor electrode is formed by the highly doped connection region 17, which serves for connecting the source electrode 13 to the body region 8 with low resistance. The connection region 17 is directly adjacent to the capacitor dielectric 129 in a lateral direction r. On the opposite side to the connection region 17, the capacitor structure is delimited by the accumulation dielectric 4. The capacitor is connected to the drift control region 3 by using the connection electrode 19 of the drift control region, which extends in a lateral direction via the accumulation dielectric 4 as far as above the first connection electrode 128 of the capacitor structure.

As already explained, in one embodiment with reference to FIGS. 16, 17A, 18 and 19, a diode can be provided between the drain region 5 or between the drain electrode 11 and the drift control region 3 of the semiconductor component, the diode preventing the charge carriers present in the drift control region 3 with the component in the on state, which charge carriers serve to control an accumulation channel in the drift region along the accumulation dielectric 4, from flowing away in the direction of the drain region 5 or the drain electrode 11. Referring to FIGS. 16, 17A and 19, it is possible to realize the diode in the semiconductor body by two connection regions 31, 32 doped complementarily to one another being provided between the drift control region 3 and the drain region 5 or the drift control region 3 and the drain electrode 11, which connection regions form a pn junction and therefore provide a diode function. The realization of the desired diode function in this way is complicated, however, since within the cell array, that is to say within the region of the semiconductor body 100 in which a plurality of identical transistor structures from among the transistor structures explained are arranged, a suitable patterning is required for realizing the complementarily doped semiconductor regions 31, 32. When an external diode is provided, the diode, in the case of the exemplary embodiments explained above, is connected to the drift control region directly below the cell array.

Figure 57:
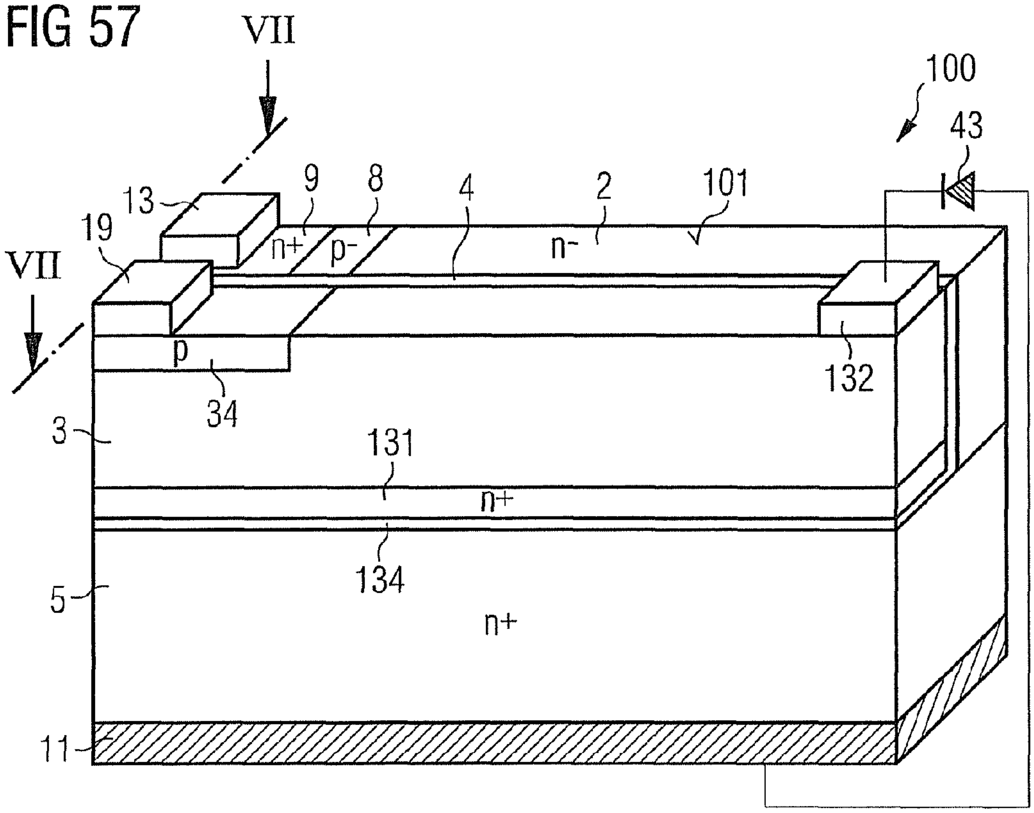
FIG. 57 illustrates a semiconductor component which is realized as a vertical MOS transistor and in which a drain electrode is connected to a drift control region at the edge of a semiconductor body.

FIG. 57 illustrates one exemplary embodiment of a power semiconductor component in which the diode between the drain region 5 and the drift control region 3, which is referred to below as drain-drift control region diode, is connected to the semiconductor body 100 at a distance from the cell array in a lateral direction. In FIG. 57, the cell array with the MOSFET structure and the drift control region 3 adjacent to the drift region of the MOSFET structure is only illustrated schematically on the left in the Figure by the source region 9, the source electrode 13 and a section of the body region 8 enclosing the source regions 9 in a lateral direction. Contact is made with the source region 9 by using the source electrode 13, and contact is made with a connection region 34 of the drift control region 3 by using the drift control region connection electrode 19. In a sectional plane VII-VII illustrated in FIG. 57, the MOSFET structure with the drift control region 3 can have any one of the transistor structures explained above. The MOS transistor can be realized in one embodiment as a planar transistor or as a trench transistor. The illustration of a gate electrode of the MOS transistor has been dispensed with in FIG. 57 for reasons of clarity.

In the example, an insulation layer 134 is arranged between the drift control region 3 and the drain region 5, which is realized as a semiconductor substrate in the example. The diode 43 is connected at the front side 101 of the semiconductor body, the cathode of the diode 43 being connected to the drift control region 3 via a drift control region connection contact 132 and an anode of the diode 43 being connected to the drain electrode 11. This component optionally includes, between the drift control region 3 and the insulation layer 134, a semiconductor region 131 which is doped more highly than the drift control region 3 and is of the same conduction type. The region 131 is intended to ensure that a reverse current generated in the drift control region 3 in the off-state case passes to the diode 43. This behavior can also be improved by realizing the more highly doped region 131 in such a way that it extends in the edge region of the component as far as the diode 43 or the connection region 132 (not illustrated).

Figure 58:
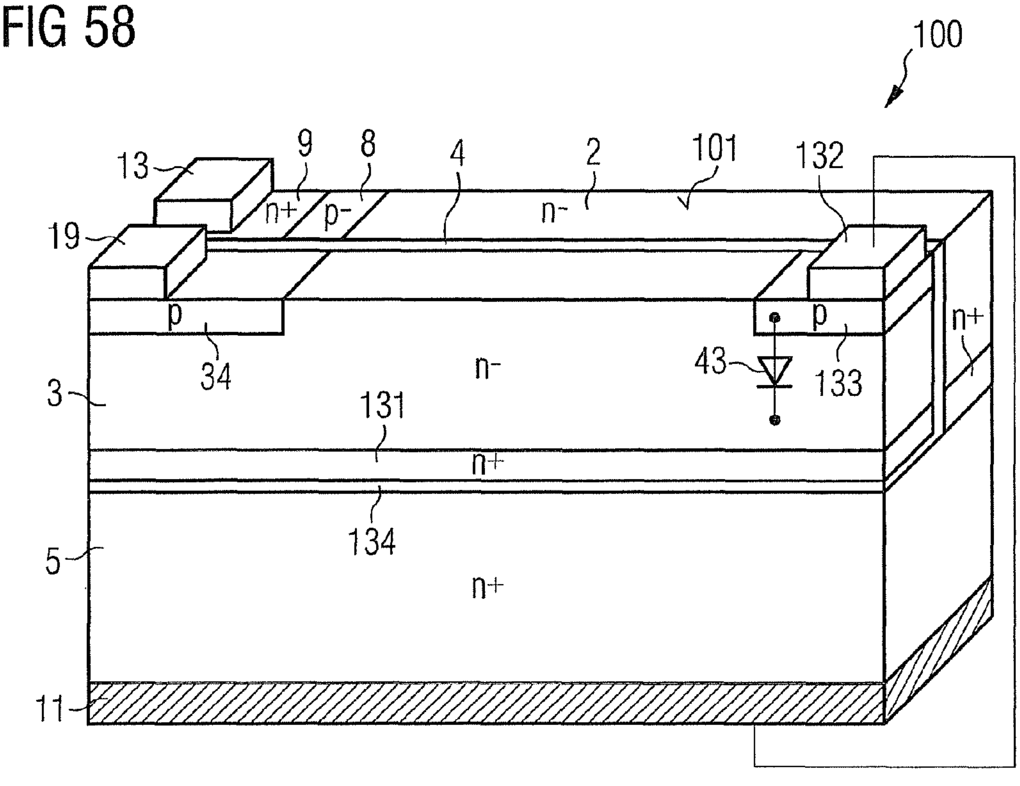
FIGS. 58 to 63 illustrate components which are modified relative to the component in accordance with FIG. 57.

FIG. 58 illustrates a modification of the semiconductor component illustrated in FIG. 57. In the case of this component, the diode is integrated in the semiconductor body and includes a p-doped connection region 133 below the drift control region connection contact 132. This p-type region 133 forms a pn junction with the drift control region 3, the pn junction forming the diode 43.

Figure 59:
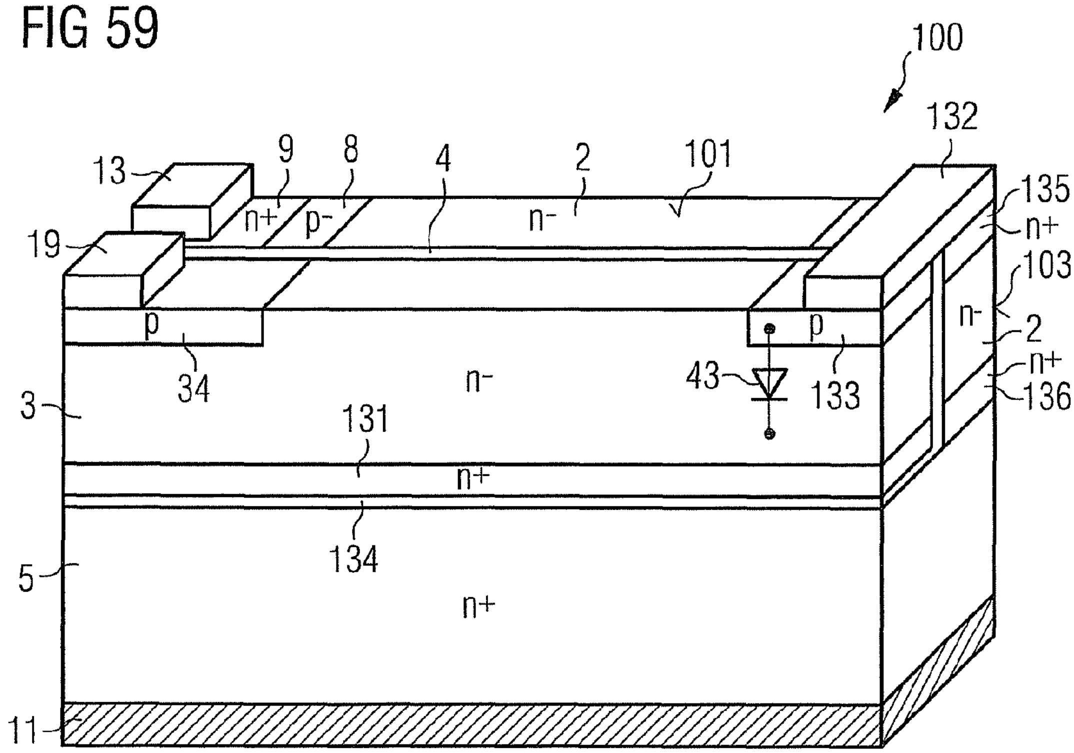

FIG. 59 illustrates a modification of the component in accordance with FIG. 58. In the case of this component, the diode 43 is connected to the drain potential via the front side 101 of the semiconductor body. In this case, a connection region 135 of the same conduction type as the drift region 2 is provided in the drift region 2 at a distance from the cell array in a lateral direction, the drift control region connection electrode 132 being connected to the region.

Optionally, this component includes, below the drift region 2 and at the level of the region 131 adjacent to the drift control region 3, a semiconductor region 136 which is doped more highly than the drift region 2 and is of the same conduction type as the drift region 2. In the off-state case, the semiconductor region 136 limits a propagating space charge region in a vertical direction to the same depth as the region 131 below the drift control region 3. This avoids field strength spikes.

In the case of the component in accordance with FIG. 59, the drift control region connection electrode 132 and also the highly doped region 135 are arranged in the edge region of the semiconductor body 100. This makes use of the fact that in the edge region of the semiconductor body, the front side 101 of the semiconductor body is also at drain potential, such that the drain potential can be tapped off via the highly doped connection region 135 of the drift control region 2.

Figure 60:
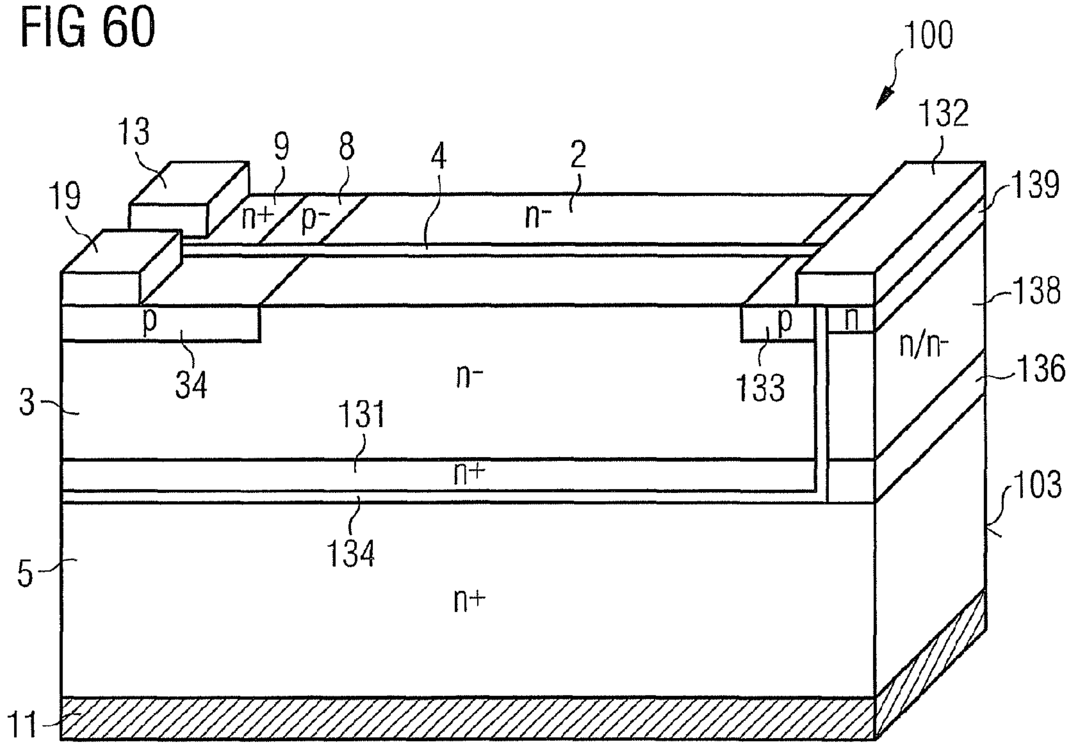

In the case of the component in accordance with FIG. 59, the pn junction for realizing the diode 43 extends directly to the edge 103 of the semiconductor body. In the case of the modification of the component that is illustrated in FIG. 60, an n-doped semiconductor region 138, 139 is present between the edge 103 of the semiconductor body 100 and the pn junction, the drift control region connection electrode 132 likewise making contact with the semiconductor region. The provision of this n-type region, through which the pn junction does not extend as far as the edge 103 of the semiconductor body, reduces leakage currents in the region of the pn junction. A dielectric layer is present between the drift control region 3 and the semiconductor region 133, which forms the pn junction with the drift control region 3, and the n-type region 138, 139. The n-type region 138, 139 can include two differently doped semiconductor regions, a more highly doped region adjacent to the drift control region connection electrode 132 and a more lightly doped semiconductor region 138 situated underneath.

Figure 61:
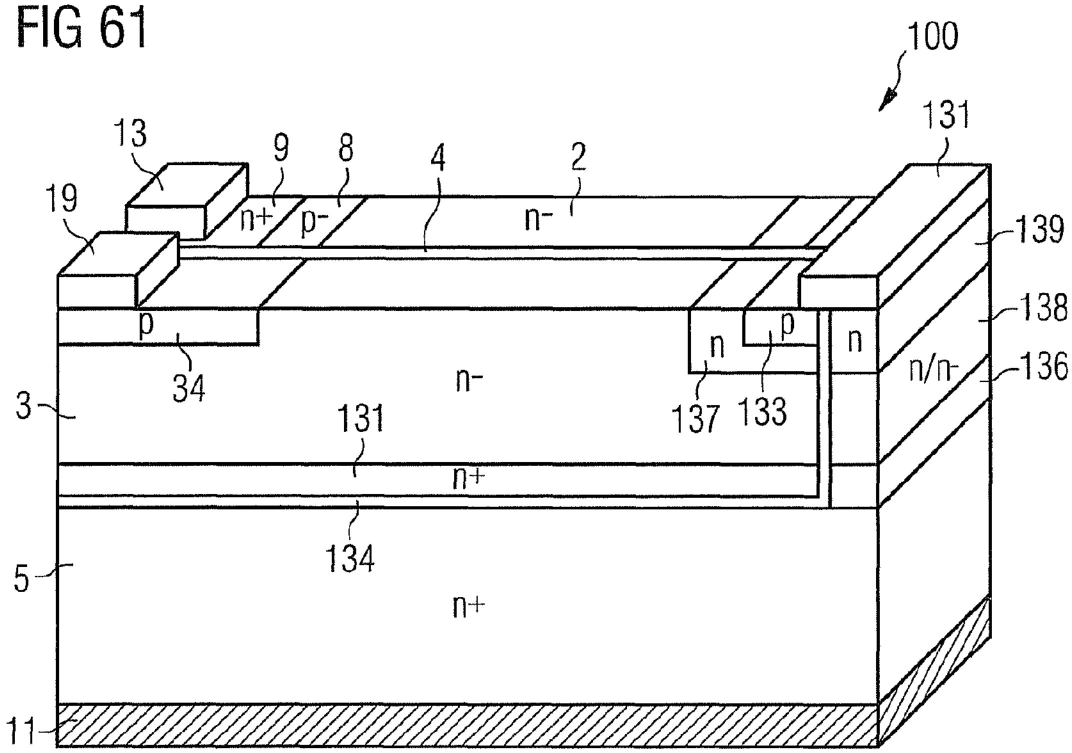

Referring to FIG. 61, the blocking capability of the diode and the long-term stability of the component can be improved by a more highly doped region 137 of the same conduction type as the drift control region 3 being arranged between the p-type region 133 and the drift control region 3, which region prevents the formation of a parasitic p-type channel by charges at the semiconductor surface.

Figure 63:
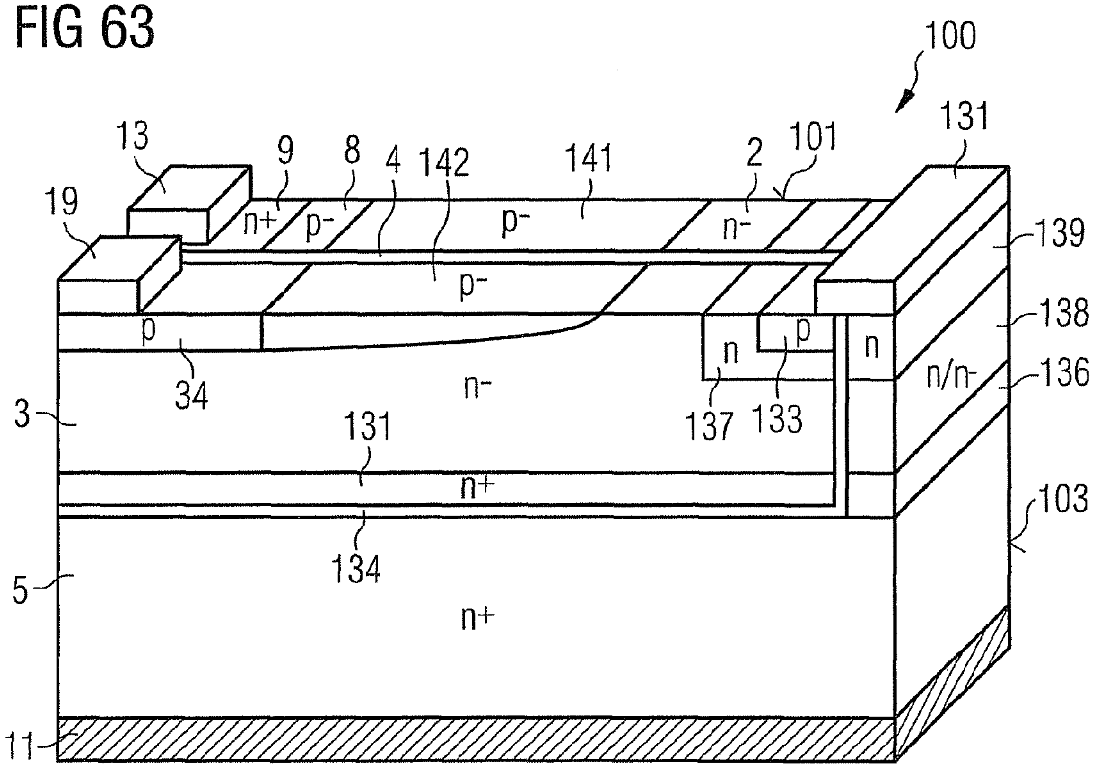

As already explained, in the edge region 103 of the semiconductor body 100, the front side 101 is also at drain potential. The source and body regions 9, 8 arranged at a distance from the edge region 103 in a lateral direction and also the connection region 34 of the drift control region 3 can be at source potential, however, during the operation of the component. In order to be able to take up the voltage difference between drain potential and source potential, referring to FIG. 63, VLD regions (VLD=variation of lateral doping) 141, 142 can be provided in the region of the front side 101 of the semiconductor body between the cell array and the edge 103 of the semiconductor body. The VLD regions are doped semiconductor regions which are doped complementarily to the drift region 2 and the drift control region 3 and the doping concentration of which decreases proceeding from the cell array in the direction of the edge 103.

Figure 62:
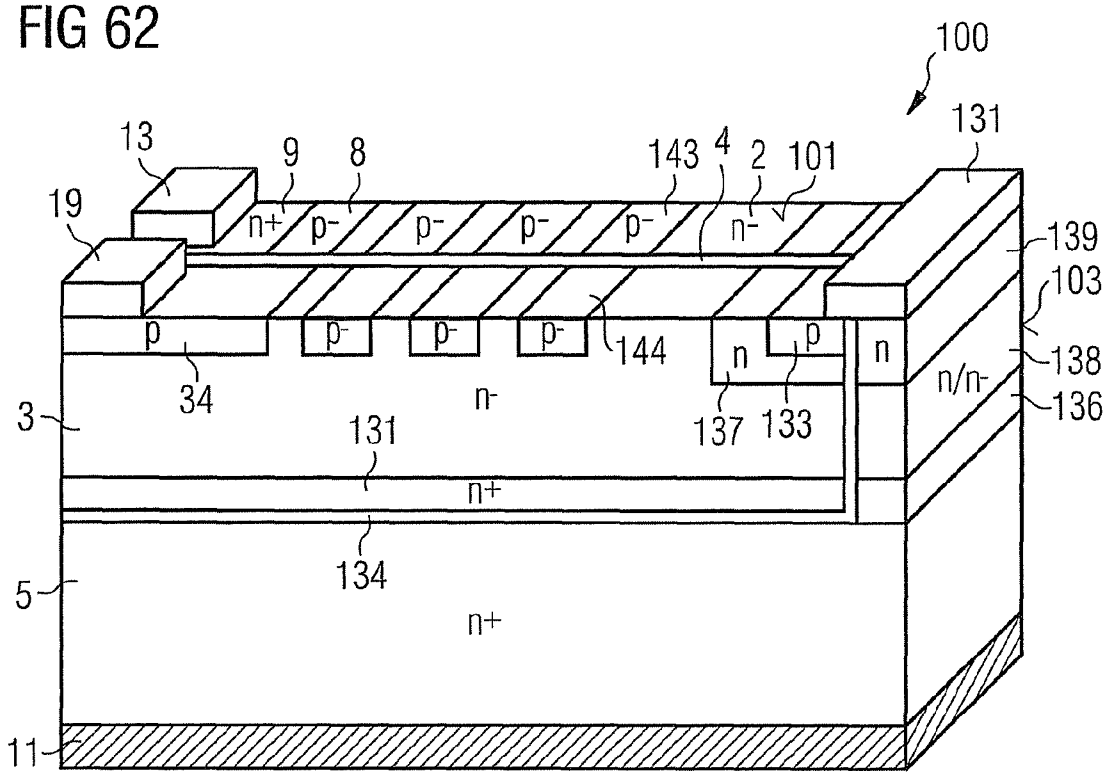

In the case of a p-doped drift region and a p-doped drift control region (not illustrated in FIGS. 62 and 63), the p-type doping of the p-type drift region 2 and of the p-type drift control region 3 undertakes the VLD region function, such that these regions are not required. However, an n-doped semiconductor region that is continuous in a vertical direction should then be present at the edge of the component 103.

A further variant for reducing the voltage difference between the edge 103 and the cell array consists in providing field ring structures 143, 144. The field ring structures surround the cell array of the power semiconductor component in ring-shaped fashion. In the case of the component in accordance with FIG. 62, three such field rings are provided, which are arranged at a distance from one another in a lateral direction of the semiconductor body 100 and which are in each case doped complementarily to the drift region 2 and the drift control region 3.

Figure 64:
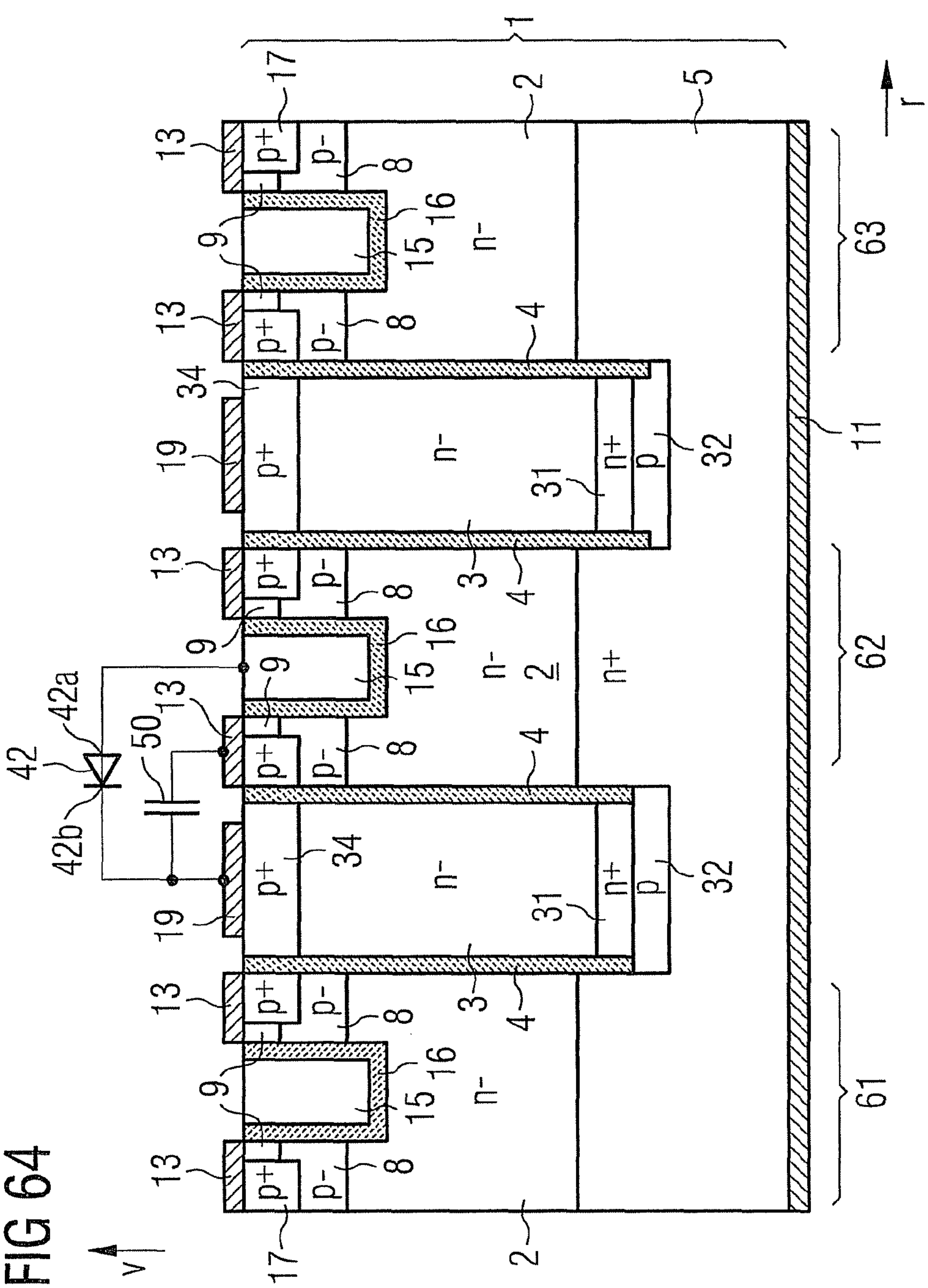
FIG. 64 illustrates a cross section through a MOSFET with a plurality of drift control regions, each of which is connected to the drain region via an integrated diode on the drain side, and in which the drift control region extends right into the drain region in a vertical direction.

FIG. 64 illustrates a cross section through a section of a component that is embodied as a MOSFET, with a plurality of MOSFET cells 61, 62, 63. Each of the MOSFET cells 61, 62, 63 has a source region 9, a body region 8, a drift region 2, a bypass region 17, a gate electrode 15, a gate insulation 16 and a source electrode 13. In this case, the drain region 5 and the drain electrode 11 are shared by all the MOSFET cells 61, 62, 63.

Arranged between two adjacent MOSFET cells 61, 62, 63 in each case is a respective drift control region 3, which is connected to the drain region 5 on the drain side via a diode 31, 32 formed from the first and second connecting regions 31, 32. In this case, the dielectric layer forming the accumulation dielectric should extend at least as far as the third connecting region 32, as is illustrated in the left-hand part of FIG. 64, or may extend into the third connecting region 32, as is illustrated in the right-hand part of FIG. 64. Furthermore, the dielectric can also be produced in such a way that it ends only in the drain region 5 in a vertical direction (not illustrated).

On the source side, each of the drift control regions 3 is connected to a fourth electrode 19 via a heavily p-doped fourth connecting region 34. In this case, the storage capacitance is predominantly formed by an external capacitance 50. Optionally, the third connecting region 33 may also be formed between the fourth connecting region 34 and the drift control region 3 in this case as well.

For connecting the individual MOSFET cells 61, 62, 63 in parallel, the source electrodes 13, the gate electrodes 15 and also the fourth electrodes 19 of the individual cell are in each case interconnected. The electrical connection is preferably effected by at least one patterned metallization layer (not illustrated in FIG. 64) arranged above the front side or source side of the semiconductor body 1.

A dielectric 4 is arranged at least in sections between adjacent drift and drift control regions 2, 3. Preferably, the dielectric 4 is formed such that it is closed over the whole area between respectively adjacent drift and drift control regions 2, 3. On the drain side, the dielectric 4 preferably extends at least as far as the drain region 5. However, it can also extend as far as the drain-side surface of the semiconductor body 1.

The drift regions 2 and the drift control regions 3 can have the same doping profile in the region in which they jointly extend in the vertical direction v, whereby a similar potential distribution is achieved in the drift control region and the drift region in the off-state case, such that the voltage loading of the dielectric 4 is low.

In the case of one exemplary embodiment in accordance with FIG. 64, the drain-side blocking pn junctions 31, 32 for connecting the drift control regions 3 to the drain region 5 are arranged within the drain region 5 in the vertical direction v.

Figure 65:
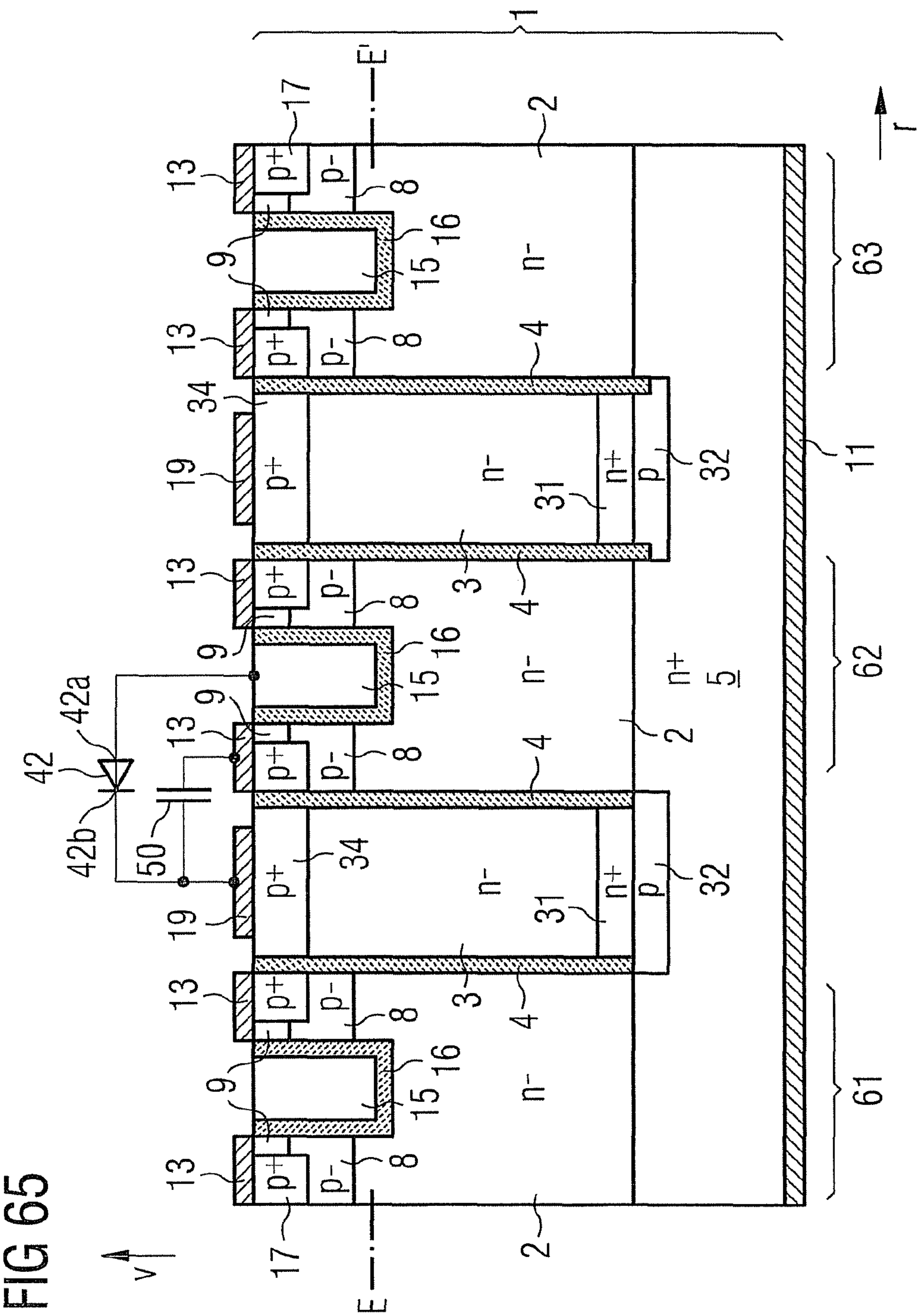
FIG. 65 illustrates a MOSFET corresponding to the MOSFET in accordance with FIG. 64, in which the drift control region is at a distance from the highly doped connection region in the vertical direction.

As an alternative, in the case of the MOSFET illustrated in FIG. 65, the first connecting region 31 is arranged in the region of the drift regions 2 in the vertical direction v and the second connecting region 32 is arranged in the region of the drain region 5 in the vertical direction v.

The individual cells can have a multiplicity of different geometries. FIGS. 66, 67, 68, 69 illustrate horizontal sections through components having different cell geometries.

Figure 66:
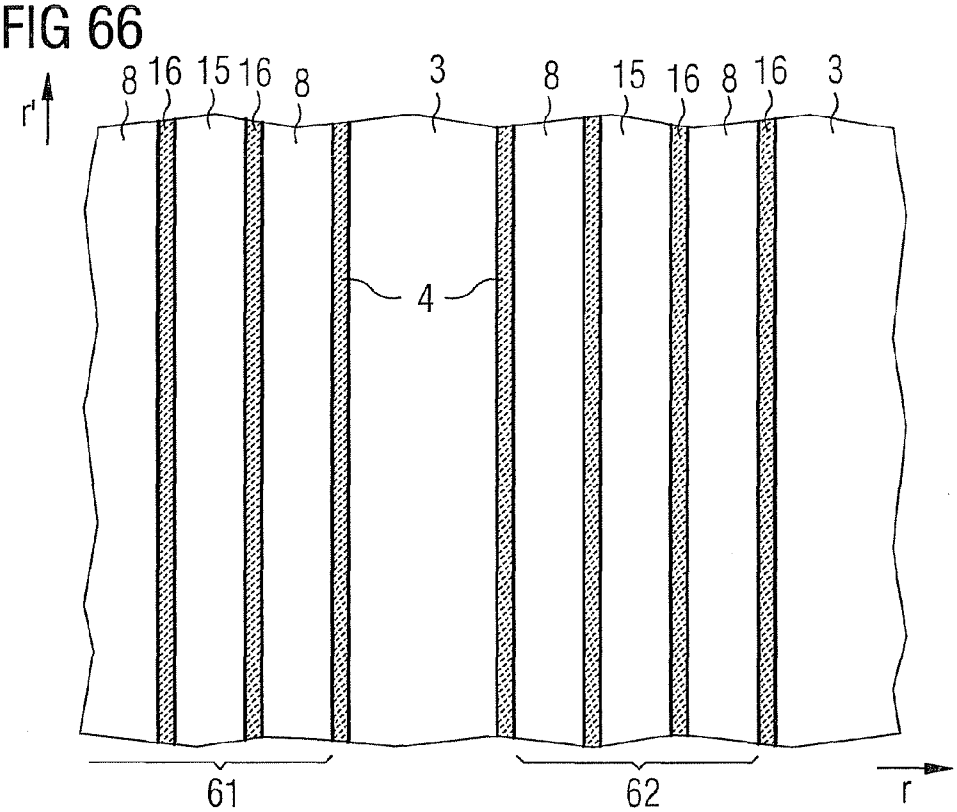
FIG. 66 illustrates a cross section—running perpendicular to the vertical direction—through a MOSFET with strip layout corresponding to the MOSFET in accordance with FIG. 65 in a plane E-E' illustrated therein.

FIG. 66 illustrates a cross section running perpendicular to the vertical direction v in a plane E-E' through a MOSFET in accordance with FIG. 65, the transistor cells of which are realized as strip cells. In this case, the individual regions of the MOSFET cells 61, 62 are formed in striplike fashion in cross section in a first lateral direction r and are arranged at a distance from one another in a second lateral direction r', a respective drift control region 3 with the associated accumulation dielectrics 4 being arranged between two adjacent MOSFET cells 61, 62.

Figure 67:
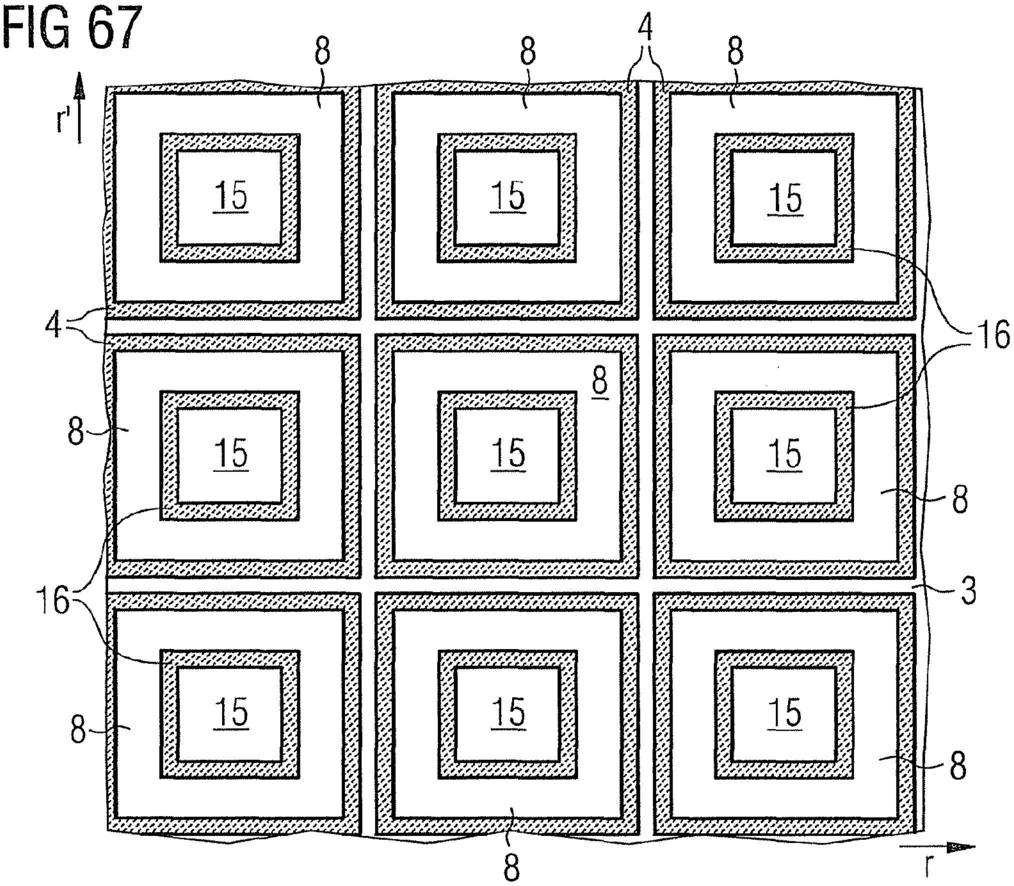
FIG. 67 illustrates a cross section—running perpendicular to the vertical direction—through a MOSFET with cross-sectionally rectangular cell arrangement.

FIG. 67 illustrates a cross section through a MOSFET with a rectangular cell structure. Drift control regions 3 arranged between adjacent MOSFET cells 61, 62, 63 are formed in continuous fashion in this case. As an alternative to this, however, the individual drift control regions 3 arranged between two adjacent MOSFET cells can also be formed in non-continuous fashion.

Figure 68:
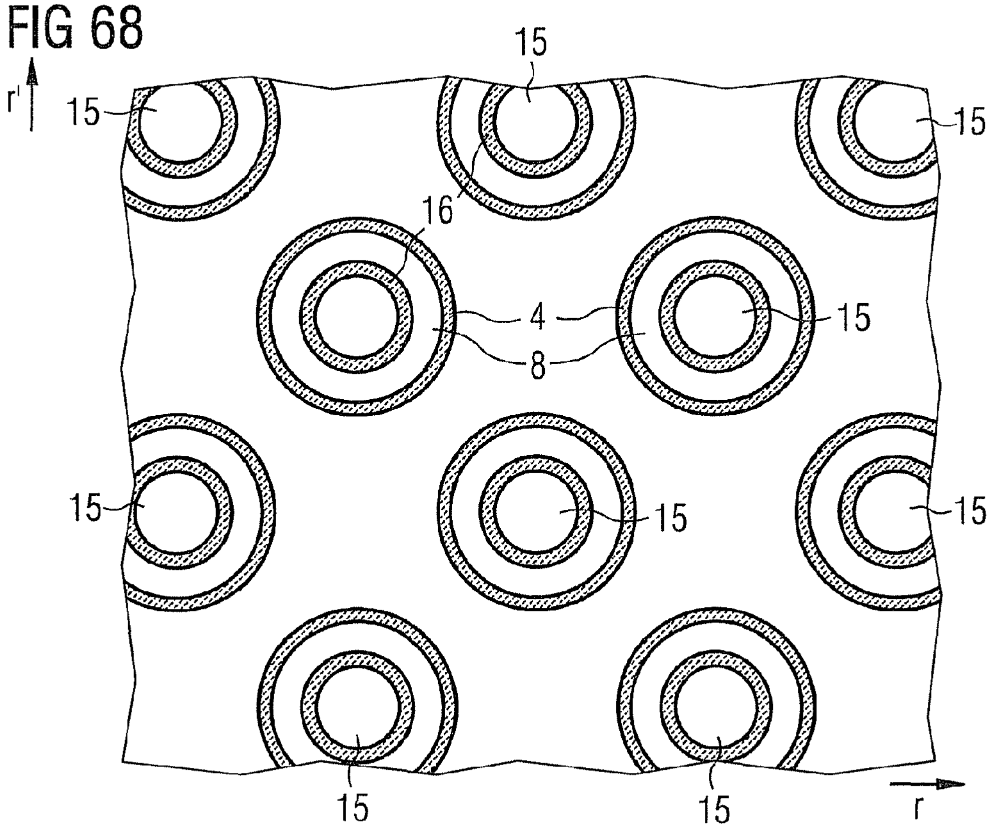
FIG. 68 illustrates a horizontal section—running perpendicular to the vertical direction—of a MOSFET with cross-sectionally circular cell arrangement.

FIG. 68 illustrates a cross section through a MOSFET whose MOSFET cells, in cross section, are formed in round fashion rather than in rectangular fashion as in the case of FIG. 67.

Figure 69:
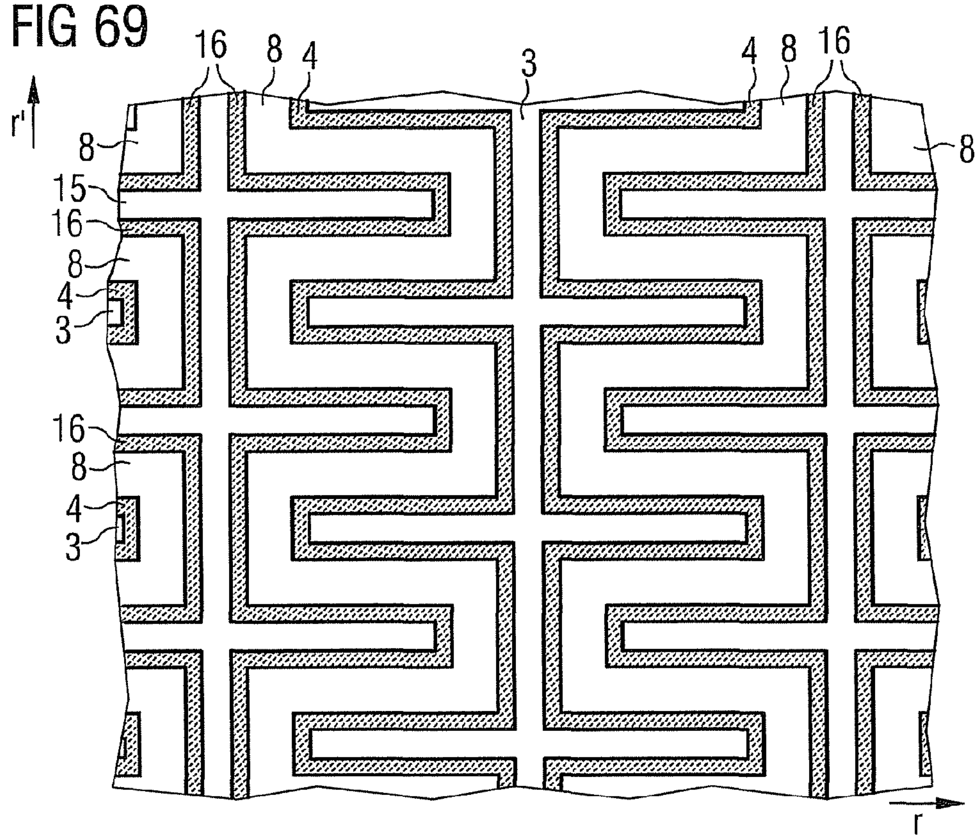
FIG. 69 illustrates a horizontal section—running perpendicular to the vertical direction—through a MOSFET with a drift region running in meander-like fashion in cross section.

A modification of the strip-type layout in accordance with FIG. 66 is illustrated in FIG. 69. In the case of this cross-sectionally meander-like cell structure, the individual regions of the MOSFET cells are formed in elongate fashion, but have meander-like scallops at specific distances.

The semiconductor component has been explained above on the basis of exemplary embodiments relating to normally off MOS transistors. The transistors are turned off if a driving potential sufficient for forming an inversion channel in the body region 8 is not present at the gate electrode 15. The normally off transistors are turned on only when a suitable driving potential resulting in the formation of an inversion channel in the body region 8 along the gate dielectric 16 is present at the gate electrode 15. However, the provision of a drift control region 3 adjacent to a drift region and of an accumulation dielectric between the drift region and the drift control region is not restricted to normally off MOS transistors.

Figure 70:
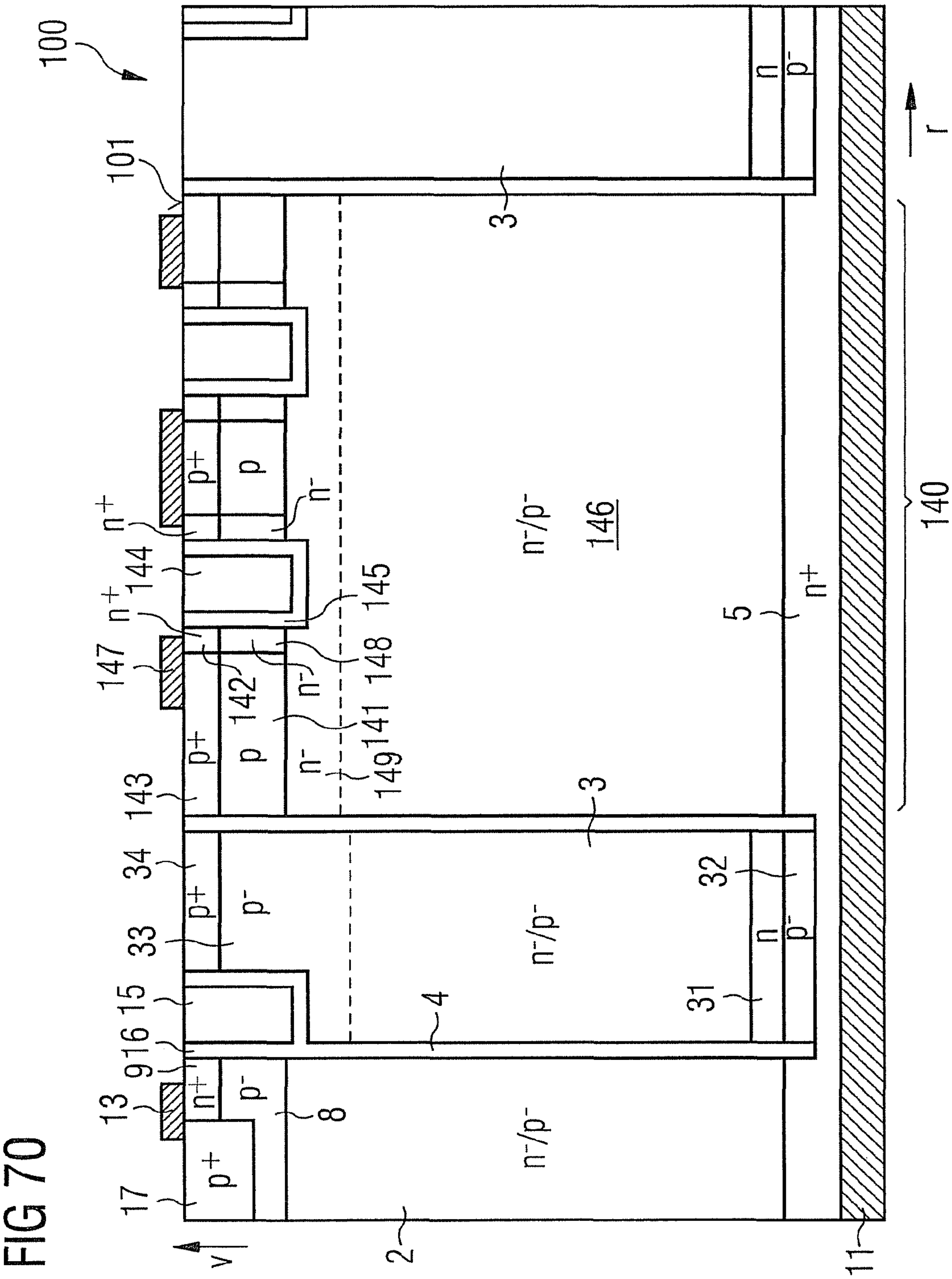
FIG. 70 illustrates a semiconductor component realized as a normally on MOS transistor, in cross section.

Referring to FIG. 70, this concept can also be applied to normally on transistors (depletion-mode transistors). The reference symbol 140 in FIG. 70 denotes a semiconductor region within the semiconductor body 100 in which transistor cells of such a normally on transistor are integrated. The transistor cells are realized as trench transistor cells and each have a gate electrode 144 which extends into the semiconductor body in a vertical direction v proceeding from the front side 101 and which is insulated from the semiconductor body by using a gate dielectric 145. The depletion-mode transistor illustrated in FIG. 70 is realized as an n-conducting transistor and has an n-doped source region 142, a p-doped body region 141 and a drift region 146. In this case, the body region 141 is arranged between the source region 142 and the drift region 146, a thin channel region 148 of the same conduction type as the source region 142, but with weaker doping, being realized in the body region 141 along the gate dielectric 145. The channel region 148 along the gate dielectric 145 enables a conducting connection between the source region 142 and the drift region 146 even when the gate electrode 144 is not driven. For driving this component in the off state, a suitable driving potential that results in the channel region 148 being depleted of charge carriers has to be applied to the gate electrode 144. In the case of an n-conducting transistor, the potential is a negative potential relative to the potential of the source region 142.

A drift control region 3 is provided adjacent to the drift region 146 in a lateral direction r of the semiconductor body 100, the drift control region being dielectrically insulated from the drift region 146 by an accumulation dielectric 4. The drift control region 3 is realized in accordance with the previous explanations and can be connected to the drain region 5 using one of the connection possibilities explained above. In a manner not illustrated in greater detail, the drift control region 3 can furthermore be connected to the source electrode 147 of the depletion-mode transistor.

In the case of the component illustrated in FIG. 70, transistor cells of a normally off transistor are also realized in the same semiconductor body 100 as the depletion-mode transistor. The transistor structure of the normally off transistor may correspond to one of the transistor structures of the normally off transistor that have already been explained. The normally off transistor illustrated in FIG. 70 is realized in such a way that its gate electrode is arranged in the same trench as the drift control region 3 above the drift control region 3.

Any desired combinations are conceivable with regard to the doping types of the drift region 2 of the normally off transistor, of the drift region 146 of the normally on transistor and of the drift control region 3. The drift region 2 of the normally off transistor can be p-doped or n-doped independently of the doping type of the drift control region 3 and the doping type of the drift region 146 of the normally on transistor. The drift control region 3 can correspondingly be p-doped or n-doped independently of the dopings of the drift regions 2 and 146. Likewise, the drift region 146 can be p- or n-doped in order to realize an n-conducting depletion-mode transistor. In the case of a p-type doping of the drift region 146, an n-doped semiconductor region 149 is to be provided between the drift region 146 and the body region 141 in the example illustrated, the semiconductor region enabling a charge carrier flow from the channel region 148 in a lateral direction r as far as the accumulation dielectric 4. The weakly p-doped connection region 33 of the drift control region 3 as illustrated in FIG. 70 can be dispensed with if the drift control region 3 is p-doped.

Figure 71:
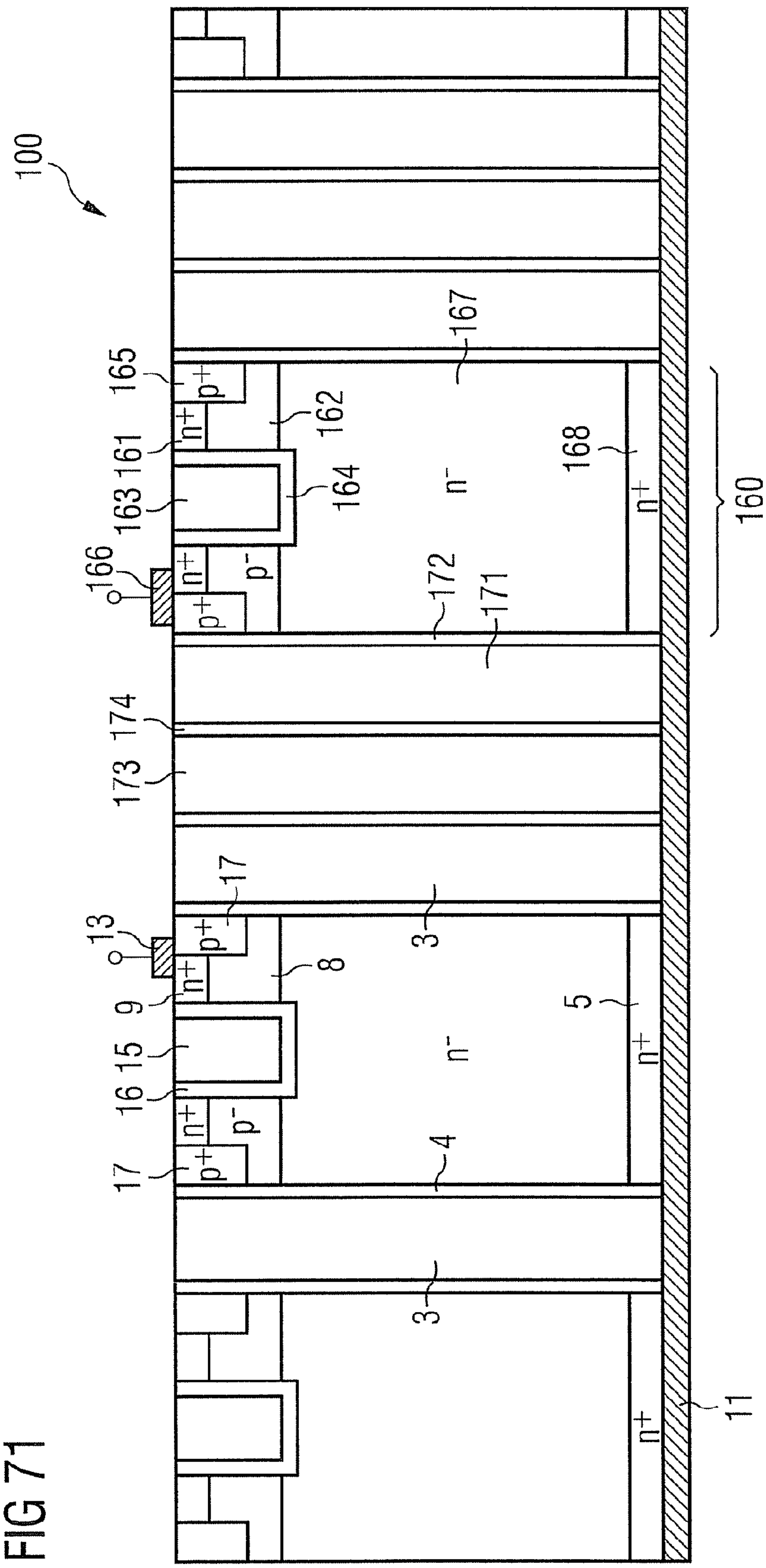
FIG. 71 illustrates a semiconductor component in which a measuring transistor for measuring a load current through a load transistor is arranged in the cell array of the load transistor.

As already explained, the semiconductor component can be realized in cellular fashion with a multiplicity of component structures, for example transistor structures, of identical type. Referring to FIG. 71, the cell array of the component can be modified here in such a way that contact can be made with individual transistor cells, a transistor cell 160 in the example, separately, that is to say independently of the rest of the transistor cells. In this case, contact can be made with a source electrode 166 of the transistor cell 160 and optionally with a gate electrode 163 of the transistor cell 160 independently of the gate electrodes 15 and the source electrodes 13 of the other transistor cells. In the example, the drain electrode 11 is shared by all the transistor cells.

Such a transistor cell 160 with which contact can be made separately can be utilized in a known manner for example for current measuring through the component. This cell, which is referred to hereinafter as measuring cell, is in this case operated during operation of the component at the same operating point as the rest of the transistor cells, and the current through this measuring cell is determined. It goes without saying that a plurality of such measuring cells can be connected in parallel in this case. The current through the measuring cell or the plurality of measuring cells connected in parallel is then proportional to the current flowing through the rest of the transistor cells, which are referred to hereinafter as load cells. In this case, the proportionality factor between the measurement current and the load current corresponds to the ratio between the number of measuring cells and load cells.

The measuring cell illustrated is realized as a normally off transistor cell, and has a source region 161, a drift region 167, and a body region 162 arranged between the source region 161 and the drift region 167 and doped complementarily to the source region 161. The gate electrode 163, which is insulated from the semiconductor regions of the component by a gate dielectric 164, serves for controlling an inversion channel in the body region 162 between the source region 161 and the drift region 167. The measuring cell additionally has a drift control region 171, which is separated from the drift region 167 by an accumulation dielectric 172. The drift control region 171 can be connected, in a manner already explained, to the drain region 5 and also the source region 161 and, if appropriate, to the gate electrode 163. The connection between the drift control region 171 and the rest of the component regions of the transistor structure is not illustrated in greater detail in FIG. 71, however, for reasons of clarity.

For decoupling the measuring cell from the load cells, an intermediate region 173 can be provided between the drift control region 171 of the measuring cell and the drift control region 3 of the adjacent load cell. The intermediate region may be in one embodiment a "dead" transistor cell, that is to say a transistor cell having no source region and no source metallization, and possibly no gate either. Such an intermediate region can be dispensed with, however, if the measuring cell is completely surrounded by a drift control region.

Figure 72:
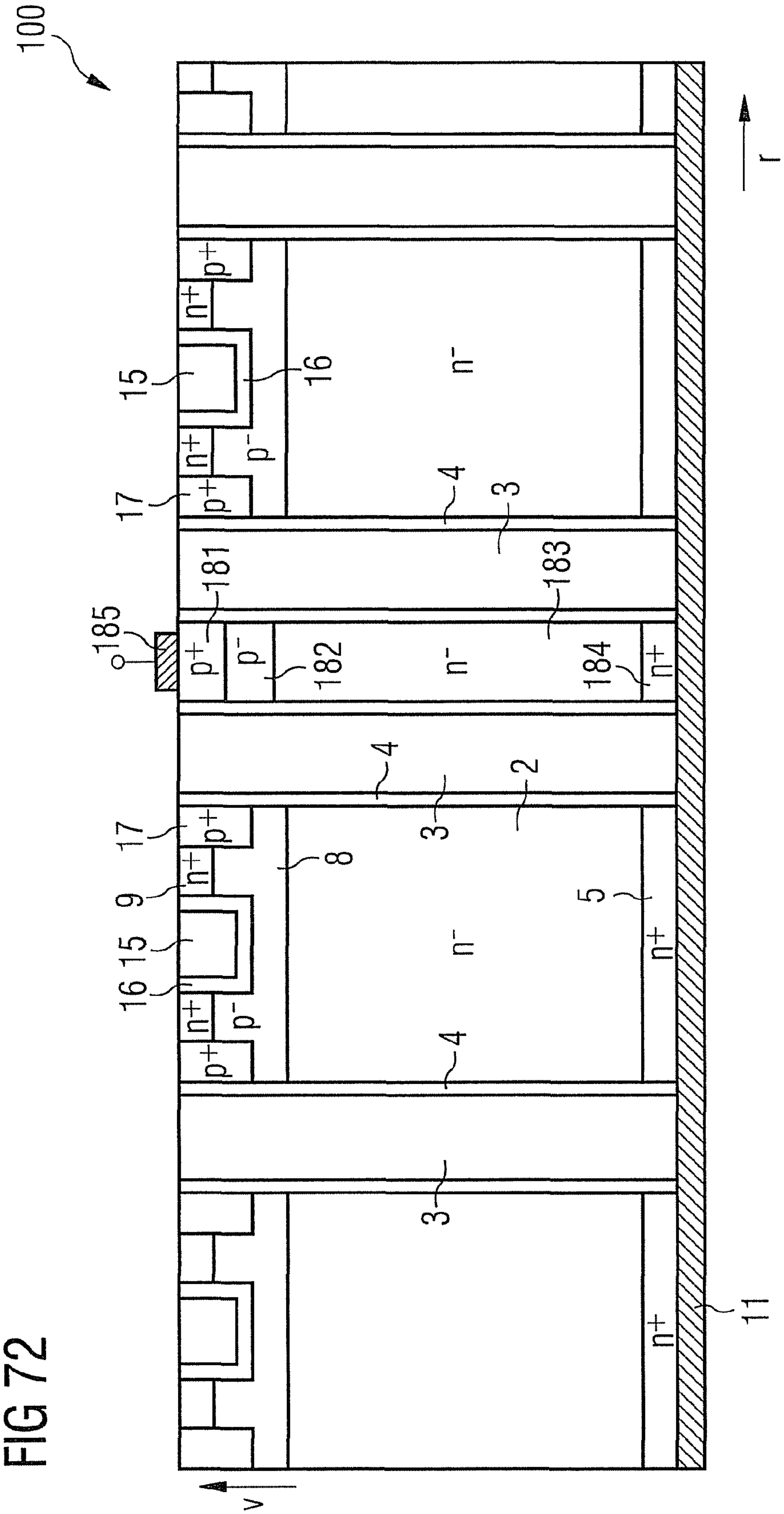
FIG. 72 illustrates a semiconductor component in which a temperature sensor is arranged in the cell array of a load transistor.

FIG. 72 illustrates a power semiconductor component in which a temperature sensor is integrated between two transistor cells, normally off transistor cells in the example. The temperature sensor is realized as a diode with a p-type emitter 181, 182, an n-type base 183 and an n-type emitter 184. These component regions are arranged adjacent to one another in a vertical direction v of the semiconductor body 100. In the example illustrated, the p-type emitter includes a heavily p-doped region, to which a connection electrode 185 is connected, and optionally a more weakly p-doped region 182 adjacent to the heavily doped region in the direction of the n-type base 183. Voltage is supplied to the sensor via the rear-side drain electrode 11, to which the n-type emitter 184 is connected. The temperature signal can be tapped off as measurement current at the connection electrode 185. This makes use of the fact that the reverse current flowing through a diode in the reverse direction is dependent on the temperature.

Figure 73:
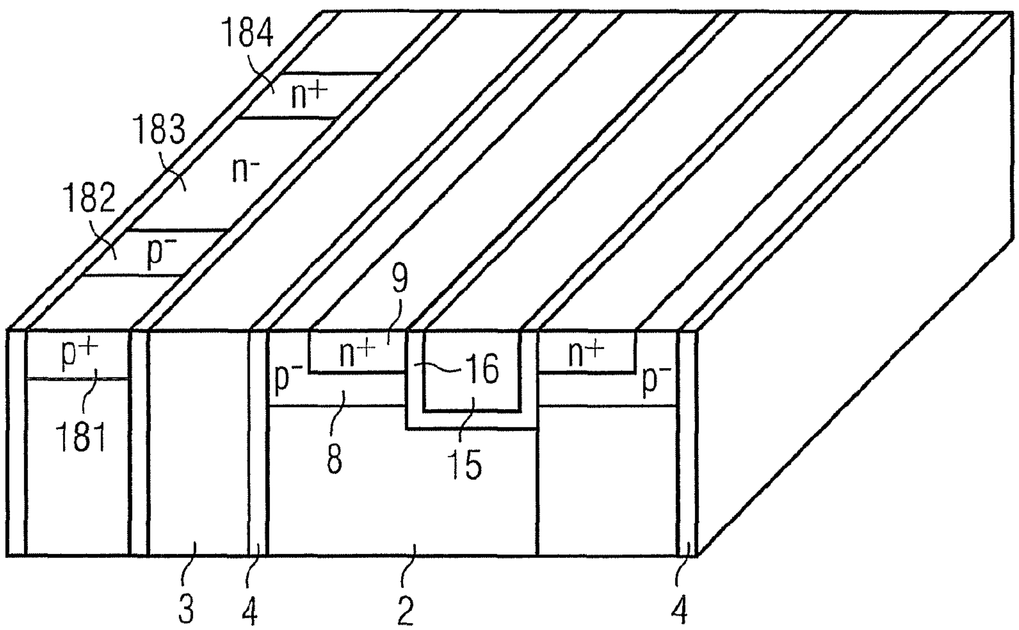
FIG. 73 illustrates a semiconductor component modified relative to the semiconductor component in accordance with FIG. 72.

Referring to FIG. 73, which illustrates an excerpt from an exemplary embodiment of a power semiconductor component, the temperature sensor can also be integrated in the semiconductor in a lateral direction. In this case, the component regions 181-184 of the temperature sensor are arranged adjacent to one another in a lateral direction r.

Various possible edge structures for a semiconductor component are explained below with reference to FIGS. 74 to 85. Such edge structures serve, in a manner known in principle, to achieve a sufficient dielectric strength of the semiconductor component in the edge region of the semiconductor chip or in the edge region of the cell array.

Figure 74:
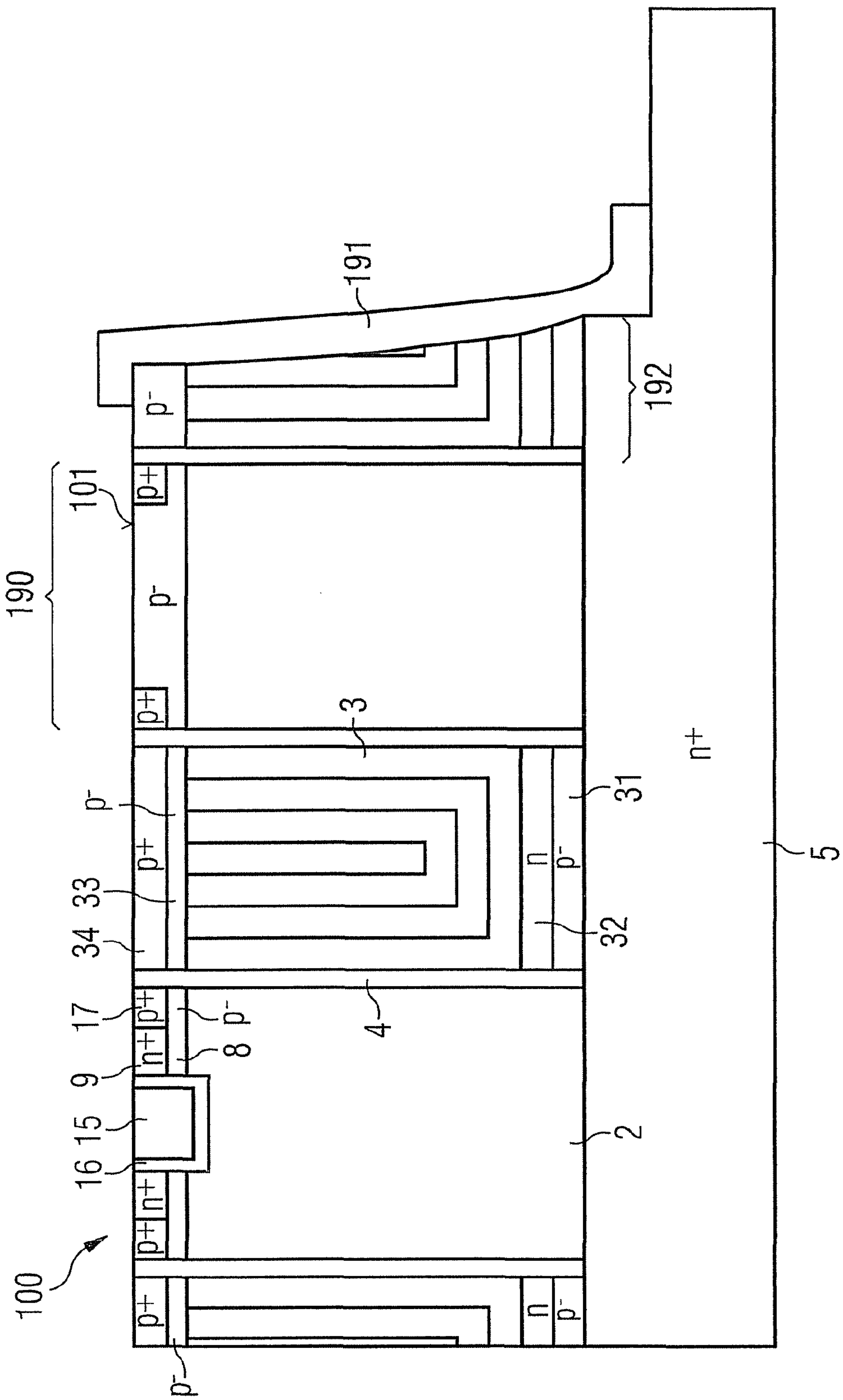
FIGS. 74 to 85 illustrate possible edge terminations for a semiconductor component.

FIG. 74 illustrates an example of a power semiconductor component with an edge structure in accordance with a first embodiment. The component includes a semiconductor substrate 5, which forms the drain region of the component realized as a transistor in the example. A semiconductor layer, for example an epitaxial layer, is applied above the semiconductor substrate, and the active component structures, that is to say the transistor structures and the drift control regions 3, are realized in the layer. The edge structure of this component is realized by virtue of the fact that the semiconductor layer arranged on the substrate 5 is etched back as far as the semiconductor substrate 5 in the edge region of the semiconductor body or of the cell array proceeding from the front side 101. A passivation layer 191 is applied to the uncovered edge present after etching, the passivation layer extending from the front side 101 down to the semiconductor substrate 5. In this case, the etching for producing the edge is effected in the region of a component structure corresponding to the drift control region 3 within the cell array. The component structure is designated by the reference symbol 192 in FIG. 74. A non-active transistor structure 190, in the example a transistor structure having no gate electrode and no source region, is present between the semiconductor structure 192 and a first active drift control region, that is to say a drift control region of a first active transistor cell, proceeding from the edge.

In the case of the component illustrated, the drift control region 3 includes a plurality of semiconductor layers which, during the production process, are deposited epitaxially successively in a trench bounded by the accumulation dielectric 4, until the trench has been filled. These layers can be p-doped, but can also be weakly n-doped, in which case it is possible to modulate the profile of the electric field at the surface in a targeted manner by way of the type of doping.

Figure 75:
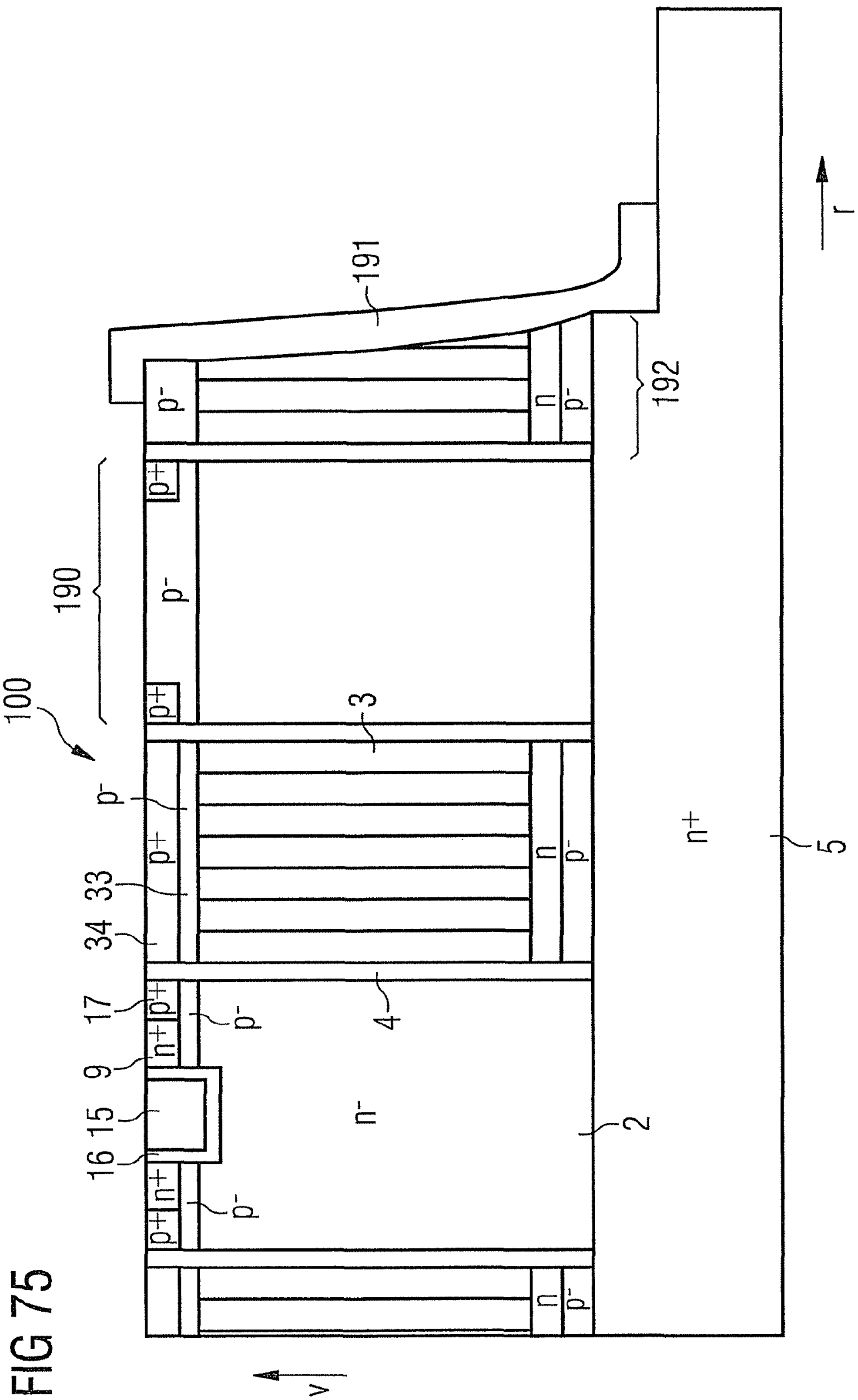

FIG. 75 illustrates a component modified relative to the component in FIG. 74. In the case of this component, the drift control region 3 is likewise realized in multilayer fashion, the individual layers being arranged adjacent to one another exclusively in a lateral direction in the example. Such a structure is achieved by virtue of the fact that, in each case after the deposition of a semiconductor layer into a trench bounded by the accumulation dielectric 4, the deposited layer is etched back anisotropically at the bottom of the trench.

Figure 76:
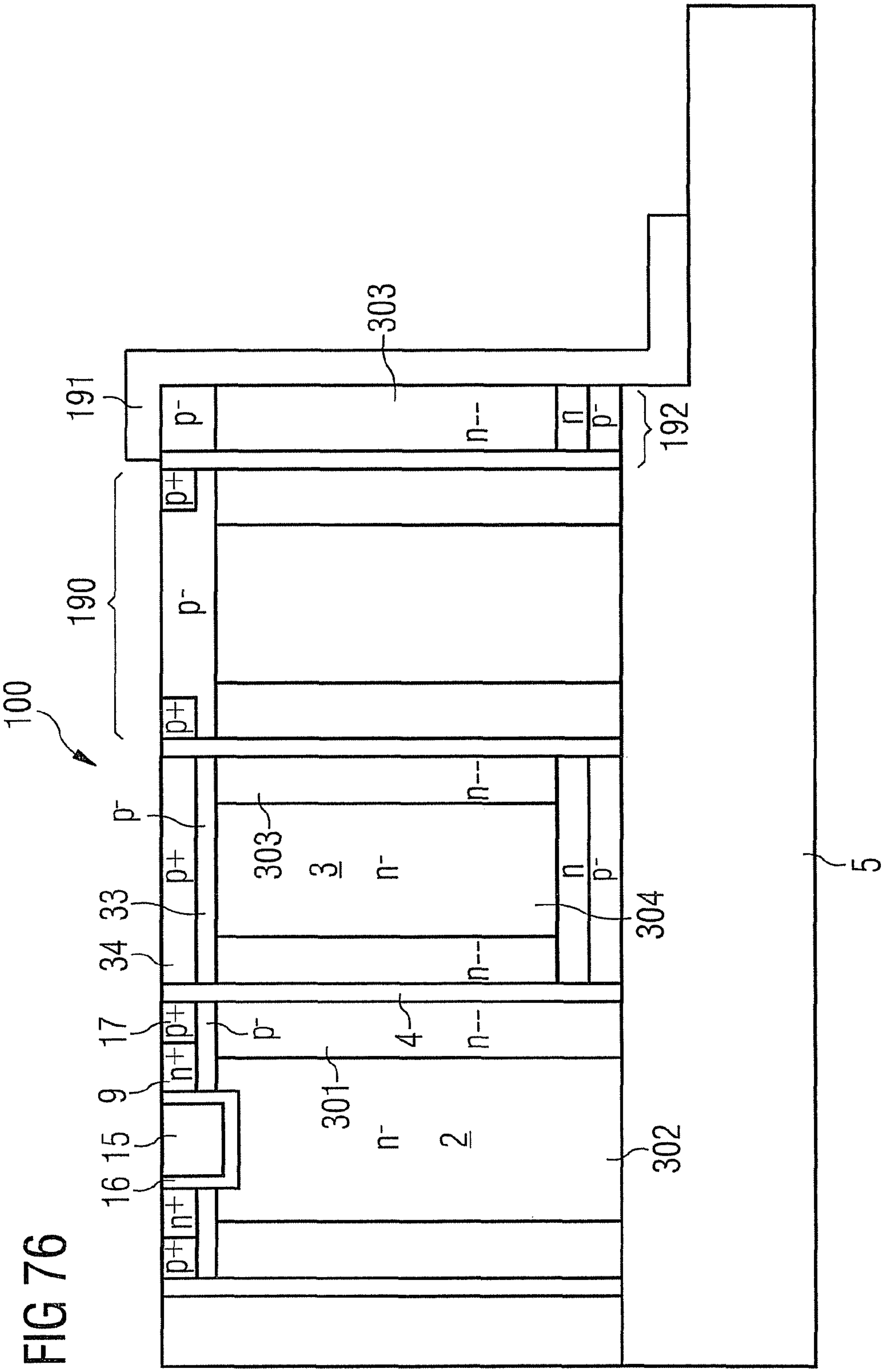

FIG. 76 illustrates one exemplary embodiment of a power semiconductor component with an edge structure. In the case of this component, the drift region 2 has semiconductor layers that are doped differently in a lateral direction r of the semiconductor body, namely a more weakly doped semiconductor layer 301 adjacent to the accumulation dielectric 4 and a more highly doped semiconductor layer 302 adjacent to the more weakly doped semiconductor layer 301. In a corresponding manner, the drift control region 3 also has a more weakly doped semiconductor layer 303 adjacent to the accumulation dielectric 4 and a more highly doped semiconductor layer 304 adjacent to the more weakly doped semiconductor layer 303. When the component is driven in the off state, these more lightly doped semiconductor layers 301, 303 adjacent to the accumulation dielectric 4 prevent a voltage breakdown at the accumulation dielectric 4. In the case of the semiconductor component illustrated in FIG. 76, part of such a drift control region with a weakly doped semiconductor region 303 is arranged in a lateral direction between the non-active transistor cell 190 and the passivation layer 191.

Figure 77:
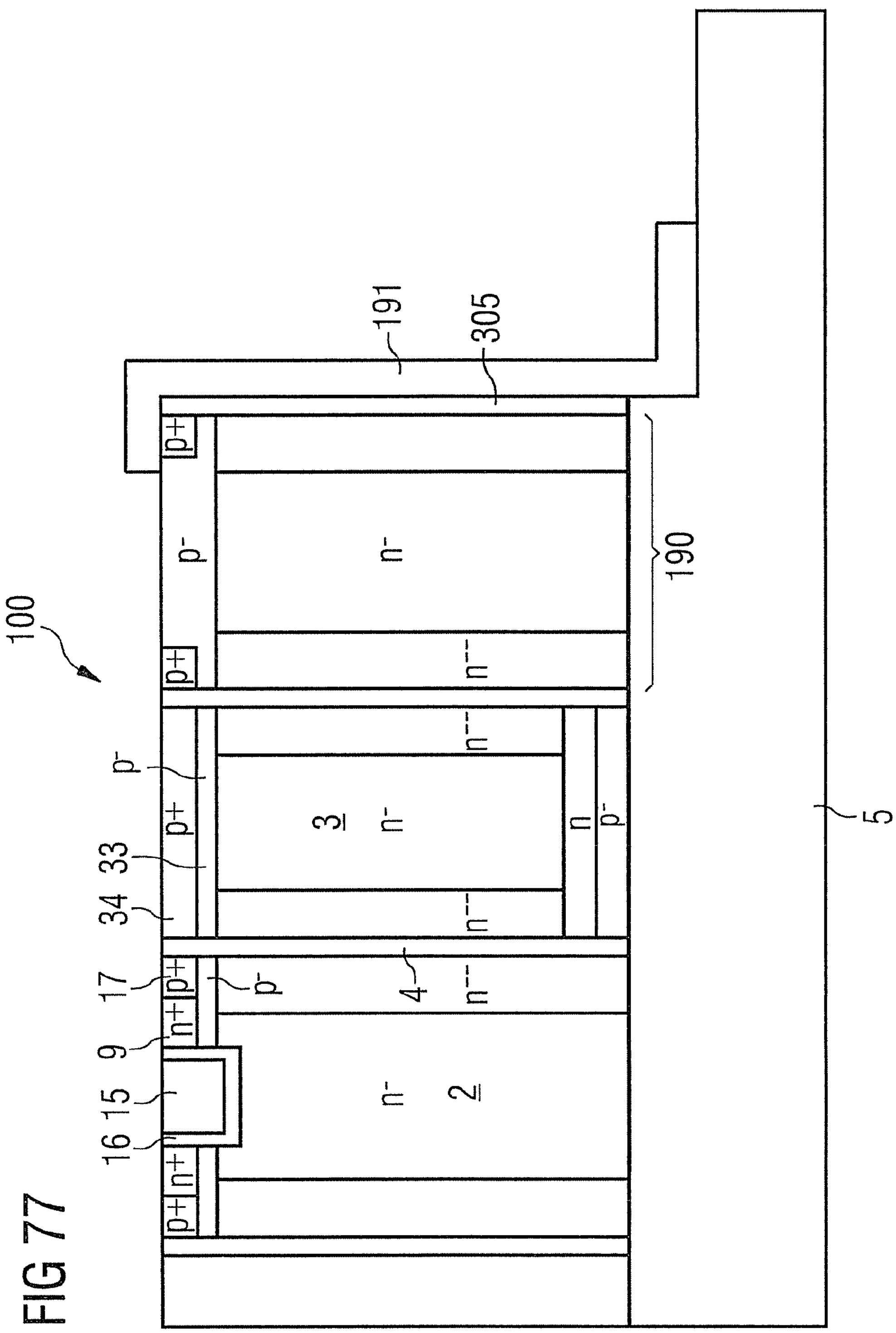

FIG. 77 illustrates a variant of the component in accordance with FIG. 76. In the case of this component, the passivation layer 191 is applied directly to the non-active transistor cell 190, in which case a dielectric layer 305 corresponding to the accumulation dielectric 4 in the cell array can be arranged between the passivation and the transistor cell.

Figure 78:
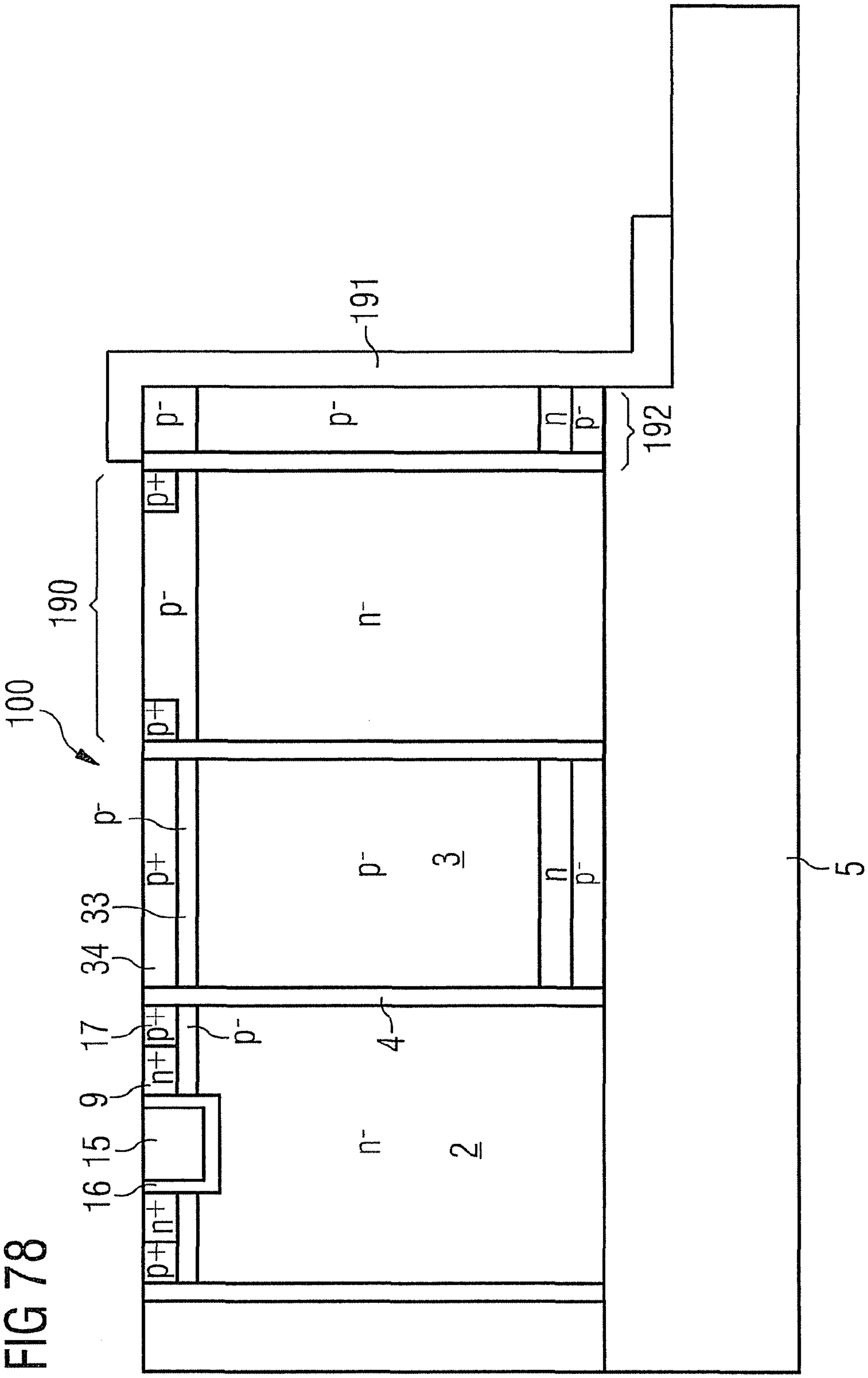

FIG. 78 illustrates a further exemplary embodiment of a semiconductor component with an edge structure. In this case of this component, the drift control region 3 is p-doped. A p-doped semiconductor section is correspondingly present between the non-active transistor cell 190 and the passivation layer 191, the semiconductor section having been produced by partial etching of a drift control region structure in the edge region.

Figure 79:
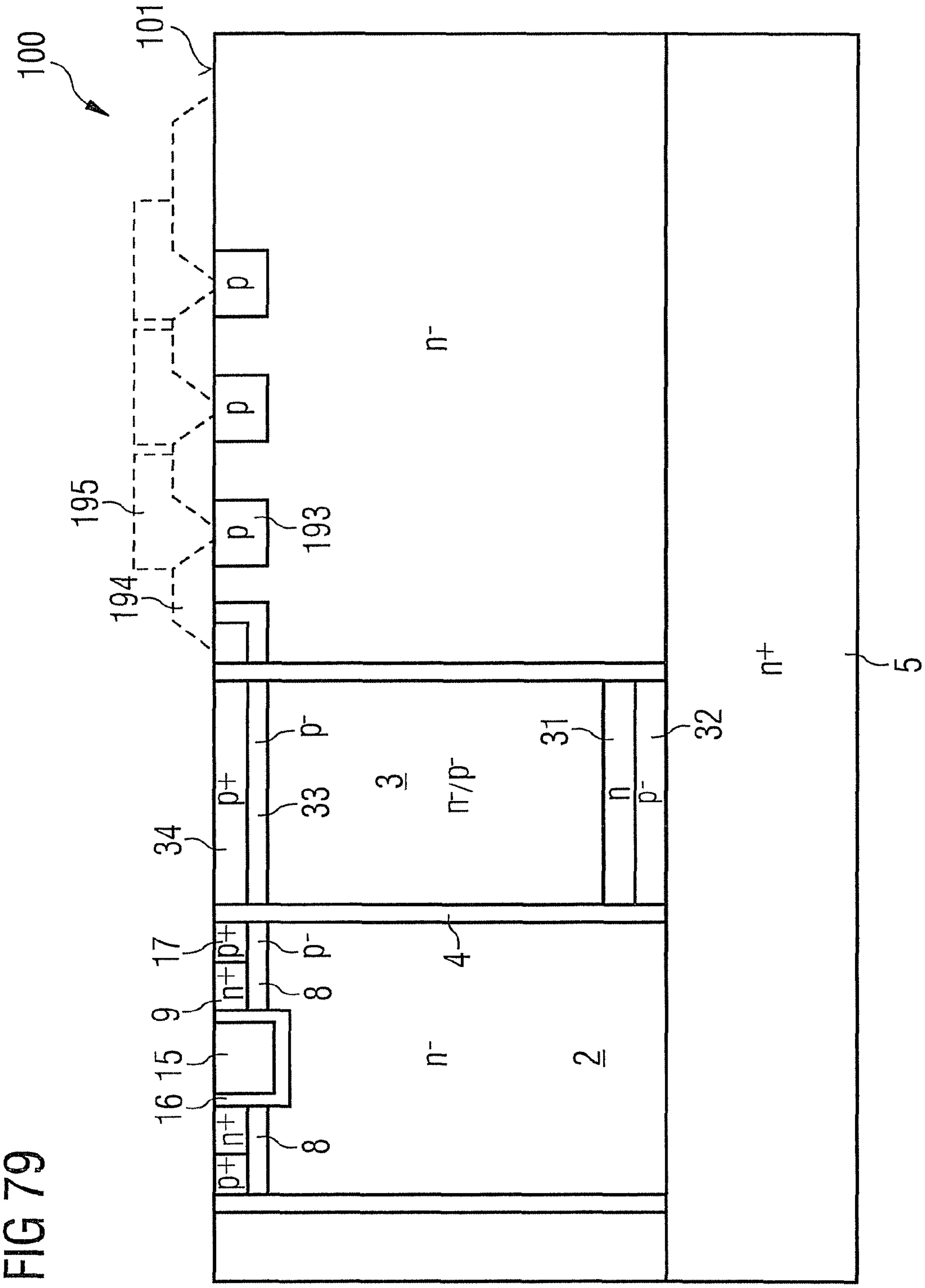

The edge structures explained above with reference to FIGS. 74 to 78 require the epitaxial layer to be etched back down to the semiconductor substrate 5. Referring to FIG. 79, such etching back of the epitaxial layer can be dispensed with. In the case of the component illustrated in FIG. 79, an edge termination is formed by field rings 193 arranged at a distance from one another in a lateral direction below the front side 101 of the semiconductor body. These field rings are doped complementarily to a basic doping (an n-type doping in the present case) of the epitaxial layer. Optionally, contact can be made with the field rings by field electrodes 195. The field electrodes or field plates 195 are insulated from basically doped regions of the epitaxial layer by insulation layers.

Figure 80:
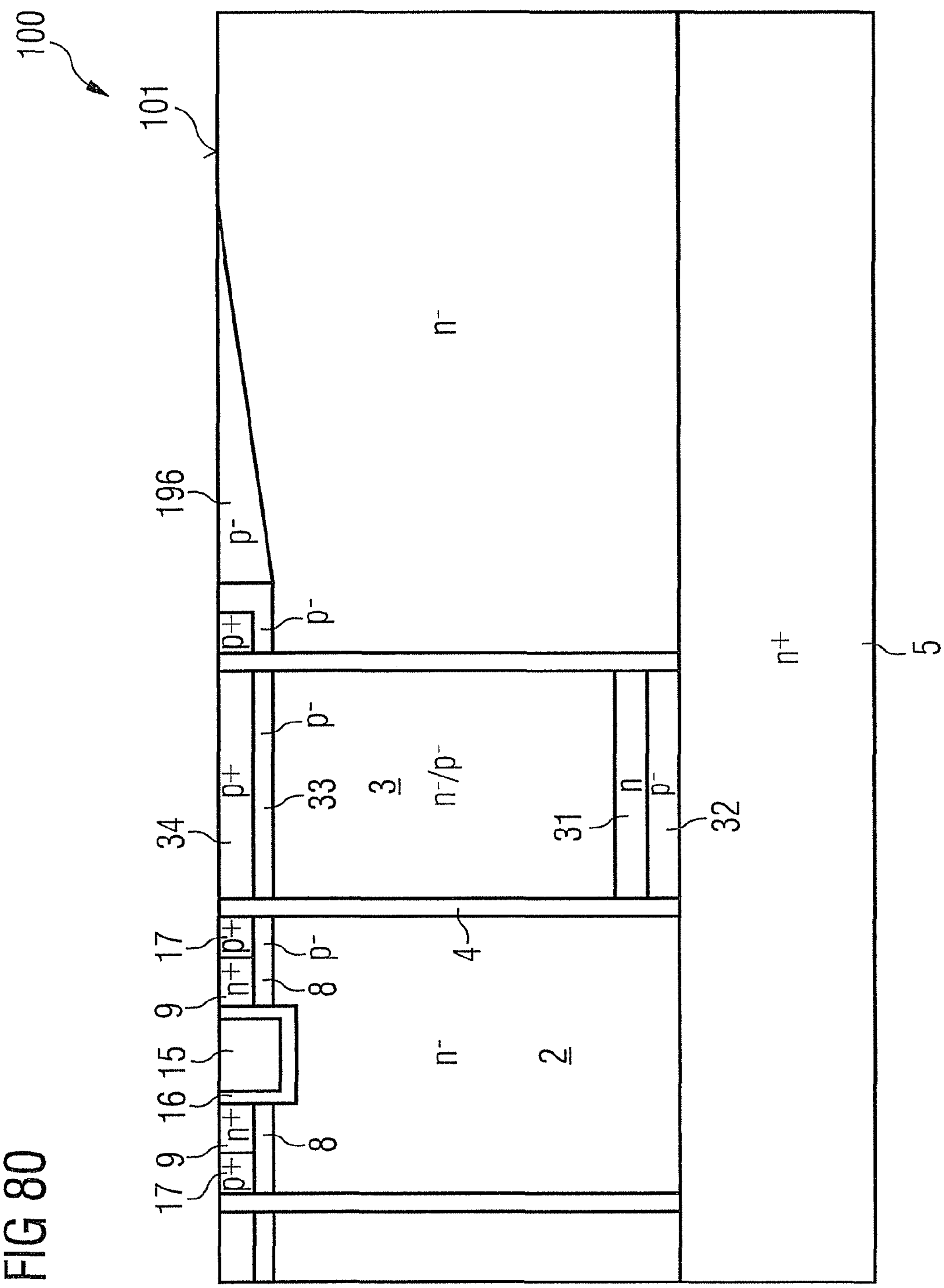

Instead of field rings, referring to FIG. 80, it is also possible to provide a VLD region 196 in the edge region of the semiconductor body.

Figure 81:
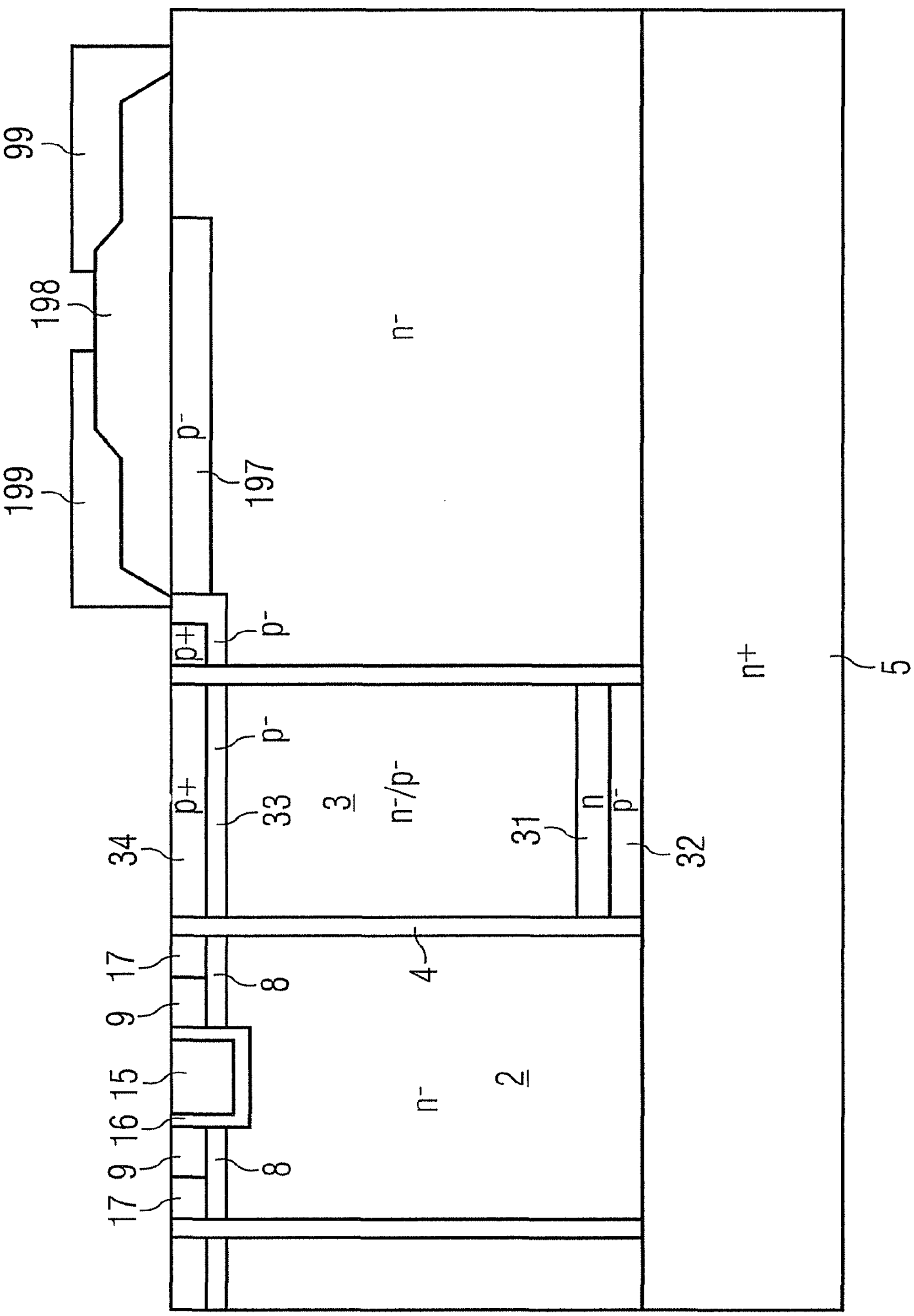

Referring to FIG. 81, there is also the possibility of providing in the edge region a uniformly doped semiconductor region 197 doped complementarily to the basic doping of the epitaxial layer. Field plates 199 are present above the semiconductor region 197, the field plates being connected on the one hand to a basically doped section of the epitaxial layer and on the other hand to the semiconductor region 197 doped complementarily to the basic doping.

Figure 82:
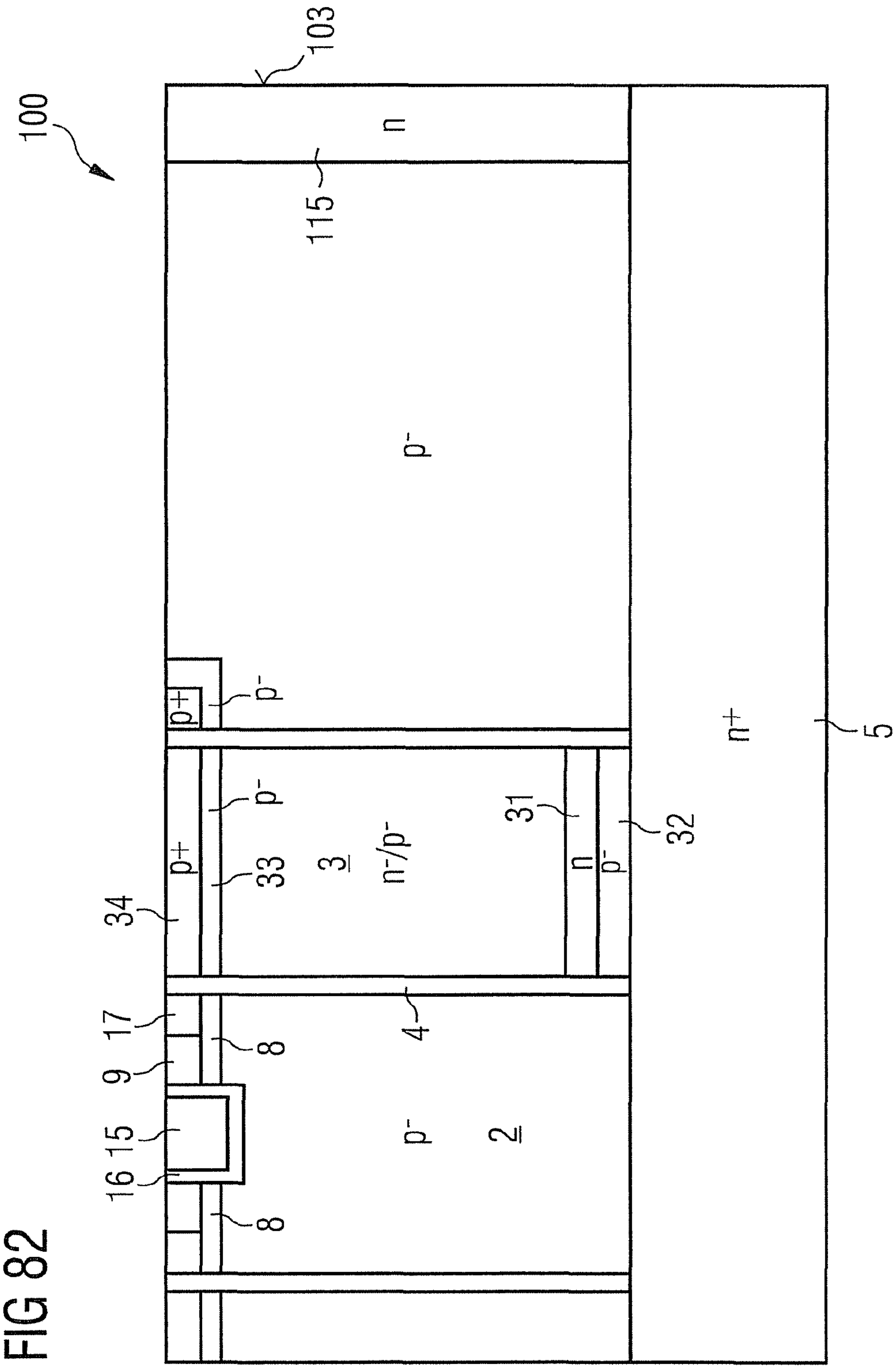
Figure 83:
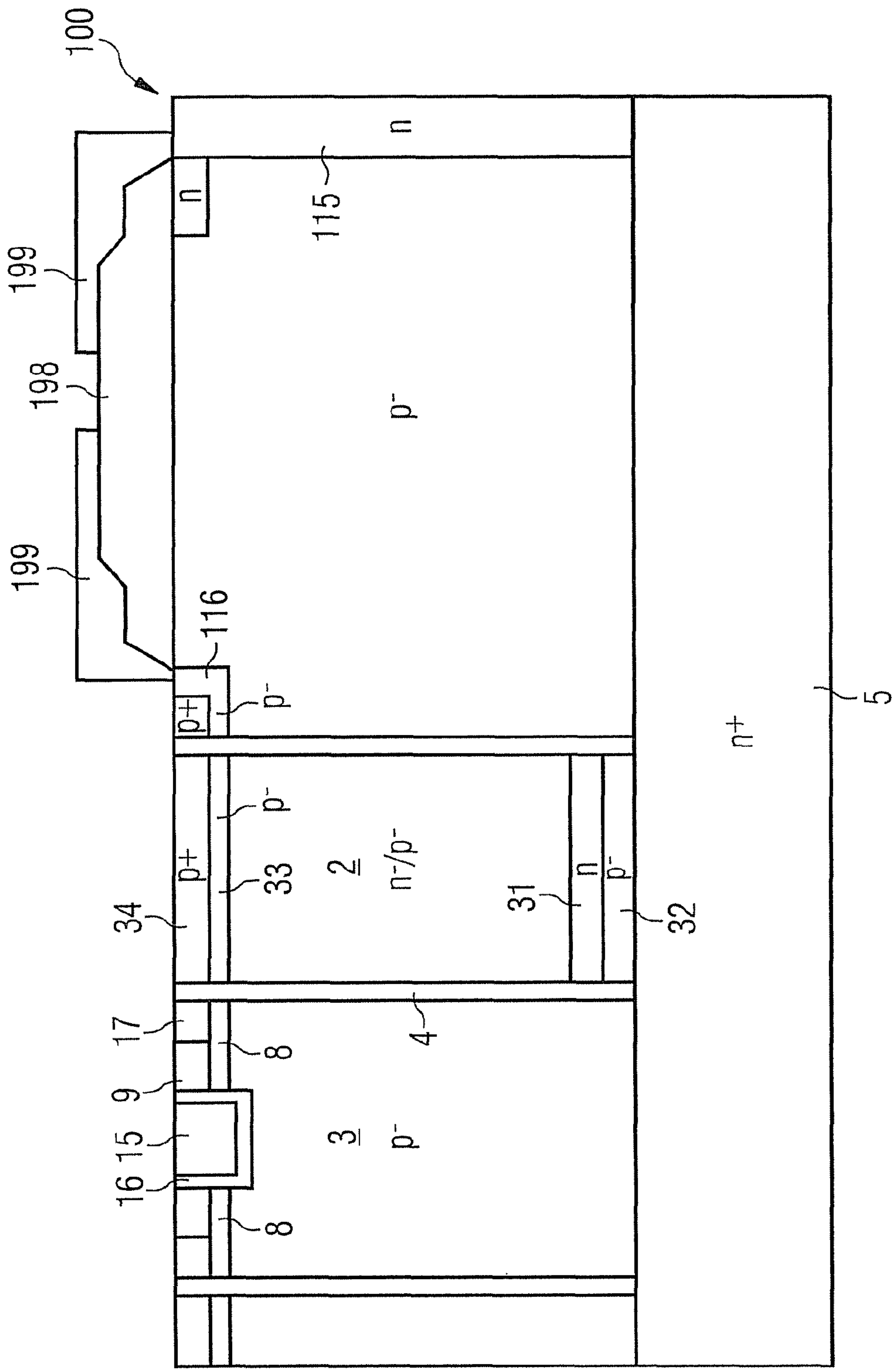

FIG. 82 illustrates an edge termination for an n-conducting semiconductor component with a p-doped epitaxial layer and thus a p-doped drift region 2. In the case of this component, the edge structure includes an n-doped semiconductor region 115 at the edge of the semiconductor body 100. Referring to FIG. 83, the n-doped semiconductor region 115 can be combined with a field plate structure 199, one of the field plates 199 being connected to the n-type region 115 and another of the field plates 199 being connected to a basically doped section of the epitaxial layer. This other field plate can be connected to the basically doped section via a connection region 116 of the same conduction type as the epitaxial layer.

Figure 84:
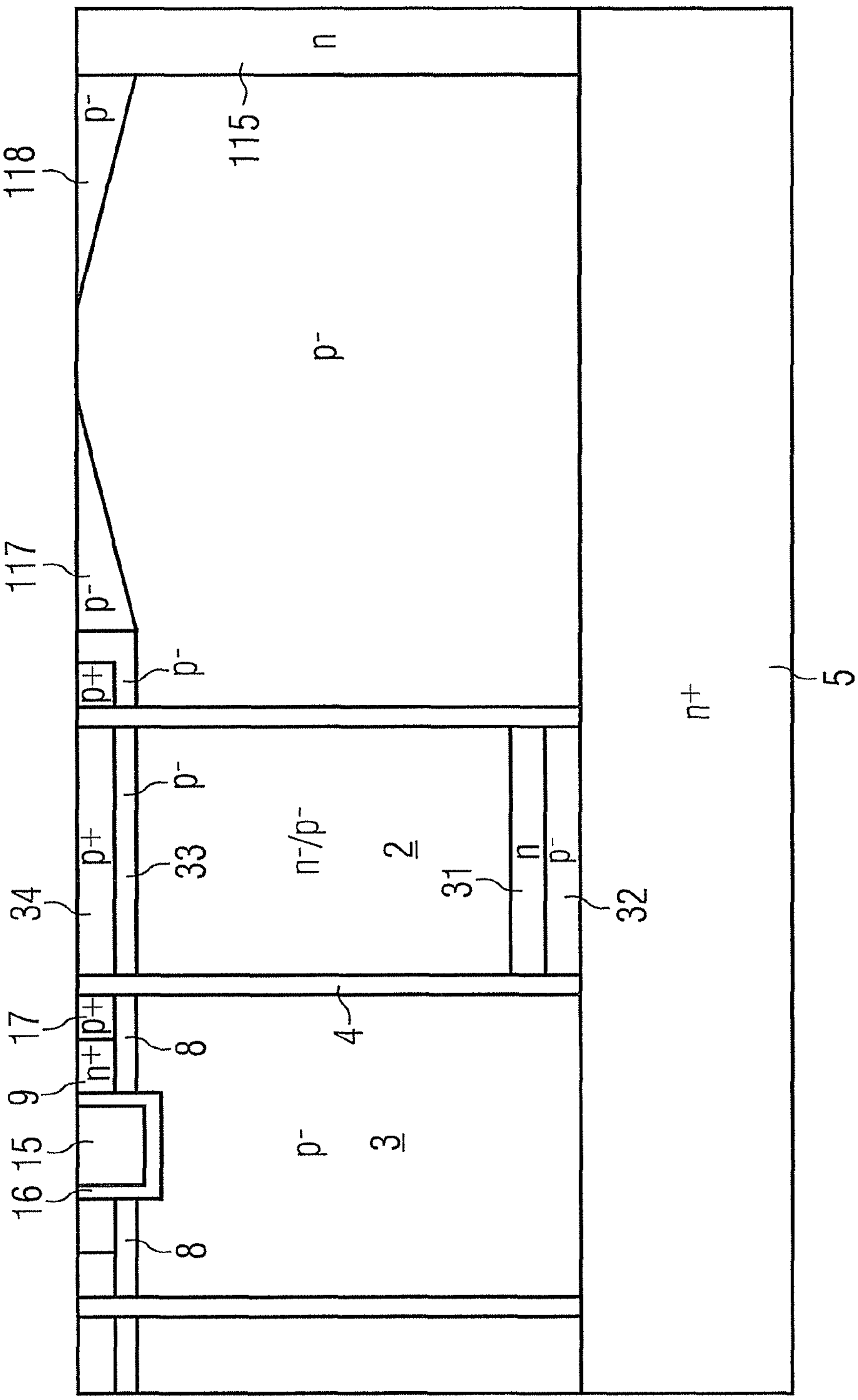

In a further embodiment, illustrated in FIG. 84, of an edge structure, two VLD regions 117, 118 are present, one 117 of which extends from the direction of the cell array in the direction of the edge and another 118 of which extends from the direction of the edge in the direction of the cell array. In this case, the "extending direction" denotes the direction in which the doping of the respective VLD region decreases.

Figure 85:
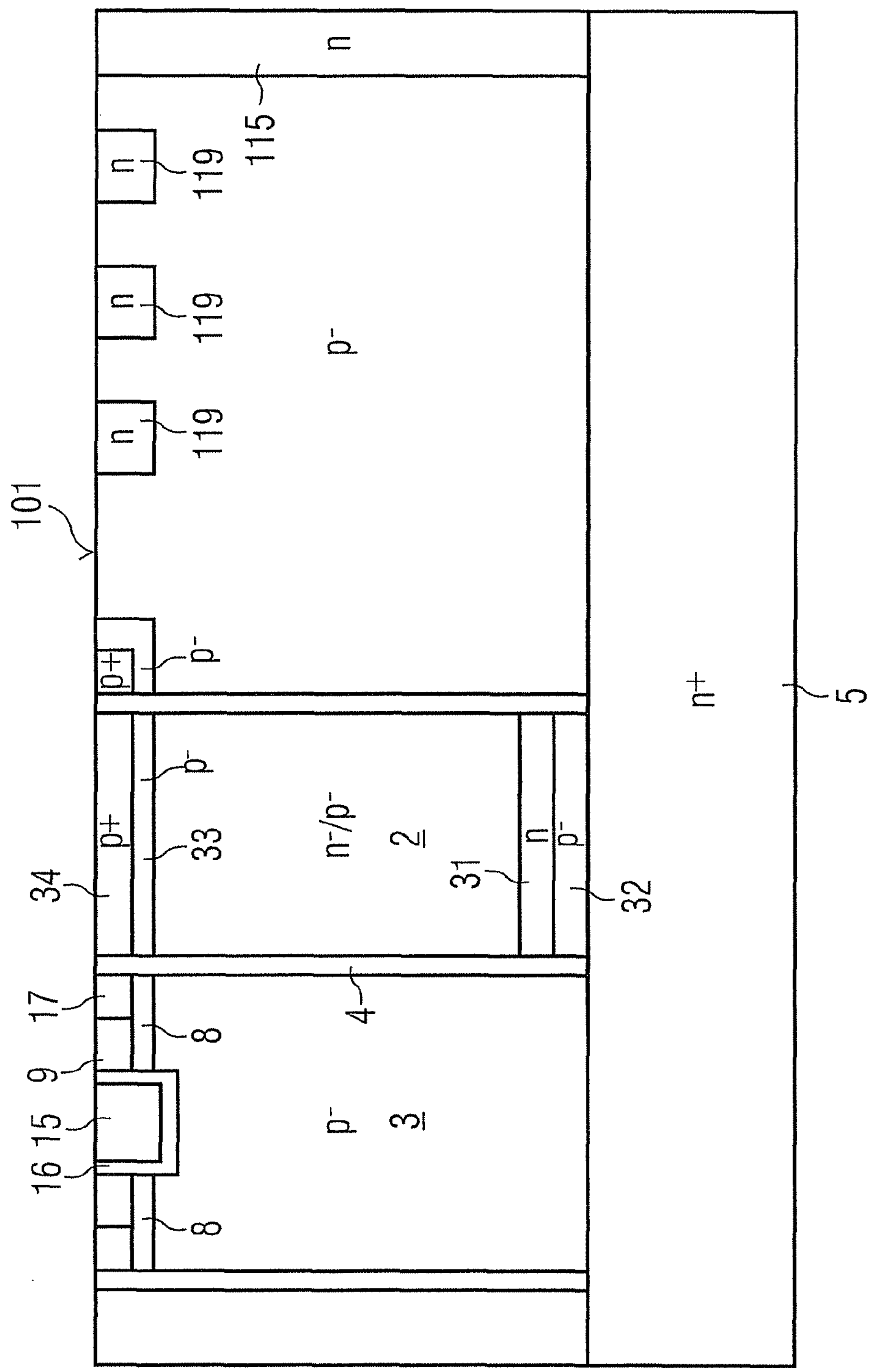

Referring to FIG. 85, in the case of a p-doped epitaxial layer, the n-doped edge region 115 can also be combined with n-doped field rings 119 arranged below the front side 101 of the semiconductor body in the edge region of the p-type epitaxial layer.

The present invention is not restricted to MOSFETs, but rather can be applied to any power semiconductor components, in one embodiment unipolar power semiconductor components. The following Figures illustrate the application of the principle to a Schottky diode.

Figure 86:
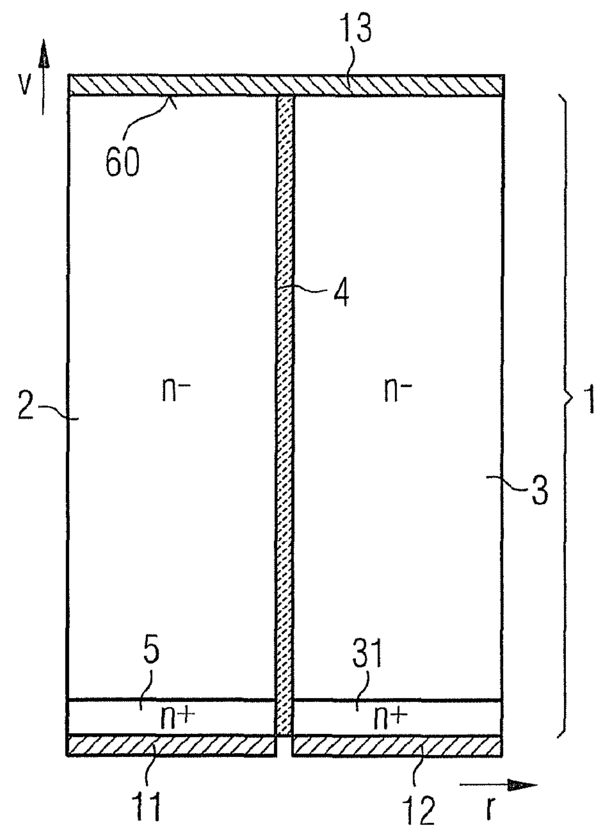
FIG. 86 illustrates a cross section through a semiconductor component which is embodied as a Schottky diode and in which the drift control regions are formed in monocrystalline fashion and are electrically insulated on the cathode side from the highly doped connection region of the diode region.

FIG. 86 illustrates a Schottky diode with a metallic anode 13, which makes contact with a weakly n-doped drift region 2 and forms a Schottky junction 60 with the latter. A heavily n-doped connection region 5 is arranged on that side of the drift region 2 which is remote from the Schottky junction 60, a cathode electrode 11 making contact with the connection region.

A weakly n-doped, monocrystalline drift control region 3 is provided adjacent to the drift region 2, and is separated from the drift region via a dielectric layer 4. In the case of the component in accordance with FIG. 86, a connecting region 31 doped more highly than the drift control region 3 is adjacent to the drift control region 3 and electrically connects the drift control region 3 to a second electrode 12 on the cathode side.

In accordance with one preferred embodiment, the drift region 2 and the drift control region 3 extend over the same region in the vertical direction v and preferably have the same doping profile in the vertical direction v. Likewise, the connection region 5 and the first connecting region 31 extend over the same region in the vertical direction v and preferably have the same doping profile in the vertical direction v.

The cathode electrode 11 and the second electrode 12 are electrically insulated from one another.

During operation in the forward direction, the Schottky diode in accordance with FIG. 86 has between the anode electrode 13 and the cathode electrode 11*a* diode current $I_D$ that is significantly higher than the diode current $I_D$ of the same component if the cathode electrode 11 and the second electrode 12 are short-circuited. The latter case of a cathode electrode 11 short-circuited with the second electrode 12 corresponds—apart from the accumulation dielectric 4—to that of a conventional Schottky diode without a drift control region.

For the operation of a Schottky diode in accordance with FIG. 86, the drift control region 3 should be connected to the connection region 5 on the cathode side, preferably with high resistance, such that an electrical potential profile that leads to the formation of an accumulation channel along the accumulation dielectric in the drift region 2 can be established in the drift control region.

Figure 87:
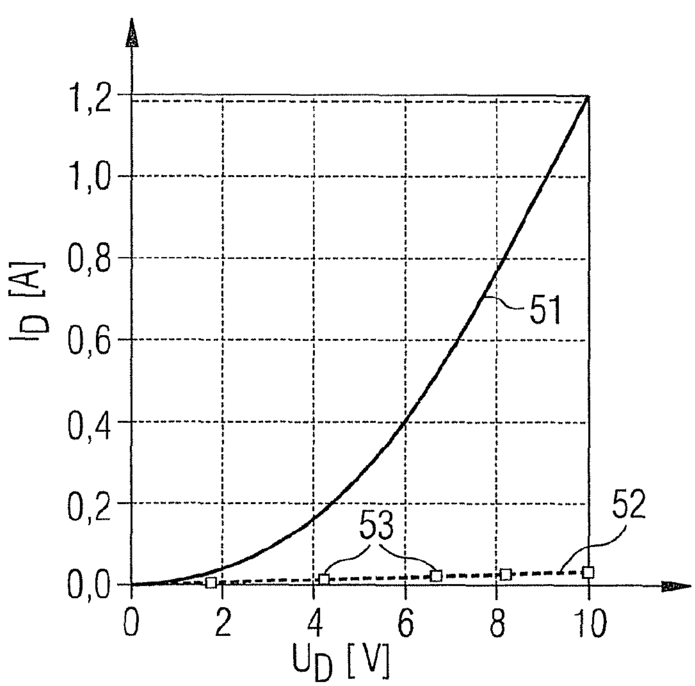
FIG. 87 illustrates a diagram with the profile of the diode current of the Schottky diode in accordance with FIG. 86, in which the drift control regions are connected to the highly doped connection region with high resistance on the cathode side, in comparison with the diode current through the same diode but with a cathodal short circuit between the drift control regions and the cathode electrode, in a linear representation.
Figure 88:
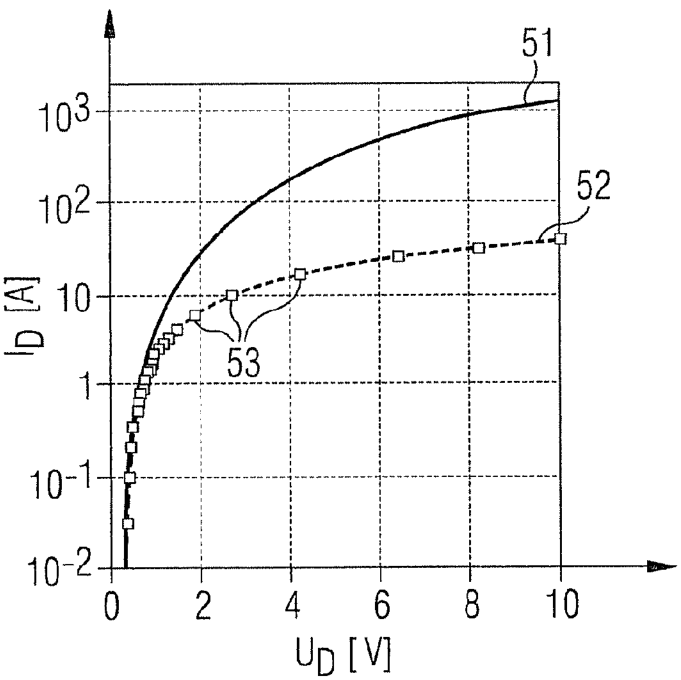
FIG. 88 illustrates the diagram in accordance with FIG. 87, but in a logarithmic representation.

FIGS. 87 and 88 illustrate the diode current $I_D$ as a function of the diode voltage $U_D$ in a linear and logarithmetic plot, respectively. In this case, the characteristic curve 51 represents the current-voltage characteristic curve of the diode in accordance with FIG. 86, the second electrode 12 being connected to the cathode electrode 11 with high resistance. The current-voltage characteristic curve 52 of the same diode for the case where the cathode electrode 11 and the second electrode 12 are short-circuited is illustrated for comparison with the characteristic curve 51.

The operating points 53 illustrate the conditions in the case of a conventional Schottky diode without a drift control region and without a dielectric, whose drift region also extends in a lateral direction over the region of the dielectric 4 and the drift control region 3 of the Schottky diode in accordance with FIG. 86 and which thus has a larger cross-sectional area than the drift region 2—carrying the steady-state current—of the Schottky diode in accordance with FIG. 86.

The operating points 53 lie to a very good approximation on the characteristic curve 52 of a conventional Schottky diode. It is evident from this that a Schottky diode having the properties of a conventional Schottky diode with the same width arises as a result of the short circuit between the cathode electrode 11 and the second electrode 12. Any deviation of the operating points 53 from the characteristic curve 52 that possibly arises as a result of the dielectric 4 additionally present is negligible owing to the small dimensions of the dielectric 4.

The reason for this greatly different profile of the characteristic curves 51, 52 is a highly inhomogeneous, channel-like electron distribution in the drift region 2 of the Schottky diode, which is brought about by the high-resistance cathodal linking of the drift control region 3 to the connection region 5.

Figure 89:
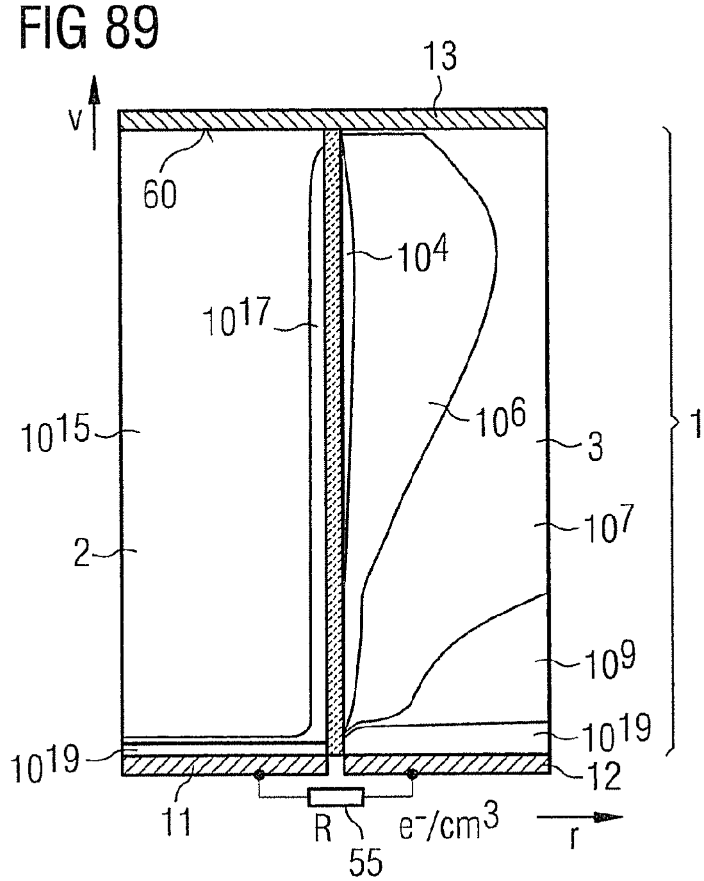
FIG. 89 illustrates the electron distribution of the Schottky diode in accordance with FIG. 86 in the on-state case.

FIG. 89 illustrates such an electron distribution in the case of a voltage with a level of 5 V present between the cathode electrode 11 and the anode electrode 13. It is evident from this that a region having an increased electron concentration with an electron density of approximately $10^{17}$ electrons/$cm^3$ forms on that side of the drift region 2 which faces the drift control region 3. The reason for this is the electric field in the accumulation dielectric 4, which is established on account of the high-resistance linking of the drift control region 3 to the connection region 5.

The high connection resistance for linking the drift control region 3 to the connection region 5 should be low enough to dissipate the hot leakage current from the region of the connection region 5 near the cathode electrode, with the Schottky diode in the off state, without an appreciable voltage drop to the cathode electrode 11. On the other hand, the connection resistance must be significantly higher than the bulk resistance of this region of the connection region 5 that is near the electrode, in order to enable an accumulation when the Schottky diode is forward-biased. For a Schottky diode having a reverse voltage strength of 600 V, expedient values for the cathodal connection resistivity between the connection region 5 and the drift control region 3 lie within the range of 1 to $10^4$ Ω·cm$^2$. Various possibilities that enable such a connection resistance to be realized are illustrated below in FIGS. 90 to 96.

Figure 90:
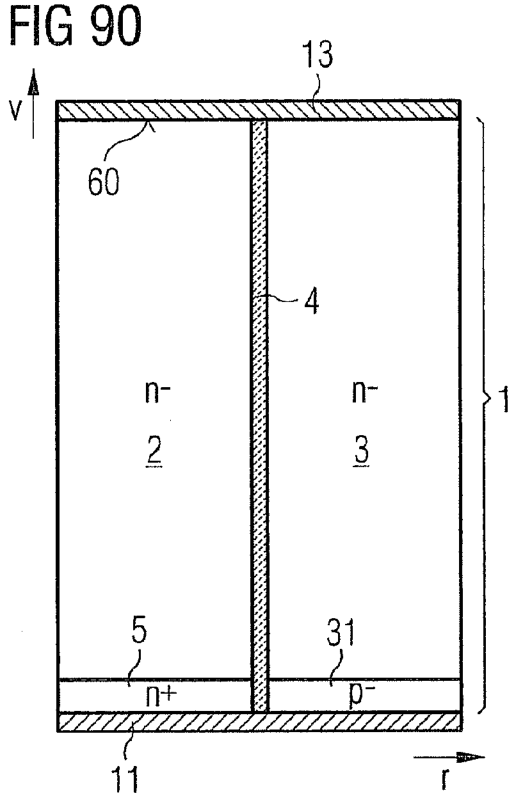
FIG. 90 illustrates a Schottky diode with a drift control region which is connected to the cathode electrode of the Schottky diode via a first connecting region that is doped weakly and complementarily with respect to the drift control region.

In the case of the Schottky diode in accordance with FIG. 90, a weakly p-doped first connecting region 31 is provided for this purpose, which connecting region connects the drift control region 3 to the drift region 2 on the cathode side via the cathode electrode 11 and the heavily n-doped connection region 5.

Figure 91:
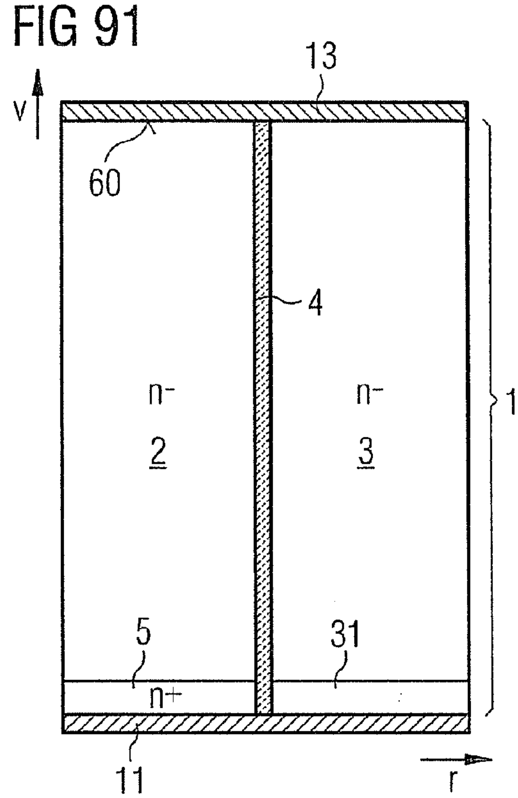
FIG. 91 illustrates a Schottky diode in accordance with FIG. 90, in which the first connecting region is formed from intrinsic rather than doped semiconductor material.

The Schottky diode in accordance with FIG. 91 has the same construction as the Schottky diode in accordance with FIG. 90, with the difference that the first connecting region 31 is not formed in weakly p-doped fashion, but rather as an intrinsic, i.e. undoped, semiconductor region or as a semiconductor region $n^{--}$-doped more lightly than the drift control region 3.

Figure 92:
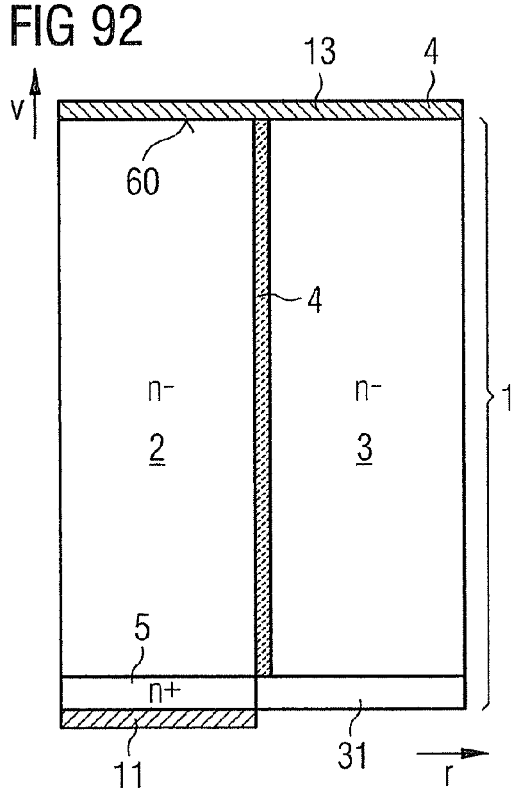
FIG. 92 illustrates a Schottky diode with a drift control region which is directly connected to the highly doped connection region via an intrinsic first connecting region.

Referring to FIG. 92, it is not necessary to couple the drift control region 3 to the drift region 2 with the interposition of the cathode electrode 11. Instead, by way of example, the first connecting region 31 can be coupled to the drift region 2 via the highly doped connection region 5 whilst bypassing the cathode electrode 11. In accordance with this embodiment of the invention, the first connecting region 31 in this case makes contact directly with the highly doped connection region 5. In order to make this possible, the dielectric 4 is spaced apart from the cathodal surface of the semiconductor body 1 at least in sections. However, the dielectric 4 must be formed in such a way that nowhere is there a direct connection between the drift region 2 and the drift control region 3.

Figure 93:
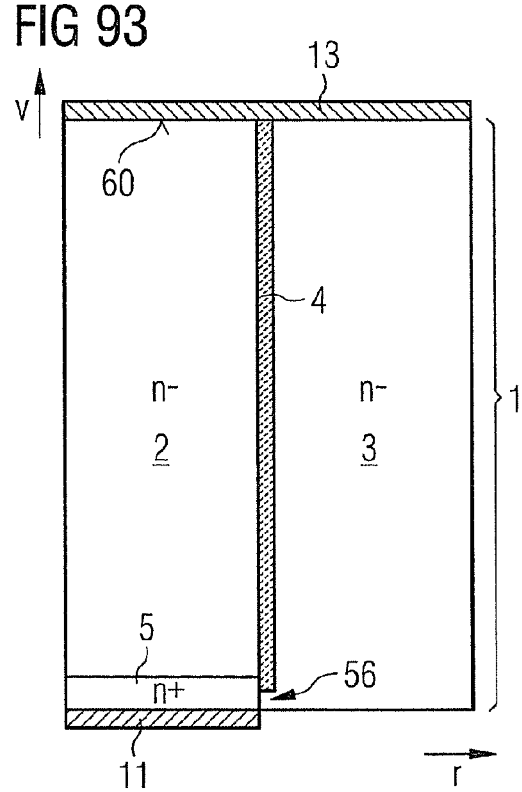
FIG. 93 illustrates a Schottky diode in which at least one of the drift control regions has an extension which extends as far as the highly doped connection region and makes contact with the latter.

One exemplary embodiment in accordance with FIG. 93 provides for the drift control region 3 to make contact directly with the highly doped connection region 5. For this purpose, the dielectric 4, at least in sections, does not extend as far as the cathodal surface of the semiconductor body 1. In this region between the dielectric 4 and the cathodal surface of the semiconductor body 1, a section 56 of the drift control region 3 extends as far as the highly doped connection region 5 and makes contact with the latter. The electrical linking resistance between the drift control region 3 and the drift region 2 can be established in one embodiment by way of the geometrical dimensions of this extension 56.

Instead of a section 56 of the drift control region 3, however, it is also possible to introduce some other electrically resistive material which electrically connects the drift control region 3 to the connection region 5.

Figure 94:
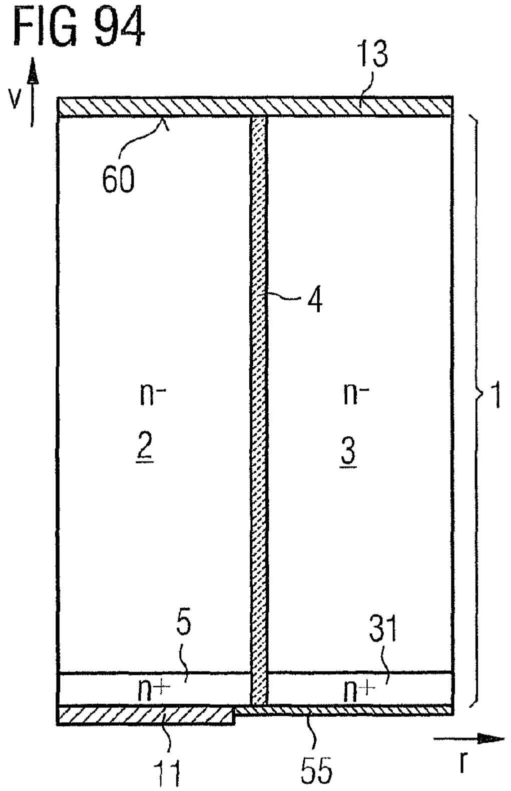
FIG. 94 illustrates a Schottky diode with a drift control region which is connected to the highly doped connection region via a high-resistance resistive layer.

In the case of one exemplary embodiment in accordance with FIG. 94, the cathodal linking of the drift control region 3 to the connection region 5 is effected by using a layer-like resistor 55 applied to the semiconductor body 1 on the cathode side. In this case, the resistor 55 makes contact both with a first heavily n-doped connecting region 31 and with the highly doped connection region 5.

Figure 95:
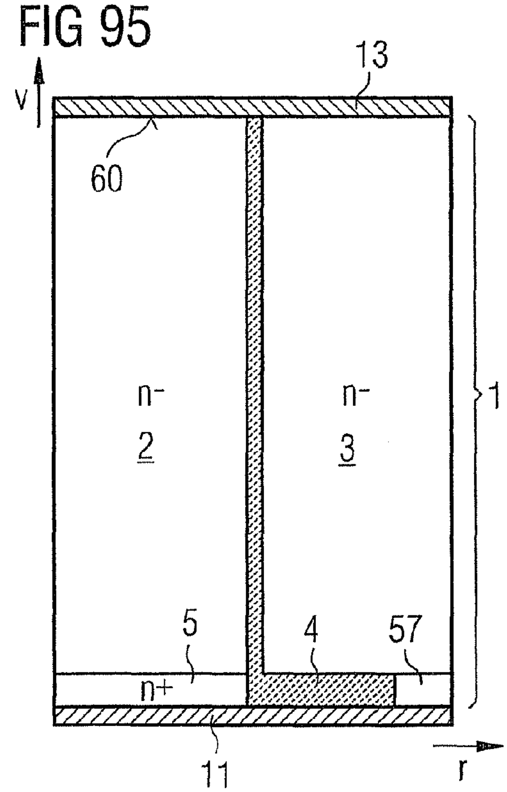
FIG. 95 illustrates a Schottky diode with a drift control region which is insulated from the cathode electrode of the Schottky diode in sections on the cathode side.

In one exemplary embodiment in accordance with FIG. 95, the dielectric 4 also extends in sections between the cathodal end of the drift control region 3 and the cathode electrode 11, which extends as far as below the drift control region 3 in a lateral direction.

In the region between the drift control region 3 and the cathode electrode 11, the dielectric 4 has one or more cutouts 57 filled with resistive material. The linking resistance between the drift control region 3 and the connection region 5 can be established in a targeted manner depending on the number and size of the cutouts 57 and on the resistivity of the resistive material introduced therein. In one embodiment, n-doped, p-doped or intrinsic semiconductor material is also suitable as resistive material.

Figure 96:
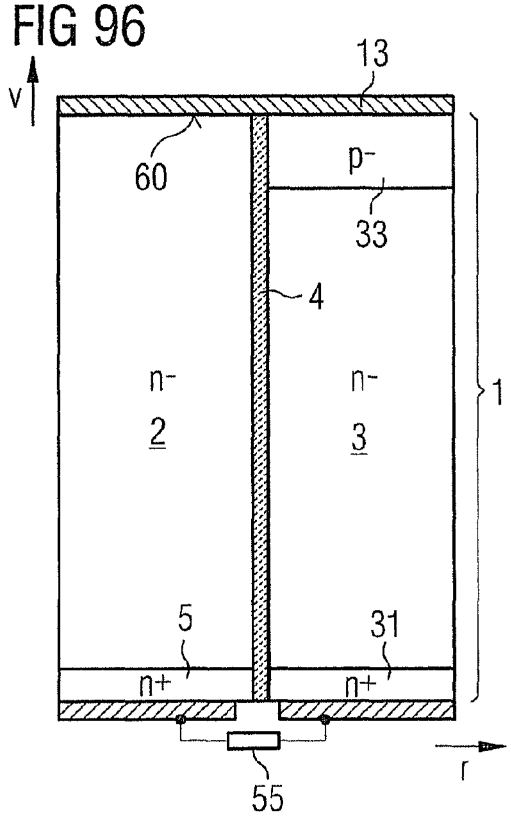
FIG. 96 illustrates a Schottky diode in accordance with FIG. 86, in which the drift control region is connected to the anode metal of the Schottky contact of the Schottky diode by using a weakly p-doped connecting layer.

The exemplary embodiment in accordance with FIG. 96 illustrates a special feature. In this case, the drift control region 3 is connected to the metal 13 of the Schottky junction 60 on the anode side via a weakly p-doped third connecting region 33. Through this weakly p-doped third connecting region 33, no bipolar charge carrier injection occurs on account of the high-resistance cathodal connection of the drift control region 3 to the drift region 2.

The weakly p-doped third connecting region 33 acts in a field-shielding fashion in a manner similar to the corresponding p-doped regions of a merged pin Schottky diode and thus reduces the electric field strength at the Schottky junction 60. Since there is no appreciable current flow in the region of the drift control region 3, however, the injection behavior that is undesirable in the case of a merged pin Schottky diode as well does not occur here and, consequently, nor does an undesirable increase in the turn-off loses as a result of the depletion of injected charge carriers from the drift control region 3.

In one exemplary embodiment in accordance with FIG. 96, the drift region 2 and the drift control region 3 are electrically connected on the cathode side via a symbolically illustrated resistor 55. This resistor is realized in any desired manner, in principle. However, the electrical linking can be realized in one embodiment in accordance with the exemplary embodiments illustrated in FIGS. 89 to 95 and 97 to 100.

Figure 97:
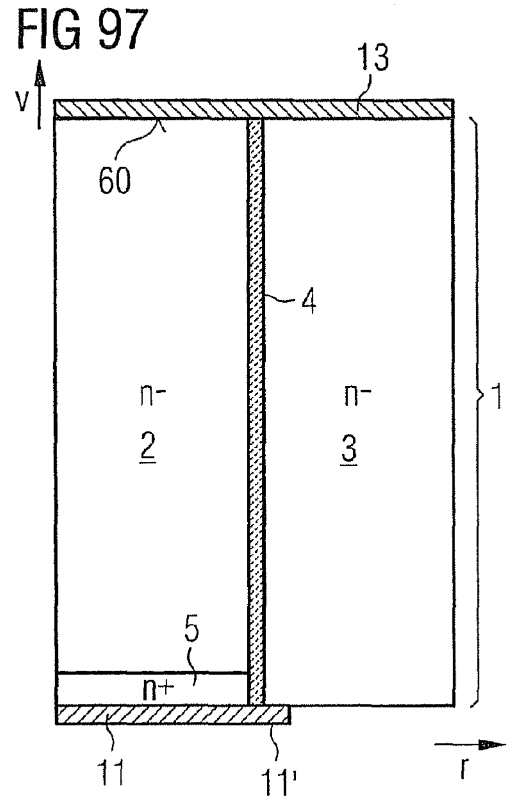
FIG. 97 illustrates a Schottky diode in which the drift control region is connected to the highly doped connection region via a section of a connection electrode.

FIG. 97 illustrates an embodiment in which the resistive linking of the drift control region 3 to the connection region 5 is effected by virtue of the fact that the cathode electrode 11, in sections, overlaps the drift control region 3 in a section 11'. In this case, the value of the contact resistance can be set by way of the width of the contact area 11'.

The nonreactive resistance that can be realized in various ways between the drift control region 3 and the connection region 5 can be replaced by a tunnel dielectric, in one embodiment a tunnel oxide, as is explained with reference to the following figures.

Figure 98:
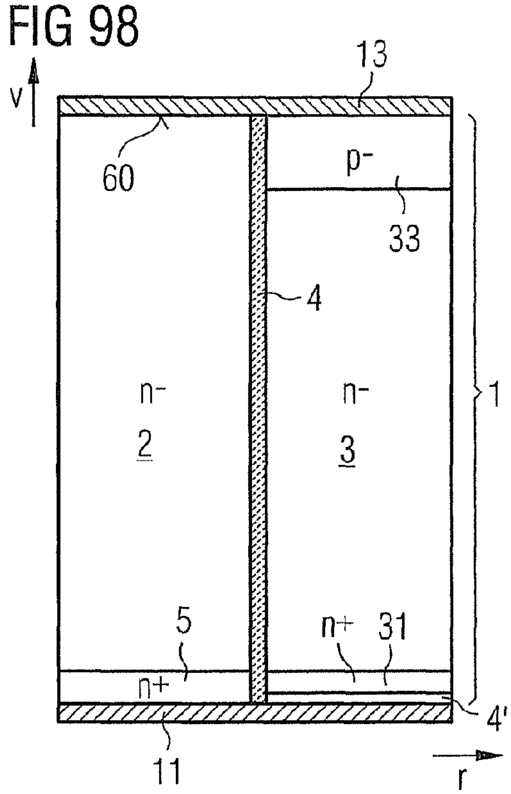
FIG. 98 illustrates a Schottky diode in which the drift control region is connected via a tunnel dielectric to a connection electrode that makes contact with the highly doped connection region.

In the case of the Schottky diode in accordance with FIG. 98, the connection electrode 11 completely covers the region of the drift control region 3 and the drift region 2, the drift control region 3 being connected to the connection electrode 11 via an optional highly doped connection region 31 and a tunnel dielectric 4'. The drift control region 3 is optionally connected to the anode electrode 13 via the third connecting region 33.

Figure 99:
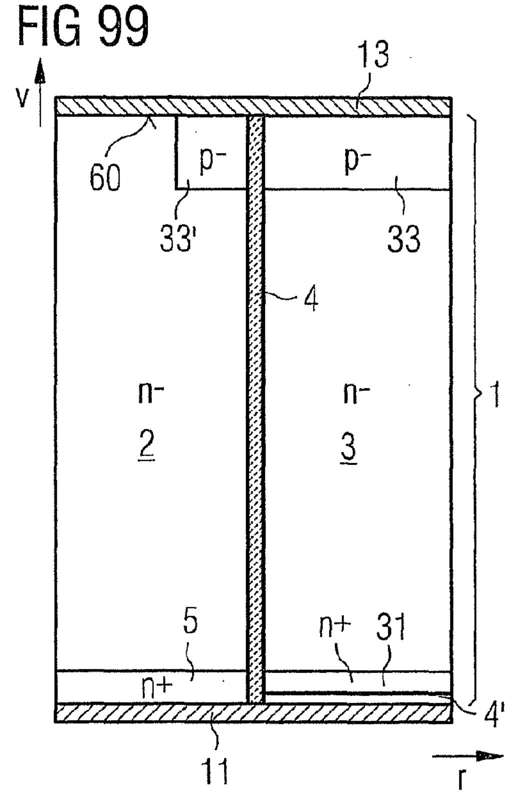
FIG. 99 illustrates a Schottky diode which is modified relative to the Schottky diode in FIG. 98 and which is embodied as a “merged” Pin Schottky diode.

The component in accordance with FIG. 99 is embodied as a merged pin Schottky diode and has in the drift region 2, in sections, a p-doped injection region 33' adjacent to the anode electrode 13. In this case, as illustrated in FIG. 99, the injection region 33' can adjoin the dielectric 4 or else be spaced apart laterally from the latter. The latter variant (not illustrated) facilitates the linking of the Schottky junction 60 to the accumulation channel formed at the boundary between the drift region 2 and the dielectric 4.

Figure 100:
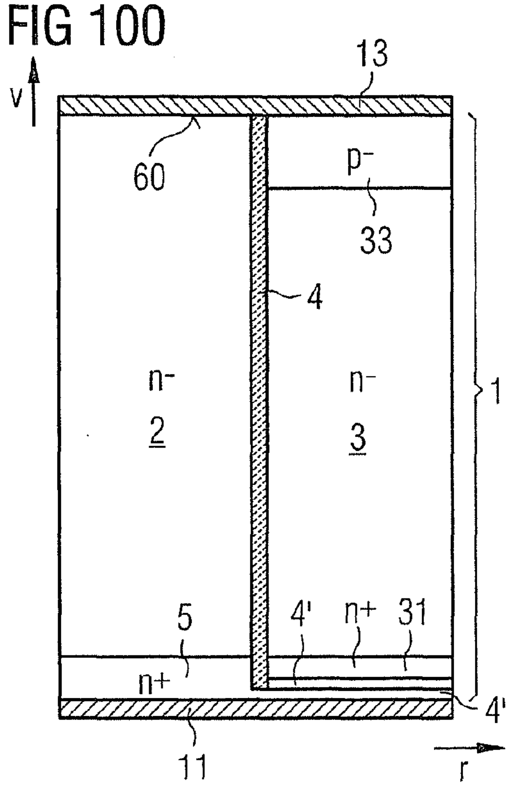
FIG. 100 illustrates a Schottky diode which is modified relative to the Schottky diode in FIG. 98 and in which a monocrystalline semiconductor layer is arranged between the tunnel dielectric and the connection electrode.

The component in accordance with FIG. 100 differs from the component in accordance with FIG. 98 by virtue of the fact that the dielectric 4 does not extend as far as the cathode electrode 11, and that the connection region 5 extends below the tunnel dielectric 4', such that the drift control region 3 is connected to the connection region 5 via the optional highly doped connecting region 31 and the tunnel dielectric 4'.

Figure 101:
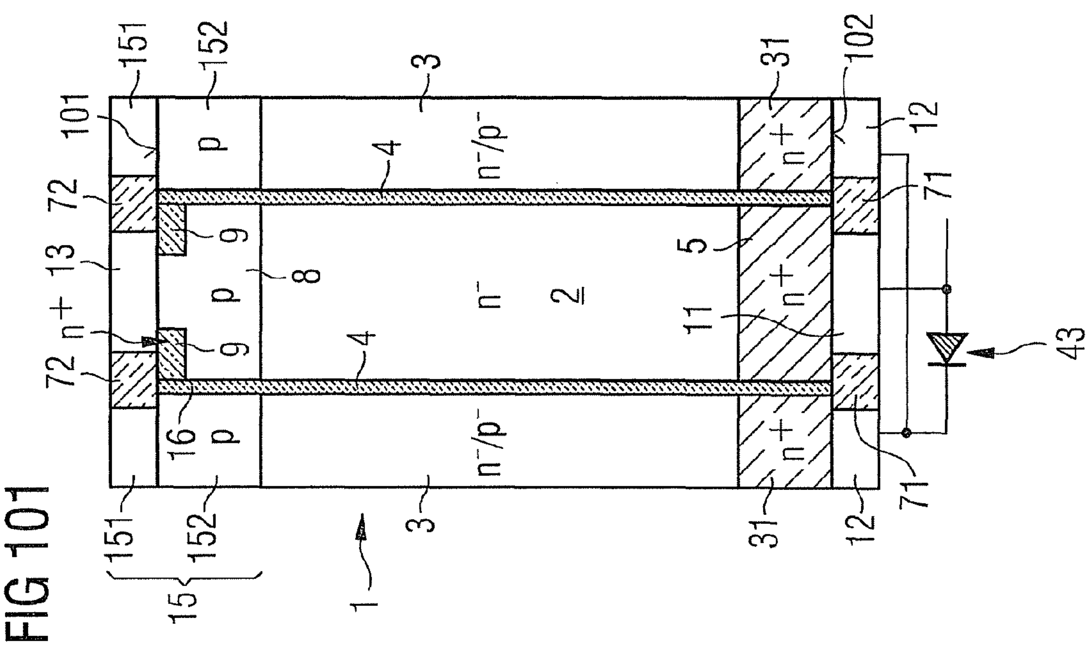
FIG. 101 illustrates a semiconductor component which is embodied as a MOSFET and in which the drift control region directly adjoins the gate electrode on one side and is coupled to the drain region via a diode on another side.

FIG. 101 illustrates one exemplary embodiment of a power semiconductor component embodied as a MOSFET. In the case of this component, the gate electrode 15 and the drift control region 3 are arranged adjacent to one another in a vertical direction of the semiconductor body 1, the gate electrode 15 being directly adjacent to the drift control region 3. In the case of this component, the gate electrode 15 is constructed in two parts and includes a connection electrode 151, which is arranged above the front side of the semiconductor body 1 and is insulated form the source electrode 13 by using an insulation layer 72. A p-doped semiconductor section 152 is adjacent to the connection electrode 151 in a vertical direction, which semiconductor section is arranged adjacent to the body region 8 in a lateral direction of the semiconductor body 1 and is separated from the body region 8 by the gate dielectric 16. The semiconductor region 152 fulfils the actual function of the gate electrode and serves, when a suitable driving potential is applied, to form a conducting channel between the source region 9 and the drift region 2 in the body region 8 along the gate dielectric 16.

The semiconductor region 152 of the gate electrode 15 is p-doped in the case of the n-conducting MOSFET illustrated in FIG. 101. The drift control region 3 directly adjacent to the semiconductor region 152 is either n-doped or p-doped, the doping concentration of the drift control region being lower than the doping concentration of the semiconductor region 152. The doping of the drift control region is for example in the region of $1\cdot10^{14}$ $cm^{-3}$ and may correspond to the doping concentration of the drift region 2. In this case, the doping concentration of the semiconductor region 152 may correspond to the doping concentration of the body region 8.

The n-MOSFET illustrated in FIG. 101 is turned on if a positive voltage is present between the drain region 5 and the source region 9, and if a driving potential higher than the potential of the source and body regions 9, 8 is present at the gate electrode 15. This positive driving potential of the gate electrode 15 leads to the formation of an inversion channel in the body region 8 between the source region 9 and the drift region 2. When the component is driven in the on state, the drift control region 3 is approximately at the potential of the gate electrode 15, which leads to the formation of an accumulation channel in the drift region 2 along the accumulation dielectric 4. When the component is fully driven in the on state, the potential of the drain region 5 is usually lower than the potential of the gate electrode 15, such that the accumulation channel forms in a vertical direction completely along the accumulation dielectric 4 between the body region 8 and the drain region 5. A diode 43 connected between the connection electrode 12 of the drift control region 3 and the drain region 5 or the drain electrode 11 prevents, during this circuit state, the holes present in the drift control region 3, which holes bring about the accumulation channel, from flowing away in the direction of the drain region 5 or the drain electrode 11.

Figure 102:
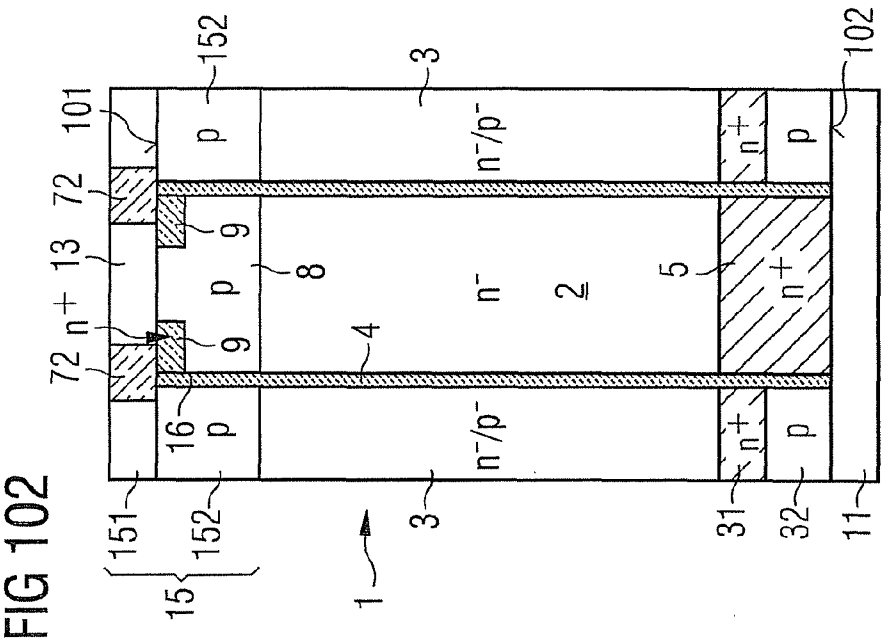
FIG. 102 illustrates a component which is modified relative to the component in FIG. 101 and in which the diode is realized as an integrated diode.

The diode 43, only the circuit symbol of which is illustrated in FIG. 101, can be realized as an external diode. Referring to FIG. 102, there is also the possibility of integrating the diode 43 in the drift control region by virtue of a semiconductor region 32 doped complementarily to the connection region 31 and complementarily to the drain region 5 being provided between the highly doped connection region 31 of the drift control region 3 and the drain electrode 11. The task of the diode 43—as already explained in connection with FIG. 16—is to prevent holes from flowing away from the drift control region 3 to the drain region 5.

In the case of the components illustrated in FIGS. 101 and 102, the gate dielectric 16 and the accumulation dielectric 4 can be realized as a common dielectric layer extending in a vertical direction of the semiconductor body 100. In the case of the components illustrated in FIGS. 101 and 102, these dielectric layers run in a vertical direction in each case over the entire depth of the component, that is to say that the dielectric layers extend from the front side as far as the rear side of the semiconductor body 1.

Figure 103:
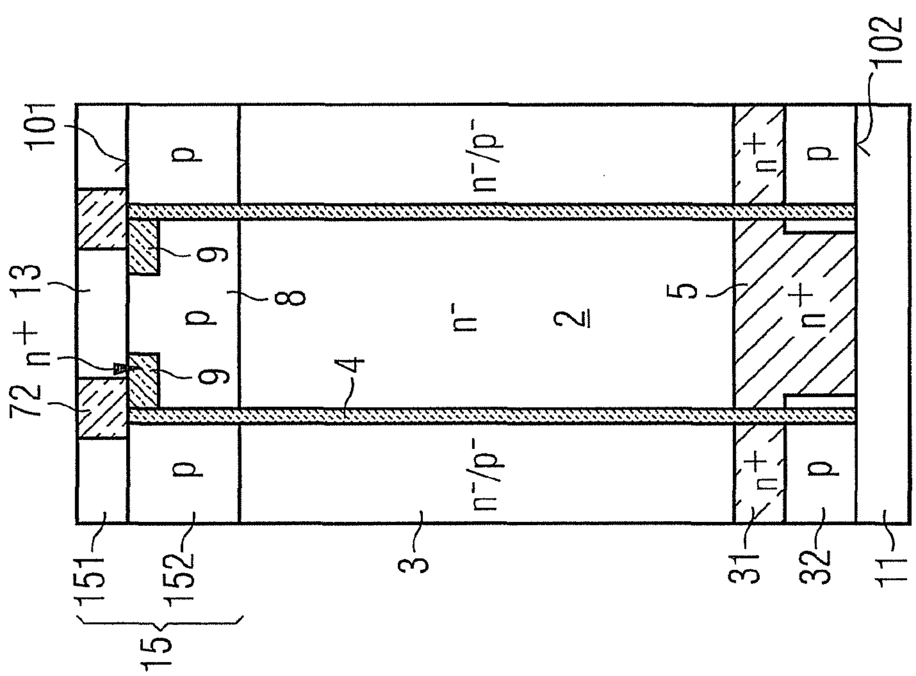
FIG. 103 illustrates a further component modified relative to the component in FIG. 101.

FIG. 103 illustrates a component which is modified relative to the component in FIG. 102 and in which the accumulation dielectric 4 ends before the rear side 102 of the semiconductor body 1, such that the drain region 5 and the p-doped connection region 32 adjoin one another in sections in a lateral direction. The n-doped connection region 31 and the drain region 5 are completely separated from one another in a lateral direction of the semiconductor body, however, by the accumulation dielectric 4.

Figure 104:
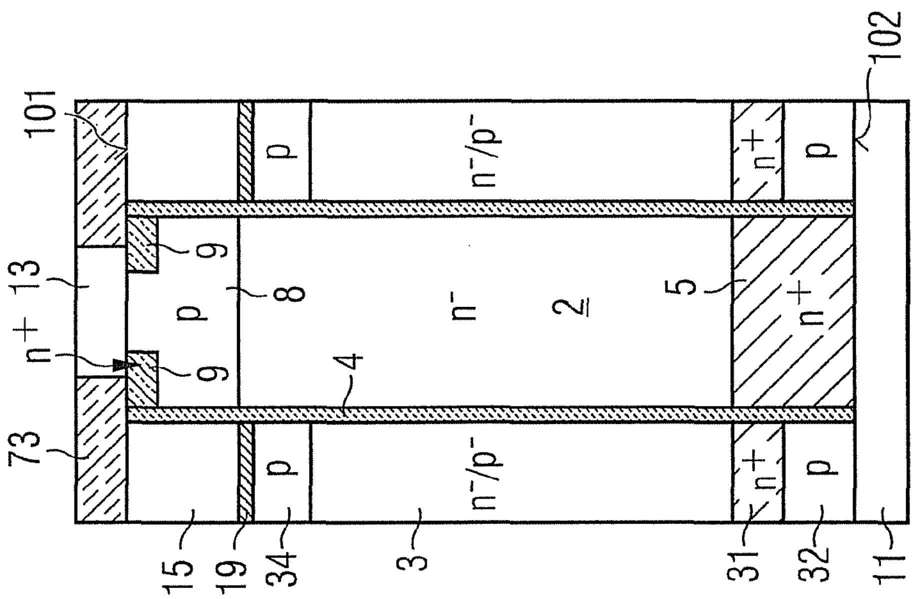
FIG. 104 illustrates a component which is modified relative to the component in FIG. 102 and in which the drift control region is connected to the gate electrode via a contact electrode.

FIG. 104 illustrates a further component modified relative to the component in FIG. 102. In this case, the drift control region 3 has in the direction of the gate electrode 15 a connection region 34 doped more highly than the drift control region 3, the connection region being p-doped in the example. The connection region 34 is connected to the gate electrode 15 via a connection electrode 19, which is composed of a silicide or a metal, for example. In the case of this component, the gate electrode 15 may be composed of a metal or a highly doped polysilicon.

The task of the conductive connection electrode 19 is, when using n-doped polysilicon for the gate electrode 15, to electrically conductively connect the gate electrode 15 to the p-doped connection region 34 of the drift control region 3. Without the presence of the connection electrode 19, a pn junction would otherwise be present between the gate electrode 15 and the drift control region 3 and would impede the charge carrier transport from the gate electrode 15 to the drift control region 3. The provision of the connection electrode 19 can be dispensed with if the gate electrode 15 is composed of a p-doped polysilicon.

FIG. 105 illustrates a modification of the MOSFET illustrated in FIG. 104. In the case of this component, the gate electrode 15 and the drift control region 3 are insulated from one another by the provision of a further insulation layer 74 between the gate electrode 15 and the drift control region 3. In the case of this component, in a manner not illustrated in greater detail, the connection electrode 19—adjacent to the insulation layer 74—of the drift control region 3 can be connected to a driving potential separate from the gate potential. The driving potential, for forming an accumulation channel in the drift region 2, should be chosen such that it is at least greater than the source potential, that is to say the potential of the source electrode 13 or of the source and body regions 9, 8. In this case, the driving potential can also be greater than the drain potential, that is to say the potential of the drain region 5, whereby the drift control region 3 is at a common potential due to the diode 31, 32 that is reverse-biased between the drift control region 3 and the drain region 5. If the driving potential of the connection electrode 19 is less than the potential of the drain region 5, then a voltage drop is present across the drift control region 3 in a vertical direction and the formation of an accumulation channel in the drift region 2 along the accumulation dielectric 4 is not possible over the entire length of the accumulation dielectric 4 in this case, but is possible in sections in a region adjacent to the body region 8, which leads to a reduction of the on resistance.

Figure 106D:
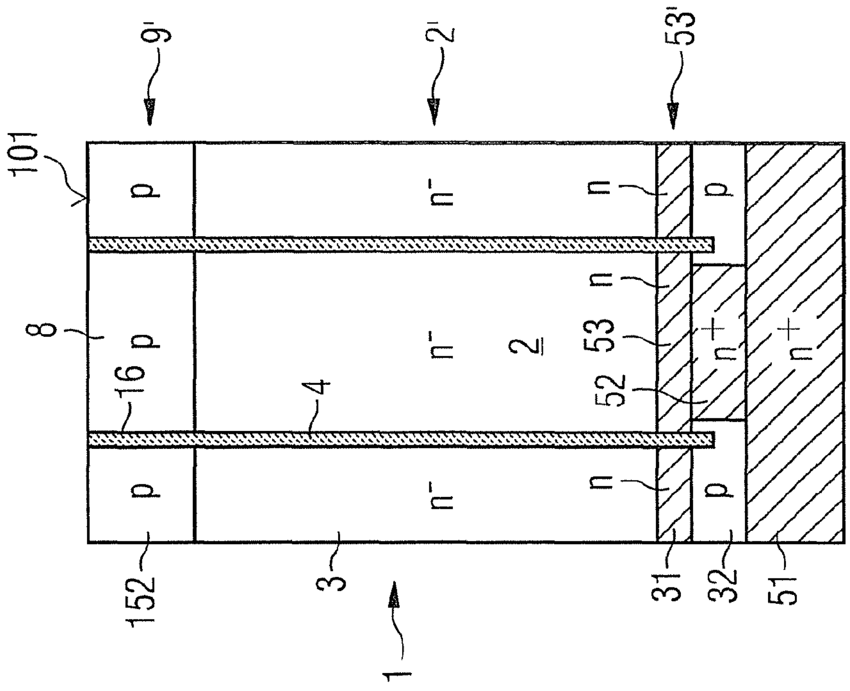
Figure 106E:
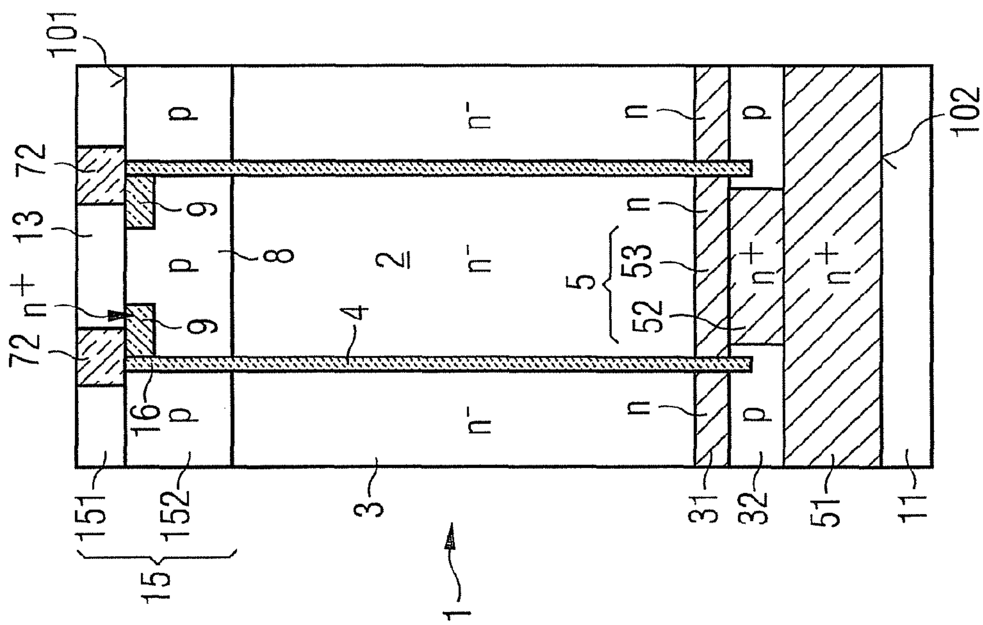

FIG. 106E illustrates a semiconductor component which is modified relative to the component in FIG. 103 and is embodied as a MOSFET. In the case of this component, a semiconductor region 51 that is highly doped continuously in a lateral direction and is adjacent to the drain electrode 11 is present in the region of the rear side 102 of the semiconductor body 1. The connection regions 31, 32 of the drift control region 3, the connection regions being doped complementarily to one another and forming a diode, are arranged between the semiconductor region 51 and the drift control region 3, and an n-doped semiconductor region that forms the drain region of the component and includes two semiconductor regions 52, 53 arranged one above another is formed between the highly doped semiconductor region 51 and the drift region 2.

In the case of this component, a section 52 of the drain region 5 adjoins the p-doped connection region 32 of the drift control region 3 in a lateral direction. In the case of this component, the semiconductor region 51 essentially serves as a substrate for the component structures arranged above it and provides for a low-resistance electrically conductive connection between the drain electrode 11 and the drain region 5.

A method for producing the component in accordance with FIG. 106E is explained below with reference to FIGS. 106A to 106D.

The starting point of this method, referring to FIG. 106A, is the provision of a semiconductor substrate 51, which is for example a highly n-doped semiconductor substrate. It should be noted in this connection that the dimensions of the semiconductor substrate in a vertical direction and the dimensions of the component regions of the semiconductor component that are yet to be explained below are not illustrated in a manner true to scale. The dimensions of the substrate 51 in a vertical direction are usually significantly larger than the dimensions of the further component regions or semiconductor layers that are yet to be explained.

Referring to FIG. 106B, a semiconductor layer is applied to the semiconductor substrate 51, the semiconductor layer having alternately n-doped and p-doped semiconductor regions 52, 32 in a lateral direction. In this case, the p-doped regions form part of the later diode via which the drift control region 4 is connected to the drain region or drain electrode. The n-doped semiconductor regions 52 form part of the later drain region of the component. The semiconductor layer applied to the semiconductor substrate 51 is produced for example by using an epitaxy method as a uniformly doped layer of one conduction type or as an intrinsically doped semiconductor layer. The different doping of the semiconductor regions 32, 52 can subsequently be produced by using an implantation method through which dopant atoms are introduced into the semiconductor layer.

Referring to FIG. 106C, three further semiconductor layers 53', 2', 9', of which a first layer 53' is n-doped in the example, a second layer 2' is n-doped more weakly than the first layer 53', and a third layer 9' is p-doped, are subsequently deposited onto the semiconductor layer having the semiconductor regions 32, 52 doped complementarily to one another.

The third layer 9' forms a front side 101 of a semiconductor body 1 present after the deposition of these semiconductor layers.

Referring to FIG. 106D, trenches are subsequently produced proceeding from the front side 101, which trenches extend in a vertical direction of the semiconductor body right into the p-doped semiconductor regions 32 of the semiconductor layer deposited first. The trenches are subsequently filled with a dielectric material, for example a semiconductor oxide, which forms the accumulation dielectric 4 in the region of the second layer 2' and the gate dielectric 16 in the region of the third layer 9'.

The trenches with the dielectric arranged therein subdivide the three semiconductor layers 53', 2', 9' into individual semiconductor sections. The semiconductor sections of the semiconductor layers 53', 2', 9' form, in a region above the n-doped semiconductor regions 52 of the first semiconductor layer, a part 53 of the drain region 5, the drift region 2 and also the body region 8. Above the p-doped semiconductor regions 32 of the first layer, these three semiconductor layers form a part 31 of the integrated diode, the drift control region 3 and also a part 152 of the gate electrode 15.

Referring to FIG. 106E, the production of the component is completed by producing the source region 9 in the body region. For this purpose, dopant atoms of a conduction type complementary to the doping of the body region are introduced in a region of the body region 8 near the surface. Finally, the source electrode 13 and connection electrodes 151 of the gate electrode 15 are produced above the front side 101. These electrodes 13, 151 can be produced by depositing a metal layer or highly doped polysilicon layer and subsequently patterning the layer. In this case, the patterning includes subdividing the semiconductor layer into individual electrode sections and producing an insulation layer 72 between the individual electrode sections.

In the case of the component in accordance with FIG. 106E, the integrated diode connecting the drift control region 3 to the drain region 5 is formed by the p-doped sections 32 of the semiconductor layer deposited first, and also by the section 31 of the n-doped semiconductor layer deposited afterward. In the case of this component, the drain region 5 is formed by the n-doped sections 52 of the semiconductor layer deposited first and by sections 53 of the n-doped semiconductor layer deposited afterward.

A method modified relative to the method of FIGS. 106A to 106E is explained below with reference to FIGS. 107A to 107D.

This method differs from the method in accordance with FIG. 106 by virtue of the method steps for producing the source region of the MOSFET. Proceeding from the arrangement illustrated in FIG. 106D, in the case of the modified method in accordance with FIG. 107, a heavily n-doped semiconductor layer 9" is produced over the whole area on the third semiconductor layer 9' proceeding from the front side 101, and it forms the later source region of the component in sections. The semiconductor region 9" is produced for example by ion implantation via the front side 101 of the semiconductor body.

Figure 107A:
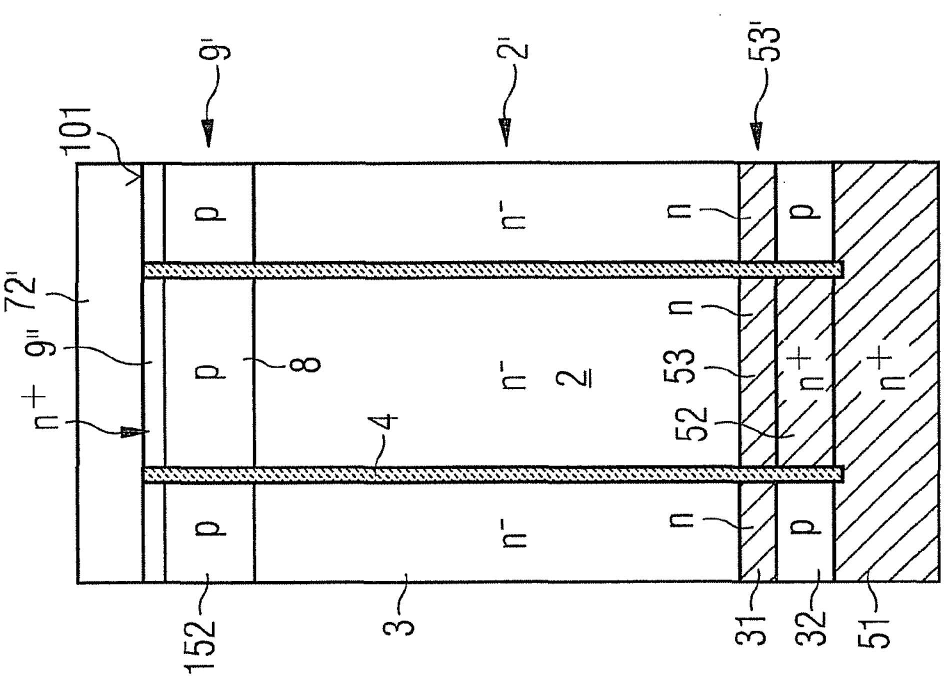
FIGS. 107A-107D illustrate a method for producing a further semiconductor component embodied as a MOSFET, in which the drift control region is directly adjacent to the gate electrode, during individual method steps.
Figure 107B:
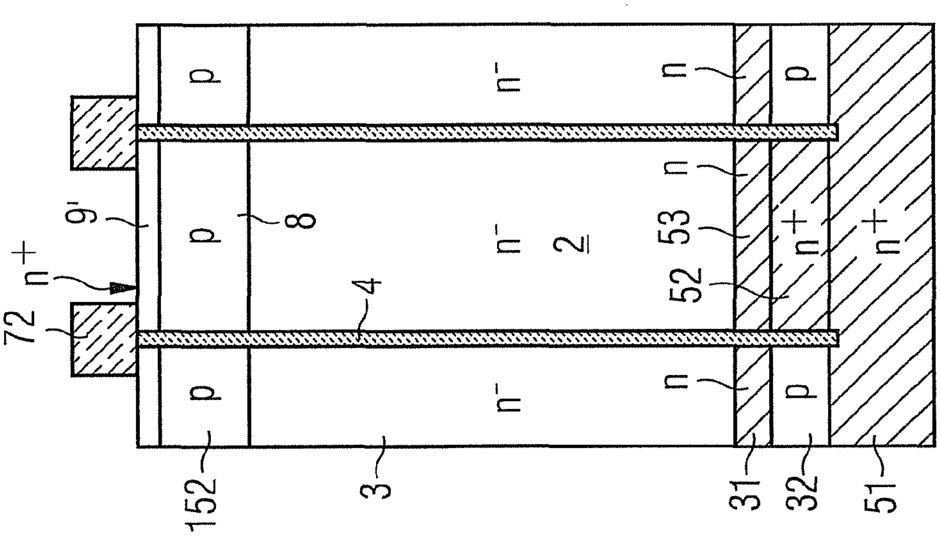

Referring to FIG. 107B, insulation regions 72 are subsequently produced above the trenches with the dielectric material. The insulation regions can be produced by depositing an insulation layer and subsequently patterning the insulation layer. The task of the insulation regions 72, in the manner already explained, is to electrically insulate the later source electrodes and gate electrodes of the component from one another. The dimensions of the insulation regions 72 above the trenches are chosen in such a way that the insulation regions 72 in each case overlap the highly doped semiconductor region 9" in sections on both sides of the trenches in a lateral direction of the semiconductor body.

Figure 107D:
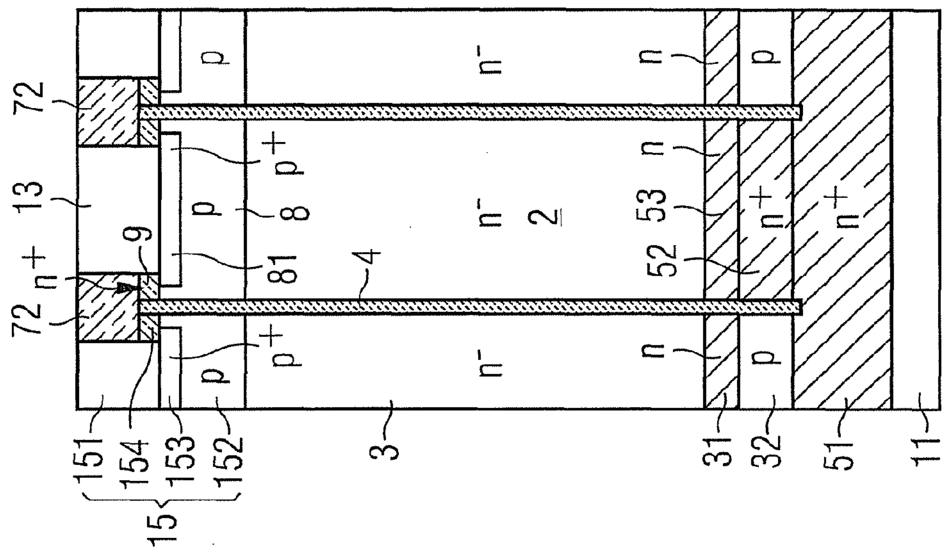
Figure 107C:
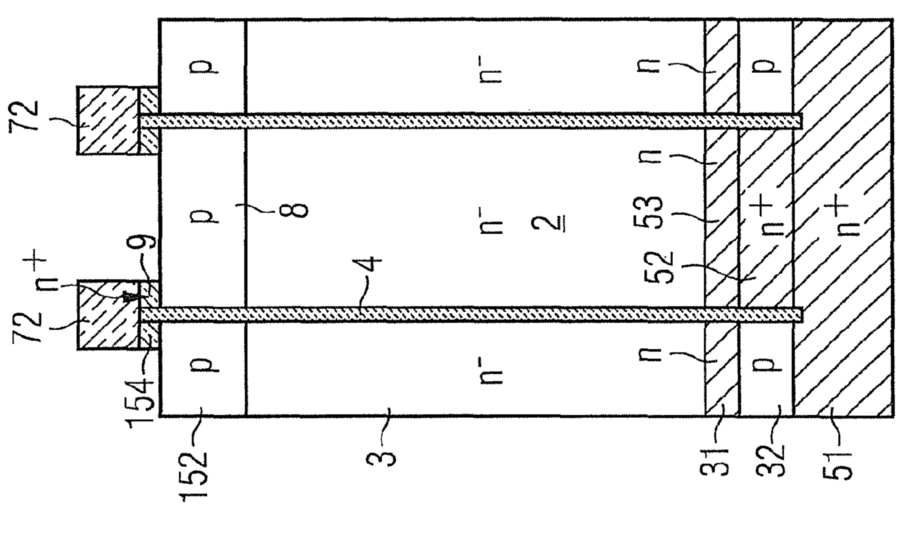

Referring to FIG. 107C, the highly n-doped semiconductor layer 9" is subsequently removed in the regions not covered by the insulation sections 72. This can be done by using an anisotropic etching method using an etchant that etches the semiconductor layer 9" selectively with respect to the insulation sections 72. After the conclusion of the etching method, the body regions 8 and the semiconductor regions 152 forming part of the later gate electrode are uncovered in sections in the region of the front side 101 of the semiconductor body. On both sides of the trenches with the dielectric material, sections 9, 154 of the highly doped semiconductor layer 9" remain below the insulation sections 72 in the case of the method explained with reference to FIG. 107. The n-doped regions 9 that have remained above the body region 8 in this case form the source regions of the later component. The remaining sections 154 of the highly doped layer 9" have no electrical function and merely result from the production method in the example.

Referring to FIG. 107D, the production procedure finally involves producing source electrodes 13 above the body regions 8 and connection regions 151 of the gate electrodes 15 above the p-doped semiconductor regions of the gate electrodes 15. Optionally, before producing the electrodes 13, 151, semiconductor regions 81, 153 doped more highly than the body regions 8 and the semiconductor regions 152 are produced in the body regions 8 and the semiconductor regions 152. These more highly doped regions 81, 153 provide for a low-resistance connection contact of the electrodes 13, 151 to the body regions 8 and the p-type semiconductor regions 152, respectively. In the case of the semiconductor component illustrated in FIG. 107D, contact is made with the source regions 9 by the source electrode 13 in regions in which the source regions 9 are adjacent to the source electrode 13 in a lateral direction.

A further method for producing a semiconductor component illustrated in FIG. 107D is explained below with reference to FIGS. 108A to 108F. In the case of this method, firstly a semiconductor body 100 is made available, having a highly doped semiconductor substrate 51, for example an n-type substrate, and a more weakly doped semiconductor layer 2' applied to the semiconductor substrate, which semiconductor layer, in sections, forms the later drift region of the component. Optionally, before producing the more weakly doped semiconductor layer 2', a more heavily doped semiconductor layer 53' is applied to the semiconductor substrate 51.

Trenches 10 are subsequently produced proceeding from the front side 101 of the semiconductor body, the trenches extending in a vertical direction right into the semiconductor substrate 51. The trenches are produced, in a manner known in principle, by producing a mask 200 above the front side 101 and then selectively etching the semiconductor body in regions not covered by the mask 200.

Figure 108B:
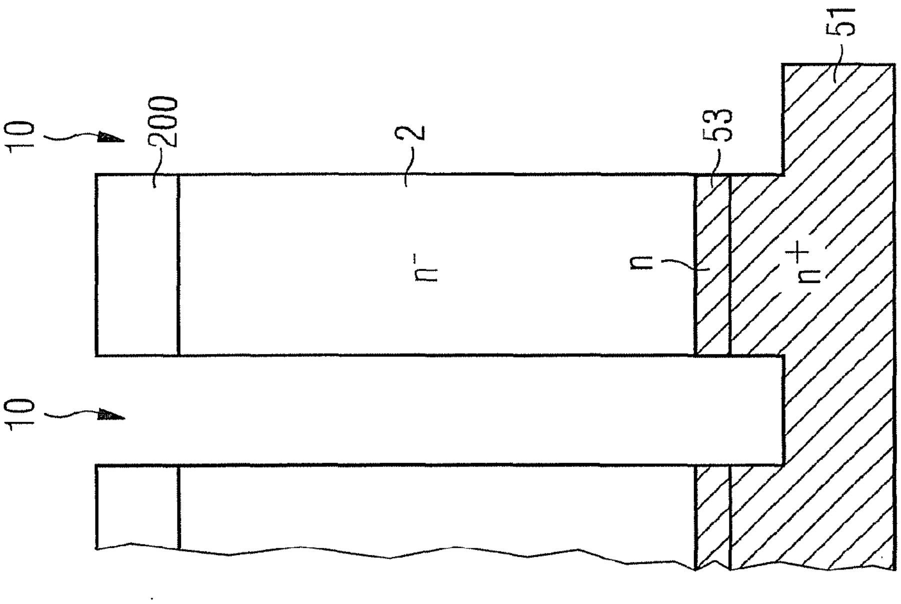
FIGS. 108A-108F illustrate a method for producing a further semiconductor component embodied as a MOSFET, in which the drift control region is directly adjacent to the gate electrode, during individual method steps.
Figure 108A:
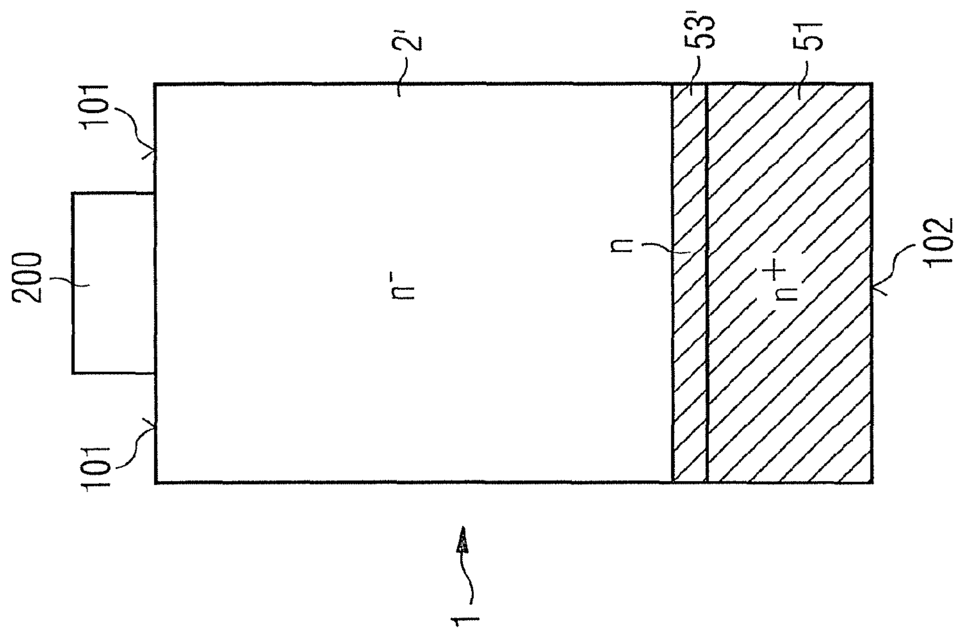
Figure 108D:
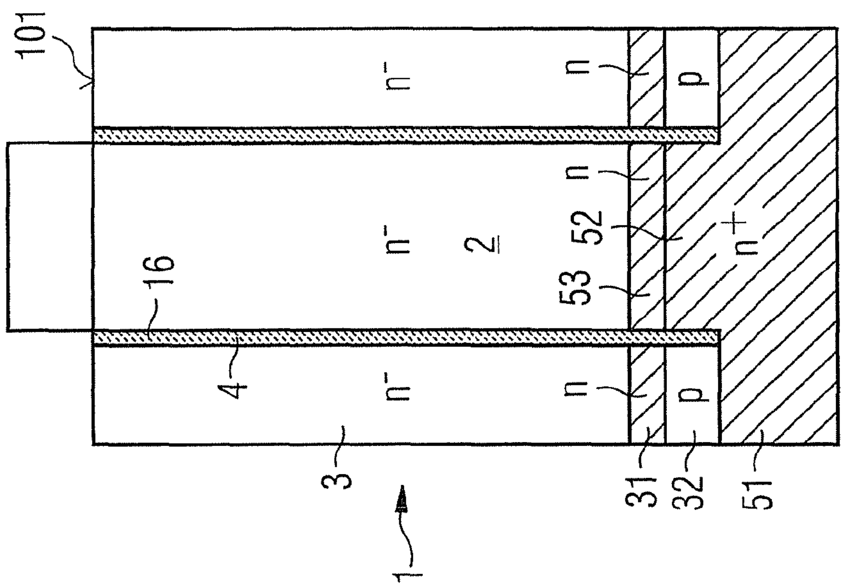
Figure 108C:
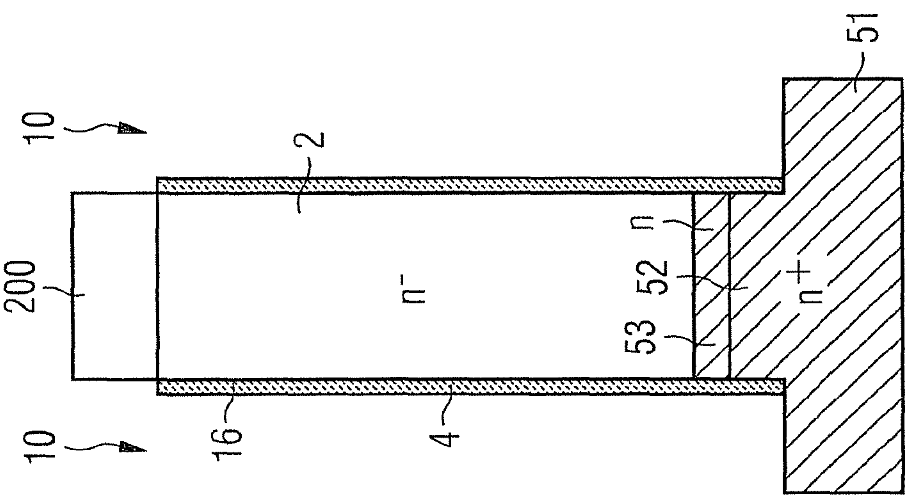

Referring to FIG. 108C, dielectrics are subsequently produced on sidewalls of the trenches 10 produced in this way, the dielectrics later forming the gate dielectric 16 and the accumulation dielectric 4. The production of this dielectric on the sidewalls of the trenches 10 is effected for example by thermal oxidation of the semiconductor body and subsequent removal of the resultant oxide layer from the bottom of the trenches 10. The removal of the oxide layer or dielectric layer from the bottom of the trenches 10 can be effected by using an anisotropic etching method.

Referring to FIG. 108D, a monocrystalline semiconductor material including differently doped sections is subsequently introduced into the trenches. This semiconductor material can be produced by using an epitaxy method. p-doped semiconductor sections 32 that are directly adjacent to the semiconductor substrate 51 are produced by this method. A weakly n-doped semiconductor material is produced above the p-doped sections 32, the semiconductor material forming the later drift control region 3 in sections. Optionally, a semiconductor region 31 n-doped more heavily than the drift control region 3 can be produced between the p-type regions 32 and the drift control region 3, the semiconductor region forming part of the later integrated diode.

Figure 108E:
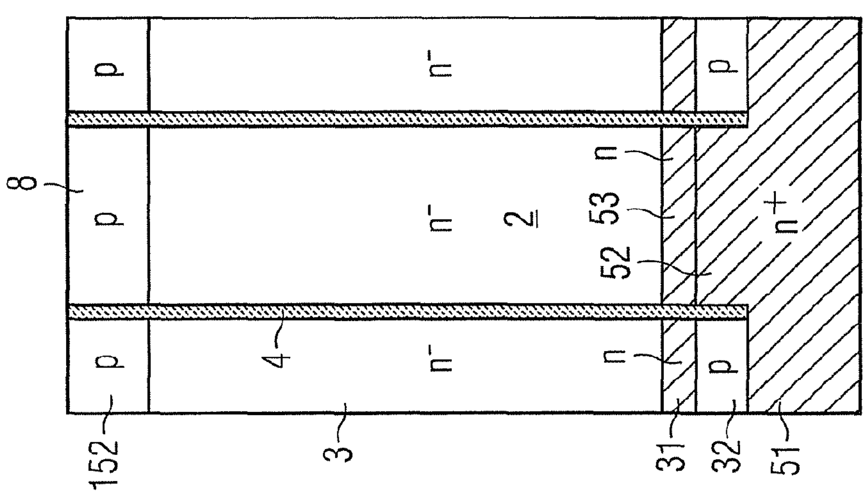

Referring to FIG. 108E, p-doped semiconductor regions 8, 152 are produced in the region of the front side 101 of the resultant semiconductor body 1, the semiconductor regions forming the body regions 8 in a region above the drift region 2 and parts of the gate electrodes of the later MOSFET above the drift control region 3. These p-type regions 8, 152 are produced for example by implantation of p-type dopant atoms followed by a corresponding annealing step.

Figure 108F:
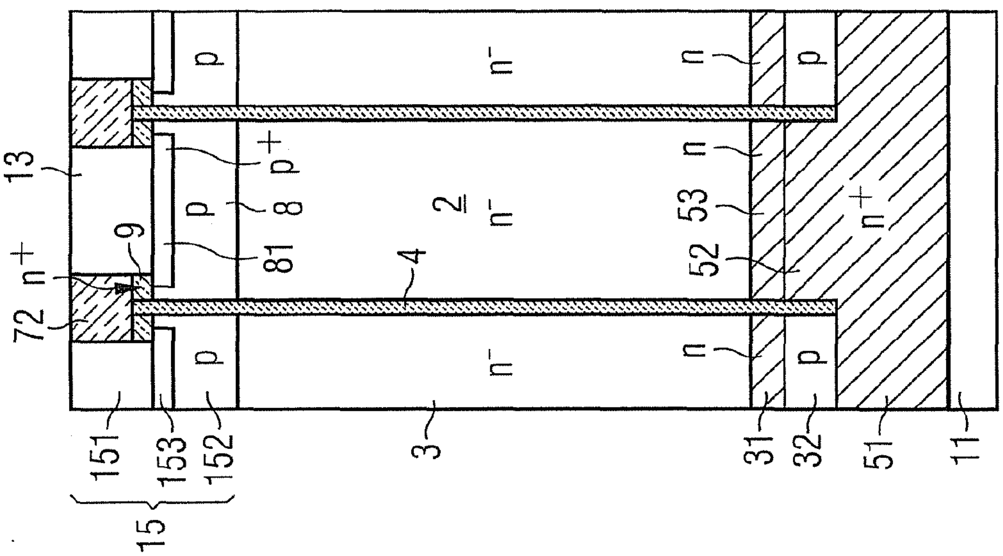

The production of the p-type regions 8, 152 is followed by the method steps—already explained with reference to FIGS. 107A to 107D—for producing the source region 9 and for producing the source electrodes 13 and for completing the gate electrodes 15. A cross section through the completed component is illustrated in FIG. 108F.

Figure 109:
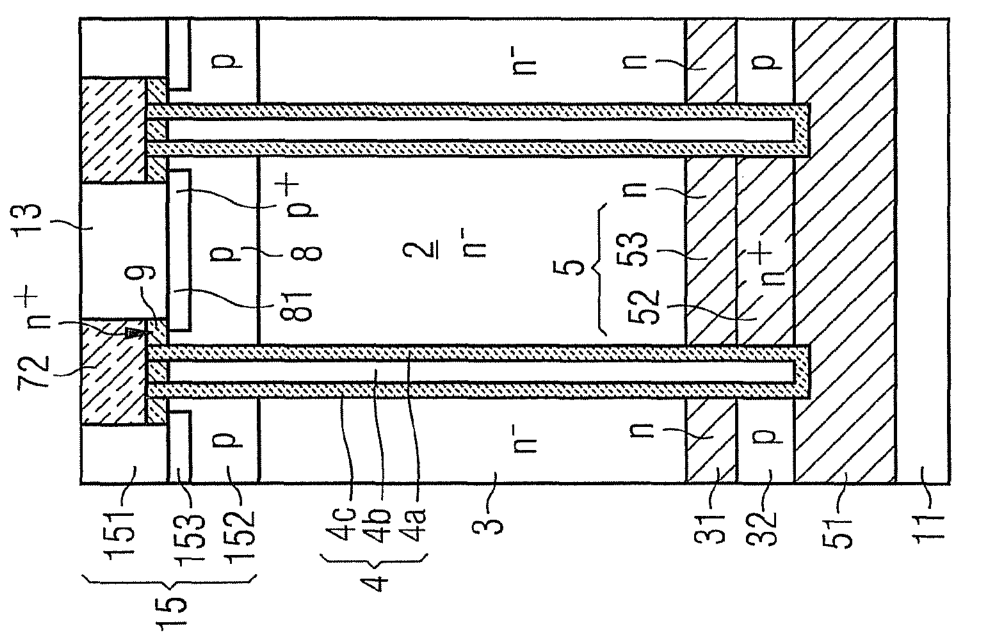
FIG. 109 illustrates a semiconductor component embodied as a MOSFET with a drift control region directly adjacent to the gate electrode and with an accumulation dielectric constructed in multilayer fashion.

FIG. 109 illustrates in cross section a modification of the MOSFET illustrated in FIG. 107D. In the case of the component in accordance with FIG. 109, the dielectric layer which forms the accumulation dielectric 4 in the region between the drift control region 3 and the drift region 2 and forms the gate dielectric in the region between the gate electrode 15 and the body region 8 is constructed in multilayer fashion. This layer construction includes for example two oxide layers 4A, 4C, which are directly adjacent to the drift region 2 on one side of the trench and the drift control region 3 on the other side of the trench, and also a dielectric layer 4B arranged between the oxide layers and preferably having a higher dielectric constant than the two oxide layers 4A, 4C. The advantage of realizing the dielectric layer as a layer stack having a plurality of dielectric layers is that when using a dielectric material having a high dielectric constant, for example a dielectric constant greater than 15, it is possible to provide a wider trench for the production of the dielectric layer than when just using one oxide layer, without impairing the capacitive coupling between the drift control region 3 and the drift region 2.

Figure 110:
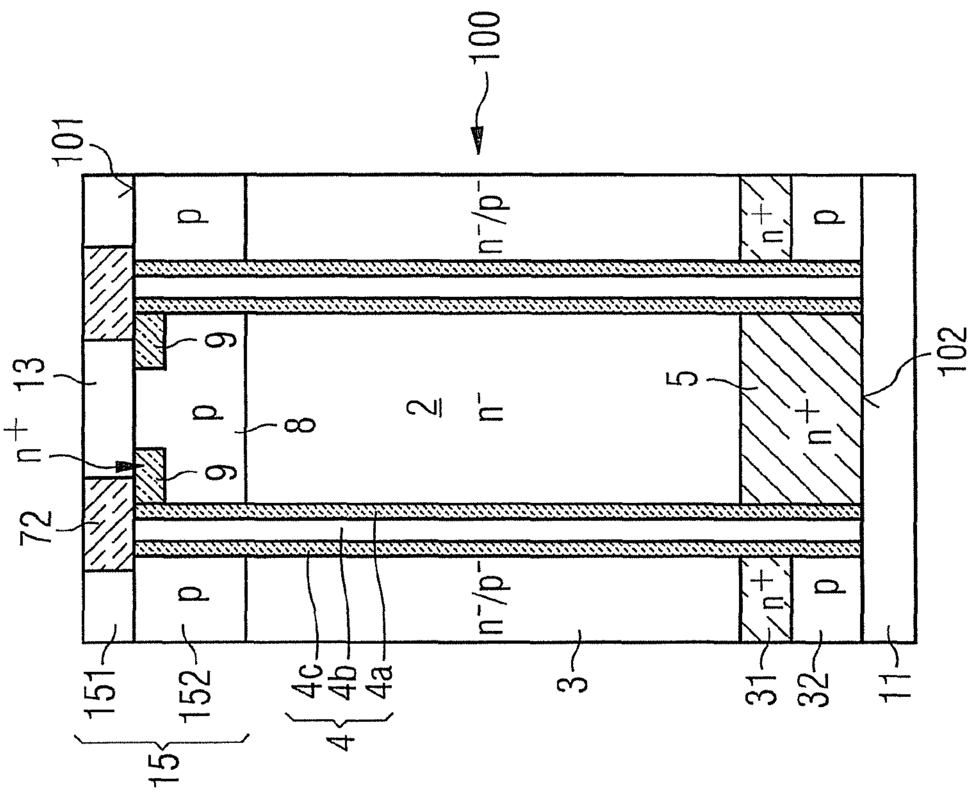
FIG. 110 illustrates a component, modified relative to the component in FIG. 109, with an accumulation dielectric constructed in multilayer fashion.

FIG. 110 illustrates a modification of the component illustrated in FIG. 109. In the case of the component in accordance with FIG. 110, the multilayer dielectric layer extends from the front side 101 as far as the rear side 102 of the semiconductor body 100.

For a given voltage difference between the drift control region 3 and the drift region 2, the quantity of charge carriers accumulated in the drift region 2 is dependent on the accumulation capacitance formed by the drift region 2, the drift control region 3 and the accumulation dielectric 4. In this case, the accumulated charge is all the greater, the greater the capacitance. For a given thickness of the accumulation dielectric 4, the capacitance is all the greater, the greater the dielectric constant of the accumulation dielectric. For a given accumulation capacitance, the required thickness of the accumulation dielectric is all the smaller, the lower the dielectric constant. When using silicon dioxide ($SiO_2$) as material for the accumulation dielectric, a thickness for the accumulation dielectric of typically 200 nm or less is required in order to obtain a sufficient accumulation effect. Dielectric layers that are so thin and furthermore extend into the depth are difficult to produce.

In this case, one embodiment of the invention provides for realizing the accumulation dielectric wholly or partly from a material having a medium dielectric constant, a medium-K material. Such a material is distinguished by a relative permittivity or dielectric constant of approximately 7 to 25. The use of such a material makes it possible to use an accumulation dielectric which is thicker than $SiO_2$ and thus easier to produce. Suitable materials are for example silicon nitride (SiN), whose dielectric constant of 7.5 is approximately double that of $SiO_2$, or silicon carbide (SiC), whose dielectric constant of 9.7 is approximately 2.5 times that of $SiO_2$. Unlike high-dielectric materials (high-K materials), the abovementioned medium-K materials can be produced by processes that are standard processes in the fabrication of semiconductor components.

In the case of the components explained above, the accumulation dielectric 4 can be composed entirely of a medium-K material.

In the case of the components in accordance with FIGS. 11, 109 and 110, by way of example, the middle one 4*b* of the dielectric layers can be composed of a medium-K material and the two outer layers 4*a*, 4*c* can be composed of a material having a lower dielectric constant, for example $SiO_2$. In this case, the middle layer 4*b* can be significantly thicker, for example thicker by a factor of 5 to 10, than the outer layers 4*a*, 4*c*.

Furthermore, there is also the possibility of realizing the accumulation dielectric 4 between the drift region 2 and the drift control region 3 from a medium-K material and of realizing a dielectric that separates further regions of the component from one another from a material having a lower dielectric constant. Such other regions, in the case of a component in accordance with FIG. 19, by way of example, are the body region 8 and the connection region 33, which can be separated by a dielectric having a lower dielectric constant, or, in the case of the component in accordance with FIG. 101, the connection region 31 and the drain region 5, which can be separated by a dielectric having a lower dielectric constant.

A further variant provides, in the case of a component in accordance with FIG. 16, for realizing the dielectric layer between the p-doped semiconductor regions 33, 34 and the body region 8 and the short-circuit region 17 by using a medium-K material, in order thereby to increase the internal storage capacitance of the component. In this case, the accumulation dielectric 4 between the drift region 2 and the drift control region 3 is composed of a material having a lower dielectric constant. The accumulation dielectric 4 could also be realized by a medium-K material; in order to increase the internal storage capacitance, a high-K material would then have to be provided for the dielectric layer between the p-doped semiconductor regions 33, 34 and the body region 8 and the short-circuit region 17.

The semiconductor component has been explained above on the basis of vertical power components, that is to say on the basis of those components in which a current flow direction in the drift region runs in a vertical direction. In this case, the drift region is arranged in a vertical direction of the semiconductor body 100 between a first component region, which corresponds to the source region in the case of a MOSFET and to the Schottky metal in the case of a Schottky diode, and a second component region, which corresponds to the drain region in the case of a MOSFET and to the cathode region in the case of a Schottky diode.

As is explained below, the concept of providing an accumulation dielectric and a drift control region adjacent to a drift region of a semiconductor component can also be applied, of course, to lateral components.

Exemplary embodiments of lateral semiconductor components are explained below with reference to sectional illustrations of a semiconductor body 100 having a first side 101, which is referred to hereinafter as front side, and a second side 102 opposite the first side, the second side being referred to hereinafter as rear side. A vertical direction v of the semiconductor body runs perpendicular to the front and rear sides 101, 102 between these two sides 101, 102. Lateral directions of the semiconductor bodies in each case run parallel to the front and rear sides 101, 102 and thus perpendicular to the vertical direction v. Lateral sectional planes hereinafter designate sectional planes parallel to the front and rear sides 101, 102 while vertical sectional planes hereinafter designate sectional planes perpendicular to the front and rear sides 101, 102.

Exemplary embodiments of the semiconductor components which are embodied as MOSFETs are explained below—without restricting the general validity of the invention—on the basis of n-channel MOSFETs (n-MOSFETs) having an n-doped drift region 211, a p-doped body region 212 and n-doped source and drain regions 213, 214. However, the drift region 211 of an n-channel MOSFET can also be undoped or intrinsically doped.

It goes without saying that the invention can, however, also be applied to a p-channel MOSFET (p-MOSFET), in which case the component regions explained below for an n-MOSFET including the semiconductor substrate 103 also explained should be doped complementarily in the case of a p-MOSFET.

Figure 111A:
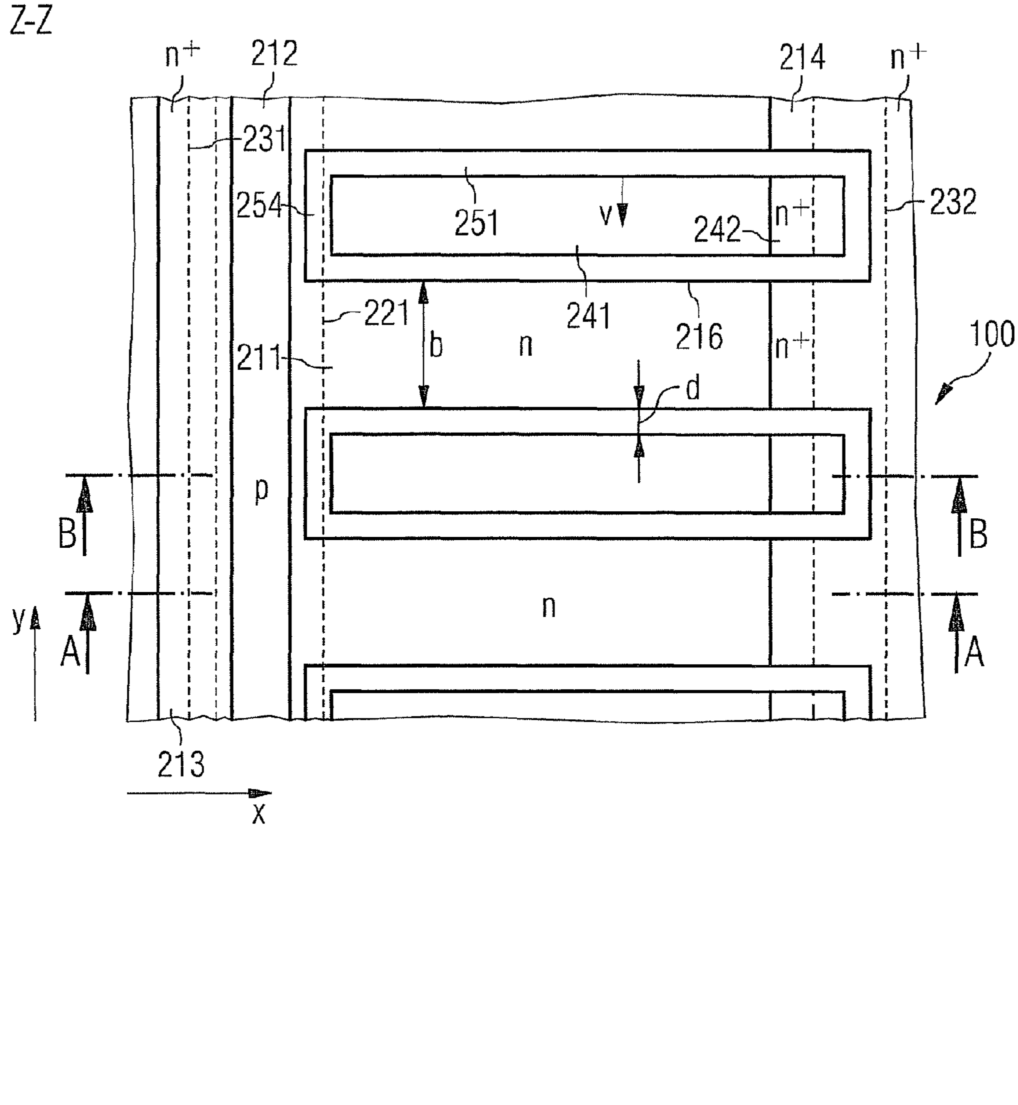
FIGS. 111A-111D illustrate a lateral power semiconductor component which is embodied as a MOSFET and which has a plurality of drift control regions that are in each case insulated from a drift region by an accumulation dielectric, on the basis of various sectional illustrations of a semiconductor body in and on which the component is integrated.
Figure 111B:
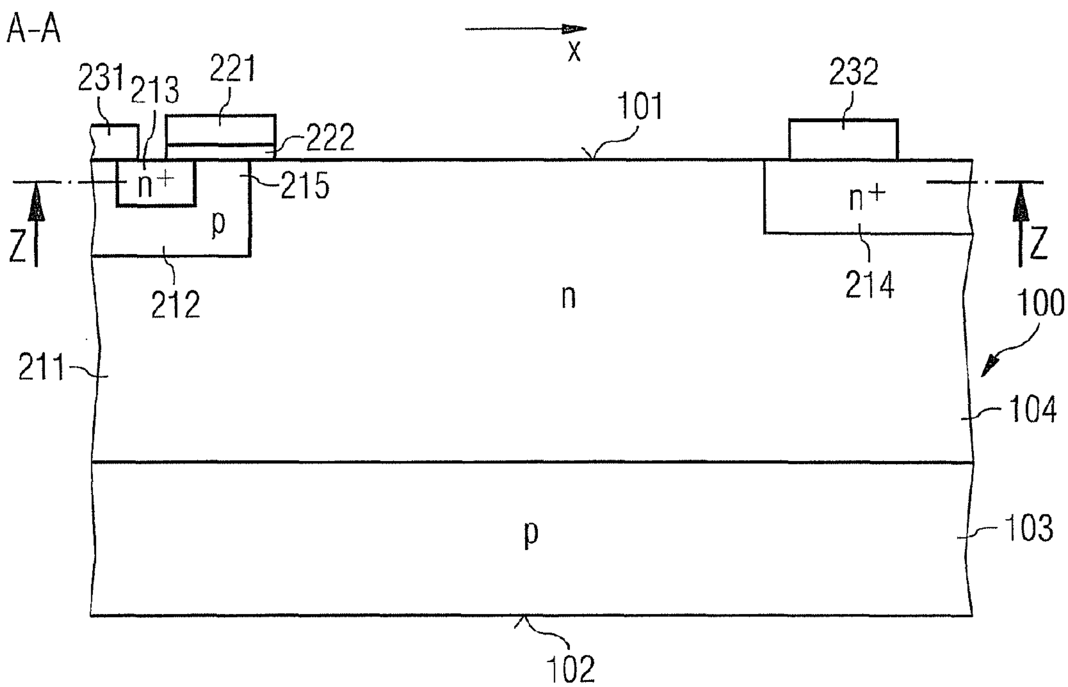
Figure 111C:
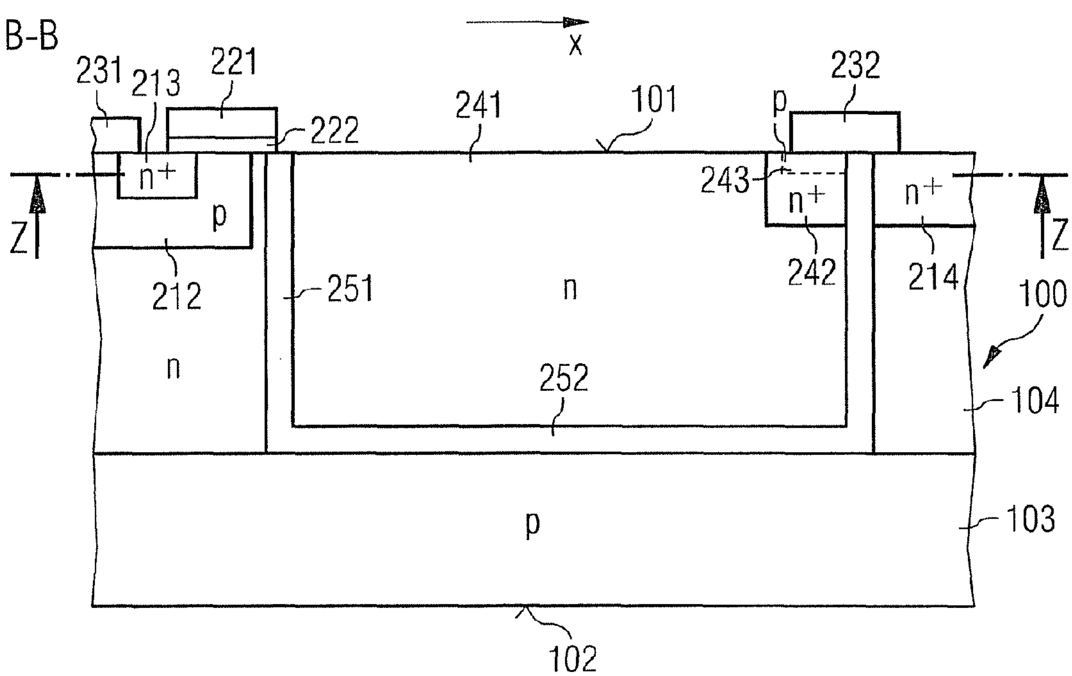
Figure 111D:
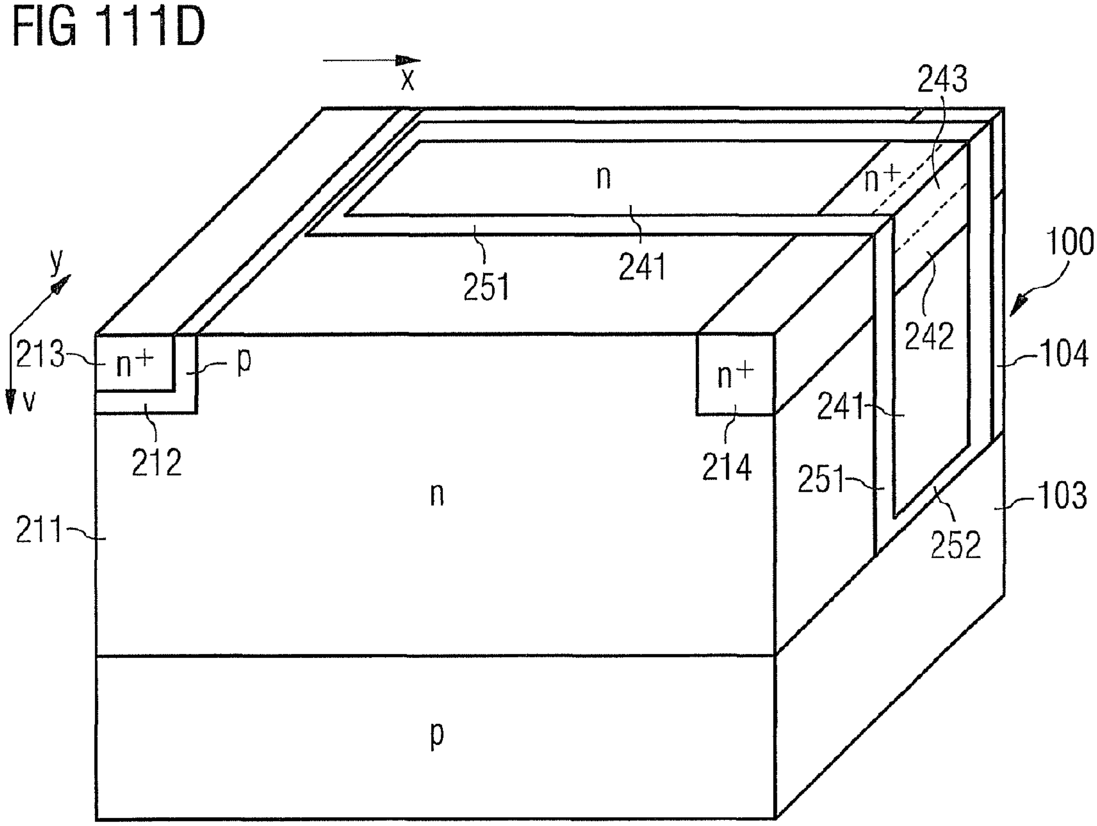

FIGS. 111A to 111D illustrate one exemplary embodiment—embodied as a MOSFET—of a lateral power semiconductor component on the basis of various cross sections of a semiconductor body 100 in which component structures of the MOSFET are integrated. FIG. 111A illustrates the semiconductor body 100 in a lateral sectional plane Z-Z, and FIGS. 111B and 111C illustrate the semiconductor body 100 in different vertical sectional planes A-A, B-B, the lateral position of which is illustrated in FIG. 111A. FIG. 111D illustrates an excerpt from a perspective sectional illustration of the semiconductor body 100.

The power MOSFET illustrated in FIG. 111 has a source region 213 and a drain region 214, which are arranged at a distance from one another in a first lateral direction x of the semiconductor body 100 and which are n-doped in each case. A drift region 211 is adjacent to the drain region 214 and in the example is of the same conduction type as the drain region 214, but is doped more weakly than the drain region 214, although it can also be undoped. Arranged between the source region 212 and the drift region 211 is a body region 212 doped complementarily to the source region 213 and the drift region 211, which body region together with the drift region 211 forms a pn junction proceeding from which, when the component is driven in the off state, a space charge region (depletion zone) can propagate in the drift region 211. The body region 212 is likewise arranged at a distance from the drain region 214 in the first lateral direction x.

A gate electrode 221 is present for controlling an inversion channel 215 in the body region 212 between the source region 213 and the drift region 211, the gate electrode being arranged in a manner insulated from the semiconductor body 100 by using a gate dielectric 222. The gate electrode 221 is arranged adjacent to the body region 212 and extends from the source region 213 as far as the drift region 211. When a suitable driving potential is applied to the gate electrode 221, an inversion channel forms in the body region 212 along the gate dielectric 222 between the source region 213 and the drift region 211.

In the example illustrated, the gate electrode 221 is arranged above the front side 101 of the semiconductor body 100, such that the inversion channel 215 runs in the body region 212 in the first lateral direction x along the front side 101 of the semiconductor body 100. For reasons of clarity, the gate electrode is not depicted in the perspective illustration in FIG. 111D.

Contact is made with the source region 213 by a source electrode 231 and contact is made with the drain region 214 by a drain electrode 232, which in the example are in each case arranged above the front side and the position of which relative to the individual semiconductor regions is illustrated by dash-dotted lines in FIG. 111A. In this case, the source electrode 231 additionally makes contact with the body region 212 in order thereby to short-circuit the source region 213 and the body region 212.

In the example, the source region 213, the body region 212 and the drain region 214 are arranged in a semiconductor layer 104 having an n-type basic doping and, referring to FIG. 111A, extend in strip-type fashion in a second lateral direction y running perpendicular to the first lateral direction x.

The gate electrode 221 and the source and drain electrodes 231, 232 likewise run in strip-type fashion in the second lateral direction y.

The power MOSFET includes a plurality of drift control regions 241 composed of a doped or undoped semiconductor material, which are arranged adjacent to the drift region 221 in the semiconductor body 104 and which are insulated from the drift region 211 by a first dielectric layer. That region of the dielectric layer which is arranged directly between the drift region 211 and the drift control region 241 is referred to hereinafter as accumulation dielectric 251. The drift control regions 241 are in each case those regions which are adjacent to the accumulation dielectric 251 in a direction perpendicular to the area of the accumulation dielectric 251 and which are therefore suitable, in a manner yet to be explained, for controlling an accumulation channel in the drift region 211.

The drift control regions 241 are coupled to the drain region 214, which is achieved in the example illustrated by virtue of the drift control regions 241 being connected to the drain electrode 232 via connection regions 242, which are of the same conduction type as the drift control regions 241 but are doped more highly than the latter. In this case, the connection regions 242 bring about a low-resistance connection contact between the drift control regions 241 and the drain electrode 232.

In a manner yet to be explained, the drift control regions 241 can also be connected to the drain electrode 232 in each case via a diode. In the case of an n-channel MOSFET, the diode is forward-biased in the direction from the drain electrode 232 to the drift control region 241 and, referring to FIG. 111C, may be formed by a pn junction between the drift control region 241 and a connection region 243 doped complementarily to the drift control region 241. In this case, the drain electrode 232 makes contact with the complementarily doped connection region 243. Optionally, the complementarily doped connection region 243 can be embedded, in a manner illustrated in FIG. 111C, into the connection region 242 of the same conduction type as the drift control region, the pn junction in this case being formed between the two connection regions 242, 243.

In an alternative embodiment, the drift control region 241 is of the same conduction type as the body region 212, but is doped more lightly than the latter or even undoped (intrinsic).

In the example, the drift control regions 241 have a plate-type or strip-type geometry and are arranged at a distance from one another in the second lateral direction y and in each case adjacent to sections of the drift region 211. In this case, a layer structure or plate structure in which drift regions 211 and drift control regions 241 alternate in each case in a manner separated by an accumulation dielectric is present in the second lateral direction.

In a vertical direction v of the semiconductor body 100, the drift control regions 214 extend into the semiconductor body 100 proceeding from the front side 101, and, in the example illustrated, extend as far as the semiconductor substrate 103, from which they are insulated by a further insulation layer 252, for example an oxide layer. In this case, the substrate 103 is of a conductivity type complementary to the conductivity type of the drift region 211. In the first lateral direction x, the drift control regions extend proceeding from the drain region 214, to which they are electrically coupled, in the direction of the body region 212. In this case, the drift control regions 241 can end before the body region 212 in the first lateral direction x or can extend in the direction right into the body region 212 (not illustrated).

In a manner that will be explained in even greater detail, when the component is driven in the on state, the drift control regions 214 serve for controlling an accumulation channel in the drift region 211 along the accumulation dielectric 251. The drift control regions 241 are preferably formed in such a way that they extend as near as possible up to the region in which the inversion channel 215 (FIG. 111B) of the body region 212, the inversion channel being controlled by the gate electrode 221, undergoes transition to the drift region 211. In the case of the component in accordance with FIG. 111, the inversion channel 215 forms below the front side 101 of the semiconductor body 100 and the drift control regions therefore extend as far as the front side 101 in a vertical direction v and approximately as far as the body region 212 in the first lateral direction x.

The inversion channel 215 and an accumulation channel that forms along the accumulation dielectric 251 of a drift control region 241 in the drift region 211, the accumulation channel being designated by the reference symbol 216 in FIG. 111A, run in a manner respectively rotated through 90° relative to one another. The inversion channel 215 propagates along the front side 101 of the semiconductor body 100, while the accumulation channels 216 form along the "sidewalls"—running in a vertical direction—of the drift control regions 241 at the accumulation dielectric in the drift region 211. A current flow direction corresponds to the first lateral direction x of the semiconductor body in the case of this component.

The drift control regions 241 are composed of a doped or undoped, preferably monocrystalline, semiconductor material, which may be of the same conduction type as the doping of the drift region 211 or of a conduction type complementary to the doping. In the direction in which the drift control region 241 and the drift region 211 run parallel to one another between the drain region 214 and the body region 212, that is to say in the first lateral direction x in FIG. 111, the drift control region 241 preferably has the same doping profile as that section of the drift region 211 which extends over the same region as the drift control region 241 in this direction.

The drift control regions 241 are doped in such a way that they have at least one semiconductor section which extends in a direction transversely with respect to the current flow direction—that is to say in the second lateral direction y in the example—over the entire width of the drift control region 241 and which can be fully depleted by an electric field in this direction.

The drift control regions 241 may be fully depletable, in one embodiment. This is fulfilled when a quotient of the net dopant charge of the drift control region 241 and the area of the accumulation dielectric 251 is less than the breakdown charge of the semiconductor material of the drift control region 241. In this case, the net dopant charge denotes the integral of the net dopant concentration of the drift control region 241 relative to the volume of the drift control region 241.

In this case, the quotient should be determined by using only that area of the accumulation dielectric 251 which lies directly between the drift control region 241 and the drift region 211, where for the case which is illustrated in FIG. 111 and in which a drift control region 241 adjoins the drift region 211—in a manner separated by the accumulation dielectric 251—from both sides in the second lateral direction y, the area of the accumulation dielectric 251 on both sides of the drift control region 241 should be used for determining the quotient.

For the further explanation, consideration shall be given below to one of the drift control regions 241 which are illustrated in FIG. 111 and which are bounded on two sides in the second lateral direction y and in the direction of the body region 212 by the dielectric layer 251 forming the accumulation dielectric. For explanation purposes, the special case shall additionally be assumed below that the drift control regions 241 are in each case doped homogeneously and are of the same conduction type as the drain region 214 and that the area of a section 254 of the dielectric layer 251 which bounds the drift control region 241 in the direction of the body region 212 is small in comparison with "lateral areas" of the dielectric layer 251 which separate the drift control region 241 from the drift region 211 in the second lateral direction y. For this special case, the doping specification indicated above is tantamount to the fact that the integral of the ionized dopant concentration of the drift control region 241 in a direction r (which corresponds to the second lateral direction y in the example) perpendicular to the dielectric layer 251 and considered over the entire dimension of the drift control region 241 is less than twice the value of the breakdown charge of the semiconductor material of the drift control region 241. For silicon as semiconductor material, the breakdown charge is approximately $1.2 \cdot 10^{12}$ e/cm$^2$, where e denotes the elemental charge.

If consideration is given to a homogeneously doped drift control region, not illustrated in greater detail, to which there is adjacent only on one side a drift region separated from the drift control region by an accumulation dielectric, then it holds true for this drift control region that the integral of the dopant concentration in the direction perpendicular to the dielectric layer is less than just the value of the breakdown charge.

Complying with the doping specification explained above for the drift control region 241 has the effect that an electric field whose field strength is always less than the breakdown field strength of the semiconductor material of the drift control region 241 can build up in the drift control region 241 in the direction of the dielectric layer 251 independently of an electrical potential present in the drift region 211.

The drift control regions 241 are preferably composed of the same semiconductor material as the drift region 211 and have the same doping concentration, their dimensions particularly in the second lateral direction y being chosen so as to fulfil the condition specified above with regard to the net dopant charge relative to the area of the dielectric layer 251.

The functioning of the lateral power MOSFET explained is explained below firstly for driving the component in the on state and then for driving the component in the off state.

The MOSFET is driven in the on state when a suitable driving potential is applied to the gate electrode 221, and by the application of a suitable voltage—a positive voltage in the case of an n-channel MOSFET—between drain region 214 and source region 212 or between drain electrode 232 and source electrode 231. For a p-channel MOSFET, the voltages or potentials should be correspondingly inverted. The electrical potential of the drift control regions 241 which are connected to the drain electrode 232 in this case follows the electrical potential of the drain region 214, in which case the electrical potential of the drift control region 241 can be lower than the potential of the drain region 241 by the value of the forward voltage of a pn junction if the drift control region 241 is connected to the drain region 214 via a pn junction.

Due to an unavoidable electrical resistance of the drift region 211, when the component is driven in the on state, the electrical potential in the drift region 211 decreases in the direction of the body region 212. The drift control region 241 connected to the drain electrode 232 is thus at a higher potential than the drift region 211, the potential difference present across the accumulation dielectric 251 increasing with increasing distance from the drain region 214 in the direction of the body region 212. The potential difference has the effect that an accumulation region or an accumulation channel in which charge carriers are accumulated arises in the drift region 211 adjacent to the accumulation dielectric 251. The charge carriers are electrons if the drift control region 241—as in the example—is at a higher electrical potential than the drift region 211, and holes in the opposite case. The accumulation channel brings about a reduction of the on resistance of the component in comparison with a conventional component which has a drift region doped in accordance with the drift region 211 but does not have a drift control region.

The accumulation effect achieved in the case of the component is dependent not only on the voltage difference between the drift control region 241 and the drift region 211 but also on the thickness (d in FIG. 111A) of the accumulation dielectric 251 in the second lateral direction y and on the dielectric constant (relative permittivity) of the accumulation dielectric. In this case, the accumulation effect is intensified as the thickness d of the accumulation dielectric 251 decreases and as the dielectric constant increases. When the component is driven in the on state, a minimum possible thickness of the dielectric results from a maximum potential difference present between the drift control region 241 and the drift region 211 and thus from the maximum permissible permanent field strength loading of the accumulation dielectric.

Suitable material for the accumulation dielectric 251 includes for example a semiconductor oxide of the semiconductor material used for realizing the drift region 211 or the drift control region 241, for example silicon. In the case of typical permanent voltage loadings of the accumulation dielectric 251 of significantly less than approximately 100 V, for example between 5 V and 20 V, and when using silicon oxide as accumulation dielectric 251, the thickness d of the dielectric 251 is less than approximately 500 nm and preferably lies within the range of approximately 25 nm to approximately 150 nm.

The component is driven in the off state if a suitable driving potential is not present at the gate electrode 221 and if a—in the case of an n-channel MOSFET positive—drain-source voltage, that is to say a—in the case of an n-channel MOSFET positive—voltage between the drain region 214 and source region 213, is present. The pn junction between the drift region 211 and the body region 212 is thereby reverse-biased, such that a space charge region forms in the drift region 211 proceeding from the pn junction in the direction of the drain region 214. In this case, the reverse voltage present is reduced in the drift region 211, that is to say that the voltage present across the drift region 211 corresponds approximately to the reverse voltage present.

Due to the space charge region propagating in the drift region 211, in the off-state case, a space charge region also propagates in the drift control region 241 of the component, the space charge region essentially being caused by the low doping concentration of the drift control region which results when complying with the doping specification indicated above for the drift control region 241. In this case, the voltage drop at the accumulation dielectric 251 is limited to an upper maximum value that is derived below.

The accumulation dielectric 251 with its thickness $d_{accu}$ forms together with the drift control region 241 and the drift region 211 *a* capacitance, for the area-related capacitance magnitude C' of which the following holds true:

$$C' = \epsilon_0 \epsilon_r / d_{accu} \qquad (4)$$

in this case, $\epsilon_0$ denotes the permittivity of free space and $\epsilon_r$ denotes the relative permittivity of the dielectric used, which is approximately 4 for silicon oxide ($SiO_2$).

The voltage across the dielectric 251 is dependent on the stored charge in a known manner in accordance with $$U=Q'/C' \quad (5)$$

where Q' denotes the stored charge relative to the area of the dielectric 251.

The charge that can be stored by this capacitance is limited by the net dopant charge of the drift control region 241. Assuming that the net dopant charge of the drift control region 241 relative to the area of the dielectric is less than the breakdown charge $Q_{Br}$, the following holds true for the voltage U present across the dielectric 251:

$$U = \frac{Q'}{C'} \leq \frac{Q_{Br}}{\varepsilon_0 \varepsilon_r} \cdot d_{accu} \quad (6)$$

The maximum voltage present across the dielectric 251 therefore rises linearly with the thickness $d_{accu}$ thereof and thus to a first approximation approximately to the same extent as its dielectric strength. For $SiO_2$ having an $\in_r$ of approximately 4 and a thickness of 100 nm, this results in a maximum voltage loading U of 6.8 V, which is significantly less than the permissible continuous loading of such an oxide of approximately 20 V. In this case, the breakdown charge of silicon is approximately $1.2\times10^{12}/cm^2$.

In the off-state case, therefore, in the drift control region 241*a* space charge region builds up whose potential profile can differ from the potential profile of the drift region 211 at most by the value of the voltage which is present across the dielectric 251 and which is limited by the low doping of the drift control region. In this case, the voltage across the accumulation dielectric 251 is always lower than the breakdown voltage thereof.

The dielectric strength of the component is crucially determined by the doping concentration of the drift region 211 and by the dimensions thereof in the direction in which the space charge region propagates, that is to say the first lateral direction x in the case of the component in accordance with FIG. 111. The dimension is referred to hereinafter as "length" of the drift region 211. In this case, given sufficiently weak doping, the dielectric strength is all the greater, the greater the length, and is approximately linearly dependent on the length, a length of approximately 10 μm being required given a desired dielectric strength of 100 V when using silicon as semiconductor material. The dielectric strength in turn decreases as the doping of the drift region 211 increases.

The on resistance of the component is dependent on the formation of the accumulation channel and only slightly dependent on the doping concentration of the drift region 211. In the case of the component, the drift region 211 can be lightly doped in favor of a high dielectric strength, while a low on resistance is achieved by virtue of the accumulation channel controlled by the drift control region 241.

In this case, the maximum dopant concentration N in the drift region 211 depends on the voltage $U_{max}$ to be blocked and the critical electric field strength $E_{crit}$ at which the breakdown owing to avalanche multiplication (avalanche breakdown) commences in the semiconductor material in the off-state case and which is approximately 200 kV/cm in the case of silicon. For one-sided abrupt pn junctions, the following relationship holds true between doping and reverse voltage:

$$N \leq \frac{Q_{Br} \cdot E_{crit}}{2 \cdot e \cdot U_{max}} \quad (7)$$

For silicon components having a blocking capability of 600 V, therefore, the donor or acceptor doping N of the drift region 211 must be less than approximately $2\cdot10^{14}/cm^3$.

Since, for the reasons explained above, the voltage loading of the accumulation dielectric 251 is always less than the maximum permissible voltage loading of the accumulation dielectric 251, the accumulation dielectric 251, in the case of the typical dimensionings specified above, does not limit the dielectric strength of the component—in contrast to known field plate components.

In the case of the component explained above with reference to FIGS. 111A to 111D, the drift control regions 241 are exclusively connected to the drain region 214. When the component is driven in the off state, holes can be accumulated in the drift control regions 241, which are n-doped in the example, due to a thermal generation of electron-hole pairs, which holes cannot flow away. A quantity of charge accumulated as a result can rise over time to an extent such that the maximum permissible field strength of the accumulation dielectric 251 is reached and the dielectric 251 breaks down.

Figure 112:
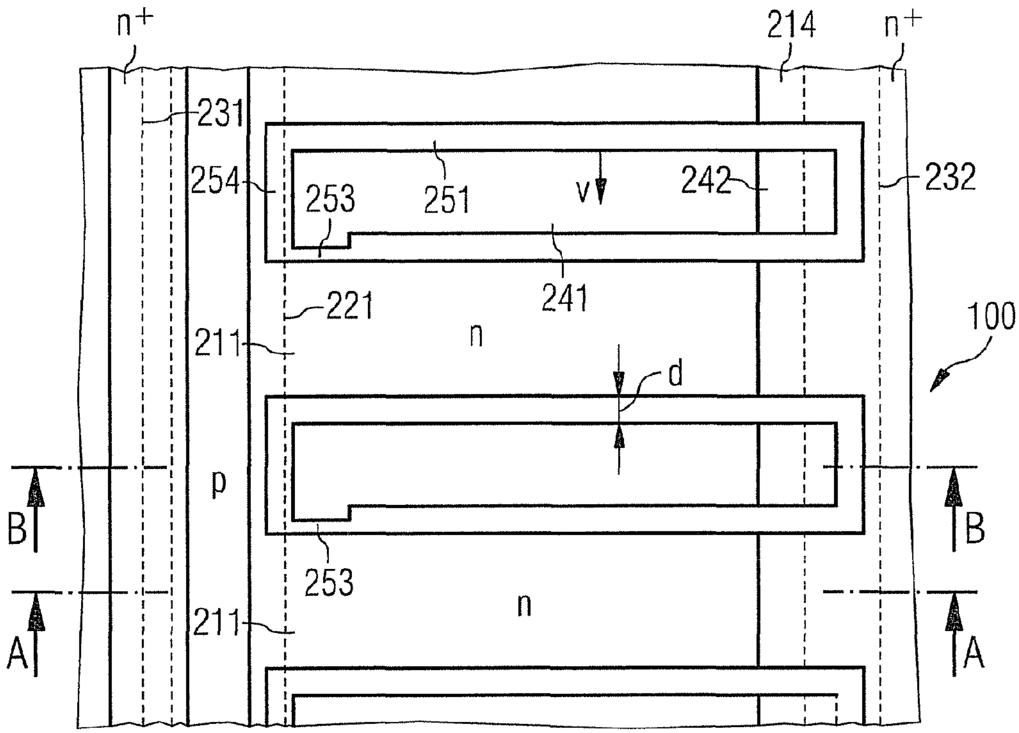
FIG. 112 illustrates a power semiconductor component which is embodied as a MOSFET and in which drift control regions are separated from the drift region in sections by tunnel dielectrics.

Referring to FIG. 112, which illustrates a modification of the component in accordance with FIG. 111, this can be avoided by virtue of the accumulation dielectric 251 being formed, in sections, as a tunnel dielectric 253, which enables the accumulated charge carriers to flow away into the drift region 211 as soon as the breakdown field strength of the tunnel dielectric 253 is reached and actually before the breakdown field strength of the rest of the accumulation dielectric 251 is reached. In the case of one exemplary embodiment illustrated in FIG. 112, the tunnel dielectric 253 is arranged in the region of that end of the drift control regions 241 which faces the body region 212.

By way of example, layers composed of silicon oxide ($SiO_2$) or silicon nitride ($Si_3N_4$) or else multilayer layers composed of silicon oxide and silicon nitride are suitable as tunnel dielectric. Mixed dielectrics composed of silicon, oxygen and nitrogen are likewise possible. Typical tunnel breakdown field strengths lie within the range of 1 . . . 2 V/nm. For a tunnel oxide 253 having a thickness of 13 nm, this results in maximum voltages of 13 . . . 26 V, which lies above the voltage present at the accumulation dielectric 251 during normal off-state operation and which an accumulation dielectric 251 composed of silicon oxide having a thickness of, for example, 100 nm, withstands without any problems.

Figure 113:
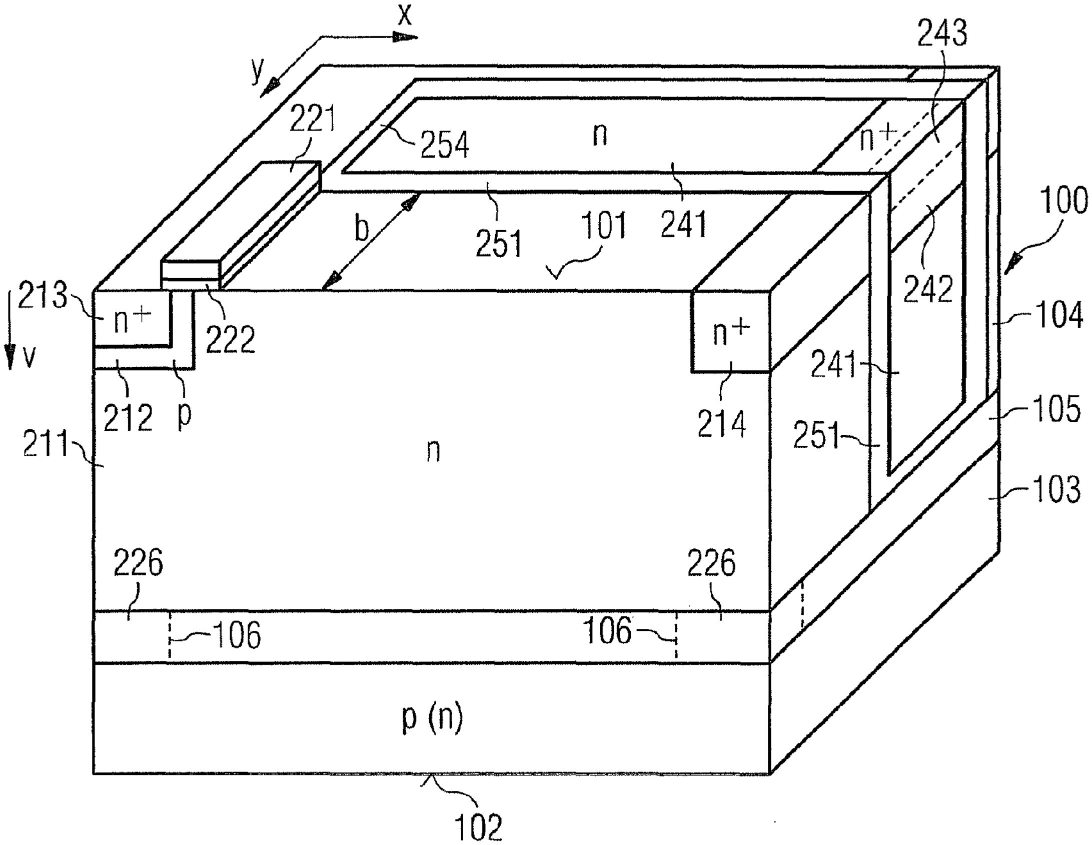
FIG. 113 illustrates, in a perspective sectional illustration, a lateral power MOSFET based on an SOI substrate with a drift region and a drift control region.

FIG. 113 illustrates an excerpt from a component modified relative to the component in accordance with FIG. 111, in perspective illustration. In accordance with the illustration in FIG. 111D, the drain and source electrodes that make contact with the drain and source regions 214, 213 are not illustrated in the case of the component in FIG. 113 for reasons of clarity.

In the case of this component, the semiconductor body 100 is realized as a SOI substrate and includes a continuous insulation layer 105 between the semiconductor substrate 103 and the semiconductor layer 104, in which the drift region 211 and the drift control region 241 and also the source and drain regions 213, 214 are integrated. In this case, the insulation layer, which is composed of a semiconductor oxide, for example, insulates both the drift region 211 and the drift control region 241 from the substrate 103. The semiconductor substrate 103 can be of the same conduction type as the semiconductor layer 104 or of a conduction type complementary to the conduction type of the semiconductor layer 104.

In order to prevent an undesirable charge carrier accumulation in the substrate 103 at the interface with the insulation layer 105 in off-state operation, cutouts 106 can be provided in the insulation layer 105 below the source region 213 and/or below the drain region 214. The cutouts 106 are filled with a doped or undoped semiconductor material forming a connecting region 226 between the drift region 211 and the substrate 103. In this case, the connecting region 226 below the drain region 214 or drain electrode is suitable for dissipating to the drain region 214 electrons that have accumulated in the substrate 103 at the interface with the insulation layer 105. In the case of holes that have accumulated in the substrate 103 at the interface with the insulation layer 105, the connecting region 226 below the source region 213 is suitable for dissipating the holes to the source region 213.

In the case of the component in accordance with FIG. 113, the gate electrode 221 is arranged above the front side 101 of the semiconductor body 100 in accordance with the component in FIG. 111. The gate electrode 221 and the gate dielectric situated underneath are formed in strip-like fashion and in the example extend in the second lateral direction y only in each case over the width b of the individual sections of the drift region. The width b of the drift region 211 is given by the mutual distance between two directly adjacent drift control regions 241. In a manner not illustrated in greater detail, the gate electrode 221 can extend in the second lateral direction y over the entire region of the semiconductor body 100 or parts thereof in which drift control regions 241 and sections of the drift region 211 are arranged. It should be noted in this connection that a lateral overlap of the gate electrode 221 over drift control region 241 is permitted, in the same way as a realization of the gate electrode 221 such that the latter is narrower in the second lateral direction y than the drift region 211 in the direction.

Figure 114A:
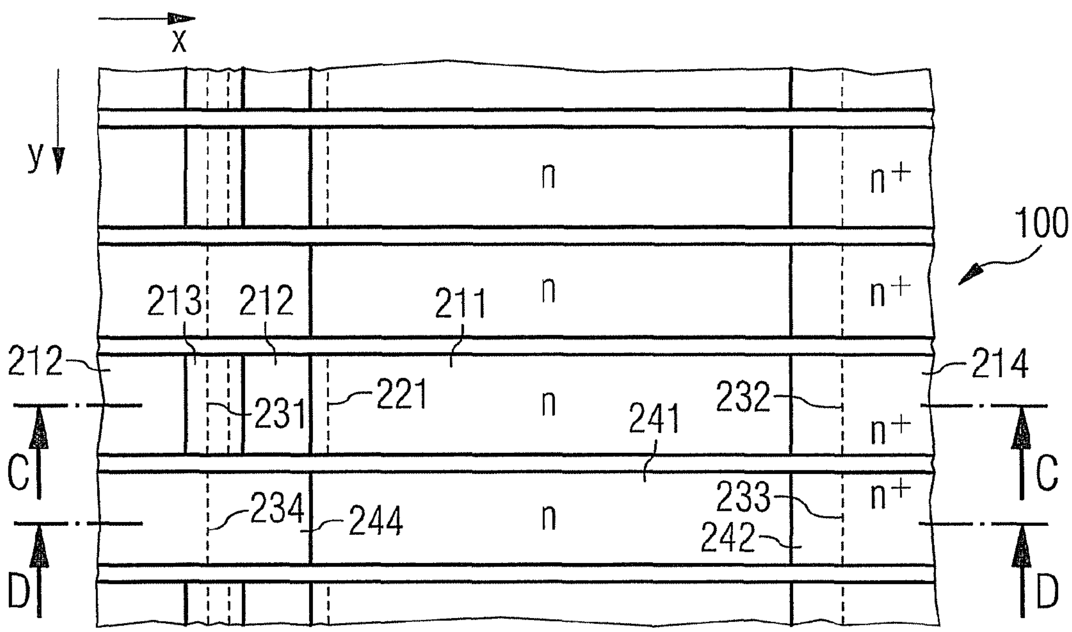
FIGS. 114A-114D illustrate a lateral power semiconductor component which is embodied as a MOSFET and in which drift control regions extend in a lateral direction over the entire length of respectively adjacent drift regions.
Figure 114B:
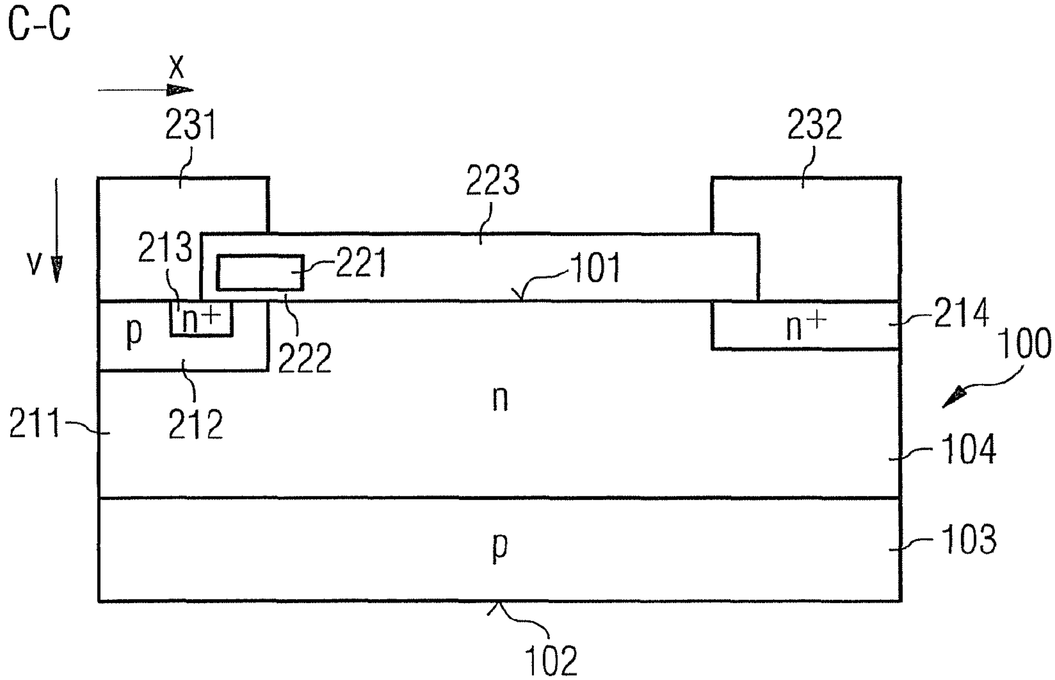
Figure 114C:
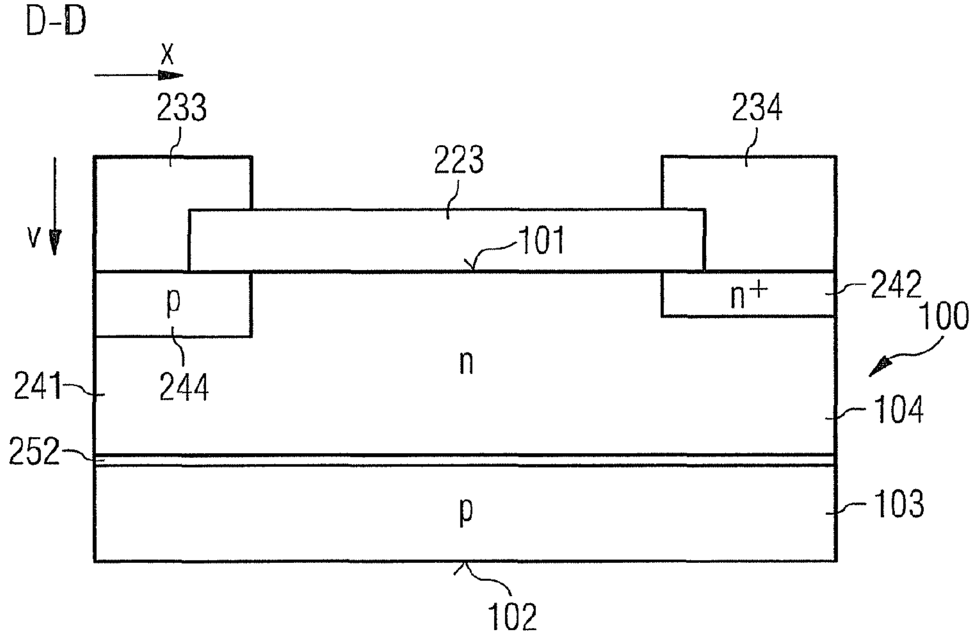
Figure 114D:
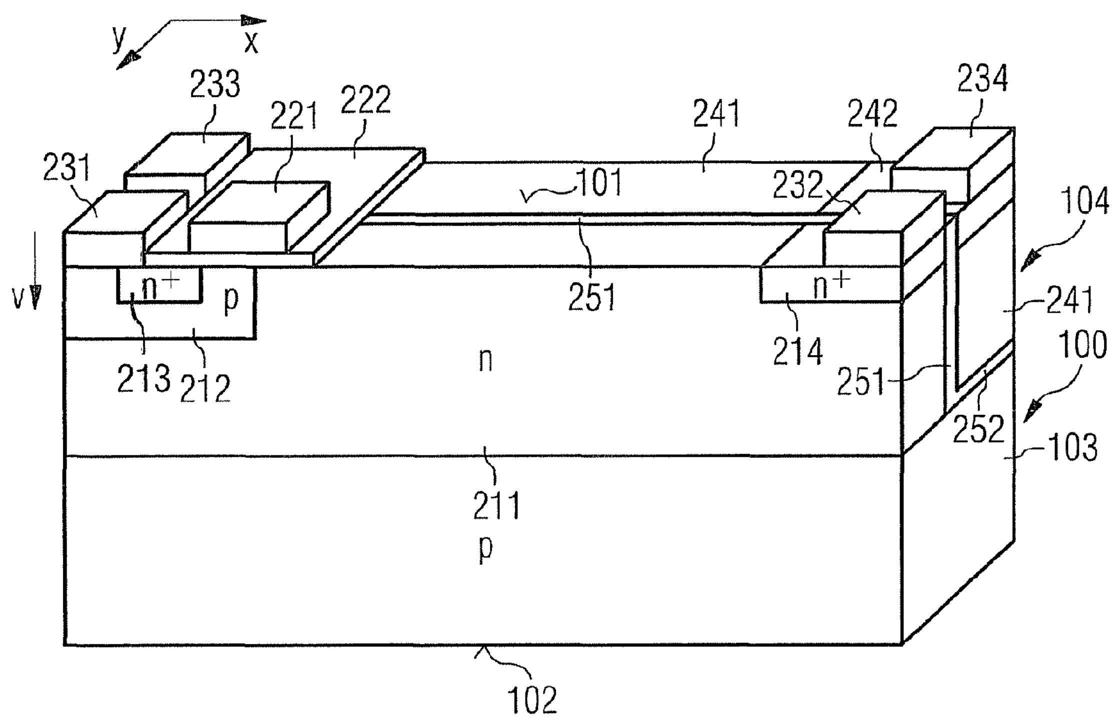

FIGS. 114A to 114D illustrate a further modification of the power MOSFET that is illustrated in FIG. 111. In accordance with FIGS. 111A to 111D, FIG. 114A illustrates the component in a lateral sectional plane located near the front side 101, or in a plan view of the front side 101, FIGS. 114B and 114C illustrate the component in two different vertical sectional planes C-C and D-D, respectively, and FIG. 114D illustrates the component in perspective sectional illustration.

While the drift control regions 241 in the case of the component in accordance with FIG. 111 only have one connection region 242 for connection to the drain region 214 or the drain electrode 232, the drift control regions 241 of the component in accordance with FIG. 114 each have a second connection region 244 arranged at a distance from the first connection region 242 in the first lateral direction x. In a manner yet to be explained, the second connection regions 244 may be of the same conduction type as the doping of the drift control region 241, but the second connection regions 244 can also be doped complementarily to the doping of the drift control region 241. In the example illustrated, the geometrical dimensions of the second connection regions 244 match the geometrical dimensions of the body regions 212 respectively arranged adjacent in the second lateral direction y. The second connection regions 244 thus begin at the level of the body regions 212 in the first lateral direction x and extend into the semiconductor body 100 in the vertical direction v just as deeply as the body regions 212. This can be achieved by producing the body regions 212 and the second connection regions 244 by using identical method steps, that is to say identical implantation and/or diffusion steps.

Figure 115:
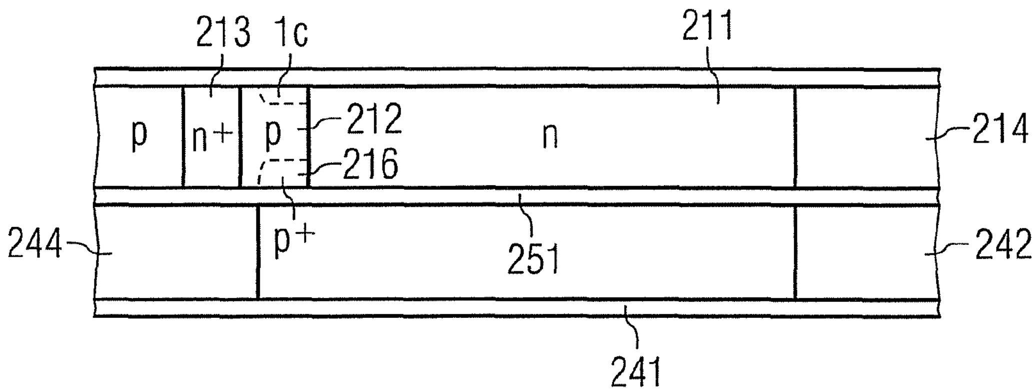
FIG. 115 illustrates a component which is modified relative to the component in accordance with FIG. 114 and in which a drift control region is arranged, in sections, adjacent to a body region of the power MOSFET.

It should be pointed out that the dimensions of the second connection regions 244 in lateral and vertical directions of the semiconductor body 100 need not, however, match the dimensions of the body regions 212. In one embodiment, there is the possibility of the drift control region 241 and the body region 212 overlapping in the first lateral direction x of the semiconductor body 100, as is illustrated in FIG. 115 in a sectional illustration corresponding to the sectional illustration in accordance with FIG. 114A. In order to avoid effects of the drift control region 241 on the switching properties of the component in this case, highly doped semiconductor regions 216 that are of the same conduction type as the body region 212 are present adjacent to the drift control region 241 in the body region 212.

The boundaries of the second connection regions 244 and the highly doped semiconductor regions 216 can also be offset relative to one another in the first lateral direction x, in contrast to the illustration in FIG. 115.

In the case of the component in accordance with FIG. 114A, contact is made with the source region 213 and the body region 212 jointly by the source electrode 231, while contact is made with the drain region 214 or the plurality of drain region sections by a drain electrode or by drain electrode sections 232. In the example, the first connection regions 242 of the drift control regions 241 are respectively connected to first connection electrodes 233, the interconnection of which with the drain electrodes 232 will be explained below. The second connection regions 244 of the drift control regions 241 are connected to second connection electrodes of the drift control regions 241, the further interconnection of which will likewise be explained below.

In the case of the power MOSFET illustrated in FIGS. 114A to 114D, the gate electrode 221 has a plurality of gate electrode sections which extend in the second lateral direction y in each case only over the width of the individual drift regions 211. Referring to FIG. 114D, the gate dielectric 222 can in this case be formed as a continuous strip-type dielectric layer. The reference symbol 223 in FIGS. 114B and 114C designates an insulation or passivation layer which insulates the gate electrode 221 from the source electrode 231 and which covers the drift regions 211 and the drift control regions 241 above the front side 101 of the semiconductor body.

In a manner not illustrated in greater detail, the dimensions of the gate electrodes 221 and/or of the gate dielectric 222 in the second lateral direction y can also deviate from the dimensions of the drift regions 211 in the direction. Thus, a common gate electrode 221 may be provided, in one embodiment, which is realized—in accordance with the gate dielectric 222 in FIG. 114D—as a continuous electrode layer.

Figure 116:
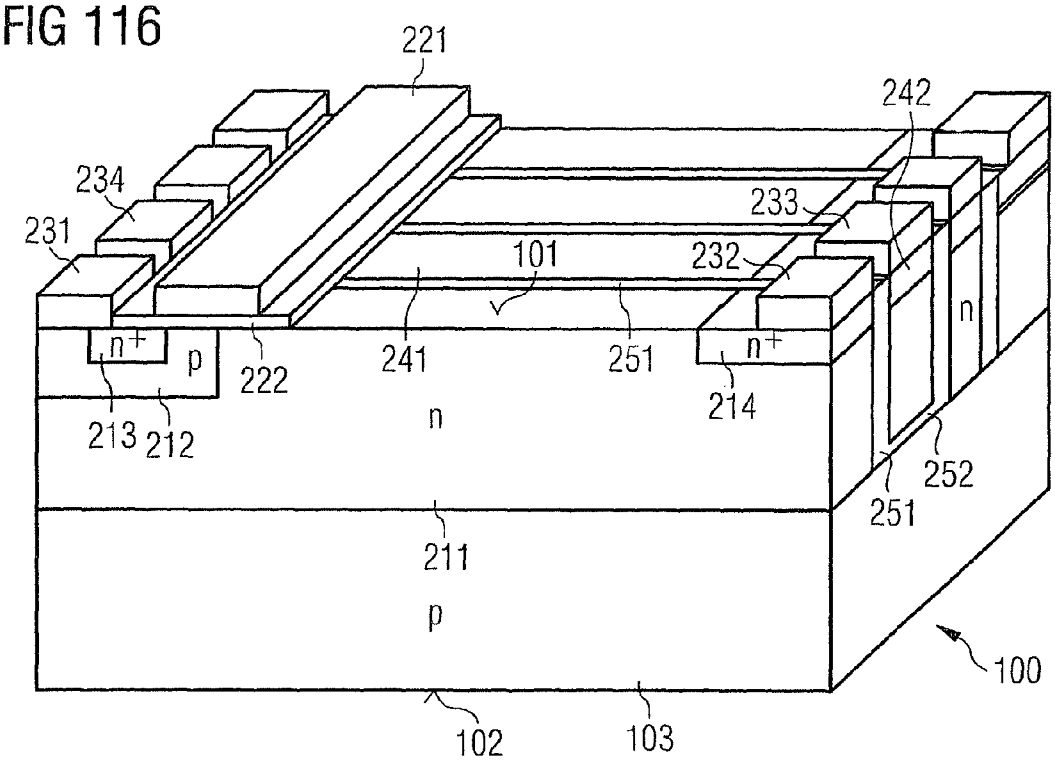
FIG. 116 illustrates a further component which is modified relative to the component in accordance with FIG. 114 and in which a gate electrode is realized as a continuous strip-type electrode.

Referring to FIG. 116, which illustrates a component modified relative to the component in accordance with FIG. 114, the gate electrode 221, in the second lateral direction y, can also be realized as a continuous strip-type electrode 221, which therefore runs in the second lateral direction y both over the body regions 212 and over the drift control regions 241 or the second connection regions thereof (not visible in the illustration in accordance with FIG. 116).

Figure 117:
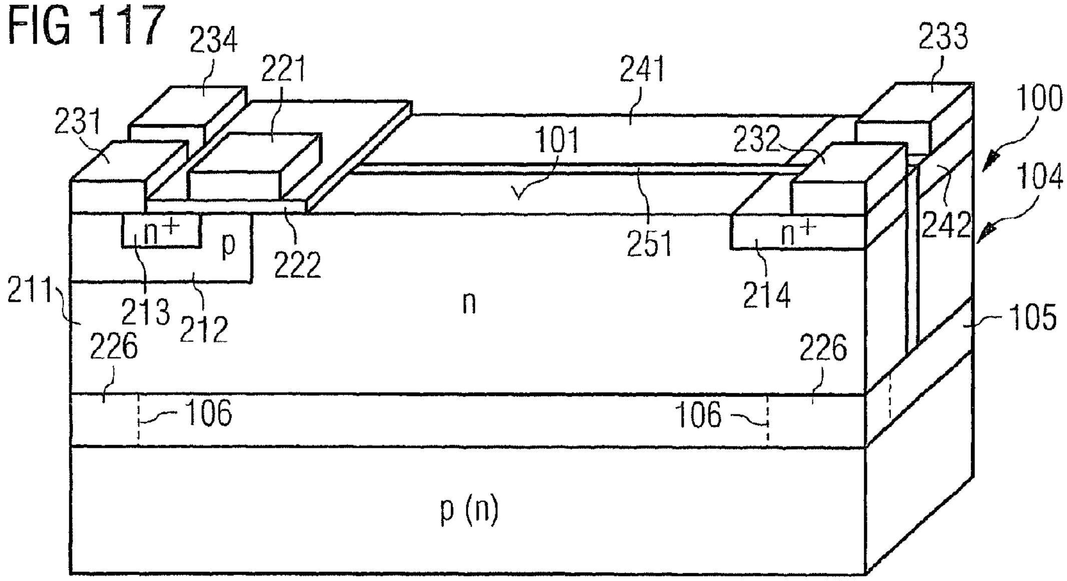
FIG. 117 illustrates a component which is modified relative to the component in accordance with FIG. 114 and which is realized on the basis of an SOI substrate.

FIG. 117 illustrates a further modification of the power MOSFET illustrated in FIG. 114. In the case of this component, the semiconductor body is realized as an SOI substrate in accordance with the component in FIG. 113 and has a semiconductor substrate 103, an insulation layer 105 arranged on the semiconductor substrate 103, and also a semiconductor layer 104 which is arranged on the insulation layer and in which the drift regions 211, the drift control regions 241, the source regions 213, the body regions 212, the drain regions 214 and also the connection regions 242, 244 of the drift control regions 241 are arranged. In the case of the component in accordance with FIG. 117, the gate electrode

221 extends in each case only over the width of a drift region 211, but can deviate arbitrarily from the width of the drift region 211 and can in one embodiment also be realized, in accordance with the component in accordance with FIG. 116, as a continuous strip-type gate electrode (not illustrated).

Contact can be made with the drift control region 241 or the first and second connection electrodes 233, 234 thereof in various ways, as is explained below.

Figure 118A:
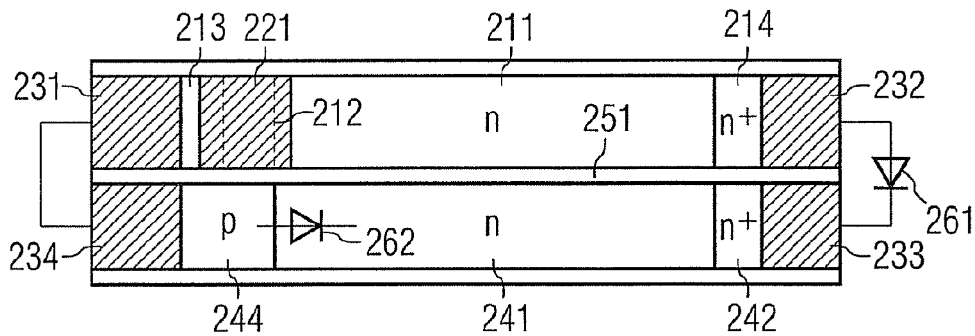
FIGS. 118A-118B illustrate an excerpt from a component which is realized as a power MOSFET and in which the drift control region is coupled to a drain electrode via a first diode and to a source electrode via an integrated second diode.
Figure 118B:
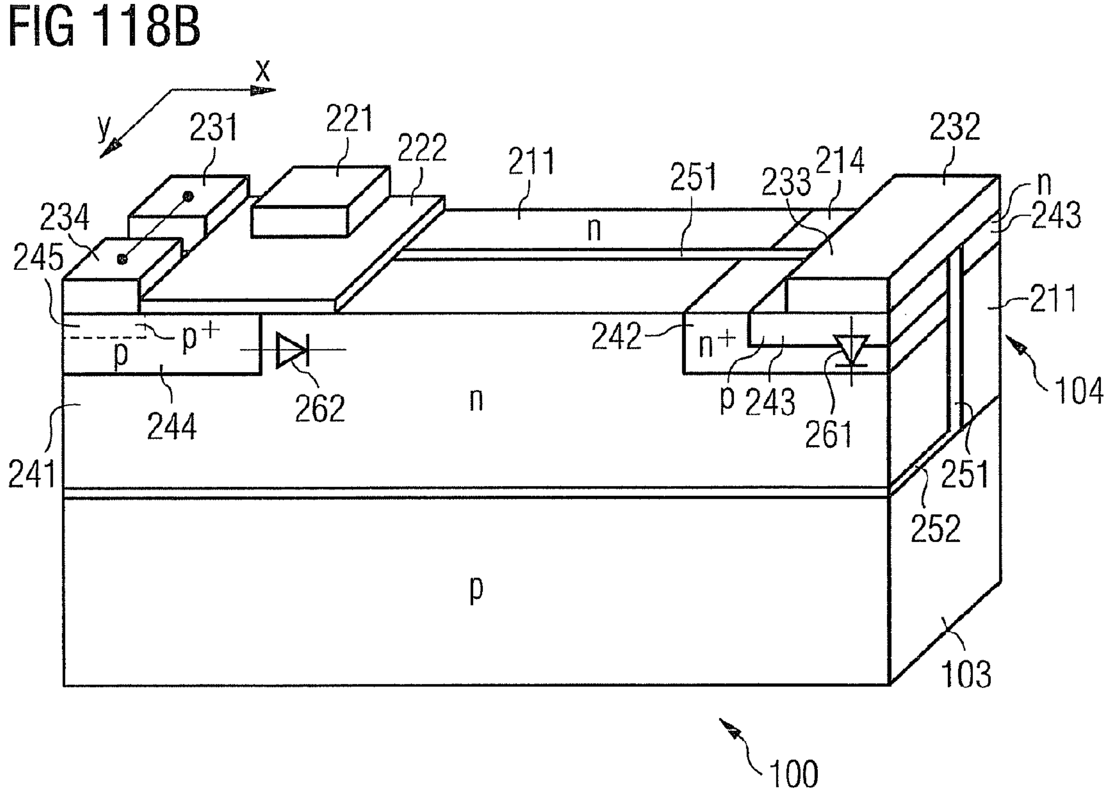

A first embodiment illustrated in FIGS. 118A and 118B provides for connecting the drift control region 241 to the drain region 214 or the drain electrode 232 via a first diode 261 at its drain-side end and to the source region or the source electrode 231 via a second diode 262 at its source-side end. In the example, these two diodes 261, 262 are integrated in the semiconductor body 100. The first diode 261 is formed by the connection regions 242, 243 explained in association with FIG. 111, of which connection regions one 242 is of the same conduction type as the drift control region 241 and one 243 is doped complementarily to the drift control region 241. In the case of this component, the drain electrode 232 and the first connection electrode 233 are realized as a common electrode which is formed in strip-type fashion and makes contact with the drift regions 241 and the connection regions 243 doped complementarily to the first connection regions 242.

The first diode 261 can also be realized as an external diode (not illustrated) between the drain electrode 232 and the first connection electrode 234.

In the example, the second diode 262 is realized by virtue of the second connection region 244 of the drift control regions 241 being realized as semiconductor regions doped complementarily to the drift control regions 241. In this case, the source electrode 231 and the second connection electrode 234 are electrically conductively connected to one another and can be realized, in accordance with the drain electrode 232 illustrated in FIG. 118B, as a common strip-type electrode (not illustrated).

In order to reduce a contact resistance between the second connection electrode 234 and the second connection region 244, a more highly doped semiconductor region 245 may optionally be present within the second connection region 244, and contact is made with it by the second connection electrode 234.

The functioning of the component illustrated in FIGS. 118A and 118B is explained below.

The n-channel MOSFET illustrated is turned on when a suitable driving potential is applied to the gate electrode 221, as a result of which an inversion channel propagates in the body region 212 between the source region 213 and the drift region 211, and when a positive drain-source voltage is applied between the drain electrode 232 and the source electrode 231. During this operating state, the first diode 261 is forward-biased, while the second diode 262 is reverse-biased. In this case, the second diode 262 is dimensioned in such a way that its dielectric strength is higher than the drain-source voltage present when the component is driven in the on state. Due to the first diode 261 that is forward-biased during the on operating state, the electrical potential of the drift control region 241 corresponds to the drain potential minus the forward voltage of the first diode 261. This potential of the drift control region 241, owing to the load current flowing in the drift region 211 and owing to the bulk voltage drop thereby generated in the drift region 211 across wide regions of the drift region 211, is greater than the electrical potential in the drift region 211, whereby the voltage drop present across the accumulation dielectric 251 brings about the formation of the accumulation channel along the accumulation dielectric 251 in the drift region 211.

When the component is driven in the off state, that is to say when there is a high positive drain-source voltage but an inversion channel is not present, a space charge region propagates in the drift control region 211. The voltage across the accumulation dielectric 251 is upwardly limited, in the manner already explained, by the small quantity of dopant in the drift control regions 241 in the second lateral direction y. The second diode 262 is reverse-biased during this operating state as well, in which case the space charge region that propagates in the drift control region 241 with the component in the off state and is controlled by the drift region 211 protects the second diode 262 against a voltage breakdown. Preferably, the second diode 262 with respect to the drift control region 241 and the body region 212 with respect to the drift region 211 have a similarly high blocking capability, particularly if the second diode 262 and the body region 212 have been produced during the same process steps.

In the case of the component illustrated in FIGS. 118A and 118B, in the off-state operating case, the second diode 262, via which the drift control region 241 is connected to the source region or source electrode 231, enables thermally generated charge carriers to flow away from the drift control region 241, thereby preventing a voltage breakdown of the accumulation dielectric 251 as a result of accumulated thermal charge carriers.

A second function (that is to say trapping the charge, see below) does not occur here since generated holes can always flow away via the p-type region. If—as in the case illustrated—the p-type region is directly connected to the source, charge storage does not occur. However, if the p-type region is connected to the source via an external diode or by using a capacitor and, if appropriate, a further diode for limiting the voltage across the capacitor, the effect described does occur.

Figure 120:
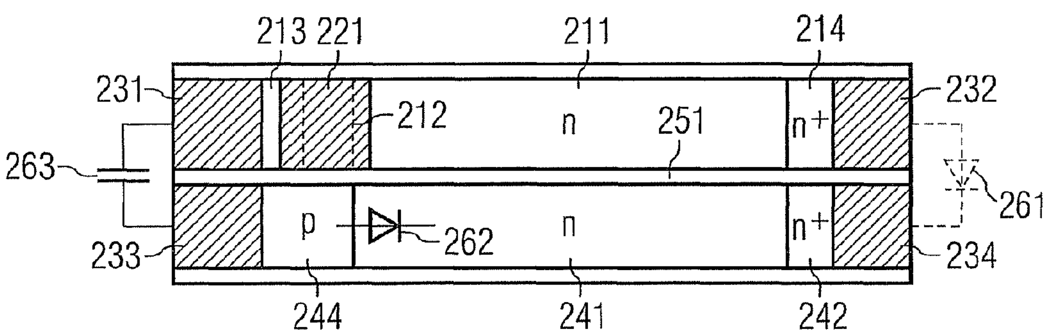
FIG. 120 illustrates an excerpt from a power MOSFET in which a capacitance and an integrated diode are connected between the drift control region and the source electrode.
Figure 121:
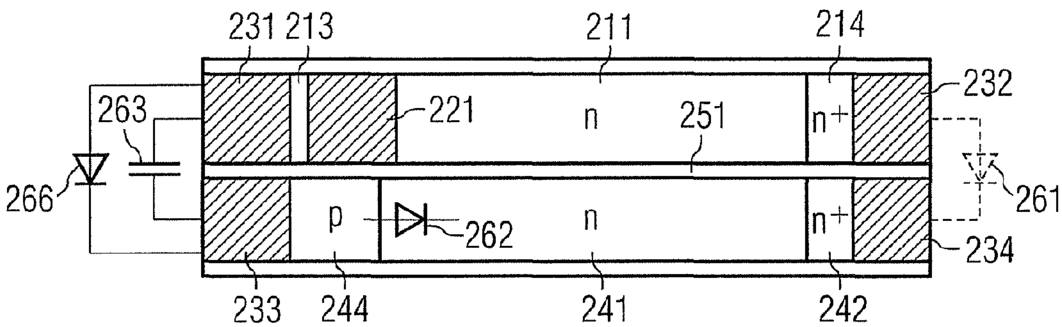
FIG. 121 illustrates a component, modified relative to the component in FIG. 120, with an external diode.

"Trapping" the charge in the drift control region 241 functions in the manner just explained when an interconnection in accordance with FIG. 120 or 121 is present. In this case, the diodes 261 and/or 266 can be either integrated or incorporated externally. The lower or right-hand part of the drift control region 241 merely has to contain the n'-doped region 242.

When the component is driven in the on state, the first diode 261 in this case prevents the holes from flowing away from the drift control region 241 to the drain electrode 232.

Figure 119:
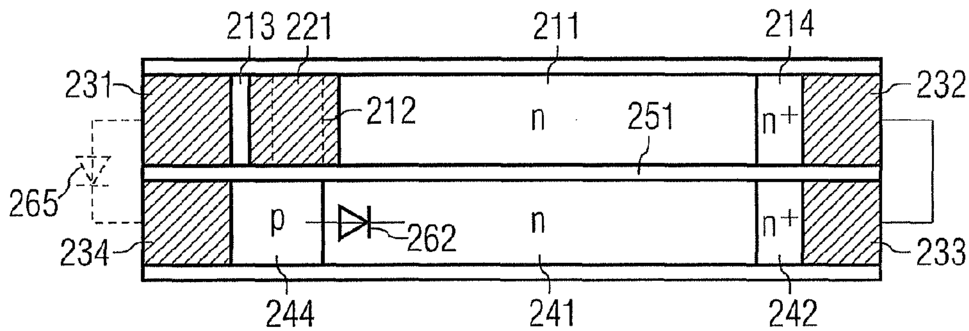
FIG. 119 illustrates an excerpt from a power MOSFET in which the drift control region is coupled directly to the drain electrode and is coupled to the source electrode via a diode.

Referring to FIG. 119, the first diode 261 can also be dispensed with. However, this results in increased on-state losses since no accumulated hole charge can occur in the drift control region 241, rather it is only possible to utilize the bulk voltage drop in the drift region and a correspondingly increased drain voltage for the formation of a channel.

There is optionally the possibility of connecting a further diode 265 between the source electrode 231 and the connection electrode 234, the further diode being illustrated by dashed lines in FIG. 119. The further diode 265 can be realized—in accordance with the diode 261—as an internal or external component and makes it possible, when the component is driven in the off state, in the second connection region 244 doped complementarily to the drift control region 241, for p-type charge carriers, that is to say holes, to be accumulated in those regions of the accumulation dielectric 251 which lie adjacent to the body region 212 (the position of which is illustrated by dashed lines). When the component is subsequently driven in the on state, the holes are required in the drift control region 241 in order to control the accumulation channel in the drift region 211 along the accumulation dielectric 251. In the case of such a switch-on, the holes are extracted from that region of the drift control region which is located near the body region 212, and are shifted in the direction of the drain region 214 or the first connection region 242 of the drift control region. When the component is subsequently driven in the on state, the hole charge from the second diode 262, which functions as a storage capacitance when the component is driven in the off state, is shifted into the "accumulation capacitance" formed by the drift region 211, the accumulation dielectric 251 and the drift control region 241.

Referring to FIG. 120, the charge storage effect explained above can also be achieved by using a capacitance 263 connected between the source electrode 231 and the second connection electrode 233. The capacitance, which is illustrated schematically as a capacitor 263 in FIG. 120, can be realized in any desired manner within or outside the semiconductor body.

In order to the limit the voltage across the capacitor 263, which is charged via the leakage current in the off-state, referring to FIG. 121, it is possible to provide a diode 266 in parallel with the capacitor 263, the breakdown voltage of the diode being adapted to the dielectric strength of the capacitor 263.

Both in the case of the component in accordance with FIG. 120 and in the case of the component in accordance with FIG. 121, the first diode 261 is optionally present between the drain-side end of the drift control region 241 and the drain region 214 or drain electrode 232 and is therefore illustrated by dashed lines in the figures. The diode 261 can be connected in one embodiment—like the diode 266—by interconnects to the connection electrodes 233 and 234, respectively, and preferably be arranged as diode structure in the monocrystalline semiconductor material or as "polysilicon diode" above the monocrystalline semiconductor body 100.

Figure 122:
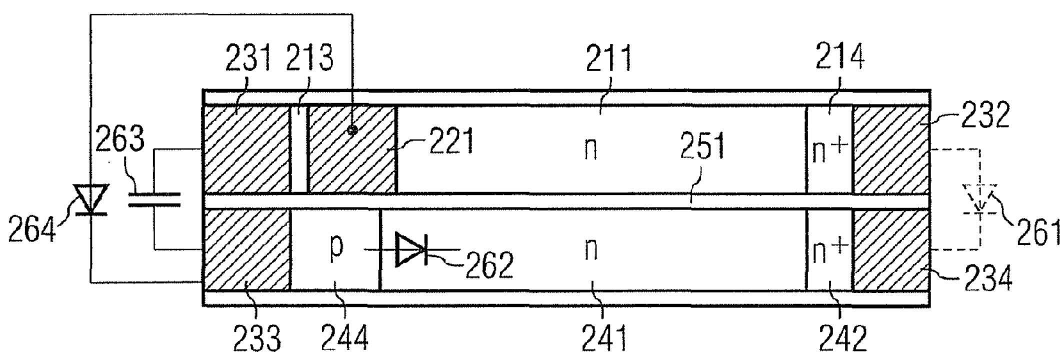
FIG. 122 illustrates a component which is modified relative to the component in FIG. 120 and in which a further diode is connected between the drift control region and a gate electrode.

One exemplary embodiment, illustrated in FIG. 122, provides for connecting the external storage capacitance 263 to the gate electrode 221 via a further diode 264. In this case, the anode of the further diode 264 is connected to the gate electrode 221 and the cathode is connected to the second connection electrode 233 or to that connection of the capacitance 263 which faces the second connection electrode 233. The further diode 264 has the effect that p-type charge carriers are subsequently supplied from the gate driving circuit. Even when the first diode 261 is present, which diode prevents holes from flowing away from the drift control region 241 to the drain electrode 232, p-type charge carriers are unavoidably lost through recombination or by using leakage currents and therefore have to be subsequently supplied. The further diode 264 has the effect, in one embodiment, that when the MOSFET is first driven in the on state, the capacitance 263 is charged from the gate circuit if it has not already been charged previously by a reverse current generated thermally in the drift control region 241. In this case, the voltage limiting diode 265 can optionally be connected in parallel with the capacitor 263.

Various possibilities for integrating the "external" capacitance 263 in the semiconductor body 100 are explained below with reference to FIGS. 123 to 126.

Figure 123:
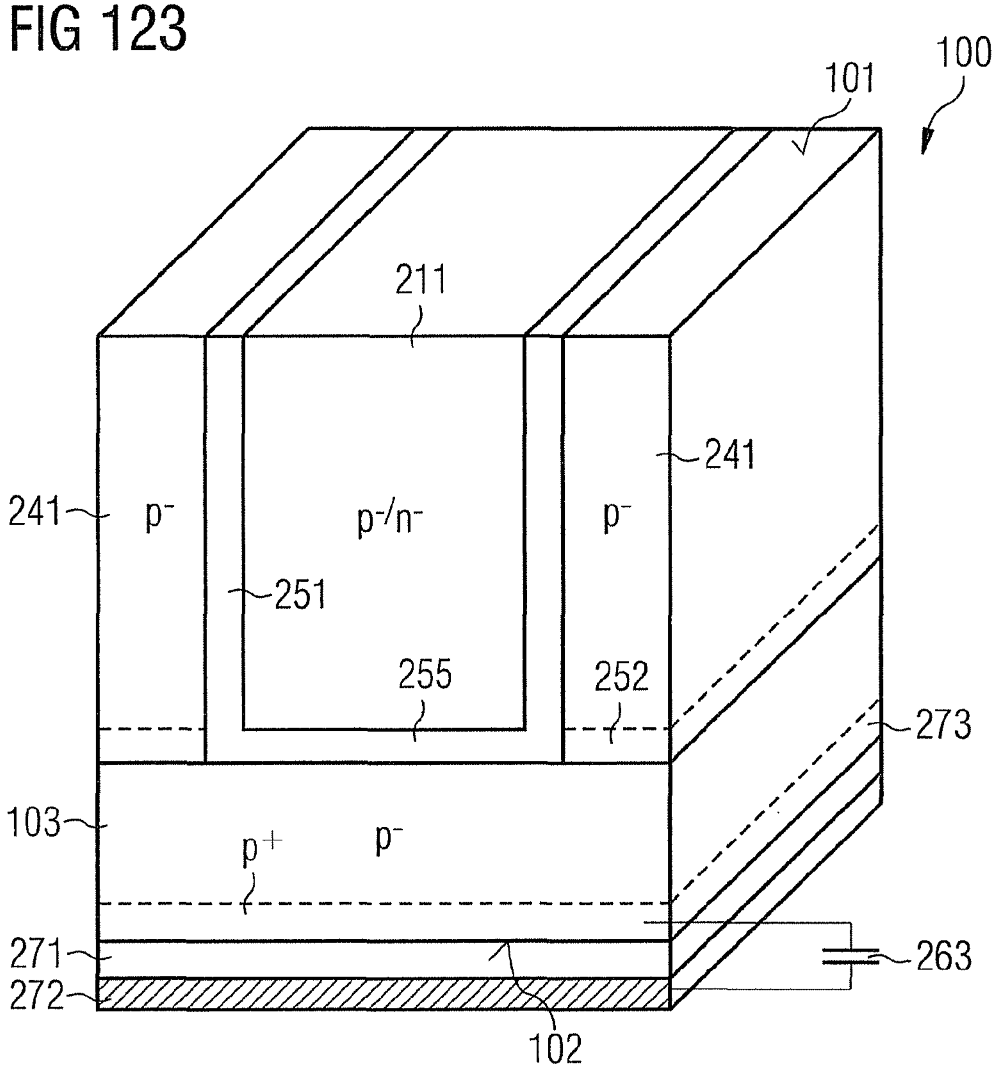
FIG. 123 illustrates an excerpt from a semiconductor component with a drift region and a drift control region, in which component a capacitance is integrated in the region of a semiconductor body.

FIG. 123 illustrates an excerpt from a perspective cross section through a semiconductor body with a transistor structure of a lateral MOSFET integrated therein. For reasons of clarity, only a laterally running drift region 211, a laterally running drift control region 241 and the accumulation dielectric 251 arranged between the drift region 211 and the drift control region 241 are illustrated in this case. The capacitance 263 is in this case formed by a dielectric layer 271 applied to the rear side 102 of the semiconductor body 100 or of the semiconductor substrate 103, the semiconductor substrate 103 and an electrode layer 272 applied to the dielectric layer 271. In this case, the electrode layer 272 is connected to the source electrode of the MOSFET in a manner not illustrated in greater detail, whereby one connection of the capacitance 263 is at source potential. The semiconductor substrate 103 can directly adjoin the drift control region 241, the drift control region 241 and the semiconductor substrate 103 being of the same conduction type in this case. A second connection of the capacitance is in this case formed by the substrate 103 and is directly connected to the drift control region 241.

As an alternative, a dielectric layer 252 can be arranged between the semiconductor substrate 103 and the drift control region 241. In this case, the second connection of the capacitance should be connected to the drift control region 241 via a connecting line (not illustrated in greater detail).

A semiconductor layer 273 doped more highly than the substrate 103 can optionally be present on the side of the substrate 103, which semiconductor layer is directly adjacent to the accumulation dielectric 271 and prevents the extension of a space charge region from the dielectric 271 into the substrate 103 and thus ensures a constantly large storage capacitance. In this case, the doping concentration of the substrate 103 may correspond to the doping concentration of the drift control region 241. It must in any case be low enough that approximately the entire reverse voltage of the component can be taken up under the drain region of the transistor. As an alternative, there is also the possibility of doping the semiconductor substrate 103 somewhat more highly (within the scope of the condition mentioned above) than the drift control region 241. The more highly doped intermediate region 273 can then be dispensed with. Furthermore, there is also the possibility of doping the drift control region 241 complementarily to the semiconductor substrate.

Figure 124:
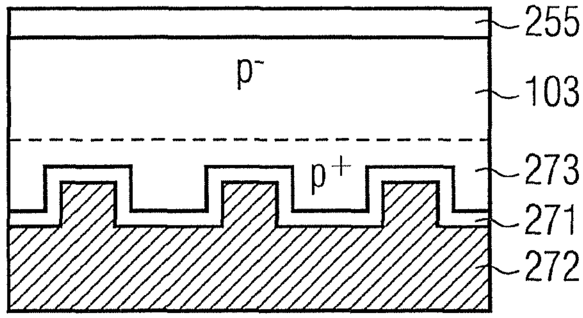
FIGS. 124 to 126 illustrate semiconductor components modified relative to the component in accordance with FIG. 123.
Figure 125:
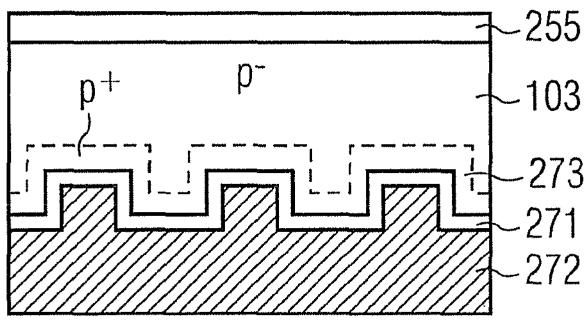

In order to increase the storage capacitance, referring to FIGS. 124 and 125, there is the possibility of forming the storage dielectric 271 not in planar fashion but rather in structured fashion in the lateral plane, for example in undulatory fashion. In this case, the more highly doped region 273 optionally present can follow the structure of the dielectric 271 (FIG. 125) or be realized in such a way that an essentially planar interface with the semiconductor substrate 103 is present.

Figure 126:
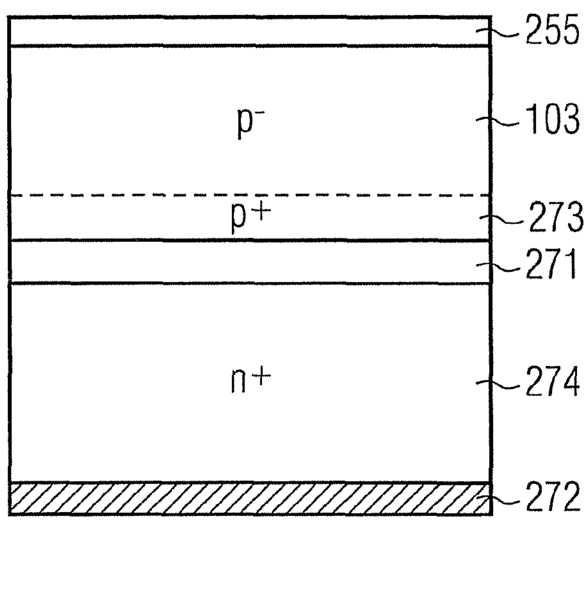

Referring to FIG. 126, the external capacitance 263 can also be realized by using a wafer bonding method. In this case, a semiconductor body to which a dielectric layer 271 is applied is bonded onto the rear side of the semiconductor substrate by using a bonding method including a thermal treatment, for example. In this case, the substrate can be doped more highly in the region of the rear side in order to obtain the more highly doped intermediate region 273. An electrode layer 272 on that side of the bonded semiconductor body which is remote from the substrate 103 ensures a good electrical connection of the storage capacitance.

In the case of the components explained above in which the gate electrode 221 is arranged above the front side 101 of the semiconductor body, the inversion channel runs in the body region 212 below the gate dielectric 222 in the region of the front side 101 of the semiconductor body 100. In this case, the effective channel width is approximately determined by the total width of the drift region 211, that is to say the sum of the widths b (FIG. 111A) of the individual drift region sections 211 lying between two drift control regions 241. When the component is driven in the on state, a current flow within the drift region 211 is concentrated in the accumulation channels that form in the drift region 211 along the accumulation dielectric 251. The dimensions of this accumulation region are very small in a direction perpendicular to the accumulation dielectric 251, that is to say in the second lateral direction y in the case of the components explained above, such that, in the case of the component, the mutual distance between two drift control regions 214 or the width b of the individual drift region sections 211 can be chosen to be very small and can be reduced approximately to double the value of the dimensions of the accumulation channel, without significantly influencing the on resistance of the component. With increasing reduction of the distance between two drift control regions 241, that is to say with increasing reduction of the width b of a drift region section 211, in the case of the components explained above, there is also a reduction in the channel width of the inversion channel of the body region 212 that is effective for the respective drift region section 211, and this increases the on resistance. The dimensions of the accumulation channel in the second lateral direction lie for example in the range of less than 50 nm.

Figure 127A:
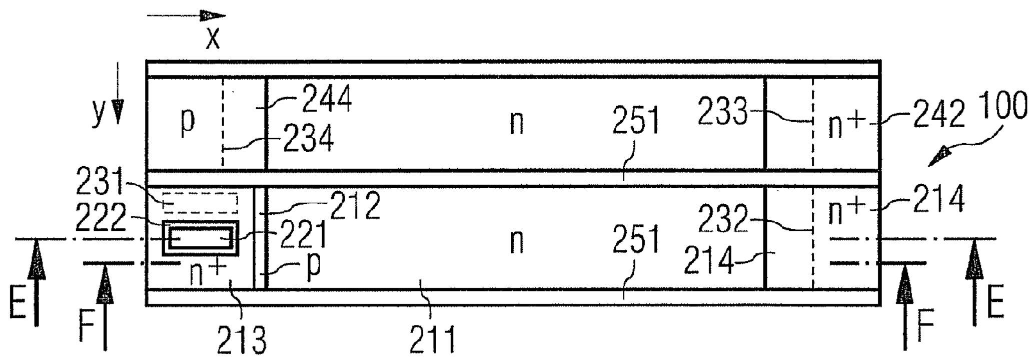
FIGS. 127A-127C illustrate a lateral power semiconductor component which is realized as a MOSFET and in which a gate electrode is arranged in a trench and in which an inversion channel controlled by the gate electrode runs in a vertical direction.

This problem is avoided in the case of the components which are explained below with reference to FIGS. 127 to 129 and in which the gate electrode 221 extends into the semiconductor body 100 in a vertical direction proceeding from the front side 101 of the semiconductor body. FIGS. 127A, 128A and 129A each illustrate the components in a plan view of the front side of the semiconductor body 100 in which they are respectively integrated, while FIGS. 127B, 128B, 129B illustrate the components in a first vertical sectional plane and FIGS. 127C, 128C, 129C illustrate the components in a second vertical sectional plane.

Figure 127B:
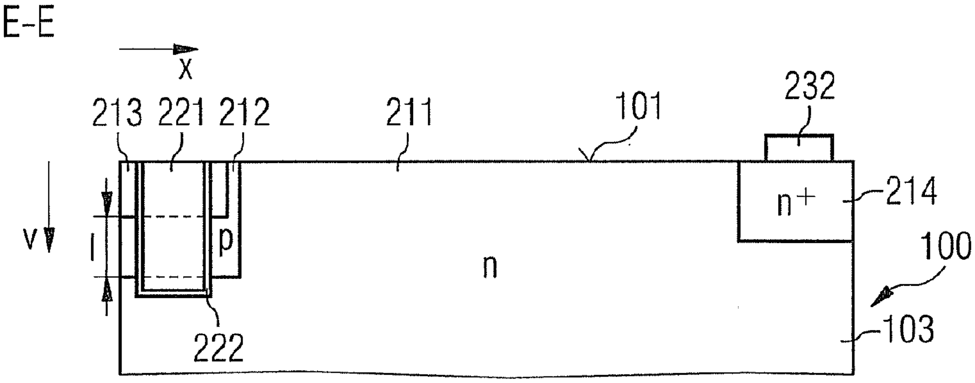
Figure 127C:
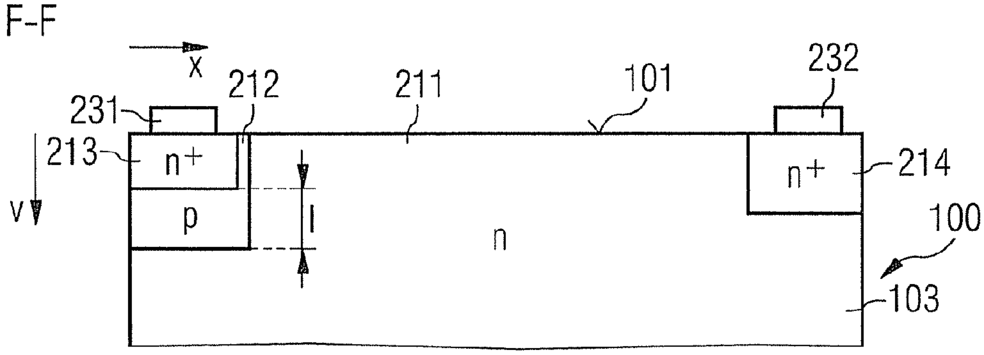
Figure 128A:
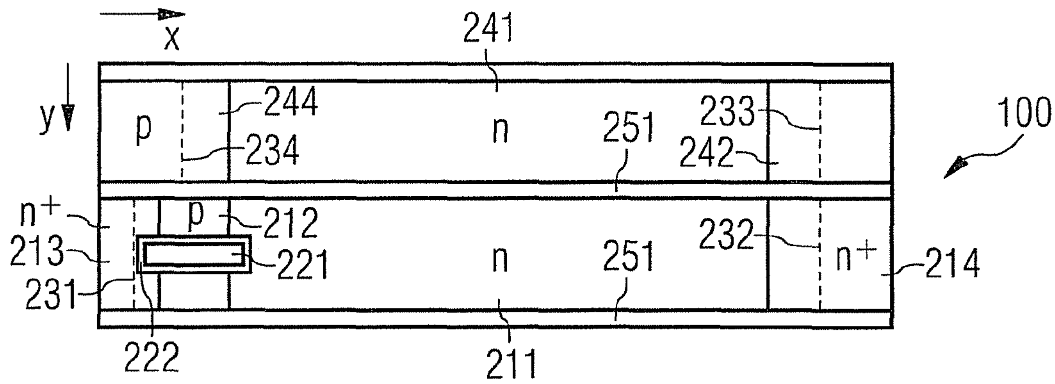
FIGS. 128A-128C illustrate a power MOSFET which is modified relative to the MOSFET in FIG. 127 and in which an inversion channel controlled by the gate electrode runs in a lateral direction.

In the case of the component in accordance with FIG. 127, the source region 213 is arranged within the body region 212 and the gate electrode 221 extends in a vertical direction through the source region 213, the body region 212 right into the drift region 211. In this case, the gate electrode 221 is arranged in extension of the drift region 211 in the first lateral direction x and in each case at a distance from the accumulation dielectric 251 in the second lateral direction y. When the component is driven in the on state, an inversion channel runs in a vertical direction along the gate dielectric 221 from the source region 213 through the body region 212 to the drift region 211. In this case, the channel length of the inversion channel is determined by the dimensions of the body region 212 in a vertical direction v between the source region 213 and the drift region 211. The channel length is designated by l in FIGS. 127B and 127C. In this case, FIG. 127B illustrates a vertical cross section through the semiconductor body 100 in the region of the gate electrode 221, while FIG. 127C illustrates a cross section through the semiconductor body 100 in a region between the gate electrode 221 and the accumulation dielectric 251.

The illustration of a cross section of the drift control region and the connection regions 242, 244 thereof is dispensed with in FIG. 127. The cross section corresponds to the cross section already explained with reference to FIG. 114C, in which case the drift control region 241, in a manner not illustrated in greater detail, can be connected up to the source and drain electrodes in accordance with the explanations concerning FIGS. 118 to 122 or can be connected only to the drain region 214 in accordance with the explanations concerning FIG. 111.

In a manner not illustrated in greater detail, the semiconductor body 100 of the component illustrated in FIG. 127 can be realized in accordance with the semiconductor body in FIG. 111, in the case of which a semiconductor layer 104 is applied directly to a semiconductor substrate 103, while the drift control region 241 is insulated from the semiconductor substrate 103 by a further insulation layer 252. There is furthermore the possibility of realizing the component according to FIG. 127 in accordance with the component in FIG. 113 in an SOI substrate in which a continuous insulation layer 105 is present between a semiconductor substrate 103 and a semiconductor layer 104.

FIG. 128 illustrates a modification of the semiconductor component which is illustrated in FIG. 127 and which is embodied as a power MOSFET. In the case of the component illustrated in FIG. 128, a length of the inversion channel is determined by the distance between the source region 213 and the drift region 211 in the first lateral direction x. In the case of this component, the gate electrode 221 extends into the semiconductor body in a vertical direction v and is arranged in such a way that it extends in the first lateral direction x in a manner insulated by the gate dielectric 222 from the source region 213 through the body region 212 right into the drift region 211. When the component is driven in the on state, the inversion channel having a length l runs in the first lateral direction x along the gate dielectric 222.

Figure 128B:
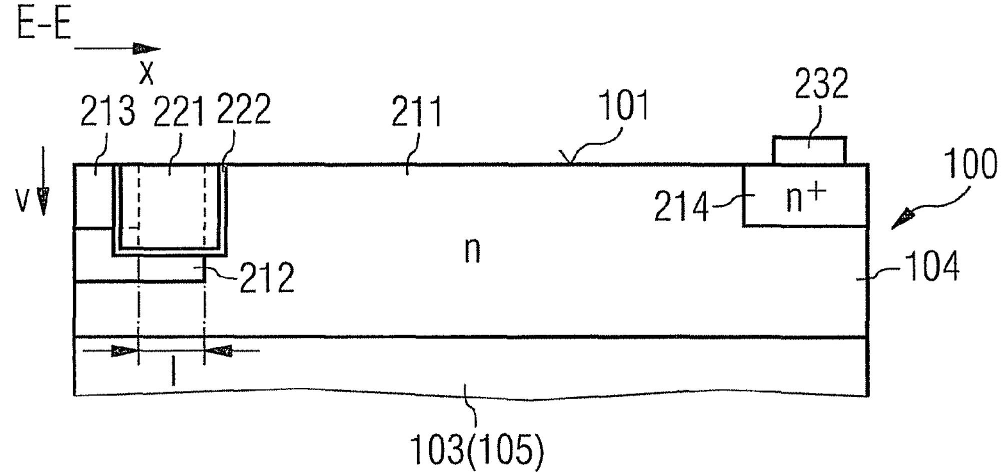
Figure 128C:
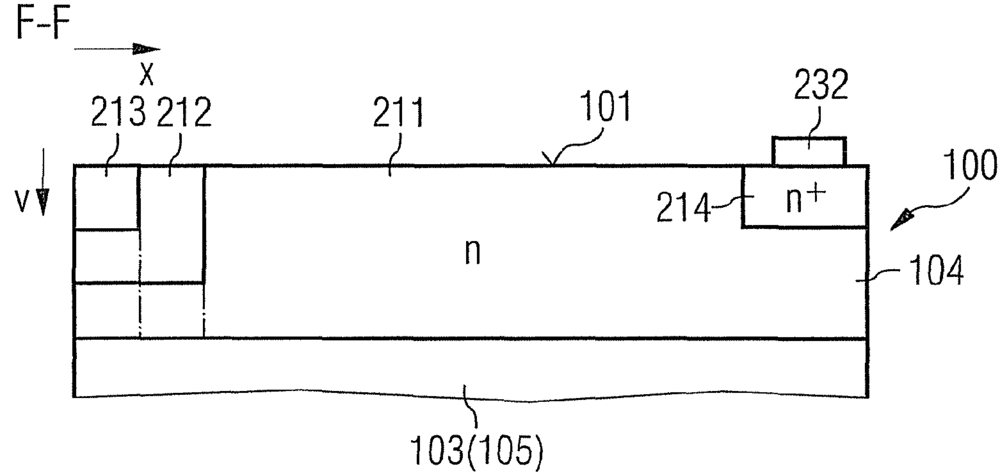
Figure 129A:
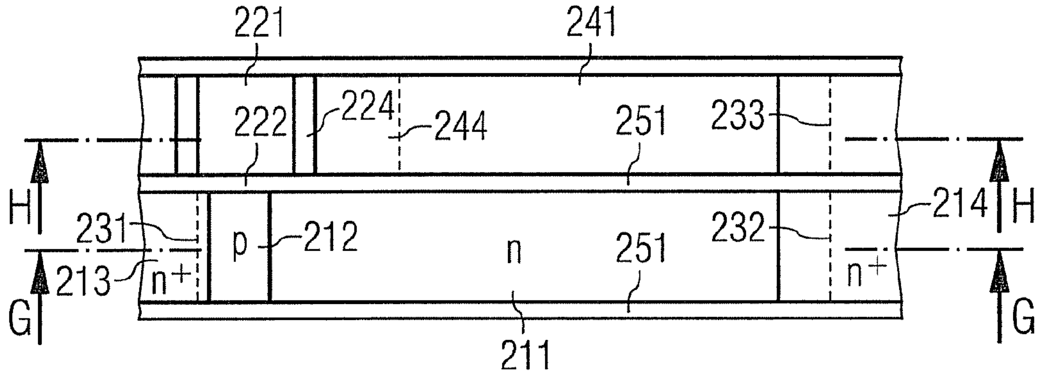
FIGS. 129A-129C illustrate a lateral power MOSFET having a plurality of gate electrode sections which are arranged in each case in extension of a drift control region in a lateral direction.

Referring to FIGS. 128B and 128C, the source region 213 is arranged in the body region 212 and is therefore separated from the drift region 211 by the body region 213 both in the first lateral direction x and in the vertical direction v. As is illustrated by dash-dotted lines in FIGS. 128B and 128C, there is also the possibility of realizing the source region 213 and the body region 212 in each case in such a way that they extend in a vertical direction v from the front side 101 of the semiconductor body 100 as far as a semiconductor substrate 103 arranged below the semiconductor layer 104, or as far as an insulation layer 105, when using an SOI substrate.

As an alternative, analogously to a component according to FIG. 127, the gate electrode 221 can also extend more deeply in a vertical direction v than the body region 212, such that, in the switched-on state, an inversion channel can form both in the first lateral direction x and in a vertical direction v.

FIG. 129 illustrates a modification of the component illustrated in FIG. 128. In the case of this component, the gate electrode 221 is arranged in extension of the drift control region 241 in the first lateral direction x and adjacent to the body region 212 in the second lateral direction y. In the case of this component, the accumulation dielectric 251 and the gate dielectric 222 are formed by a common dielectric layer which, in the second lateral direction y, separates the drift region 211 from the drift control region 241 and the body region 212 and also sections of the source region 213 and of the drift region 211 from the gate electrode 221. In the first lateral direction x, the gate electrode 221 is separated from the drift control region 241 by a further dielectric layer or insulation layer 224.

Figure 129B:
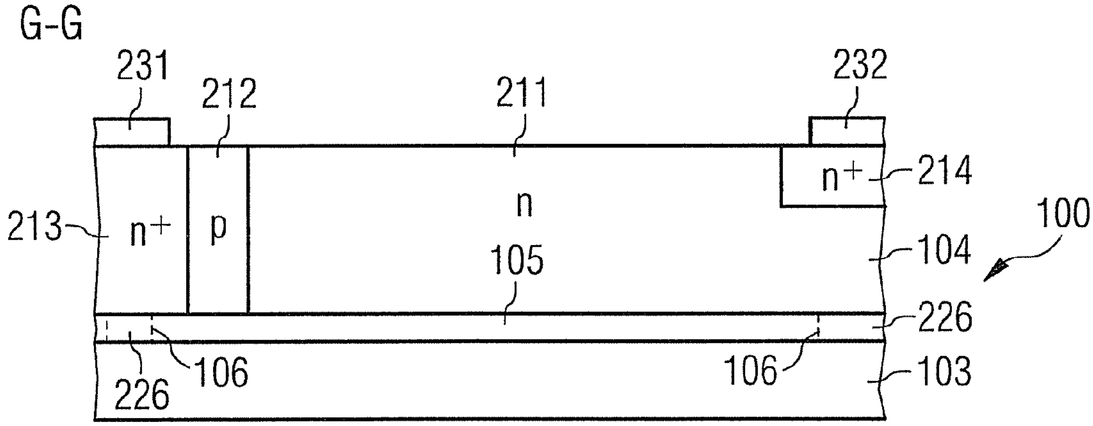
Figure 129C:
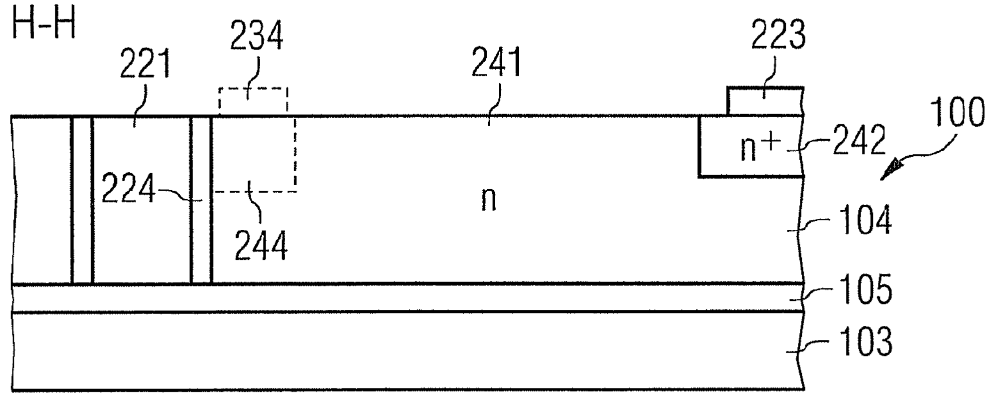

Referring to FIGS. 129B and 129C, the semiconductor body 100 of this component is realized as an SOI substrate with a semiconductor substrate 103, an insulation layer 105 and a semiconductor layer 104. Referring to FIG. 129B, the body and source regions 212, 213 extend in a vertical direction v of the semiconductor body 100 as far as the insulation layer 105. The same applies to the gate electrode 221, which extends in a vertical direction v likewise as far as the insulation layer 105. In the case of this component, an inversion channel forms in the first lateral direction x in the body region 212 between the source region 213 and the drift region 211 along the gate dielectric 222.

In a manner not illustrated in greater detail, the body region 213 can also end above the insulation layer 105 and the source region 213 can be arranged completely within the body region 212, in order thereby to obtain, in accordance with the component according to FIG. 127, a power MOSFET having an inversion channel extending in a vertical direction v.

The drift control region 241 of the component according to FIG. 129 can be connected up in accordance with the explanations concerning FIGS. 118 to 122. In this case, a second connection region 244 of the drift control region 241 can be arranged, in the first lateral direction x, adjacent to the further insulation layer 224 of the gate electrode 221 in the drift control region 241.

In a manner not illustrated in greater detail, the second connection region 244 can extend in the vertical direction v over the entire depth of the body region 212 and/or can extend in the vertical direction as far as the insulation layer 105.

In accordance with the explanations concerning FIGS. 111 to 113 there is, of course, also the possibility of coupling the drift control region to the drain potential only via the first connection electrode 233 with interposition or without interposition of a diode.

Figure 130:
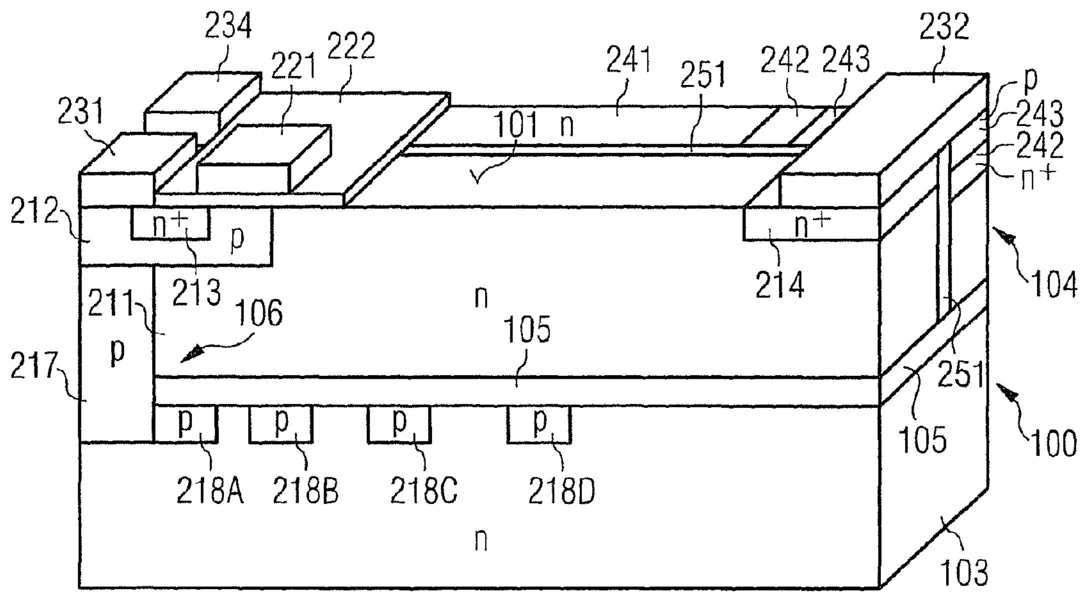
FIG. 130 illustrates a first exemplary embodiment of a lateral power MOSFET which is based on an SOI substrate and the body region of which is connected to a semiconductor substrate.
Figure 131:
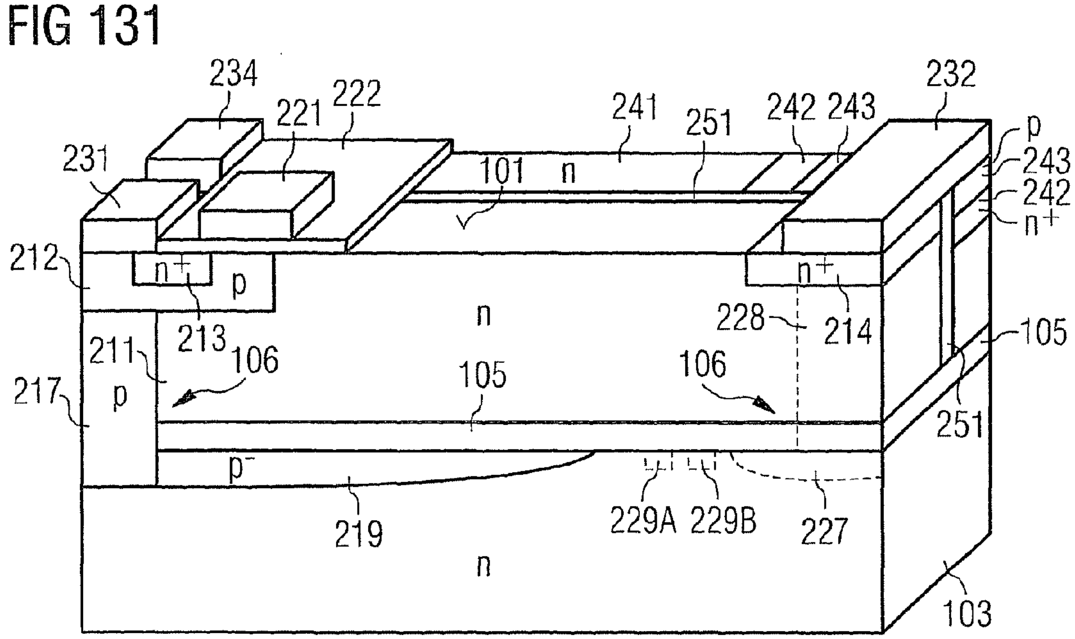
FIG. 131 illustrates a second exemplary embodiment of a lateral power MOSFET which is based on an SOI substrate and the body region of which is connected to a semiconductor substrate.

FIGS. 130 and 131 illustrate exemplary embodiments of a lateral power MOSFET based on an SOI substrate. In this case, the semiconductor body 100 in which the MOSFET is integrated respectively has a semiconductor substrate 103, an insulation layer 105 arranged on the semiconductor substrate 103, and also a semiconductor layer 104 which is arranged above the insulation layer 105 and in which the active component regions of the MOSFET are integrated.

In the case of these components in accordance with FIGS. 130 and 131, the insulation layer 105 has a cutout 106 through which a connecting region 217 adjoining the body region 212 extends through the insulation layer 105 right into the semiconductor substrate 103. The connecting region is of the same conduction type as the body region 212. The semiconductor substrate 103 is doped complementarily to the connecting region 217.

In the case of the component in accordance with FIG. 130, field regions 218A, 218B, 218C, 218D doped complementarily to the substrate are arranged in the semiconductor substrate 103, which field regions are arranged at a distance from one another in the first lateral direction x and are directly adjacent to the insulation layer 105. In the second lateral direction y, the field regions 218A-218D are formed in strip-type fashion in a manner not illustrated in greater detail. In this case, the field region 218A closest to the connecting region 217 is connected directly to the connecting region 217. The lateral distance between two adjacent field regions 218A-218D preferably increases with increasing distance from the connecting region 217.

The field regions 218A-218D fulfill the function of field rings, such as are known from edge terminations in the case of power semiconductor components, and influence through the dielectric insulation layer 105 the field distribution in the drift region 211 with the aim of reducing the voltage loading of the insulation layer 105 in the case of a semiconductor substrate 103 which is at a given potential. The potential can be a ground potential or reference potential, but can also correspond to the drain potential.

In the case of the component in accordance with FIG. 131, the same aim is achieved by using a field region 219 doped complementarily to the semiconductor substrate 103, the field region being realized in such a way that its dopant dose considered in a vertical direction v decreases with increasing distance from the connecting region 217. Such a region is also referred to as a VLD region (VLD=variation of lateral doping).

Referring to FIG. 131, a cutout 106 can be provided in the insulation layer 105 below the drain region 214, through which cutout a connecting region 228 extends from the drain region 214 as far as the semiconductor substrate 103. In the region of the cutout, a semiconductor region 227 is optionally present which extends as far as below the insulation layer 105 in the first lateral direction and with which contact is made by the connecting region 228. Field rings 229A, 229B can optionally be provided in the substrate in the region below the drain region 214, the function of the field rings corresponding to the function of the field rings in FIG. 130. The connecting region 228, the semiconductor region 227 in the substrate 227 and the field rings are preferably of the same conduction type as the drain region 214. These regions are preferably doped more highly than the drift region 211.

In the case of the components illustrated in FIGS. 130 and 131, the gate electrode 221 is arranged as a planar electrode above the front side 101 of the semiconductor body. It goes without saying that the gate electrode, in a manner not illustrated in greater detail, can also be realized as a trench electrode in accordance with one exemplary embodiments in FIGS. 127 to 129.

Furthermore, in the case of the components in accordance with FIGS. 130 and 131, the drift control region 241 is connected to the drain electrode 232 via a diode formed by the pn junction between the first connection region 242 and the semiconductor region 243 doped complementarily to the latter. Contact is additionally made with the drift control region 241 via the second connection electrode 234. The drift control region 241 can be connected up in any desired manner already explained with reference to FIGS. 118 to 122. Furthermore, there is also the possibility of coupling the drift control region 241 only to drain potential, as was explained for the exemplary embodiments in FIGS. 111 to 113.

In the case of the components explained above which are not based on an SOI substrate, that is to say in which the drift region 211 directly adjoins an underlying semiconductor substrate 103 doped complementarily to the drift region 211, for example, an insulation layer 252 that insulates the drift control region 241 from the semiconductor substrate 103 (cf. FIG. 111D, for example) is required in the manner explained. These components are based on a basic structure having a semiconductor substrate 103, drift regions 211 arranged on the semiconductor substrate 103, and drift control regions 241 arranged adjacent to the drift regions 211 in a lateral direction, the drift control regions being insulated from the drift regions 211 by an accumulation dielectric 251 and from the semiconductor substrate 103 by a further insulation or dielectric layer 252.

A possible method for producing such a component basic structure is explained below with reference to FIG. 132.

Figure 132A:
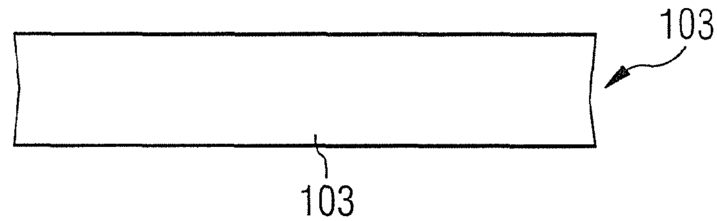
FIGS. 132A-132G illustrate a possible method for producing a drift control region separated from a drift region by using an accumulation dielectric.

Referring to FIG. 132A, the starting point of the method is formed by the provision of a semiconductor substrate 103.

Figure 132B:
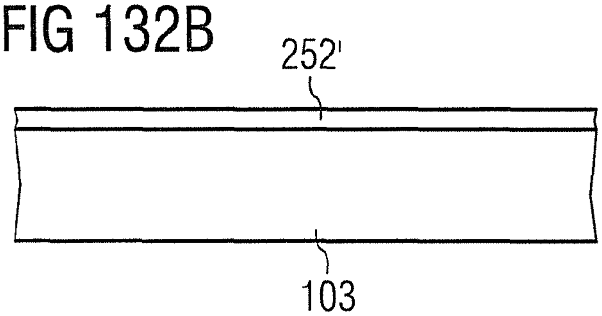

Referring to FIG. 132B, an insulation layer 252' is produced on one of the sides of the semiconductor substrate 103. The insulation layer 252' is an oxide layer, for example, which can be produced by thermal oxidation, or a deposited oxide, such as TEOS (tetraethyl orthosilicate), for example.

Figure 132C:
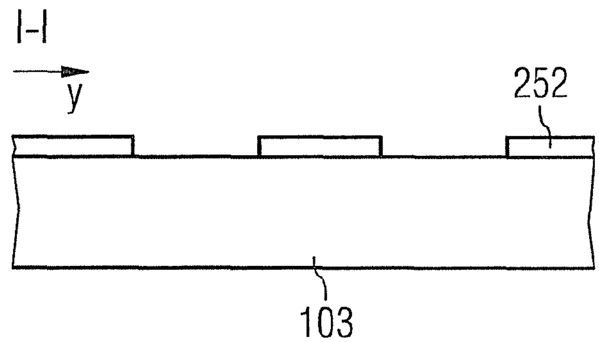
Figure 132D:
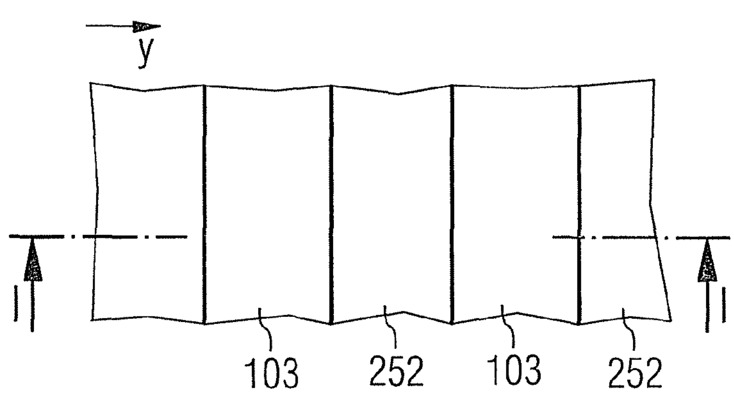

The insulation layer 252' is subsequently patterned by removing individual sections of the insulation layer 252' in such a way that strip-type insulation layers 252 arise, which is illustrated as the result in FIGS. 132B and 132C. In this case, FIG. 132B illustrates a cross section through the arrangement with the semiconductor substrate 103 and the patterned insulation layer, while FIG. 132C illustrates a plan view. In this case, the individual strip-type insulation layers 252 are arranged at a distance from one another in a lateral direction, corresponding to the second lateral direction y of the later component. The width of the remaining insulation layers 252 in the second lateral direction y defines the width of the later drift control regions, while the mutual distance between two such insulation layers 252 defines the width of the later drift regions 211.

Figure 132E:
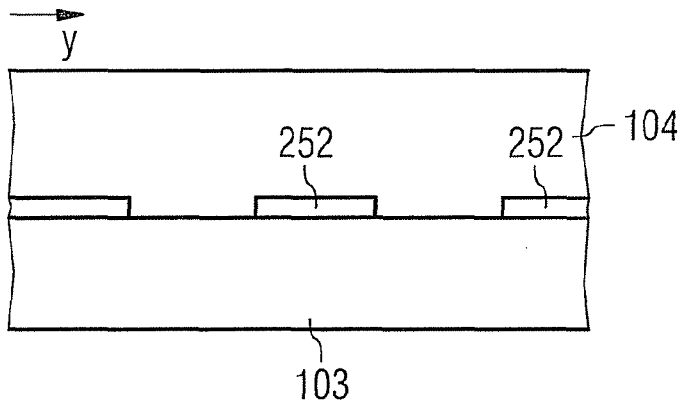

Referring to FIG. 132E, a semiconductor layer 104 is subsequently deposited on the substrate 103 with the patterned insulation layer 252 by using an epitaxy method, the insulation layers 252 being overgrown epitaxially in this case.

The thicker the semiconductor layer 104 is made, the lower the on resistance of the finished transistor. The thickness is limited by the technical possibilities of the subsequent etching and filling processes and the costs thereof. Typical thicknesses lie within the range of 2 μm to 40 μm.

Figure 132F:
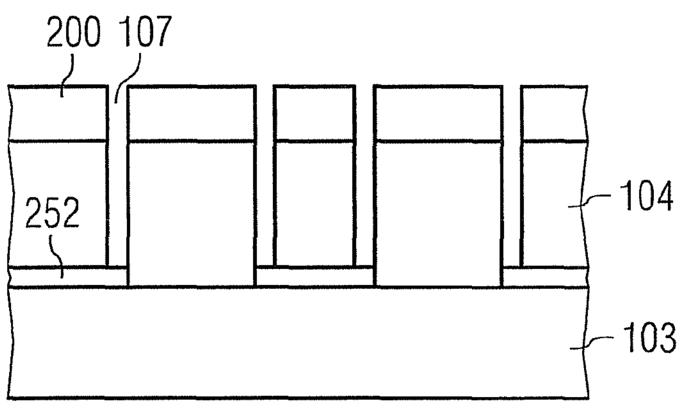

Referring to FIG. 132F, using an etching mask 200, proceeding from the front side 101 of the semiconductor body 100 formed from the semiconductor substrate 103 and the semiconductor layer 104, trenches are subsequently etched into the semiconductor body 100, the trenches being arranged at a distance from one another in the second lateral direction y and being positioned in such a way that a trench is in each case arranged in the region of a lateral edge of the insulation layers 252. The etching is effected for example by using an etchant that etches the semiconductor layer 104 selectively with respect to the material of the insulation layer 252, such that the insulation layers 252 serve as etching stop layers during etching. The width of the trenches 107 is given by the maximum voltage loading between the later drift region 211 and drift control region 241 and also by the method for producing the dielectric layer. If the dielectric layer is produced by thermal oxidation of the semiconductor material, then the consumption of semiconductor material should be taken into account in the trench width. Typical trench widths lie between approximately 20 nm and approximately 100 nm in the case of thermally oxidized dielectric layers, and between approximately 30 nm and approximately 200 nm in the case of dielectric filling of the trenches.

A dielectric layer is subsequently produced in the trenches 107. The dielectric layer is an oxide layer, for example, and can be implemented before or after the removal of the etching mask 200 by a thermal oxidation of uncovered regions of the semiconductor body 100 or by deposition of an insulator layer for example in a CVD process or a combination of both variants. If the thermal oxidation is effected after the removal of the etching mask 200, an oxide layer also arises above the front side 101 of the semiconductor body 100, which oxide layer should then be removed again—for example by using an anisotropic etching method.

Figure 132G:
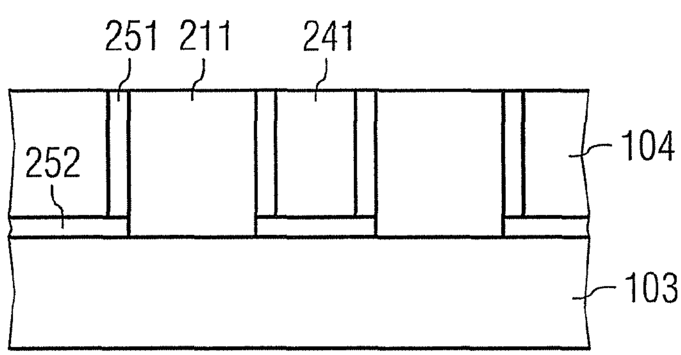

FIG. 132G illustrates the semiconductor body 100 after these method steps have been carried out. On the basis of this basic structure illustrated in FIG. 132G, the semiconductor components explained above can be realized by producing the body, source and drain regions 212, 213, 214 of the MOSFET structure and also the connection regions 233, 234 of the drift control regions 241 by using customary doping methods which are sufficiently known and which include implantation and/or diffusion steps, for example.

The use of a lightly doped drift control region 241 for controlling an accumulation channel in a drift region 211 of a power semiconductor component is not restricted to power MOSFETs, but rather can be applied to any power semiconductor components having a drift region. The use of such a drift control region can be applied to IGBTs, in one embodiment. Such IGBTs differ from the power MOSFETs explained above with reference to the Figures by virtue of the fact that the drain region 214, which is also referred to as emitter region in the case of an IGBT, is doped complementarily to the drift region. Particular advantages are afforded by the use of a lightly doped drift control region 241 for controlling an accumulation channel in a drift region 211 in the case of unipolar power semiconductors.

A further example of application for a lightly doped drift control region arranged adjacent to a drift region is power Schottky diodes. Schottky diodes of this type differ from the power MOSFETs explained above by virtue of the fact that a Schottky metal region is present instead of the body region 212, and that, moreover, there is no gate electrode present.

Figure 133:
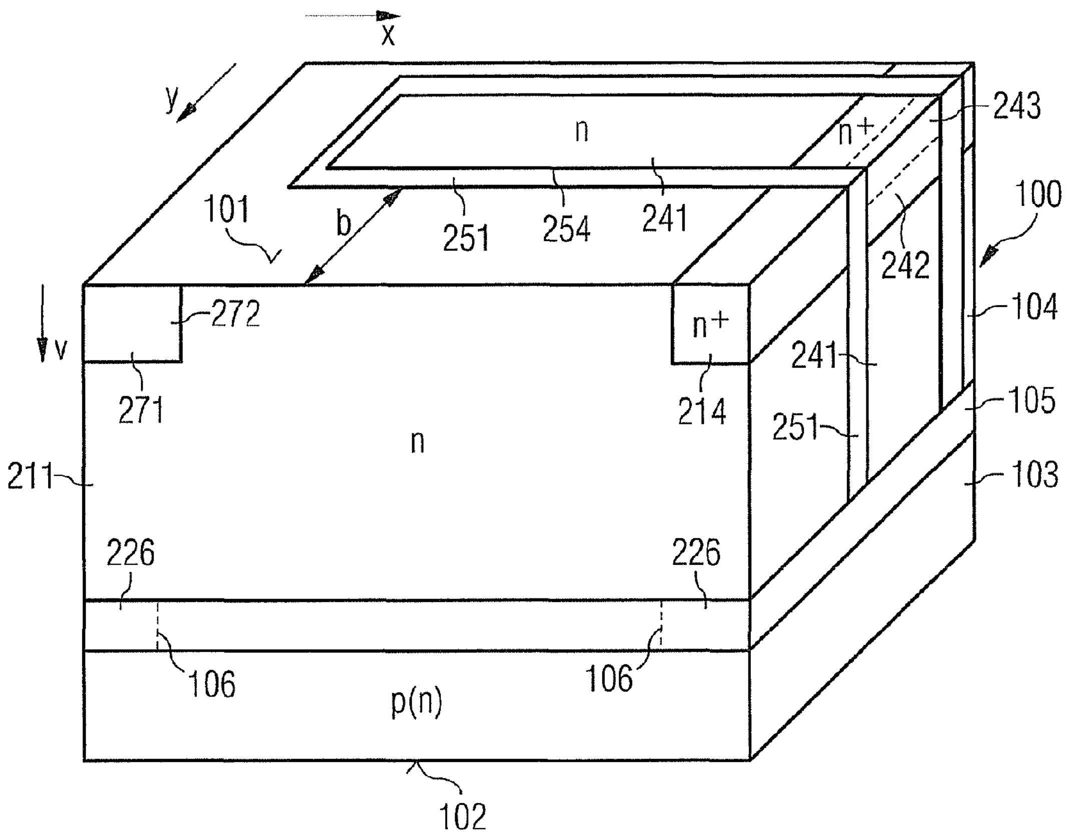
FIG. 133 illustrates, in perspective illustration, a lateral power semiconductor component realized as a Schottky diode.

FIG. 133 illustrates an example of such a power Schottky diode in a modification of the exemplary embodiment in accordance with FIG. 113. In this case, the reference symbol 271 designates the Schottky metal region, which is adjacent to the drift region 211 and which forms with the drift region 211*a* component junction 272, proceeding from which a space charge region propagates in the drift region 211 when the component is in the off state. In the case of this component, the Schottky metal region 271 forms an anode region, while the highly doped semiconductor region 214 arranged in the drift region 211, which semiconductor region forms the drain region in the case of a MOSFET forms a cathode region of the Schottky diode. This Schottky diode is turned off if a positive voltage is present between the cathode region 214 and the anode region 261.

In the case of the power components explained above, the drift region 211 and the drift control region 241 are arranged adjacent to one another in the second lateral direction y of the semiconductor body 100 and in a manner separated from one another by the accumulation dielectric 251. In this case, an area of the accumulation dielectric 251 along which the accumulation channel propagates in the drift region 211 when the component is driven in the on state runs perpendicular to the front side 101 of the semiconductor body.

Figure 134A:
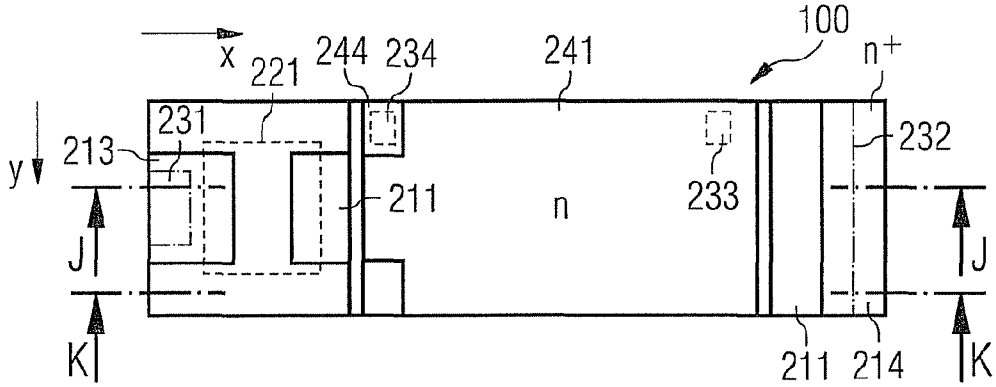
FIGS. 134A-134E illustrate a lateral power MOSFET with a drift control region running parallel to a front side of a semiconductor body and with a gate electrode arranged above the front side.
Figure 134B:
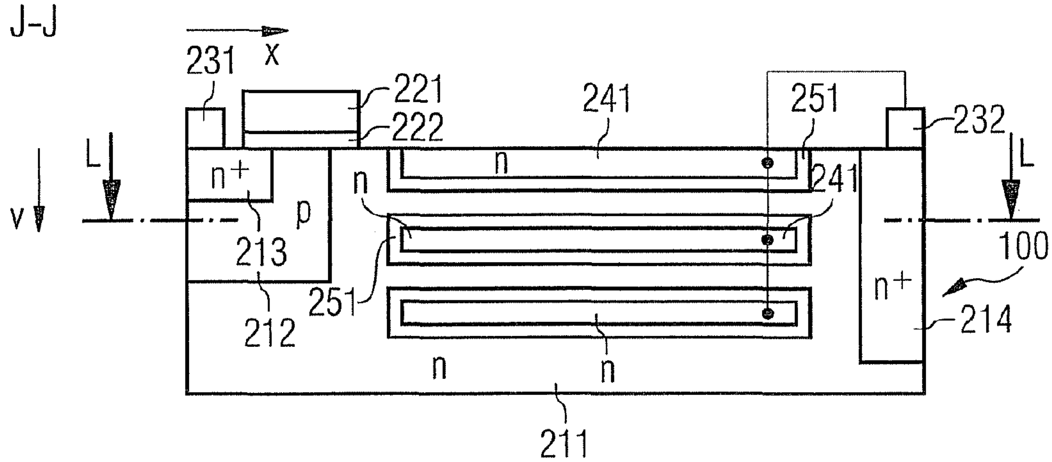
Figure 134C:
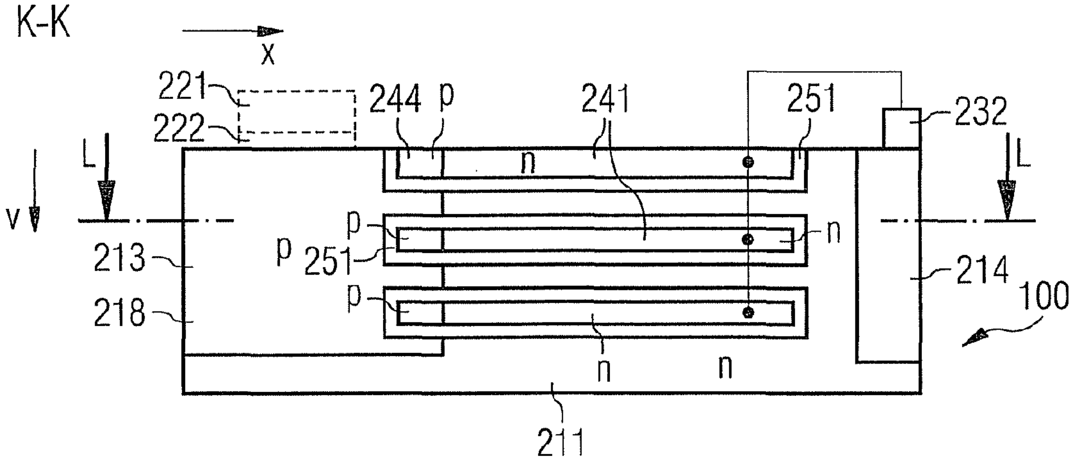
Figure 134D:
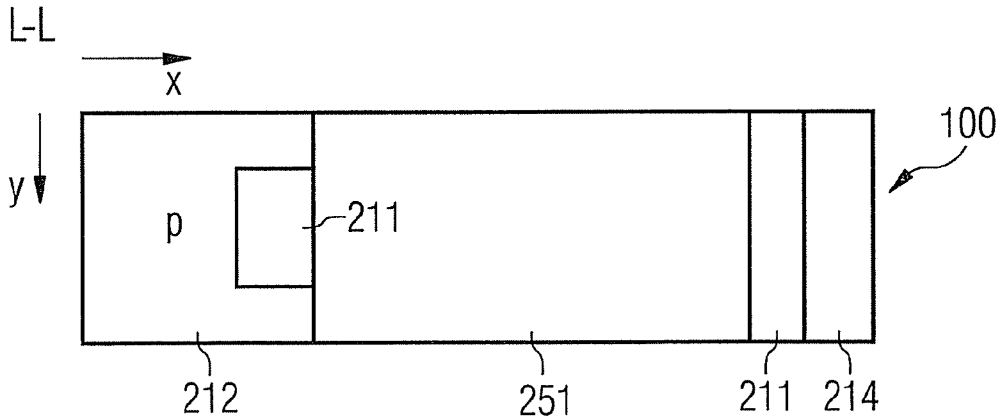

FIGS. 134A to 134D illustrate a further exemplary embodiment of a lateral power semiconductor component. In the case of this component, drift control regions 241 are arranged adjacent to a drift region 211 or to individual sections of the drift region 211 in a vertical direction v of a semiconductor body 100. FIG. 134A illustrates this semiconductor component in a plan view of a front side 101 of the semiconductor body 100, FIG. 134B illustrates this component in a vertical cross section J-J, FIG. 134C illustrates the component in a further vertical cross section K-K, and FIG. 134D illustrates the component in a lateral sectional plane L-L running parallel to the front side 101.

The individual drift control regions 241 are insulated from the drift region 211 by an accumulation dielectric 251 and are electrically coupled to the drain region 214 or the drain electrode 232, which is illustrated schematically in FIGS. 134B and 134C by a line connection making contact with the individual drift control regions 241 and the drain electrode 232.

Figure 134E:
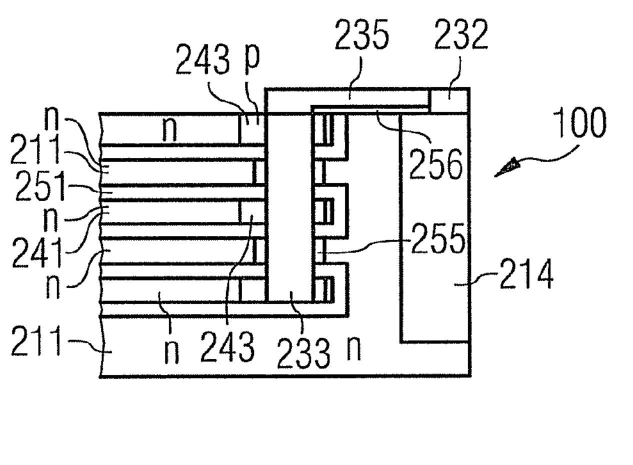

A first connection electrode 233 is present for making contact with the drift control regions 241, which connection electrode extends into the semiconductor body in a vertical direction proceeding from the front side 101 and in each case makes contact with the drift control regions 241, but is insulated from the drift region 211. FIG. 134E illustrates the component in the region of this connection contact 233 in cross section. In this case, the connection contact 233 is situated at that end of the drift control regions 241 which faces the drain region 214. The connection contact can be arranged at any desired position in the second lateral direction y. FIG. 134A depicts one possible position of the connection contact 233, which has a square cross section, for example.

The connection contact 233 is connected to the drain electrode 232 by using a connecting link 235 above the front side 101 of the semiconductor body and is insulated at least from the drift region 211 by using an insulation layer 256 above the front side. The reference symbol 255 in FIG. 134E designates a vertical insulation layer that insulates the drift region 211 within the semiconductor body 100 from the connection electrode 233 extending into the semiconductor body 100.

In order to be able to make contact with the drift control regions 241 at their end facing the body region 212 or the source region 213, a second connection electrode 234 is present, which corresponds to the first connection electrode 233 explained and which extends into the semiconductor body 100 in a vertical direction at the body- or source-side end of the drift control regions 241 and which makes contact with the drift control regions 241, but is insulated from the drift regions 211. One possible position of the second connection electrode 234, which is optionally present, is likewise depicted by dashed lines in FIG. 134A. In the example, second connection regions 244 are present in the drift control regions, the second connection regions being doped complementarily to the drift control regions 241 and the second connection electrode making contact with the second connection regions.

The drift control regions 241 can be connected to the drain electrode 232 and the source electrode 231 in any desired manner explained with reference to FIGS. 118 to 122. In order to connect the drift control regions 241 to the drain electrode 232 via a diode, for example, connection regions 243 can be provided in the drift control regions 241 in the region of the connection contact 235, the connection regions being doped complementarily to the remaining regions of the drift control region 241. Such connection regions are illustrated in FIG. 134E. In one embodiment, a highly doped region can be introduced between the connection region 243 and the drift control region 241, which highly doped region is doped complementarily to the connection region 243 and, when a blocking drain voltage is present, can prevent accumulated holes from flowing away from the drift control region toward the connection electrode 233. Connection regions 244 doped complementarily to the drift control region 241 can correspondingly be provided in the drift control regions 241 in the region of the further connection contact 237 for the purpose of connecting the drift control regions 241 to the source electrode 231.

In the case of the component illustrated in FIG. 134, the body region 212 has sections 218 which are doped complementarily to the drift region 211 and which extend in the first lateral direction x in the direction of the drain region 214. By virtue of this configuration of the body regions 218, the blocking pn junctions of drift regions 211 and drift control regions 241 are one above another in the first vertical direction x and therefore the profile of the electric field strength and of the space charge regions is practically identical in these two semiconductor regions. This reduces the static voltage loading across the accumulation dielectric 251 in off-state operation.

The gate electrode 221 of the MOSFET illustrated in FIG. 134 is arranged as a planar electrode above the front side 101 of the semiconductor body. The source region 213 is completely surrounded by the body region 212, an inversion channel forming in the first lateral direction x between the source region 213 and the drift region 211 below the front side 101 of the semiconductor body 100 when the component is driven in the on state. In the example illustrated, the areas of the accumulation dielectric 251 between the drift control regions 241 and the drift region 211 run parallel to the front side 101, such that accumulation channels in the drift regions 211 likewise form parallel to the front side 101 of the semiconductor body when the component is driven in the on state.

Figure 135A:
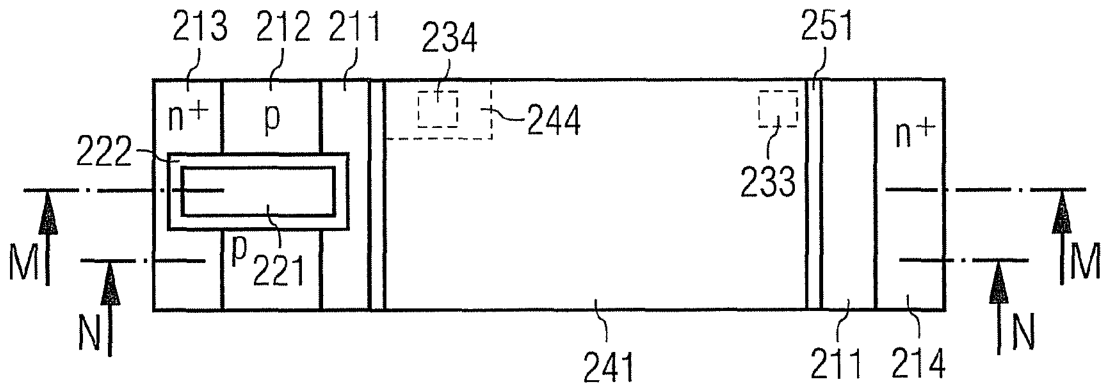
FIGS. 135A-135C illustrate a component which is modified relative to the component in FIG. 134 and in which the gate electrode is arranged in a trench.
Figure 135B:
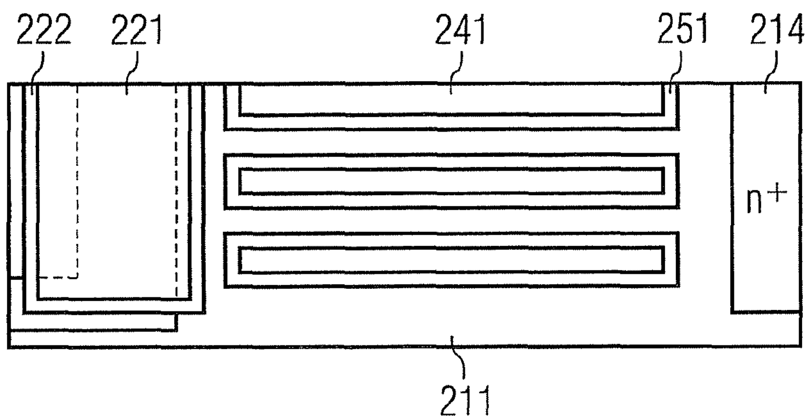
Figure 135C:
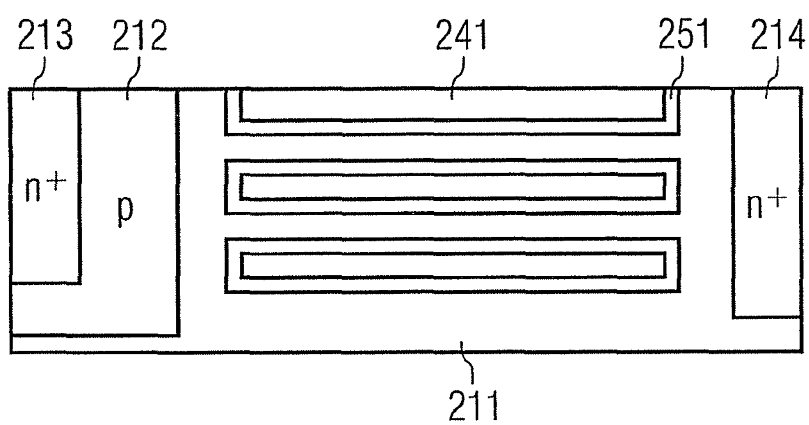

FIGS. 135A to 135C illustrate a modification of the component illustrated in FIG. 134. In the case of this component, the gate electrode 221 is realized as a trench electrode extending into the semiconductor body 100 in a vertical direction proceeding from the front side 101. FIG. 135A illustrates a plan view of the front side 101 of the semiconductor body, the illustration of source, drain and gate electrodes being dispensed with for reasons of clarity. FIG. 135B illustrates a vertical cross section of the component, passing through the gate electrode 221. FIG. 135C illustrates a vertical cross section of the component in a plane lying at a distance from the gate electrode 221 in the second lateral direction y.

The gate electrode 221 of the component is arranged in such a way that it extends, in a manner surrounded by the gate dielectric 222, in the first lateral direction x from the source region 213 through the body region 212 right into the drift region 211. When the component is driven in the on state, an inversion channel forms in this case in the body region 212 along the lateral areas of the gate electrode 221 in the first lateral direction.

In a manner not illustrated in greater detail, the drift control regions 241, in accordance with the drift control regions 241 of the component in FIG. 134, can be connected to the drain electrode 232 via the first connection electrode 233 (FIG. 135A) and to the source electrode 231 via the second connection electrode 234 optionally present (FIG. 135A).

The gate structure can also be embodied in accordance with the explanations concerning FIG. 128, including the alternatives specified there.

Figure 136A:
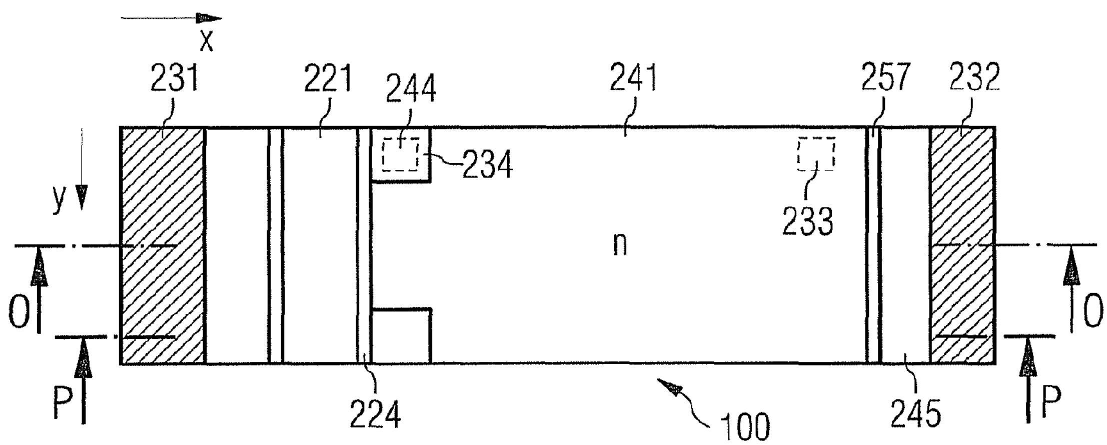
FIGS. 136A-136D illustrate a component which is modified relative to the component in FIG. 135 and in which the gate electrode has a plurality of gate electrode sections arranged in each case in extension of a drift control region.
Figure 136B:
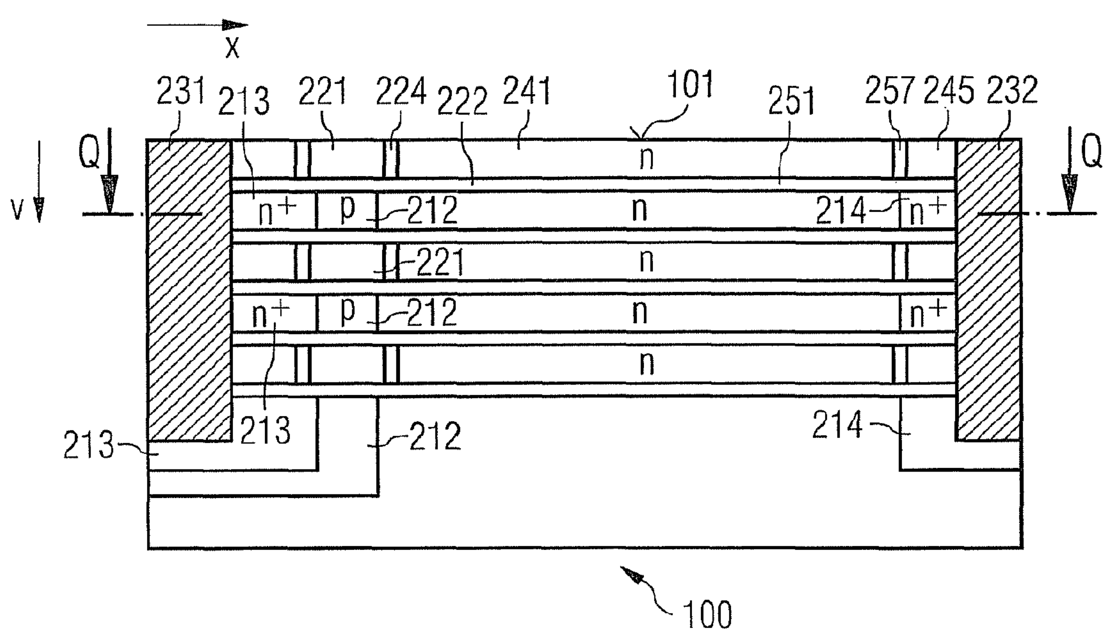
Figure 136C:
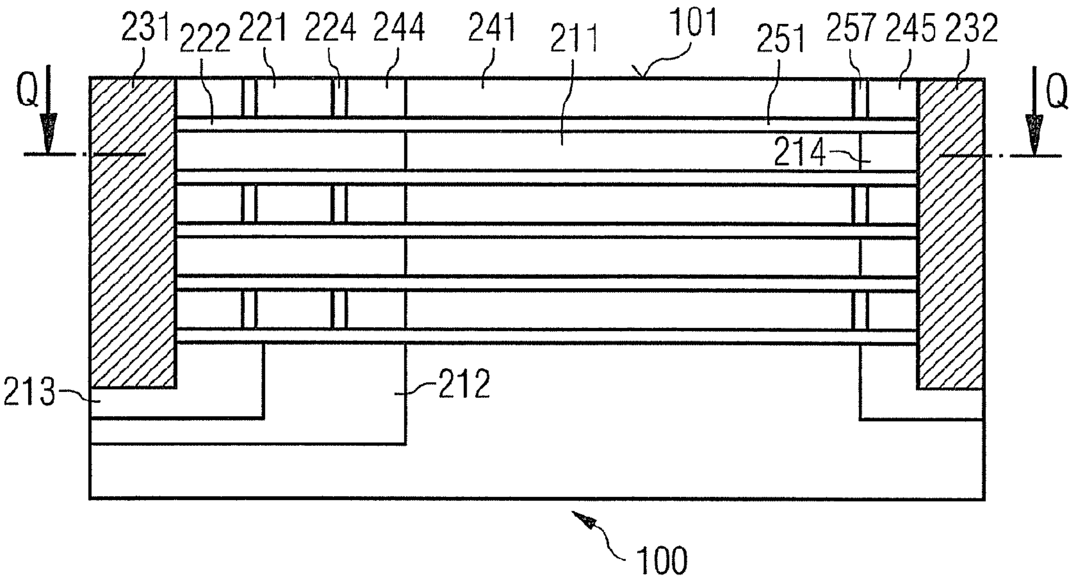
Figure 136D:
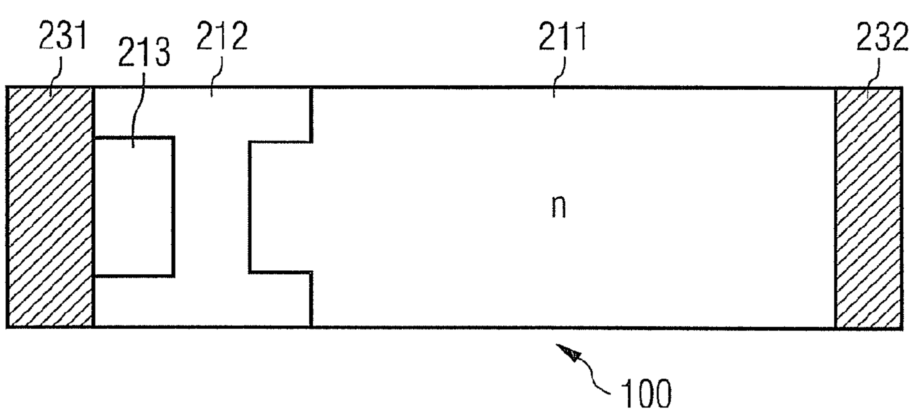

FIGS. 136A to 136D illustrate a further exemplary embodiment of a lateral power MOSFET in which drift control regions 241 are arranged adjacent to sections of a drift region 211 in a vertical direction v of a semiconductor body 100. In this case, FIG. 136A illustrates a plan view of the front side 101 of the semiconductor body, and FIGS. 136B and 136C illustrate vertical cross sections of the semiconductor body in two sectional planes O-O and P-P arranged at a distance from one another in the second lateral direction y. FIG. 136D illustrates a lateral cross section through the semiconductor body in a sectional plane Q-Q illustrated in FIGS. 136B and 136C.

In the case of this component, the gate electrode 221 has a plurality of electrode sections which are arranged at a distance from one another in a vertical direction v of the semiconductor body 100. In the case of this component, the individual gate electrode sections 221 are respectively arranged adjacent to the drift control regions 241 in the first lateral direction x and are insulated from the drift control regions 241 by an insulation layer 224. The body region 212 has a plurality of body region sections, each of which is respectively arranged adjacent to a section of the drift region 211 in the first lateral direction x and adjacent to at least one section of the gate electrode 221 in a vertical direction v. The gate dielectric 222 arranged between a gate electrode section 221 and a body region section 212 and the accumulation dielectric 251 formed between the drift control region 241 adjacent to the gate electrode section 221 and the drift region 211 arranged adjacent to the body region section 212 are formed by a common dielectric layer in the case of this component.

There are adjacent to the body region sections 212 in the first lateral direction x respective sections of the source region 213, with which contact is made by a source electrode 231 extending into the semiconductor body 100 in a vertical direction proceeding from the front side 101.

In the case of this component, the individual gate electrode sections 221, the individual body region sections 212 and also the individual source region sections 213 are formed in strip-type fashion in accordance with the drift control regions 241 and the drift regions 211 in the second lateral direction y.

In accordance with the source region 213, the drain region 214 likewise has a plurality of sections in the case of this component, a respective drain region section 214 being adjacent to a drift region section 211. Contact is made with the individual drain region sections 214 by a drain electrode 232 extending into the semiconductor body 100 in a vertical direction proceeding from the front side 101. The individual drain region sections 214 are formed in strip-type fashion, and thus in elongated fashion, in the second vertical direction y in accordance with the source region sections 213.

In the case of this component, the drift control regions 241 are insulated in the first lateral direction x, by vertical insulation layers 257, from the drain electrode 232 or from a semiconductor region 245 arranged between the insulation layer 257 and the drain electrode 232.

In a manner not illustrated in greater detail, the drift control regions 241, in accordance with the drift control regions 241 of the component in FIG. 134, can be connected to the drain electrode 232 via the first connection electrode 233 (FIG. 135A) and to the source electrode 231 via the second connection electrode 234 optionally present (FIG. 135A). One possible position of the first and second connection electrodes 233, 234 is illustrated in FIG. 136A. Referring to FIG. 136A, connection regions 244 doped complementarily to the drift control region 241 may be present within the individual drift control regions 241, contact being made with the connection regions by the connection electrode 234. In this way it is possible to realize a diode for connecting the drift control region 241 to the source electrode 231 or the source region 213.

It goes without saying that the provision of drift control regions 241 arranged in each case adjacent to drift region sections 211 in a vertical direction of a semiconductor body is not restricted to the power MOSFETs illustrated in FIGS. 134 to 136, rather such drift control regions 241 can be provided in any power components having a drift region, in one embodiment Schottky diodes. Schottky diodes differ from the MOSFETs explained above by virtue of the fact that there are no gate electrodes present, and that a Schottky metal region is provided instead of the body and source regions, the Schottky metal region being adjacent to the drift region.

In the case of the lateral power components explained with reference to FIGS. 134 to 136, stack-like component structures are present which comprise, in a vertical direction v of the semiconductor body 100, successively a semiconductor layer as drift region 211, a dielectric layer as accumulation dielectric 251 and a further semiconductor layer as drift control region 241 and, on the drift control region, a further dielectric layer as further accumulation dielectric 251. This structure can be repeated multiply in a vertical direction in order to realize, in a vertical direction of the semiconductor body, in each case alternately a plurality of drift regions 211 and a plurality of drift control regions 241 which are in each case separated from one another by an accumulation dielectric 251. In this case, the semiconductor layers which form the individual drift regions 211 or the individual drift region sections and the individual drift control regions 241 can each have the same dimensions in a vertical direction and can each have identical doping concentrations.

Layer arrangements in which a semiconductor layer and a dielectric layer are present alternately can be produced in various ways:

One possible method for producing such a layer stack consists in producing insulation layers which are buried at different depths in a semiconductor layer. For this purpose, oxygen ions are implanted into the semiconductor layer via a surface. This oxygen implantation is followed by a thermal step which, in the regions into which oxygen was introduced, causes a semiconductor oxide to arise, which forms an insulation layer. The implantation energy with which the oxygen ions are implanted into the semiconductor body determines the penetration depth of the oxygen ions and thus the position of the insulation layer in a vertical direction of the semiconductor layer. By applying different implantation energies, a plurality of insulation layers arranged at a distance from one another in the irradiation direction can be produced by this method.

Insulation layers running perpendicular to the surface of the semiconductor layer can also be produced by this method. For this purpose, the oxygen implantation is effected in masked fashion using a mask, the mask determining the position and the dimensions of the insulation layer in a lateral direction of the semiconductor layer and the applied implantation energy determining the position and the dimensions of the insulation layer in a vertical direction of the semiconductor layer.

A further method for producing a layer stack which has a semiconductor layer and a dielectric layer alternately provides firstly for producing a semiconductor layer stack which has a silicon layer and a silicon-germanium layer alternately. Such a semiconductor layer stack can be produced by epitaxial deposition in a known manner. The dimensions of the silicon-germanium layers in a vertical direction of the resulting layer stack, that is to say perpendicular to the individual layers, are smaller than the dimensions of the individual silicon layers in this case. Trenches are subsequently produced in these layer stacks proceeding from the front side, via which trenches regions of the silicon-germanium layers are selectively etched away by an etchant proceeding from the trenches, such that cavities arise between in each case two silicon layers that are adjacent in each case in a vertical direction. A semiconductor oxide is subsequently produced in the cavities by introducing an oxidizing gas into the cavities of the layer stack via the previously produced trench at suitable oxidation temperatures.

A further method for producing a layer stack which has semiconductor layers and insulation layers alternately consists in the method explained with reference to FIGS. 132A to 132E, in which insulation layers are overgrown epitaxially with a semiconductor layer, being carried out multiply, that is to say a patterned insulation layer being grown anew onto a grown epitaxial layer and an epitaxial layer being grown anew onto the insulation layer.

A layer stack which has semiconductor layers and insulation layers alternately can additionally be produced by application of the SmartCut method. A SmartCut method provides, in principle, for "ejecting" a thin semiconductor layer from a semiconductor layer by implanting hydrogen ions into a given depth and then carrying out a thermal step. The SmartCut method can be used for producing a semiconductor-insulator layer stack by applying a semiconductor layer having an insulation layer to a further semiconductor layer, which is oxidized at the surface, by using a wafer bonding method in such a way that the insulation layer is arranged between these two semiconductor layers. By using the SmartCut method, the bonded-on semiconductor layer is then ejected in such a way that the insulation layer and a thin layer of the bonded-on semiconductor layer remain on the carrier layer. This thin semiconductor layer is subsequently oxidized and then a semiconductor layer provided with an insulation layer is bonded onto it anew and the bonded-on layer is ejected anew by using the SmartCut method. These method steps can be carried out multiply in order to produce a semiconductor-insulator layer stack.

A further possible method for producing buried oxide layers consists in etching trenches into a semiconductor layer and subsequently heating the semiconductor layer in a hydrogen atmosphere. This thermal step gives rise to cavities in the semiconductor layer which are closed off from the trenches, the cavities subsequently being oxidized. The positioning of the individual cavities proceeding from a surface of the semiconductor layer is predefined in this case by the depth of the trenches etched into the semiconductor layer and the choice of the etching process that determines the sidewall geometry. Thus, in the "Bosch process", for example, anisotropic and isotropic phases that passivate the sidewall are carried out alternately during the trench etching, which leads to a regular structure of the trench wall with scallops. The formation of chambers can be promoted by a suitable choice of the ratio of the widths of the regions etched with isotropic scallops and the regions etched anisotropically and thus more narrowly. The oxidation of the semiconductor material in the cavities with the aim of producing an insulation layer in the cavity requires the production of a further trench through which the cavities are opened.

One problem to be solved in the production of the components explained with reference to FIGS. 134 to 136, in which the drift control regions 241 and the drift regions 211 are arranged in a manner lying one above another in a vertical direction, is to produce a connection electrode such as, for example, the above-explained connection electrodes 233, 234 of the drift control region 241 or the drain electrode 232 of the component in accordance with FIG. 136, which extend into the semiconductor body proceeding from the front side 101, and which makes contact with only every second semiconductor layer of the layer stack, that is to say either only each drift region 211 or only each drift control region 241. A method which solves this problem is explained below with reference to FIGS. 137A to 137F for the production of a drain electrode 232 which makes contact only with the drift regions 211. In this case, the method can correspondingly be applied to the production of the first and second connection electrodes 233, 234 of the components in FIGS. 134 to 136.

Figure 137A:
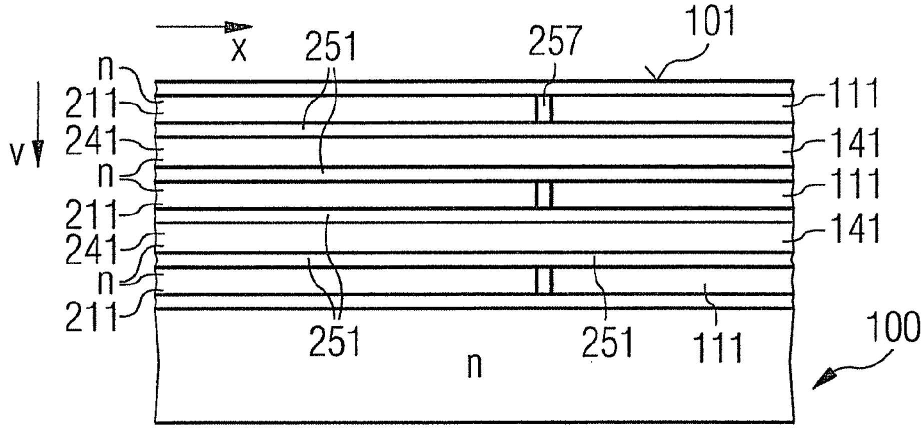
FIGS. 137A-137F illustrate a method for producing a connection contact that makes contact with buried semiconductor regions.

FIG. 137A illustrates the semiconductor body 100 at the beginning of the method, in which, in a vertical direction v, the drift regions 211 and the drift control regions 241 are arranged in a manner lying one above another and respectively separated by an accumulation dielectric 251. First semiconductor layers, which form the later drift regions 211 of the component, are designated here by the reference symbol 111 and second semiconductor layers, which form the later drift control regions 241 of the component, are designated here by the reference symbol 141. In the first semiconductor layers 111, vertical insulation layers 257 are arranged one above another in a vertical direction v of the semiconductor body 100, the insulation layers extending in a vertical direction in each case between two accumulation dielectric layers 251.

Figure 137B:
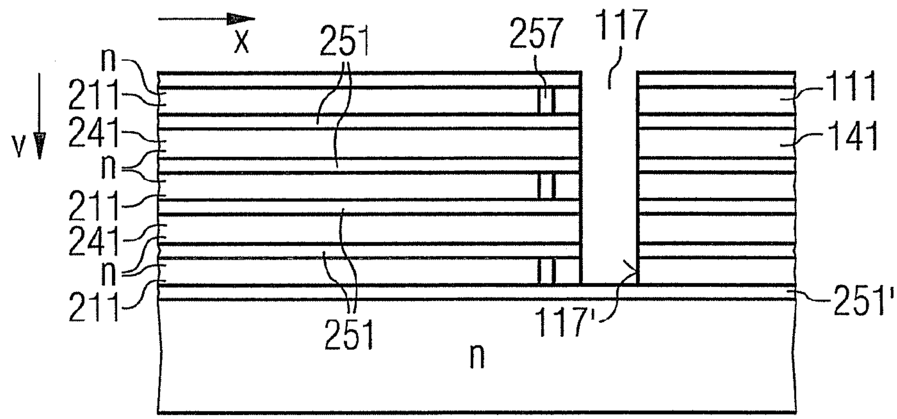

Referring to FIG. 137B, a trench 117 is subsequently produced into this arrangement proceeding from the front side 101, to which an insulation layer is likewise applied in the example, which trench extends into the semiconductor body in a vertical direction v proceeding from the front side 101 and ends above or on the bottommost dielectric layer 251' of the layer stack in a vertical direction proceeding from the front side. The trench is produced at a distance from the insulation regions 257 in the first lateral direction x outside the region of the first semiconductor layers forming the later drift regions 211.

The trench can be produced by using an etching method using an etching mask that defines the lateral position and the lateral dimensions of the trench.

Figure 137C:
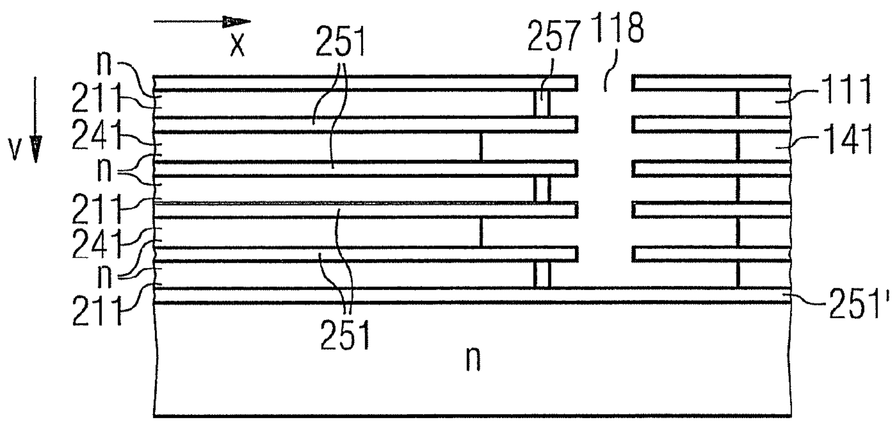

Referring to FIG. 137C, the semiconductor layers 111, 141 lying between two dielectric layers 251 in each case are subsequently removed partially in the first lateral direction by using an isotropic etching method proceeding from sidewalls of the trench 117. In the case of the semiconductor layers which in sections form the later drift regions 211, the vertical insulation regions 257 function as an etching stop, such that, in the region of the semiconductor layers, the semiconductor material is removed proceeding from the trench 117 only as far as the insulation regions 257. In this case, the etching method is carried out until, in the region of the second semiconductor layers 141 forming the later drift control regions 241, the semiconductor material has been removed in the first lateral direction x as far as behind the insulation regions 257 arranged in the first semiconductor layers 111. In the region of the sidewall 117' of the trench 117 opposite to the insulation regions 257, the semiconductor layers are removed equally during this isotropic etching method.

The result of this isotropic etching method is that the semiconductor layers forming the later drift regions 211, in the first lateral direction x on one side of the original trench 117, project further in the direction of the cutout than the semiconductor layers forming the later drift control regions 241. Proceeding from the cutout 118 produced by the isotropic etching method, the drift control regions 241 are therefore set back relative to the drift regions 211 in the first lateral direction x.

Figure 137D:
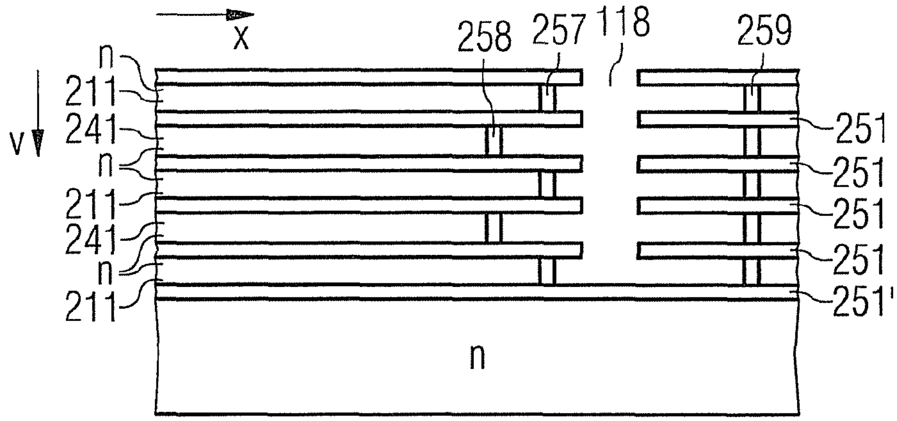

During further method steps, the result of which is illustrated in FIG. 137D, insulation layers 258, 259 are produced on uncovered regions of the semiconductor layers within the cutout 118 produced by the isotropic etching process. These are, on one side of the trench, only the second semiconductor layers 141, which form the drift control regions 241. The newly produced insulation layers are designated by the reference symbol 258 in this region. On the opposite side of the cutout and on sidewalls (not illustrated) arranged at a distance from one another in the second lateral direction y, the vertical insulation layers are produced on uncovered regions of the first and second semiconductor layers 111, 141 and are designated by the reference symbol 259 in FIG. 137D.

Figure 137E:
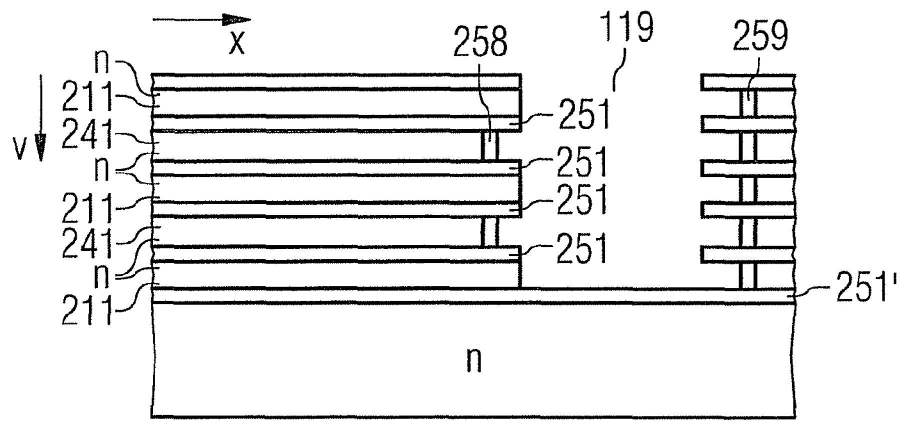

FIG. 137E illustrates the arrangement after further method steps involving the etching of a further cutout 119 into the layer stack proceeding from the front side 101, which cutout is positioned in such a way that one lateral area thereof is arranged in the first lateral direction between the first vertical insulation regions 257 originally present in the first semiconductor layers 111 and the second vertical insulation regions 258 produced later on the uncovered sides of the second semiconductor layers 141. The first vertical insulation regions 257 are removed in the process, whereby the first semiconductor layers 111 are uncovered in the further cutout 119, while the second semiconductor layers are covered by the second insulation regions in the cutout 119.

On the side of the newly produced cutout 119 opposite to the original first insulation regions 257, the sidewall of the cutout lies within the second insulation regions 258, such that, in this region, only webs of the dielectric layers 251 which run in the first lateral direction x are removed, but no semiconductor material is removed and none of the vertical insulation layers 259 is removed either. The same holds true on the opposite sides (not illustrated) of the cutout 119 in the second lateral direction y.

Figure 137F:
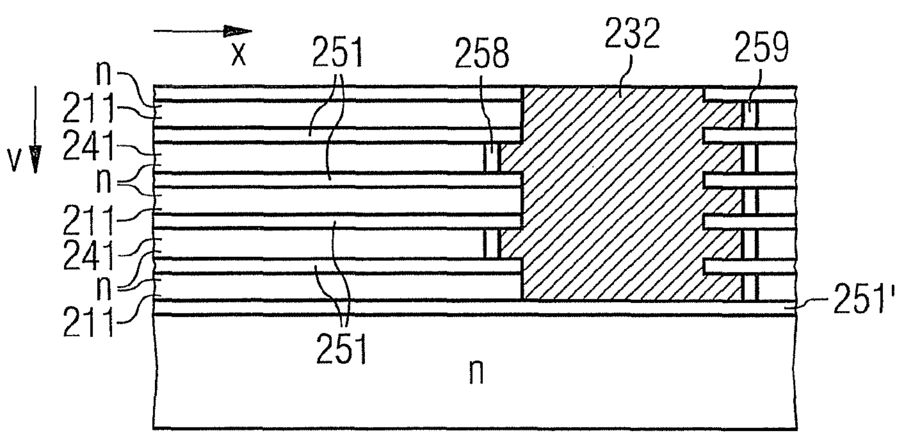

Referring to FIG. 137F, the method is concluded by depositing an electrode layer in the cutout 119, whereby a connection electrode 232 arises. In the example, the electrode 232 forms the drain electrode 232 and makes contact with the first semiconductor layers 111 which are uncovered after removal of the insulation regions 257 on the sidewalls of the cutout and which form the drift regions 211 there. The electrode 232 is insulated from the second semiconductor layers 141, which form the drift control regions 241 in regions adjacent to the drift regions 211, by the second insulation regions 258.

In a manner not illustrated in greater detail, prior to the deposition of the electrode layer for producing the electrode 232, it is possible to carry out an implantation method in which dopant atoms are implanted into the uncovered regions of the drift regions 211 in order thereby to produce highly doped connection regions. In this case, the implantation is effected at an angle obliquely with respect to the perpendicular.

The method explained above with reference to FIGS. 137A to 137F for producing a connection electrode which makes contact with only every second one of the semiconductor layers can also be used in a corresponding manner for producing the connection electrodes (236, 237 in FIGS. 134 to 136) which make contact with the drift control regions 241, or for producing the source electrode 231.

The drift control regions 241 of the power semiconductor components explained above are in each case formed in elongated fashion in the drift region 211 in the current flow direction of the component. In the case of a MOSFET, the current flow direction corresponds to the direction between the body region 212 and the drain region 214 and, in the exemplary embodiments explained above, corresponds to the first lateral direction x of the semiconductor body 100. In a direction transversely with respect to the current flow direction, the drift control regions run in each case perpendicular to the front side 101 of the semiconductor body in the case of the components in accordance with FIGS. 111 to 131 and 133 and in each case parallel to the front side 101 of the semiconductor body in the case of one exemplary embodiments of FIGS. 134 to 136. In the case of the components in accordance with FIGS. 134 to 136, the drift control regions can extend in the second lateral direction y as far as an edge of the semiconductor body or an edge termination of the semiconductor body.

Referring to FIGS. 138 to 145 explained below, it is also possible to employ combinations of the geometries of the drift control regions 241 explained above. FIGS. 138 to 145 each illustrate in perspective illustration a section of the drift regions 211 and drift control regions 241 of a power semiconductor component.

Figure 138A:
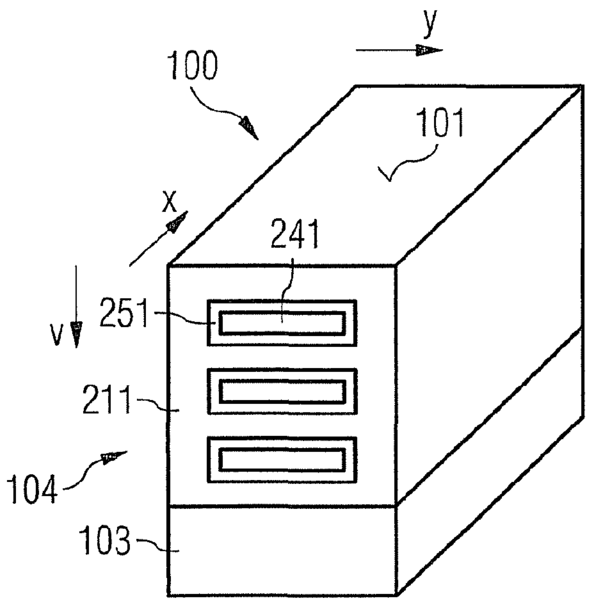
FIGS. 138A-138B illustrate an excerpt from a drift region of a power semiconductor component with strip-type drift control regions arranged therein.
Figure 138B:
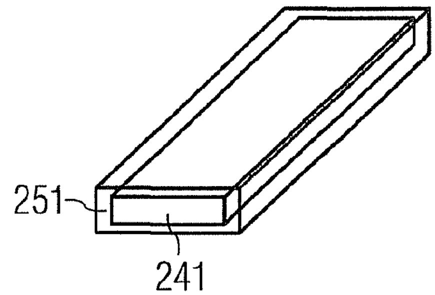

Referring to FIGS. 138A and 138B, the drift control regions 241 can be formed in strip-type fashion and be arranged in the drift region 211 in a manner surrounded by the accumulation dielectric 251. In the case of this component, accumulation channels can form in the drift region 211 both in a vertical direction above and below the drift control regions 241 and in a lateral direction adjacent to the drift control regions 241.

The semiconductor body 100 can comprise, in a known manner, a semiconductor substrate 103 and a semiconductor layer 104 applied to the semiconductor substrate, in which case the substrate 103 and the semiconductor layer 104 can be doped complementarily to one another or can be of the same conduction type. In this case, a basic doping of the semiconductor layer 104 can correspond to the doping of the drift region 211.

Figure 139:
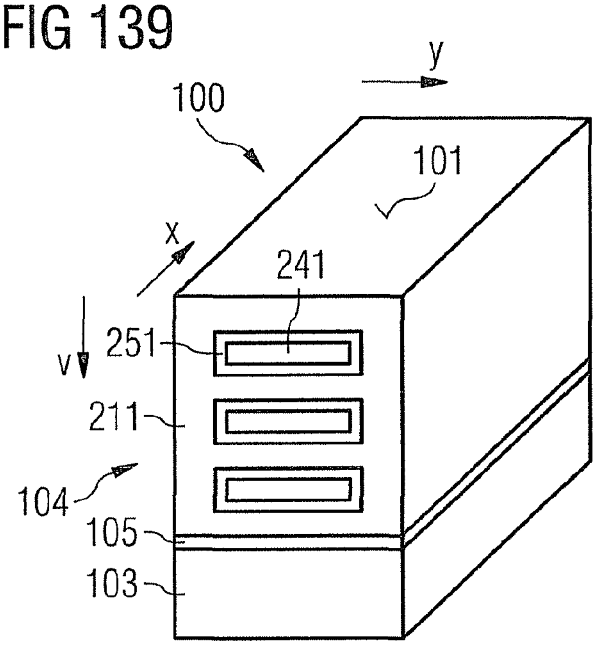
FIG. 139 illustrates an arrangement modified relative to the arrangement in FIG. 138.

Referring to FIG. 139, an insulation layer 105 can optionally be arranged between the semiconductor substrate 103 and the semiconductor layer 104, which thus insulates the drift region 100 from the semiconductor substrate 103.

Figure 140:
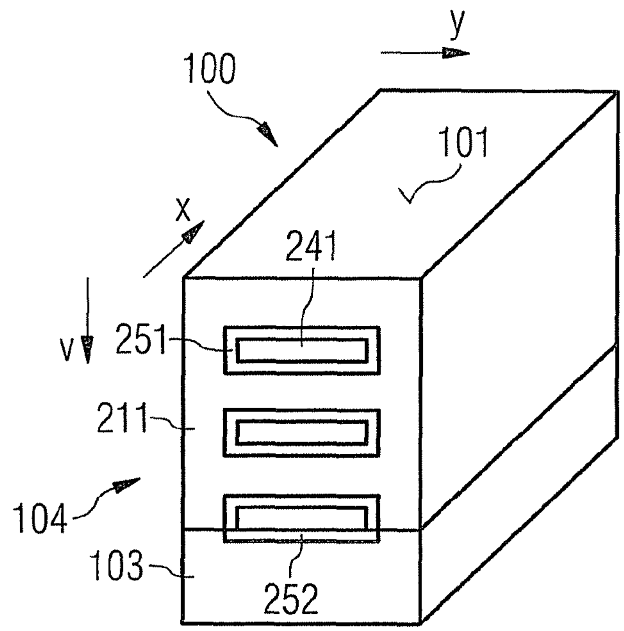
FIG. 140 illustrates a further arrangement modified relative to the arrangement in FIG. 138.

In the case of the components in accordance with FIGS. 138 and 139, the bottommost drift control region 241 proceeding from the front side 101 is arranged at a distance from the semiconductor substrate 103. A modification of the exemplary embodiment in accordance with FIG. 138 in which the bottommost drift control region 241 extends as far as the semiconductor substrate 103 is illustrated in FIG. 140. In the case of this exemplary embodiment, an insulation layer is present between the bottommost one of the drift control regions 241 and the semiconductor substrate 103, the insulation layer insulating this drift control region from the semiconductor substrate 103.

Figure 141:
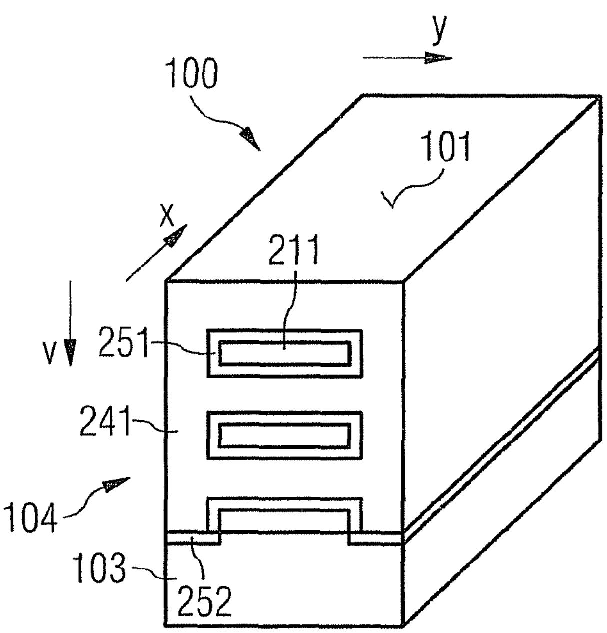
FIG. 141 illustrates an excerpt from a drift control region of a power semiconductor component with strip-type drift regions arranged therein.

FIG. 141 illustrates a modification of the arrangement illustrated in FIG. 140. In this case, the drift regions 211 are formed in strip-type fashion and are arranged in the drift control region 241. The accumulation dielectric 251 is correspondingly present between the drift control region 241 and the drift regions 211. In this case, an insulation layer 252 is arranged at least between the drift control region 241 and the semiconductor substrate 103, while a bottommost one of the drift regions 211 is directly adjacent to the semiconductor substrate 103. In this case, the semiconductor substrate 103 can be of the same conduction type or of a conduction type complementary to that of the bottommost drift region 211. In this case, a further insulation layer can optionally be provided between the bottommost drift region 211 and the semiconductor substrate 103 (not illustrated).

In the case of the above-explained strip-type configurations of the drift control regions 241 or of the drift regions 211, the dimensions of the regions 241, 211 are greater in the second lateral direction y than in the vertical direction, which results in a strip-type geometry of these component regions. As an alternative, the strip-type configuration can also be achieved by the dimensions of the regions 241, 211 being greater in the vertical direction than in the second lateral direction y.

Figure 142A:
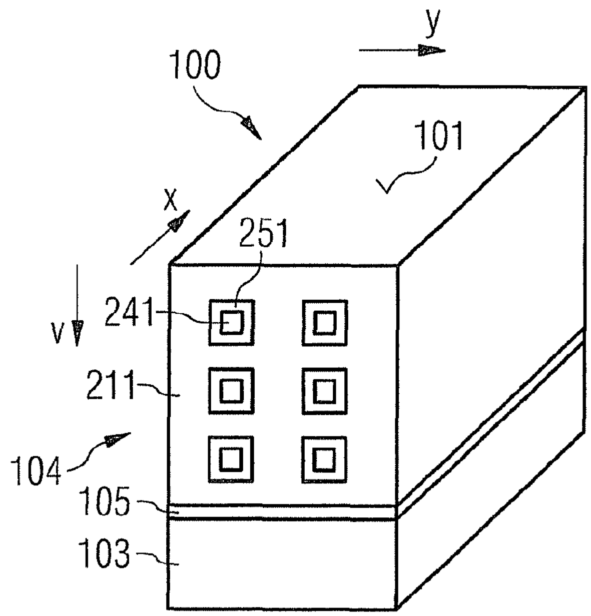
FIGS. 142A-142B illustrate an excerpt from a drift region of a power semiconductor component with beam-type drift control regions arranged therein.
Figure 142B:
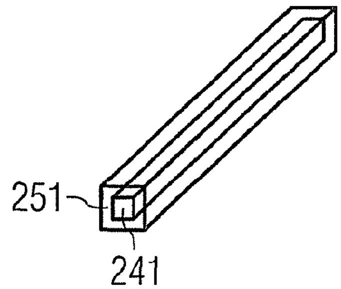

FIGS. 142A and 142B illustrate a modification of the component illustrated in FIG. 139, the drift control regions 241 in this case being realized in "beam-type" fashion, that is to say having an at least approximately square cross section in a sectional plane formed by the vertical direction v and the second lateral direction y. These drift control regions are formed in correspondingly elongated fashion in the first lateral direction x.

An insulation layer 105—illustrated in FIG. 142A—between the semiconductor substrate 103 and the semiconductor layer 104 or the drift region 211 is optionally present. The semiconductor substrate 103 can be of the same conduction type as the drift region 211 or be doped complementarily to the drift region 211.

Figure 143A:
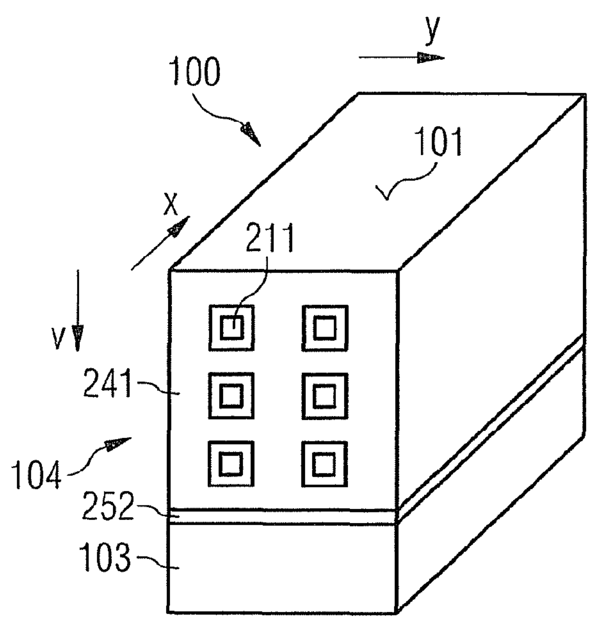
FIGS. 143A-143B illustrate an excerpt from a drift control region of a power semiconductor component with beam-type drift regions arranged therein.
Figure 143B:
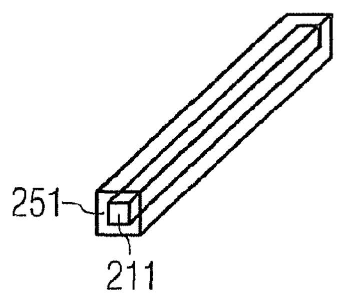

FIGS. 143A, 143B illustrate a modification of the arrangement in accordance with FIG. 142, the drift regions 211 in this case having a beam-type geometry and being surrounded by the drift control region 241 in a manner separated by the accumulation dielectric 251 both in a vertical and in a lateral direction. In this case, the drift control region 241 is insulated from the semiconductor substrate 103 by the further insulation layer 252. In this case, the semiconductor substrate can be of a conduction type identical or complementary to that of the drift control region 241.

Figure 144:
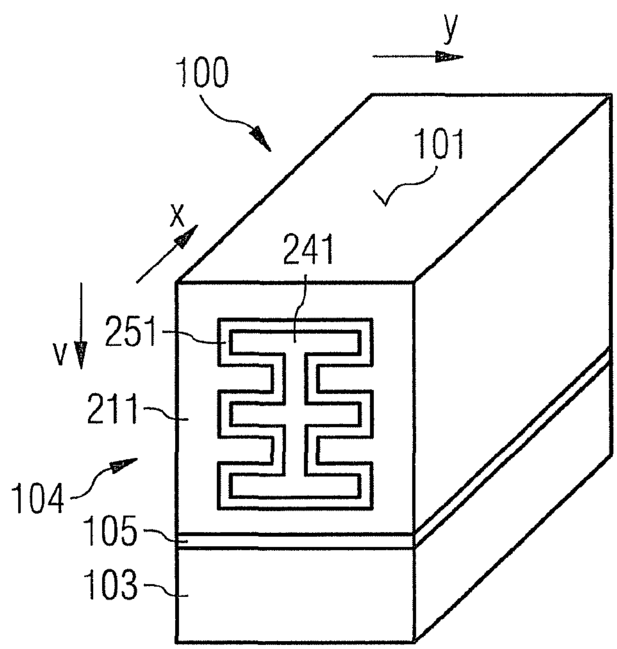
FIG. 144 illustrates an excerpt from a drift region of a power semiconductor component with a drift control region arranged therein and having a meandering periphery.

In the case of the arrangement in accordance with FIG. 144, the drift control region 241 is formed in elongated fashion in the first lateral direction x and has a geometry such that the accumulation dielectric 251 has a meander-like geometry in the vertical direction v. In this case, the drift control region 241 is completely surrounded by the drift region 211 in a manner separated by the accumulation dielectric 251. The drift region 211 and the drift control region 241 are arranged in the semiconductor layer 104 which is arranged above the semiconductor substrate 103 and which is optionally insulated from the semiconductor substrate 103 by using an insulation layer 105.

Figure 145:
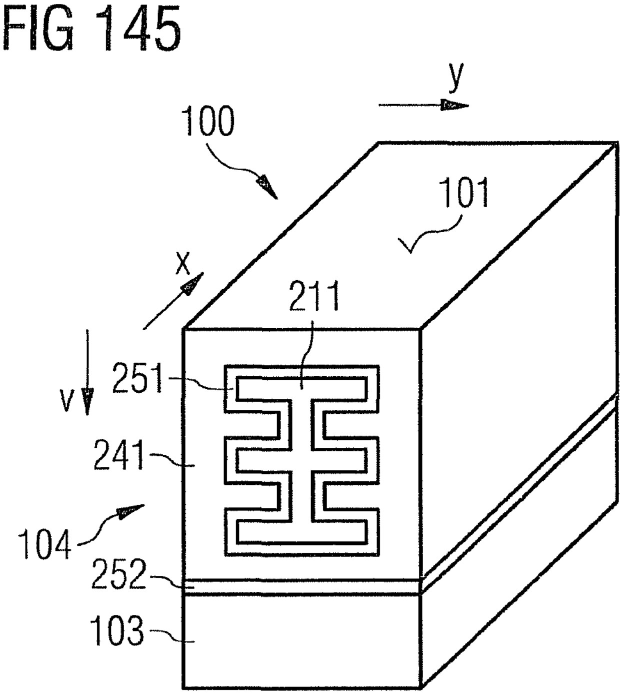
FIG. 145 illustrates an excerpt from a drift control region of a power semiconductor component with a drift region arranged therein and having a meandering periphery.

FIG. 145 illustrates a modification of the arrangement in accordance with FIG. 144 in which the drift region 211 is surrounded by the drift control region 241 and in which the drift region 211 has a geometry such that the accumulation dielectric 251 arranged between the drift region 211 and the drift control region 241 has a meander-like geometry in a vertical direction v.

Such a meander-like geometry of the accumulation dielectric is advantageous insofar as, for a given volume of the semiconductor material required for realizing the drift region 211 and the drift control region 241, it is possible to realize a large area of the accumulation dielectric 251 and thus a large width of the accumulation channel that forms when the component is driven in the on state.

The present invention has been explained by way of example on the basis of a MOSFET and a Schottky diode. In the case of a MOSFET, in one embodiment, there is the possibility of providing a p-channel MOSFET instead of the n-channel MOSFET illustrated. In this case, in the exemplary embodiments of an n-channel MOSFET illustrated, all the n-doped semiconductor regions would have to be replaced by p-doped semiconductor regions and, conversely, all the p-doped semiconductor regions would have to be replaced by n-doped semiconductor regions. This also concerns in one embodiment the first, the second and the third diodes, that is to say that these diodes must be connected in opposite polarity to the corresponding, but complementarily doped regions.

The concept can be applied to any unipolar components having a drift region, in one embodiment also to JFETs.

It should be pointed out that, for the realization of the drift control region, monocrystalline semiconductor material is not necessarily required, rather that it is also possible to use polycrystalline semiconductor material which satisfies the doping specification explained above, according to which it can be fully depleted. When a polycrystalline semiconductor material is used for the drift control region 3, however, higher leakage currents should be taken into consideration, resulting from an increased charge carrier generation at grain boundaries between individual crystals of the polycrystalline material.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:

a semiconductor body;

a drift zone of a first doping type in the semiconductor body, a drift control zone comprising a semiconductor material and arranged in the semiconductor body at least partially adjacent the drift zone;

an accumulation dielectric arranged between the drift zone and the drift control zone;

a first device zone and a second device zone distant to the first device zone, wherein the drift zone is arranged between the first device zone and the second device zone; and a capacitive component connected between the drift control zone and the first device zone, wherein the drift control zone is electrically coupled to the second device zone through a rectifier element.

2. The semiconductor device of claim 1, wherein the drift control zone is coupled to the first device zone through a rectifier element.

3. The semiconductor device of claim 1, wherein the drift control zone comprises a contact electrode; and wherein the capacitive component is connected between the contact electrode and the first device zone.

4. The semiconductor device of claim 3, wherein a doped contact zone that is doped complementarily to the drift control zone is arranged between the drift control zone and the contact electrode.

5. The semiconductor device of claim 4, wherein the contact zone adjoins the contact electrode and a dielectric of the capacitive component.

6. The semiconductor device of claim 1, wherein the drift control zone and the drift zone have the same doping type.

7. The semiconductor device of claim 1, wherein the drift zone and the drift control zone have complementary doping types.

8. The semiconductor device of claim 1, wherein the capacitive component is integrated in the semiconductor body.

9. The semiconductor device of claim 8, wherein the capacitive component comprises a dielectric that is different from the accumulation dielectric.

10. The semiconductor device of claim 1, that is implemented as a MOS transistor in which the first device zone is a body zone and the second device zone is a drain zone, and that further comprises:

a source zone separated from the drift zone by the body zone; and a gate electrode that is dielectrically insulated from the semiconductor body by a gate dielectric and that is adjacent the body zone.

11. The semiconductor device of claim 10, wherein the body zone and the source zone are connected through a source electrode and a doped semiconductor zone of the same doping type as the body zone but more highly doped; and wherein the capacitive component is connected to the source electrode.

12. The semiconductor device of claim 10, wherein the drain zone and the drift zone have the same doping type, or wherein the drain zone is doped complementarily to the drift zone.

13. The semiconductor device of claim 10 that is implemented as a MOSFET in which the drift zone is doped complementarily to the source zone.

14. The semiconductor device of claim 13, in which an intermediate zone of the same doping type as the source zone is arranged between the drift zone and the body zone.

15. The semiconductor device of claim 14, wherein the drift control zone is electrically coupled to the gate electrode.

16. The semiconductor device of claim 15, wherein the drift control zone is coupled to the gate electrode via a rectifier element.

17. The semiconductor device of claim 10, further comprising:

a drain electrode contacting the drain zone; and a doped semiconductor zone located between the drain electrode and the drift zone.

18. A semiconductor device comprising:

a semiconductor body;

a drift zone of a first doping type in the semiconductor body, a drift control zone comprising a semiconductor material and arranged in the semiconductor body at least partially adjacent the drift zone, and an accumulation dielectric arranged between the drift zone and the drift control zone;

a body zone and a drain zone distant to the body zone, wherein the drift zone is arranged between the body zone and the drain zone;

a gate electrode that is dielectrically insulated from the semiconductor body by a gate dielectric and that is adjacent the body zone;

a drain electrode directly contacting the drain zone; and a semiconductor zone doped complementarily to the drain zone and arranged between the drain electrode and the drift zone, wherein the semiconductor zone doped complementarily to the drain zone directly adjoins the drain electrode.

19. The semiconductor device of claim 18, wherein a section of the semiconductor zone doped complementarily to the drain zone is arranged between the drain zone and the drift zone.

20. The semiconductor device of claim 19, further comprising:

a field stop zone of the same doping type as the drift zone and more highly doped than the drift zone and arranged between the drift zone and the semiconductor zone doped complementarily to the drain zone.

21. The semiconductor device of claim 18, wherein the drain zone and the semiconductor zone doped complementarily to the drain zone adjoin the drift zone.

22. The semiconductor device of claim 21, further comprising:

a field stop zone distant to the drain zone and the semiconductor zone doped complementarily to the drain zone, of the same doping type as the drift zone and more highly doped.

23. The semiconductor device of claim 18, further comprising:

a field stop zone of the same doping type as the drift zone and more highly doped than the drift zone and arranged between the drift zone on one side and the drain zone or the semiconductor zone doped complementarily to the drain zone on the other side.

24. The semiconductor device of claim 18, further comprising:

a capacitive component connected between the drift control zone and the body zone.

25. The semiconductor device of claim 24, wherein a contact zone doped complementarily to the drift control zone is arranged between the drift control zone and the contact electrode.

26. The semiconductor device of claim 24, wherein the body zone and the source zone are connected with each other through a source electrode and a doped semiconductor zone of the same doping type as the body zone and more highly doped than the body zone; and wherein the capacitive component is connected to the source electrode.

27. The semiconductor device of claim 18, further comprising:

a contact electrode of the drift control zone configured to receive a drive potential.

28. The semiconductor device of claim 18, wherein the drift control zone is coupled to the body zone via a rectifier element.

29. The semiconductor device of claim 18, wherein the drift control zone and the drift zone have the same doping type.

30. The semiconductor device of claim 18, wherein the drift control zone and the drift zone have complementary doping types.

31. The semiconductor device of claim 18, wherein the drift control zone is coupled to the drain zone via a rectifier element.

32. The semiconductor device of claim 31, wherein the drift control zone is connected to the rectifier element through a doped semiconductor zone of the same doping type as the drift control zone and more highly doped than the drift control zone.

33. The semiconductor device of claim 18, wherein the drift control zone is coupled to the gate electrode through a rectifier element.

34. The semiconductor device of claim 18, wherein the source zone, the drift zone and the drain zone have the same doping type.

* * * * *